US010981938B2

(12) United States Patent
Joo et al.

(10) Patent No.: US 10,981,938 B2
(45) Date of Patent: Apr. 20, 2021

(54) POLYCYCLIC AROMATIC COMPOUNDS AND ORGANIC ELECTROLUMINESCENT DEVICES USING THE SAME

(71) Applicant: SFC CO., LTD., Cheongju-si (KR)

(72) Inventors: SungHoon Joo, Cheongju-si (KR); Ji-Hwan Kim, Cheongju-si (KR); Byung-sun Yang, Cheongju-si (KR); Hyeon Jun Jo, Cheongju-si (KR); Sungeun Choi, Cheongju-si (KR); Su-jin Kim, Cheongju-si (KR); Bong-Ki Shin, Cheongju-si (KR)

(73) Assignee: SFC Co., Ltd., Cheongju-si (KR)

( * ) Notice: Subject to any disclaimer, the term of this patent is extended or adjusted under 35 U.S.C. 154(b) by 0 days.

(21) Appl. No.: 16/687,916

(22) Filed: Nov. 19, 2019

(65) Prior Publication Data

US 2020/0172558 A1 Jun. 4, 2020

(30) Foreign Application Priority Data

Nov. 30, 2018 (KR) ........................ 10-2018-0151781
Jun. 12, 2019 (KR) ........................ 10-2019-0069314

(51) Int. Cl.

*H01L 51/50* (2006.01)
*C07F 5/02* (2006.01)
*C07F 11/00* (2006.01)
*H01L 51/00* (2006.01)

(52) U.S. Cl.

CPC ................ *C07F 5/02* (2013.01); *C07F 11/00* (2013.01); *H01L 51/006* (2013.01); *H01L 51/008* (2013.01); *H01L 51/0058* (2013.01); *H01L 51/0061* (2013.01); *H01L 51/0072* (2013.01); *H01L 51/0073* (2013.01); *H01L 51/0074* (2013.01); *H01L 51/5056* (2013.01); *H01L 51/5072* (2013.01); *H01L 51/5092* (2013.01)

(58) Field of Classification Search

None
See application file for complete search history.

(56) References Cited

U.S. PATENT DOCUMENTS

2003/0137239 A1* 7/2003 Matsuura ............ H01L 51/5016 313/503
2004/0217934 A1* 11/2004 Yang .................... G09G 3/3283 345/100
2009/0053557 A1* 2/2009 Spindler ............. H01L 51/0058 428/690
2016/0056386 A1* 2/2016 Lee ..................... H01L 51/0058 257/40
2018/0006235 A1* 1/2018 Yokoyama .......... H01L 51/0061
2018/0301629 A1 10/2018 Hatakeyama et al.
2019/0207112 A1 7/2019 Hatakeyama et al.

FOREIGN PATENT DOCUMENTS

| | | | | |
|---|---|---|---|---|
| CN | 101490207 | A | 7/2009 | |
| CN | 103864789 | A | 6/2014 | |
| CN | 107851724 | A | 3/2018 | |
| EP | 3 246 963 | A2 | 11/2017 | |
| JP | 2016-086147 | * | 5/2016 | ............ C09K 11/06 |
| KR | 10-2017-0130434 | A | 11/2017 | |
| KR | 10-2017-0130435 | A | 11/2017 | |
| KR | 10-2018-0037695 | A | 4/2018 | |
| KR | 10-2018-0122298 | A | 11/2018 | |
| WO | WO 2018/095397 | A1 | 5/2018 | |
| WO | WO 2018/203666 | A1 | 11/2018 | |

OTHER PUBLICATIONS

Korean Office Action dated Oct. 10, 2019 in corresponding Korean Patent Application No. 10-2019-0069314 (3 pages in English, 3 pages in Korean).
Korean Decision to Grant dated Dec. 24, 2019 in corresponding Korean Patent Application No. 10-2019-0069314 (2 pages in English, 2 pages in Korean).
Extended European Search Report dated Feb. 26, 2020 in corresponding European Patent Application No. 19212313.1 (7 pages in English).
Liang, Xiao, et al. "Peripheral amplification of multi-resonance induced thermally activated delayed fluorescence for highly efficient OLEDs", *Angewandte Chemie*, vol. 130, Issue 35, 2018 (pp. 11486-11490).
Japanese Office Action dated Aug. 25, 2020 in counterpart Japanese Patent Application No. 2019-217554 (4 pages in Japanese).
Chinese Office Action dated Sep. 18, 2020 in counterpart Chinese Patent Application No. 201911199295.9 (12 pages in English and 7 pages in Chinese).

* cited by examiner

*Primary Examiner* — Gregory D Clark
(74) *Attorney, Agent, or Firm* — NSIP Law

(57) ABSTRACT

Disclosed are polycyclic aromatic compounds that can be employed in various organic layers of organic electroluminescent devices. Also disclosed are organic electroluminescent devices including the polycyclic aromatic compounds. The organic electroluminescent devices are highly efficient and long lasting and have greatly improved luminous efficiency.

20 Claims, No Drawings

POLYCYCLIC AROMATIC COMPOUNDS AND ORGANIC ELECTROLUMINESCENT DEVICES USING THE SAME

CROSS-REFERENCE TO RELATED APPLICATIONS

This application claims the benefit under 35 USC § 119(a) of Korean Patent Application No. 10-2018-0151781 filed on Nov. 30, 2018 and Korean Patent Application No. 10-2019-0069314 filed on Jun. 12, 2019 in the Korean Intellectual Property Office, the entire disclosure of which is incorporated herein by reference for all purposes.

BACKGROUND OF THE INVENTION

1. Field of the Invention

The present invention relates to polycyclic aromatic compounds and highly efficient and long-lasting organic electroluminescent devices with greatly improved luminous efficiency using the same.

2. Description of the Related Art

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized structures of organic layers for organic electroluminescent devices and stable and efficient materials for organic layers of organic electroluminescent devices.

Thus, there is a continued need to develop structures of organic electroluminescent devices optimized to improve their luminescent properties and new materials capable of supporting the optimized structures of organic electroluminescent devices.

SUMMARY OF THE INVENTION

Therefore, the present invention intends to provide organic electroluminescent compounds that are employed in organic layers of organic electroluminescent devices, achieving high efficiency and long lifetime of the devices. The present invention also intends to provide organic electroluminescent devices including the organic electroluminescent compounds.

One aspect of the present invention provides an organic electroluminescent compound represented by Formula A-1 or A-2:

(A-1)

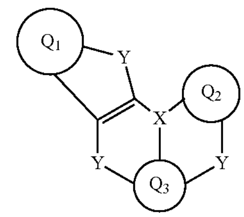

(A-2)

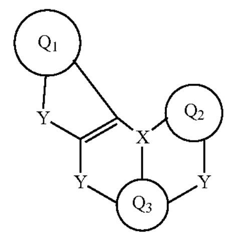

A description will be given concerning more detailed structures of the compounds of Formulae A-1 and A-2, the definitions of substituents $Q_1$, $Q_2$, $Q_3$, X, and Y in the compounds of Formulae A-1 and A-2, and specific examples of polycyclic aromatic compounds that can be represented by Formulae A-1 and A-2.

A further aspect of the present invention provides an organic electroluminescent device including a first electrode, a second electrode opposite to the first electrode, and one or more organic layers interposed between the first and second electrodes wherein at least one of the organic layers includes the polycyclic aromatic compound represented by Formula A-1 or A-2 and optionally another polycyclic aromatic compound represented by Formula A-1 or A-2.

The polycyclic aromatic compound of the present invention is employed in at least one of the organic layers of the organic electroluminescent device, achieving high efficiency and long lifetime of the device.

DETAILED DESCRIPTION OF THE INVENTION

The present invention will now be described in more detail.

The present invention is directed to a polycyclic aromatic compound represented by Formula A-1 or A-2:

(A-1)

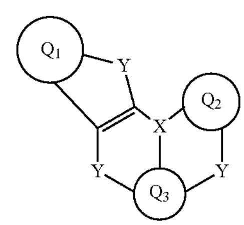

wherein $Q_1$ to $Q_3$ are identical to or different from each other and are each independently a substituted or unsubstituted $C_6$-$C_{50}$ aromatic hydrocarbon ring or a substituted or unsubstituted $C_2$-$C_{50}$ heteroaromatic ring, the linkers Y are identical to or different from each other and are each independently selected from N—$R_1$, $CR_2R_3$, O, S, Se, and $SiR_4R_5$, X is selected from B, P, and P═O, and $R_1$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that each of $R_1$ to $R_5$ is optionally bonded to $Q_1$, $Q_2$ or $Q_3$ to form an alicyclic or aromatic monocyclic or polycyclic ring, $R_2$ and $R_3$ are optionally linked to each other to form an alicyclic or aromatic monocyclic or polycyclic ring, and $R_3$ and $R_4$ are optionally linked to each other to form an alicyclic or aromatic monocyclic or polycyclic ring, (A-2)

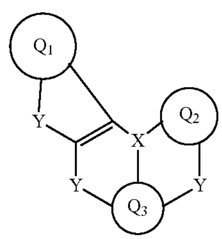

wherein $Q_1$, $Q_2$, $Q_3$, X, and Y are as defined in Formula A-1.

According to a preferred embodiment of the present invention, X in Formula A-1 or A-2 is preferably B. The presence of boron (B) in the structure of the polycyclic aromatic compound ensures high efficiency and long lifetime of an organic electroluminescent device.

The polycyclic aromatic compound of Formula A-1 or A-2 can be employed in an organic electroluminescent device, achieving high efficiency and long lifetime of the device.

According to one embodiment of the present invention, the polycyclic aromatic compound of Formula A-1 or A-2 may have a polycyclic aromatic skeletal structure represented by Formula A-3, A-4, A-5 or A-6:

(A-3)

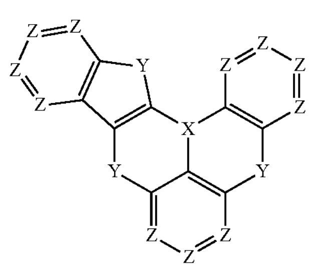

wherein each Z is independently CR or N, the substituents R are identical to or different from each other and are independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the substituents R are optionally bonded to each other or are optionally linked to other adjacent substituents to form alicyclic or aromatic monocyclic or polycyclic rings whose carbon atoms are optionally substituted with one or more heteroatoms selected from N, S, and O atoms, and X and Y are as defined in Formulae A-1 and A-2, (A-4)

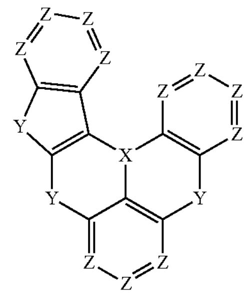

wherein X, Y, and Z are as defined in Formula A-3, (A-5)

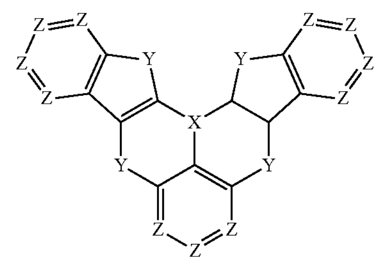

wherein X, Y, and Z are as defined in Formula A-3, (A-6)

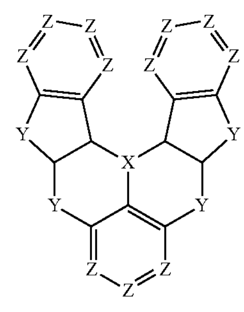

wherein X, Y, and Z are as defined in Formula A-3.

The use of the skeletal structure meets desired requirements of various organic layers of an organic electroluminescent device, achieving high efficiency and long lifetime of the device.

As used herein, the term "substituted" in the definition of $Q_1$ to $Q_3$, R, and $R_1$ to $R_5$ indicates substitution with one or more substituents selected from the group consisting of deuterium, cyano, halogen, hydroxyl, nitro, $C_1$-$C_{24}$ alkyl, $C_3$-$C_{24}$ cycloalkyl, $C_1$-$C_{24}$ haloalkyl, $C_1$-$C_{24}$ alkenyl, $C_1$-$C_{24}$ alkynyl, $C_1$-$C_{24}$ heteroalkyl, $C_1$-$C_{24}$ heterocycloalkyl, $C_6$-$C_{24}$ aryl, $C_6$-$C_{24}$ arylalkyl, $C_2$-$C_{24}$ heteroaryl, $C_2$-$C_{24}$ heteroarylalkyl, $C_1$-$C_{24}$ alkoxy, $C_1$-$C_{24}$ alkylamino, $C_1$-$C_{24}$ arylamino, $C_1$-$C_{24}$ heteroarylamino, $C_1$-$C_{24}$ alkylsilyl, $C_1$-$C_{24}$ arylsilyl, and $C_1$-$C_{24}$ aryloxy, or a combination thereof. The term "unsubstituted" in the same definition indicates having no substituent.

In the "substituted or unsubstituted $C_1$-$C_{10}$ alkyl", "substituted or unsubstituted $C_6$-$C_{30}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted alicyclic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

In the present invention, the alkyl groups may be straight or branched. The number of carbon atoms in the alkyl groups is not particularly limited but is preferably from 1 to 20. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups. The other cyclic groups may be heterocycloalkyl groups and other examples thereof include cycloalkyl, aryl, and heteroaryl groups.

The aryl groups may be monocyclic or polycyclic ones. Examples of the monocyclic aryl groups include, but are not limited to, phenyl, biphenyl, terphenyl, and terphenyl groups. Examples of the polycyclic aryl groups include naphthyl, anthracenyl, phenanthrenyl, pyrenyl, perylenyl, tetracenyl, chrysenyl, fluorenyl, acenaphathcenyl, triphenylene, and fluoranthrene groups but the scope of the present invention is not limited thereto.

The heteroaryl groups refer to heterocyclic groups interrupted by one or more heteroatoms. Examples of the heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The alkoxy group may be specifically a methoxy, ethoxy, propoxy, isobutyloxy, sec-butyloxy, pentyloxy, iso-amyloxy or hexyloxy group, but is not limited thereto.

The silyl group is intended to include alkyl-substituted silyl groups and aryl-substituted silyl groups. Specific examples of such silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, —$NH_2$, alkylamine groups, and arylamine groups. The arylamine groups are aryl-substituted amine groups and the alkylamine groups are alkyl-substituted amine groups. Examples of the arylamine groups include substituted or unsubstituted monoarylamine groups, substituted or unsubstituted diarylamine groups, and substituted or unsubstituted triarylamine groups. The aryl groups in the arylamine groups may be monocyclic or polycyclic ones. The arylamine groups may include two or more aryl groups. In this case, the aryl groups may be monocyclic aryl groups or polycyclic aryl groups. Alternatively, the aryl groups may consist of a monocyclic aryl group and a polycyclic aryl group. The aryl groups in the arylamine groups may be selected from those exemplified above.

The aryl groups in the aryloxy group and the arylthioxy group are the same as those described above. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine.

More specifically, the polycyclic aromatic compound represented by Formula A-1 or A-2 may be selected from the following compounds:
1
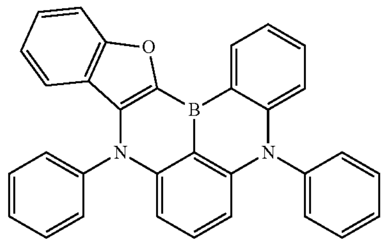
2
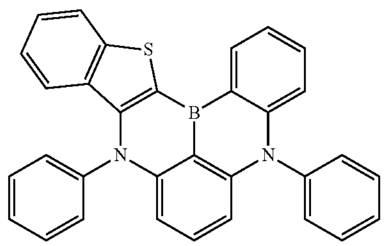
3
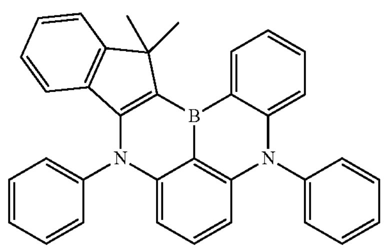
4
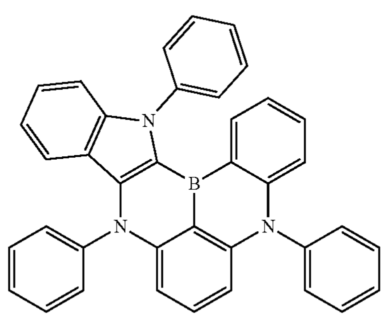
5
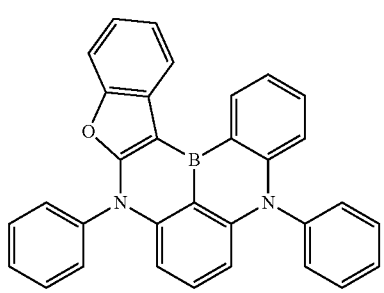
-continued
6
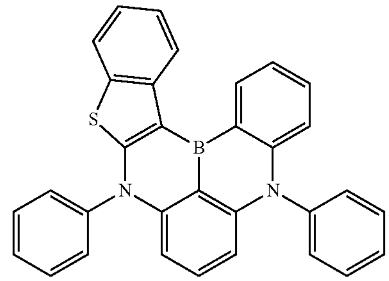
7
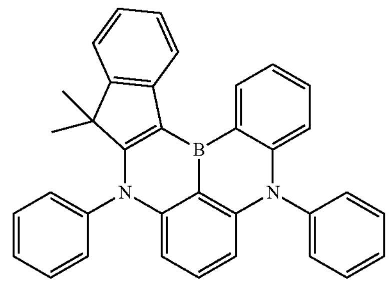
8
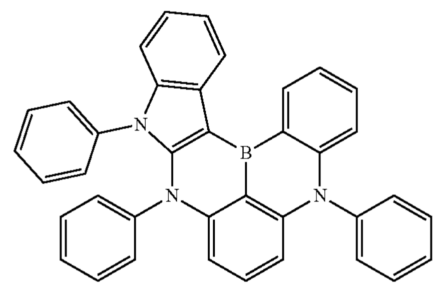
9
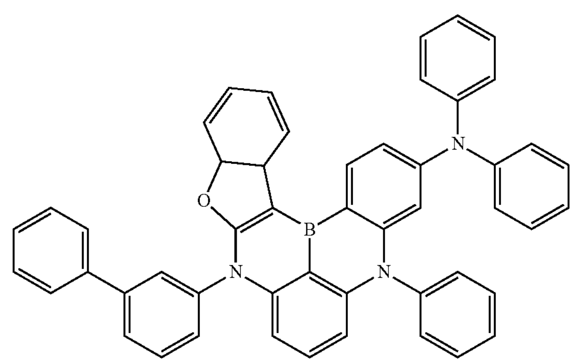
10
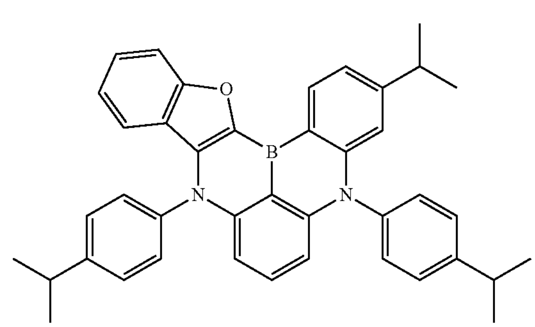

-continued
11
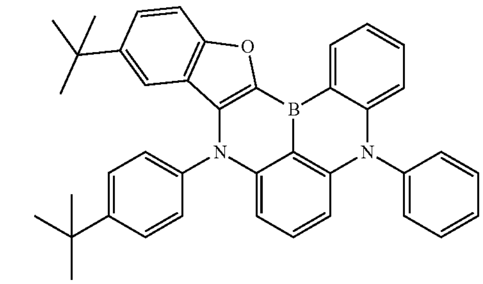
12
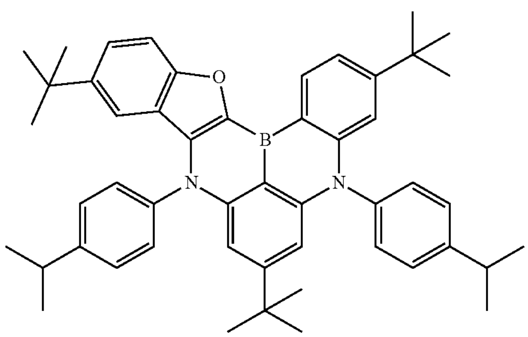
13
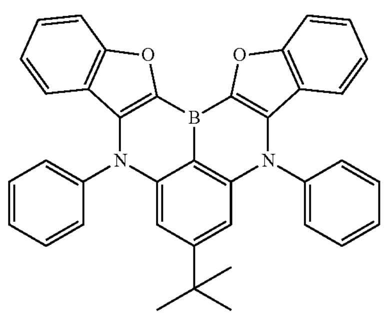
14
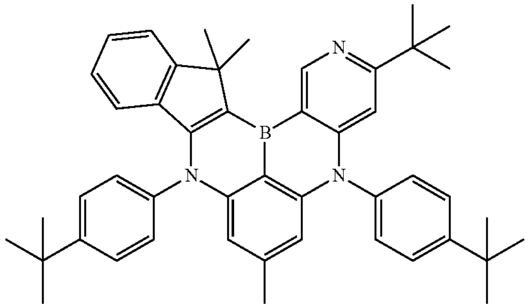
-continued
15
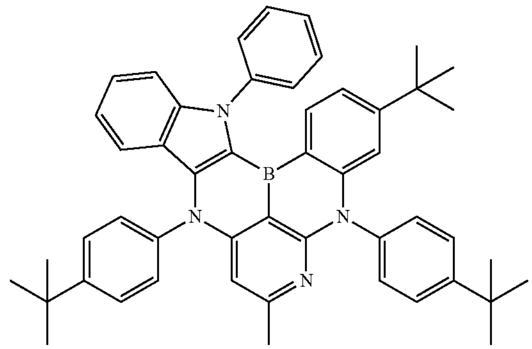
16
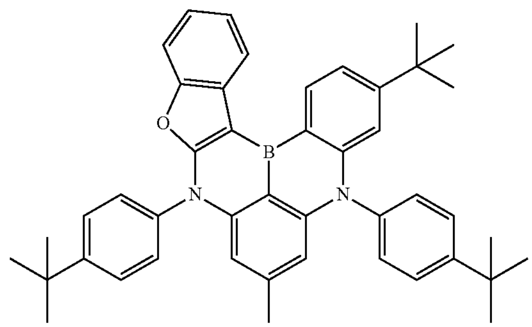
17
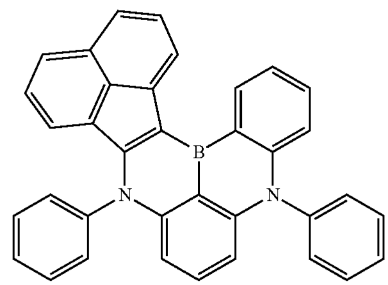
18
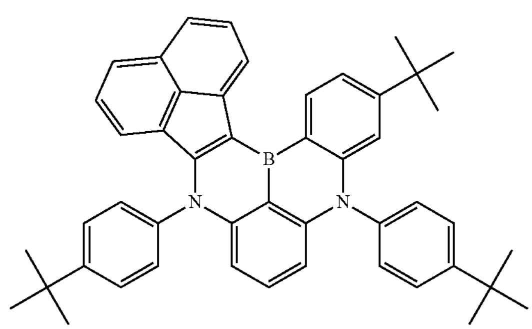

-continued
19
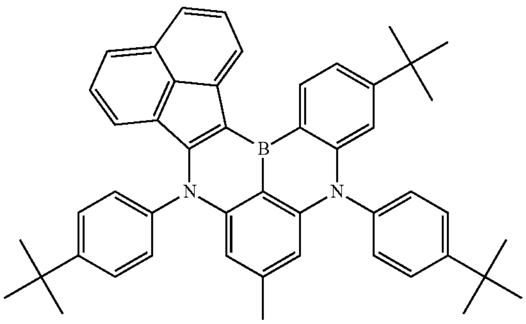
20
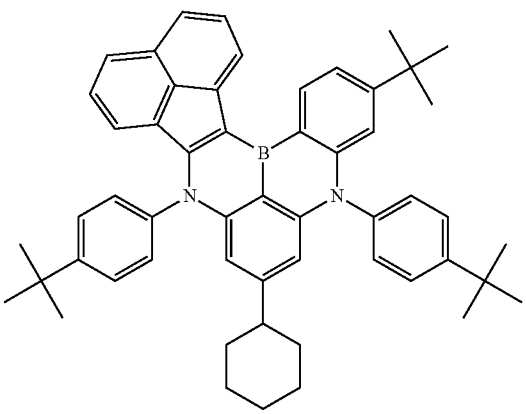
21
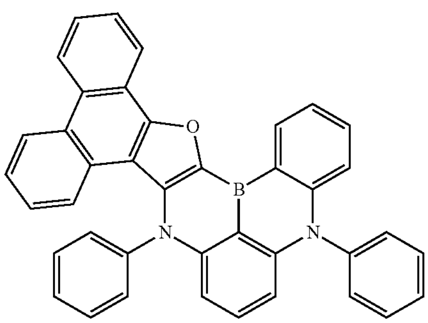
22
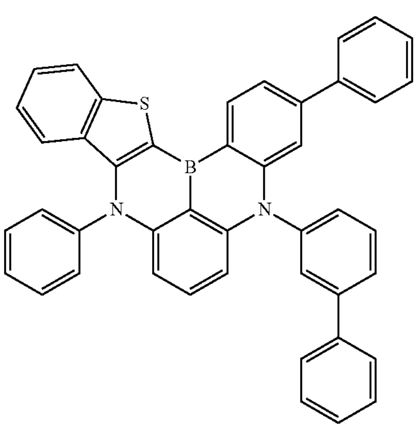
-continued
23
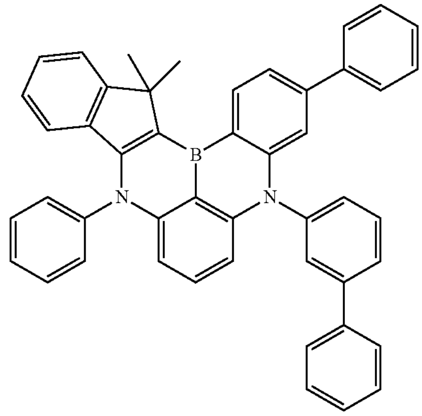
24
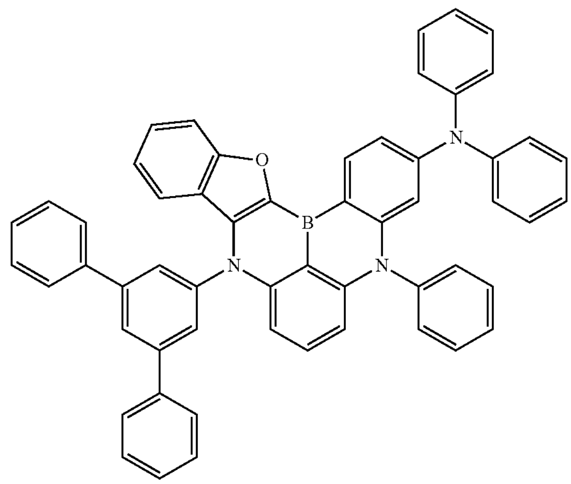
25
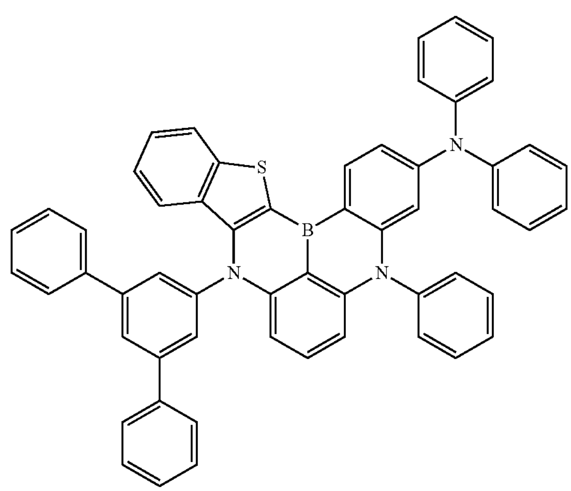

-continued
26
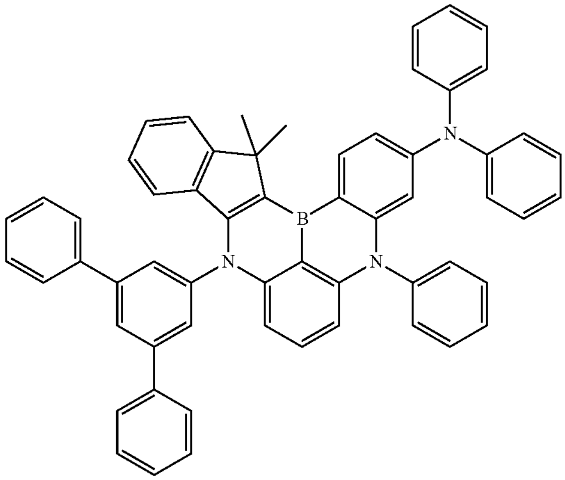
27
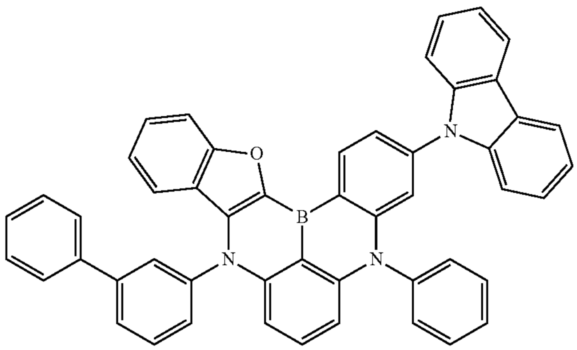
28
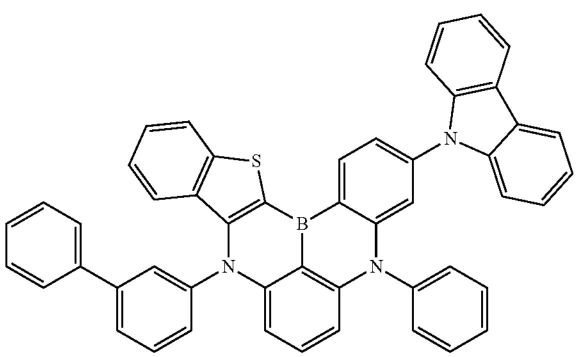
29
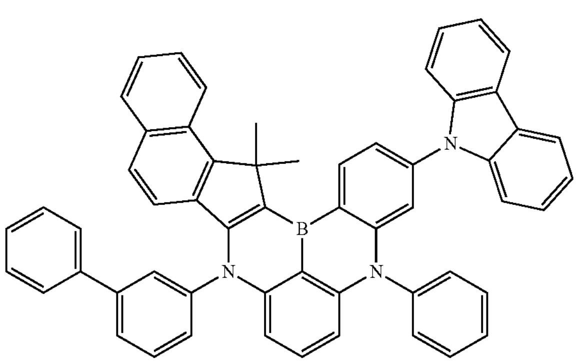
-continued
30
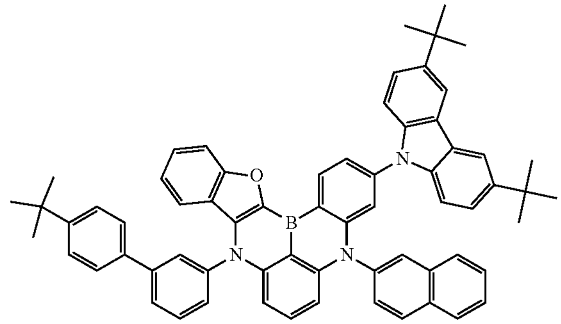
31
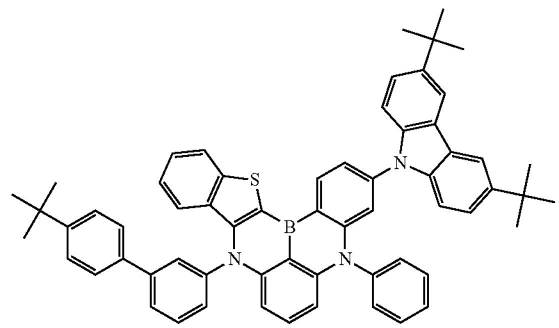
32
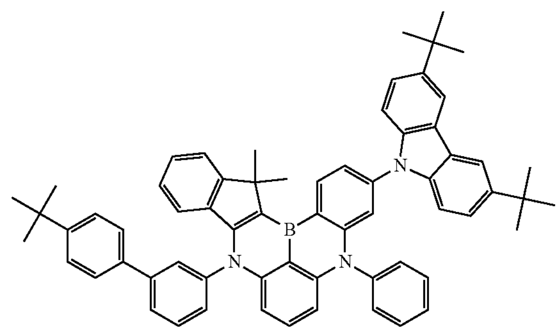
33
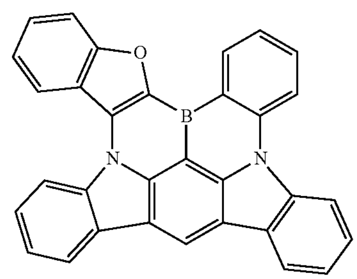
34
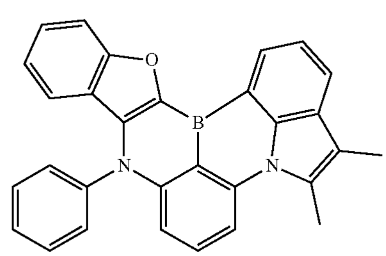

-continued
35
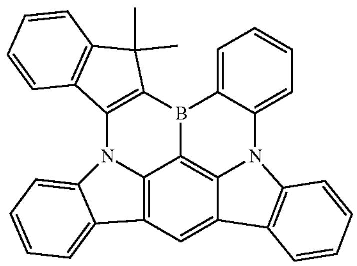
36
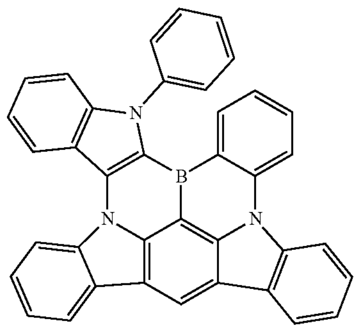
37
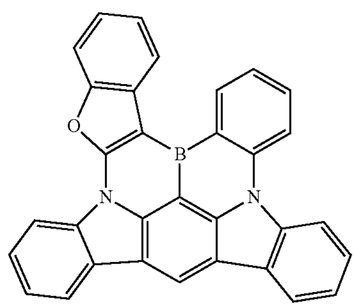
38
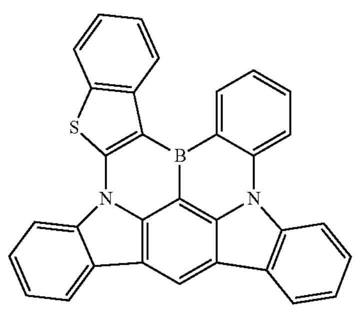
39
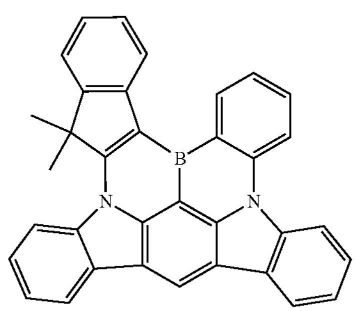
-continued
40
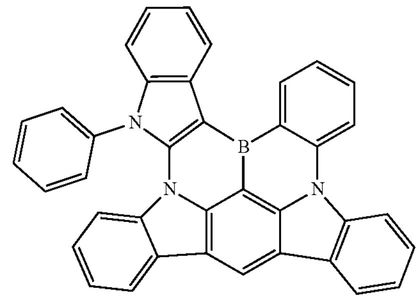
41
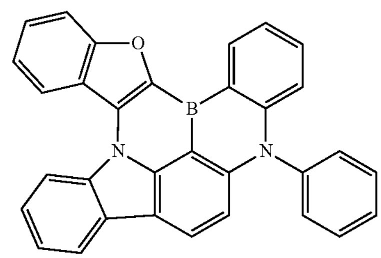
42
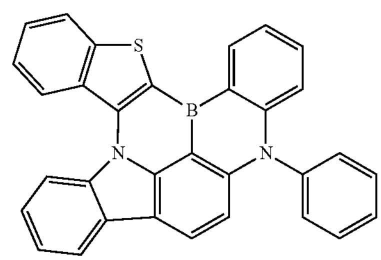
43
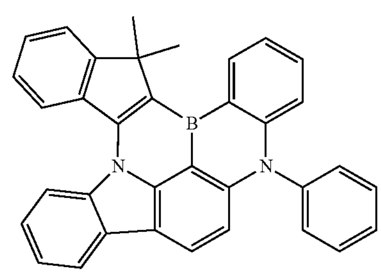
44
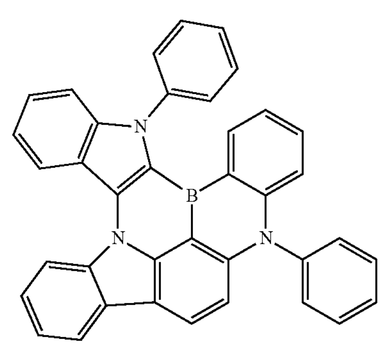

-continued
45
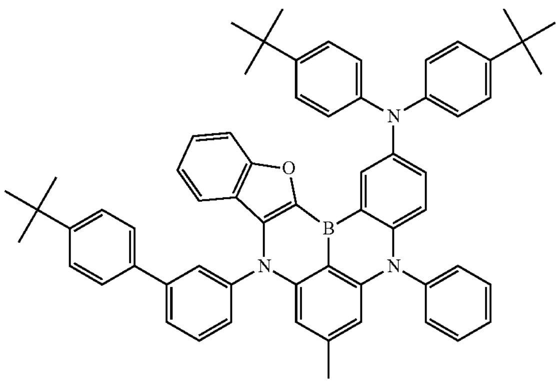
46
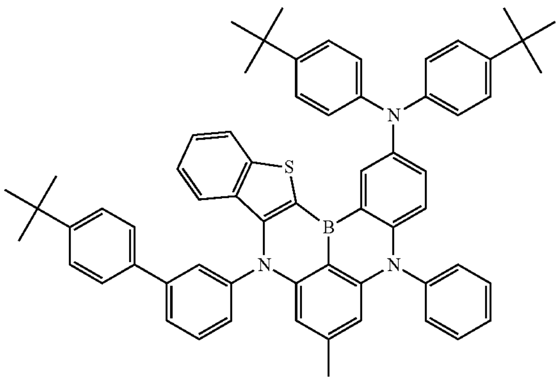
47
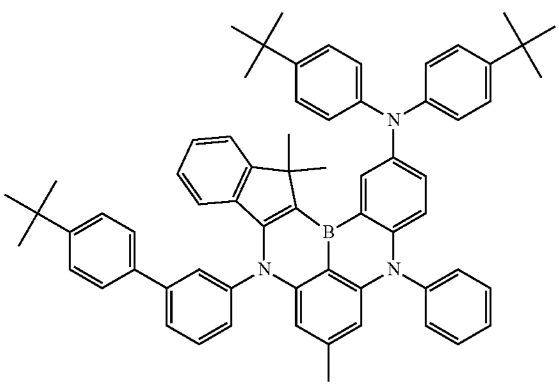
48
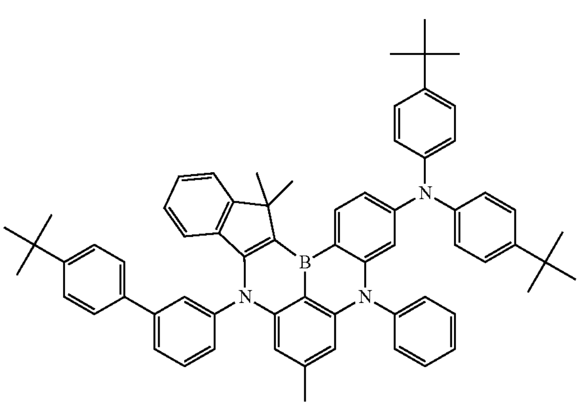
-continued
49
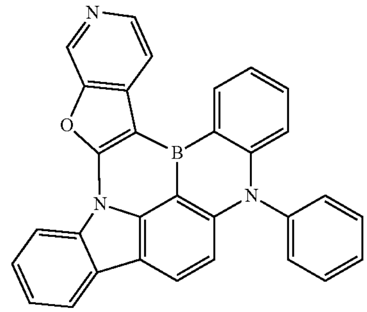
50
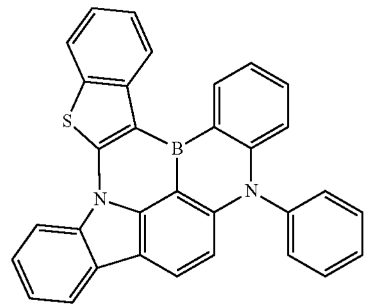
51
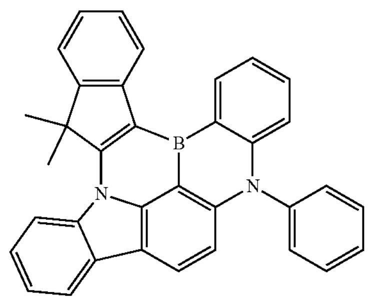
52
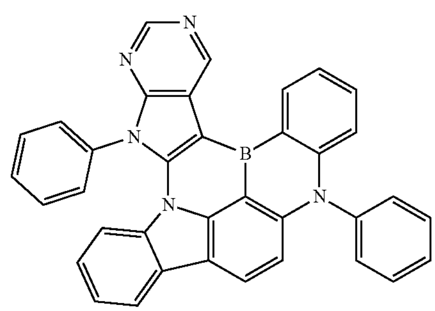
53
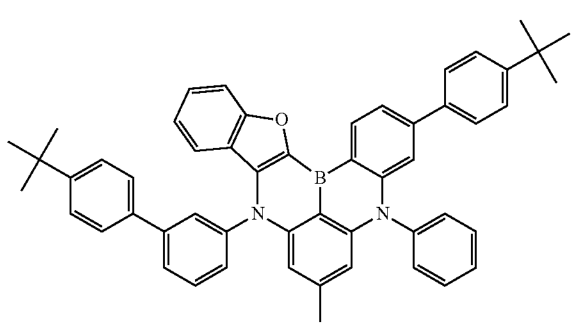

-continued
54
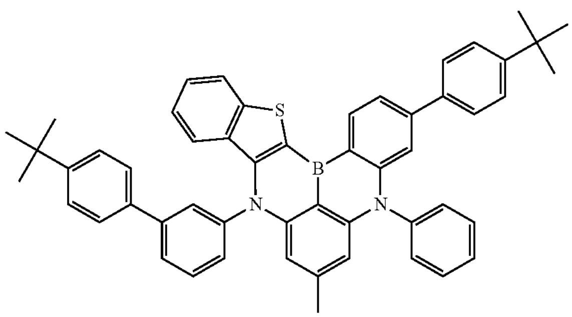
55
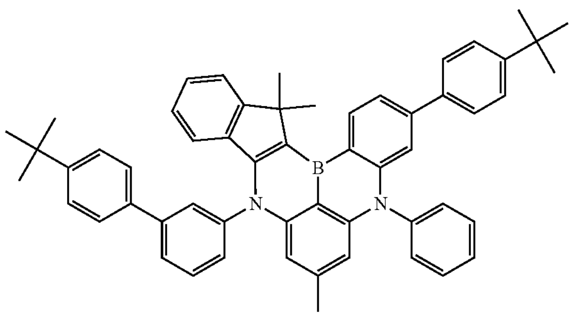
56
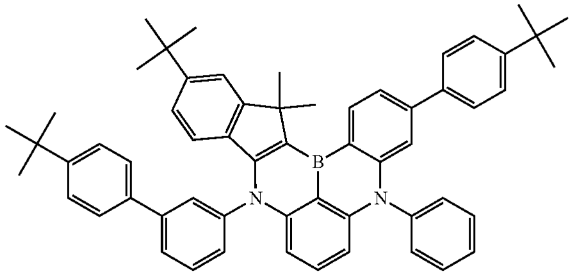
57
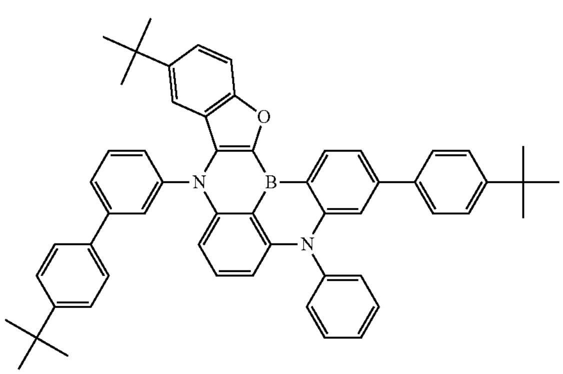
-continued
58
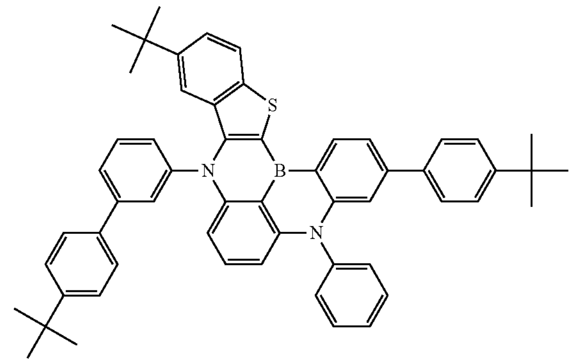
59
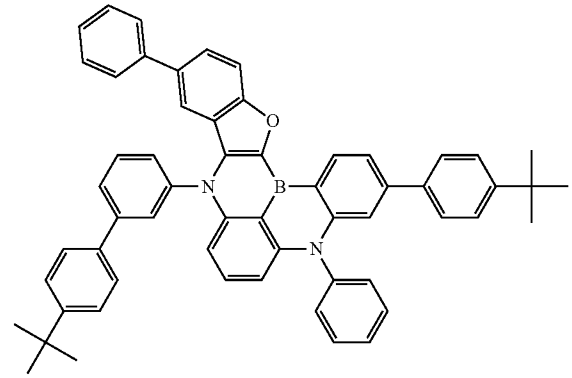
60
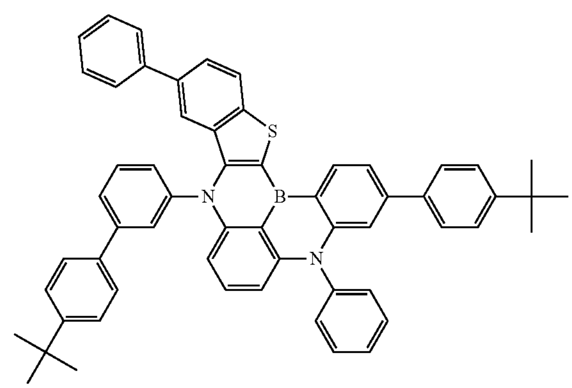
61
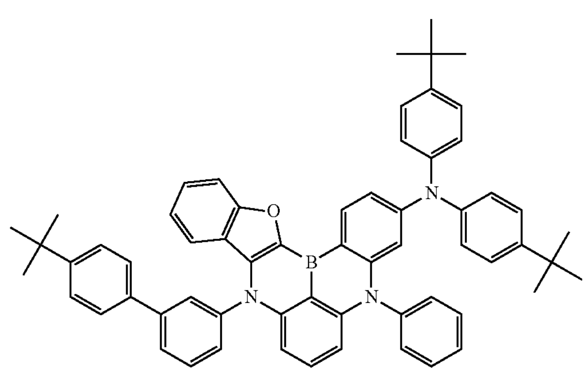

-continued
62
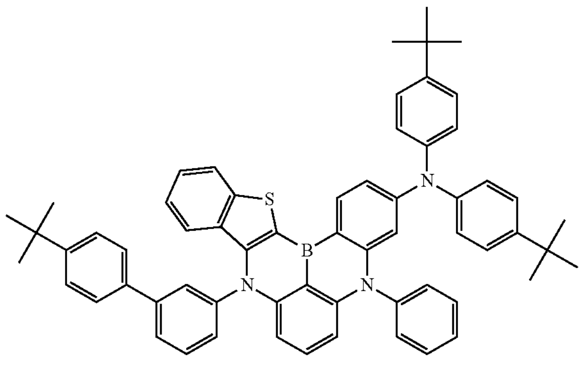
63
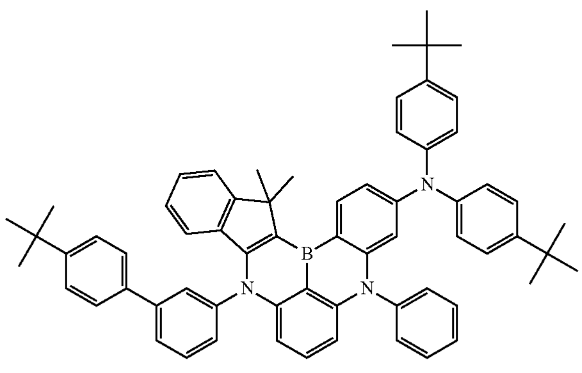
64
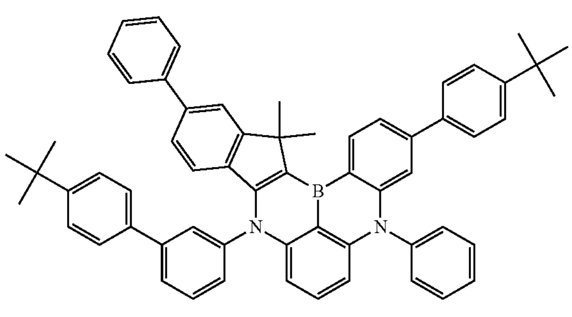
65
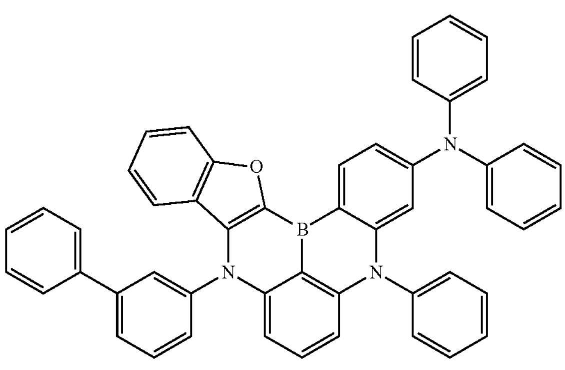
-continued
66
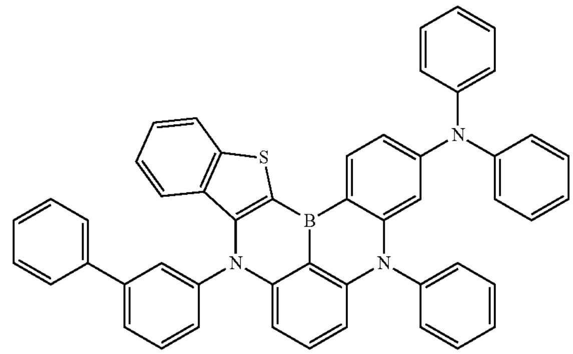
67
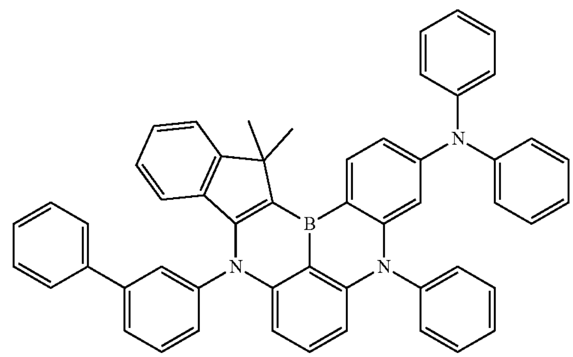
68
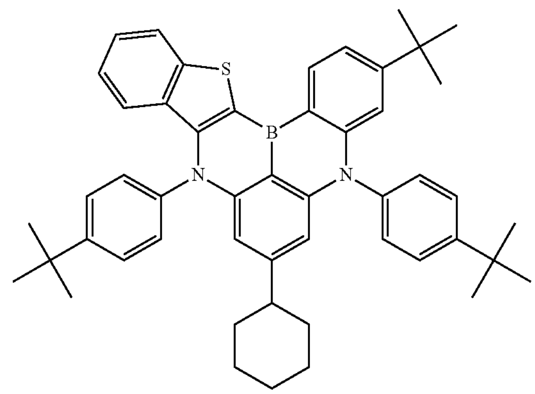
69
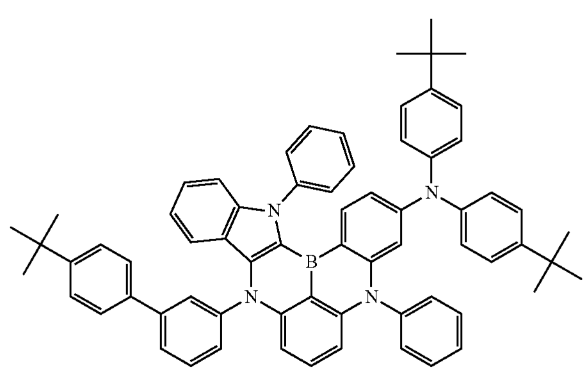

-continued
70
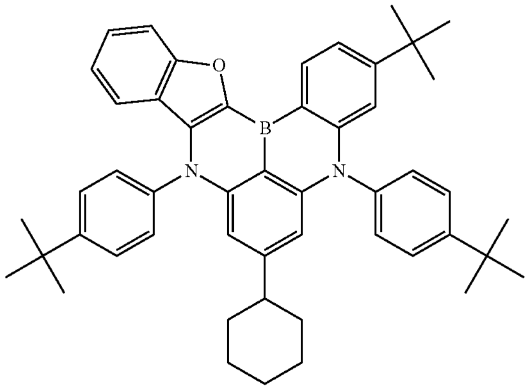
71
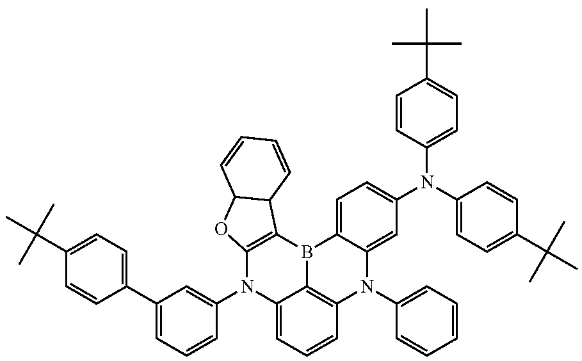
72
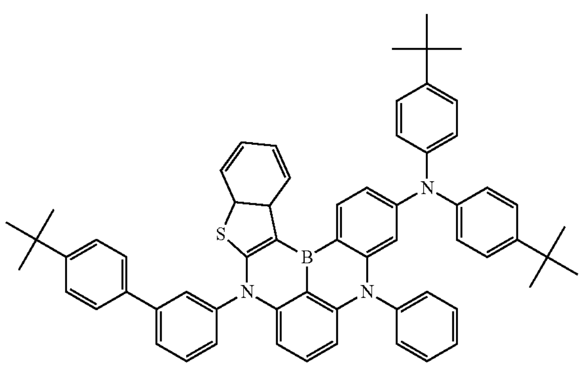
73
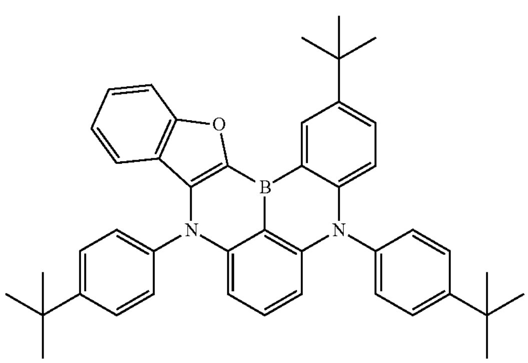
-continued
74
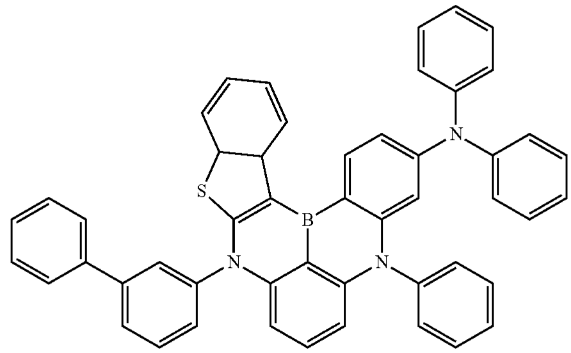
75
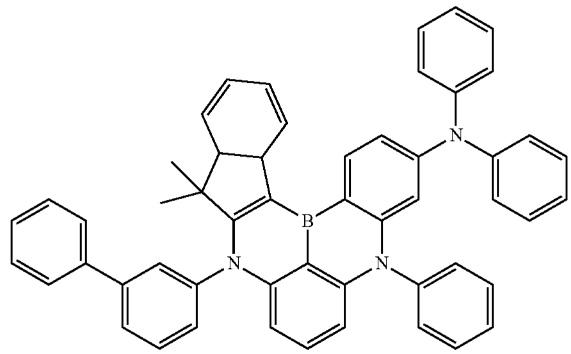
76
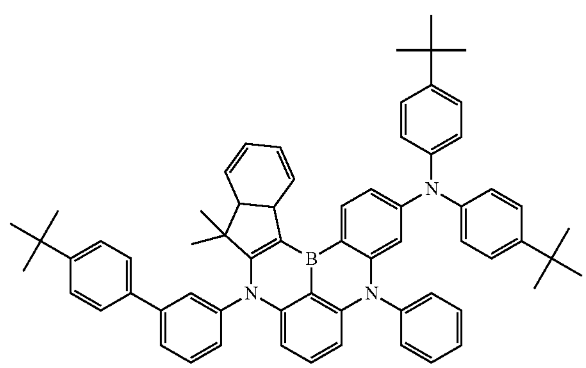
77
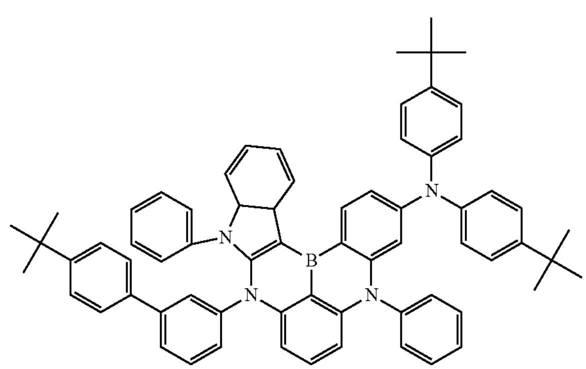

-continued
78
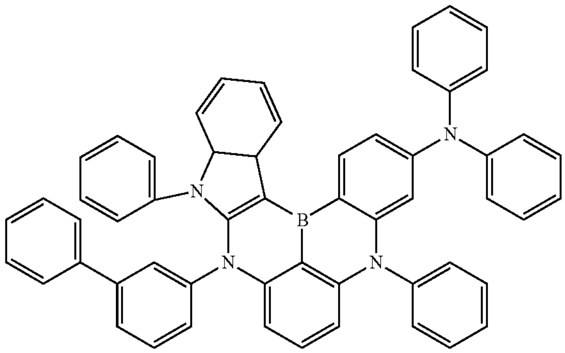
79
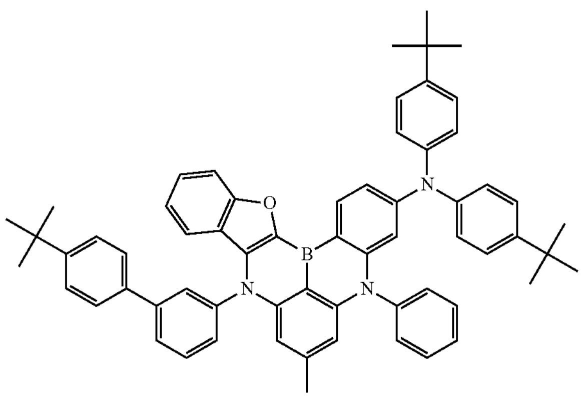
80
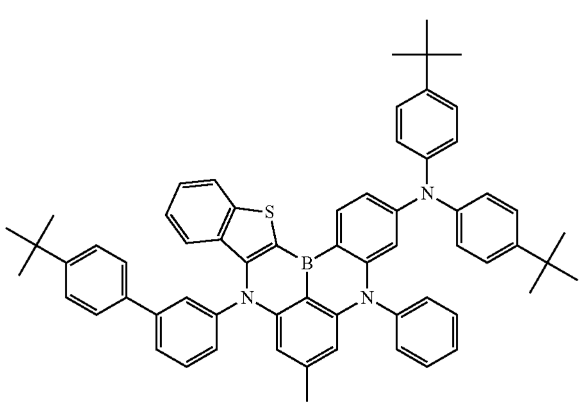
-continued
81
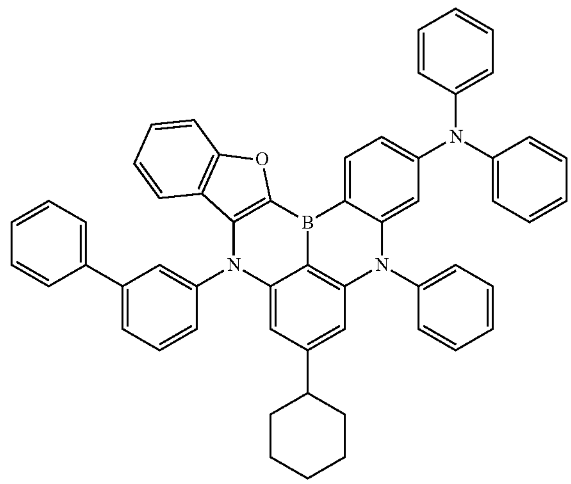
82
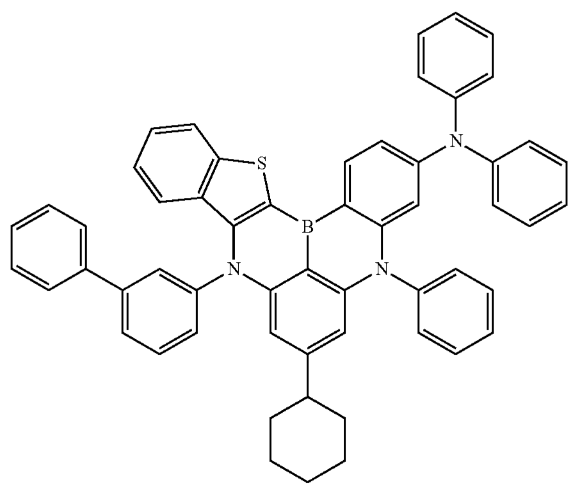
83
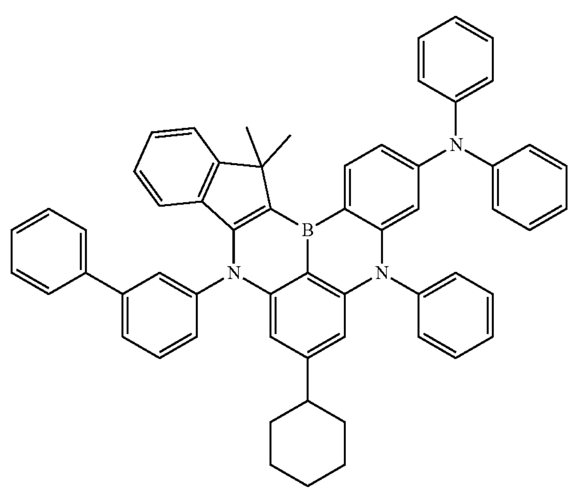

-continued
84
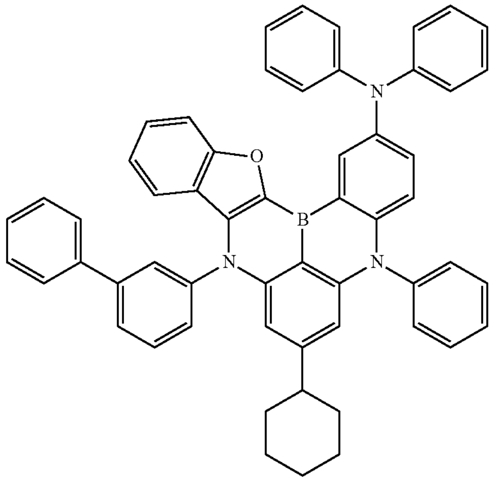
85
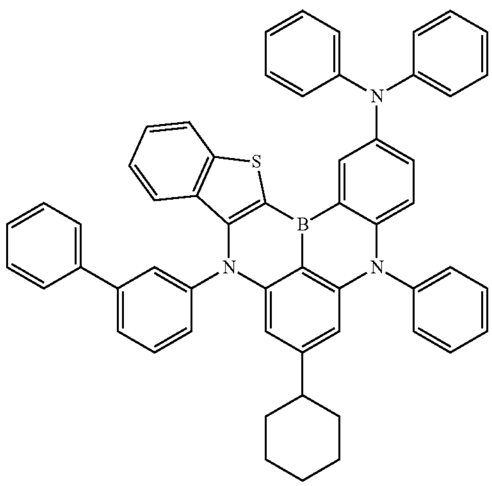
86
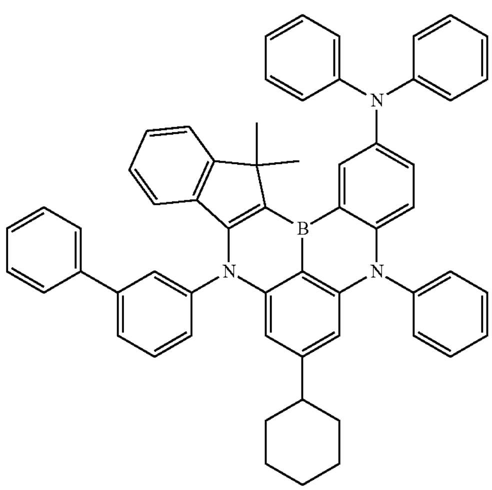
-continued
87
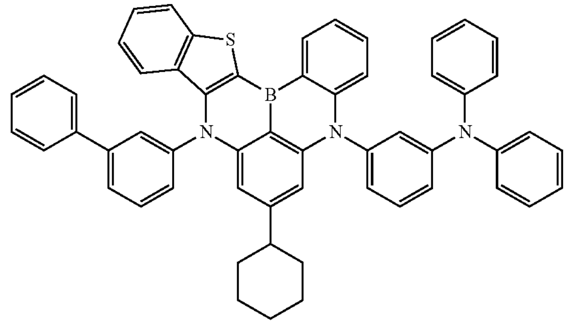
88
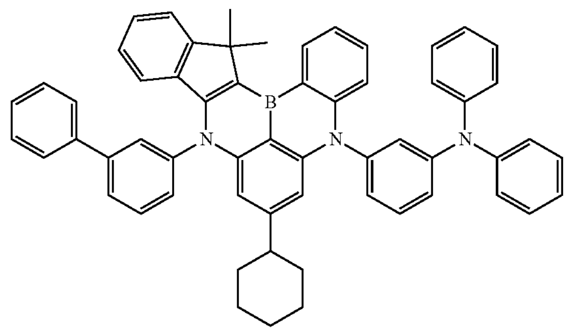
89
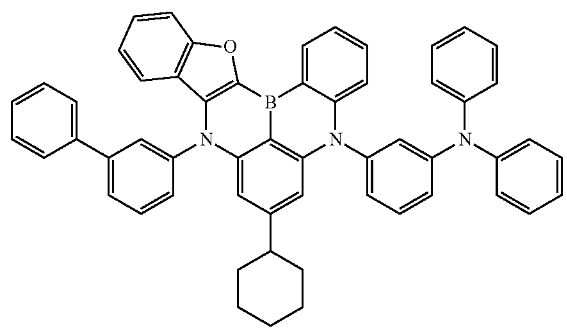
90
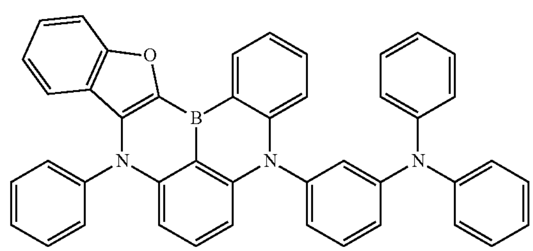
91
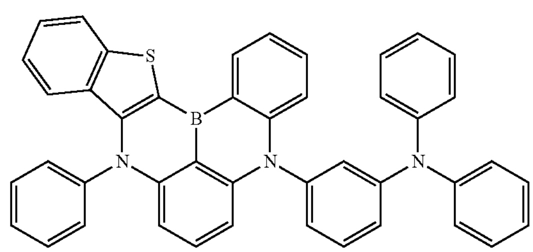

-continued
92
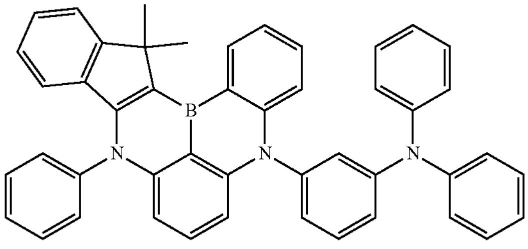
93
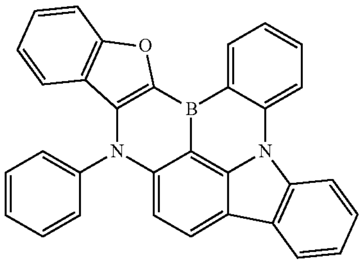
94
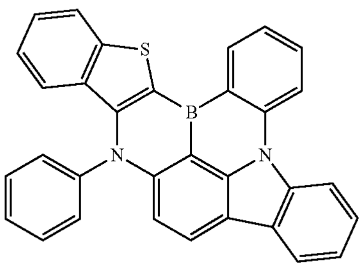
95
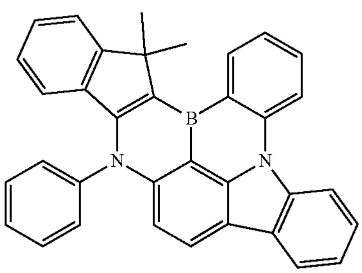
96
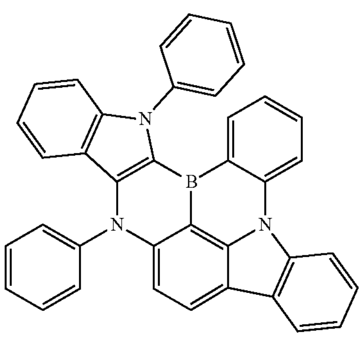
-continued
97
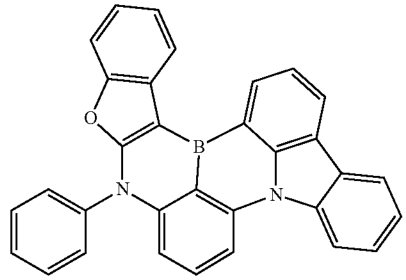
98
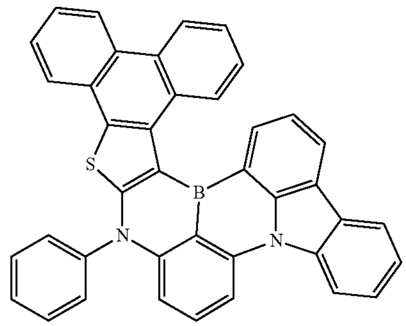
99
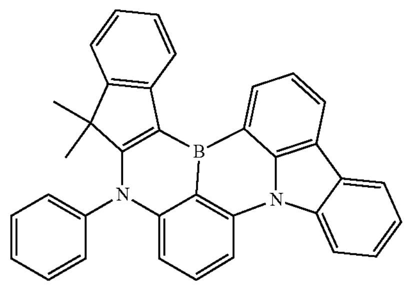
100
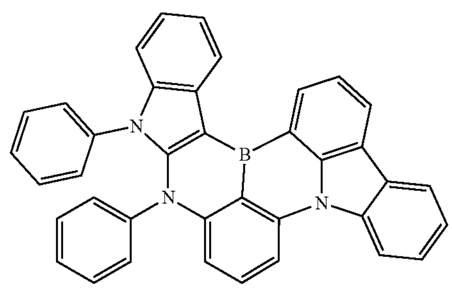
101
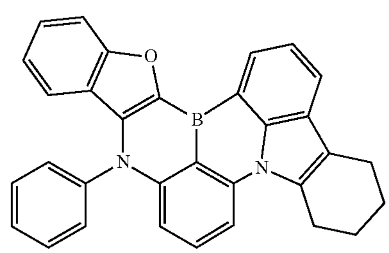

102
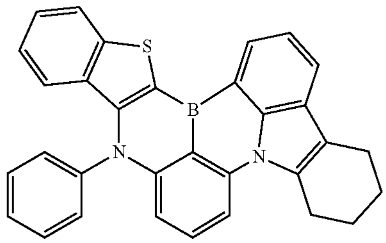
103
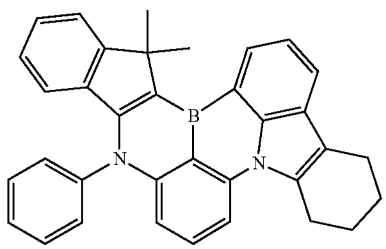
104
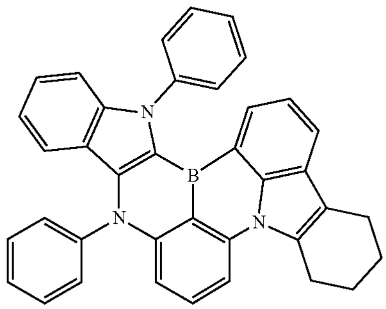
105
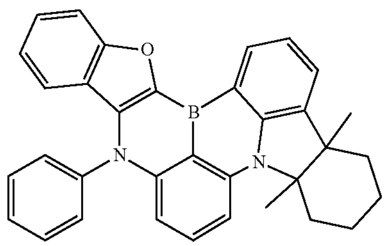
106
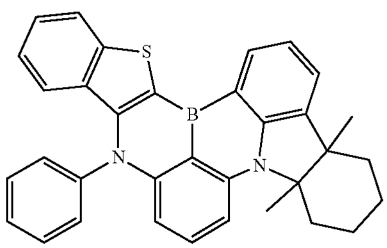
107
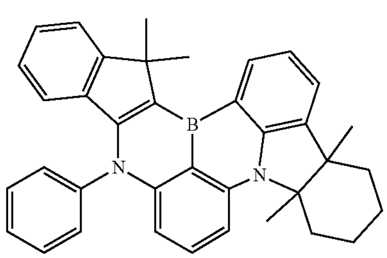
108
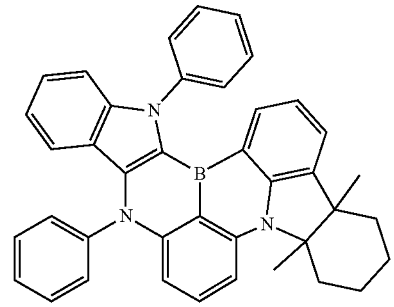
109
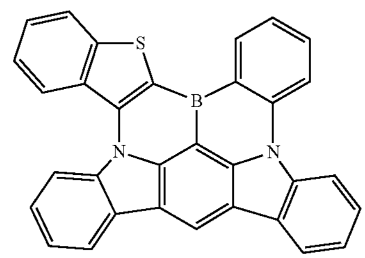
110
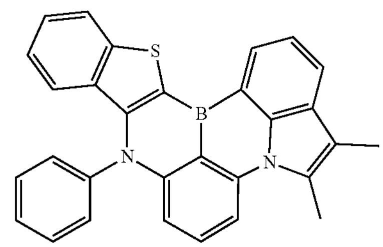
111
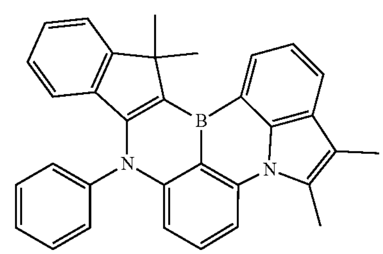
112
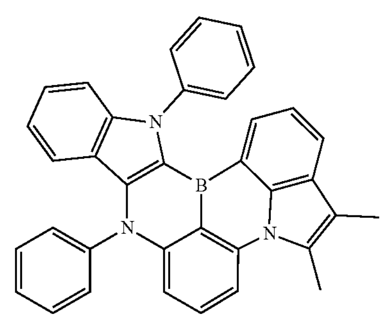

-continued
113
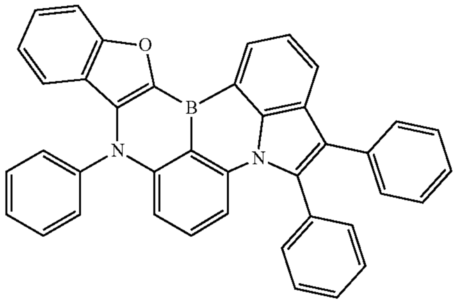
114
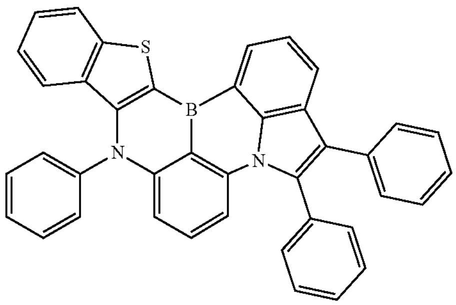
115
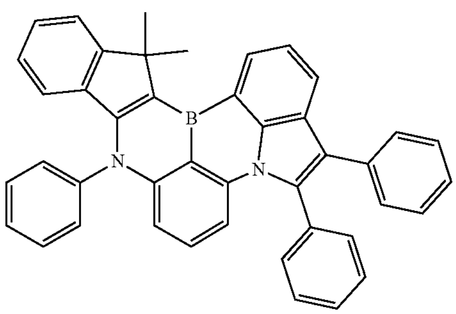
116
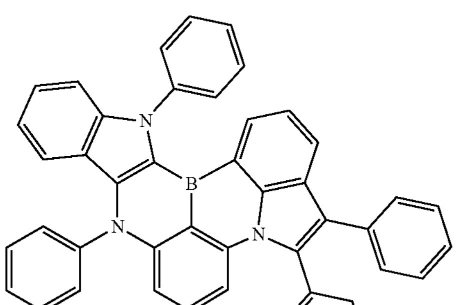
117
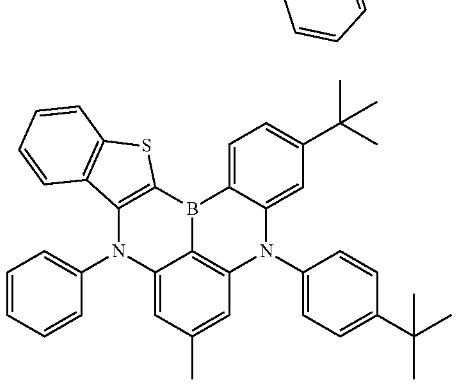
-continued
118
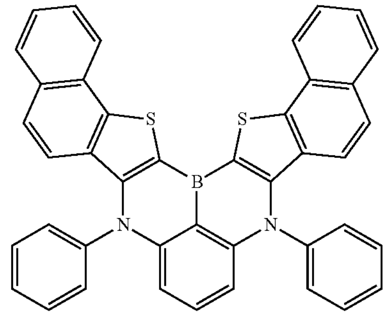
119
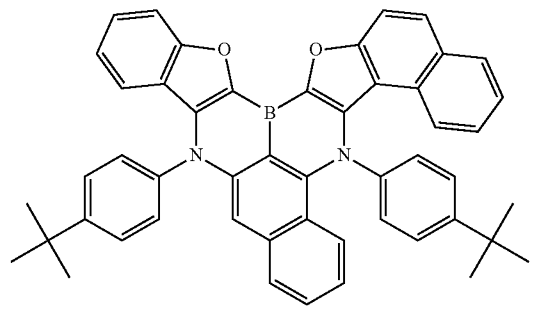
120
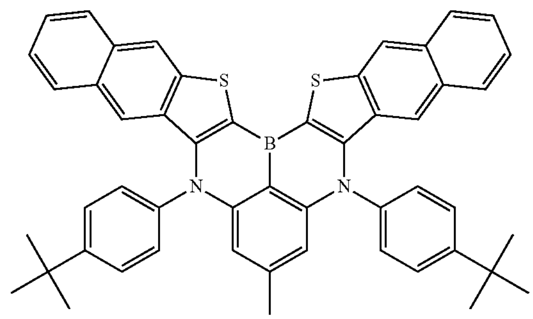
121
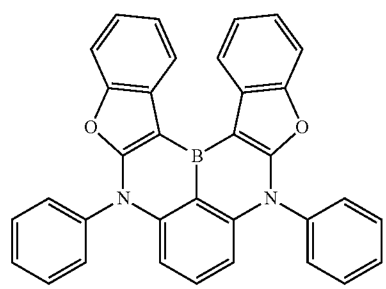
122
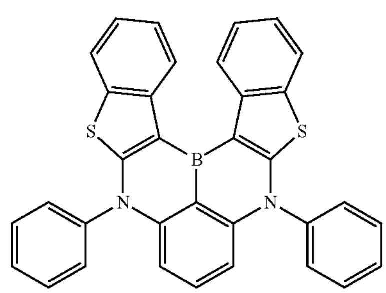

123
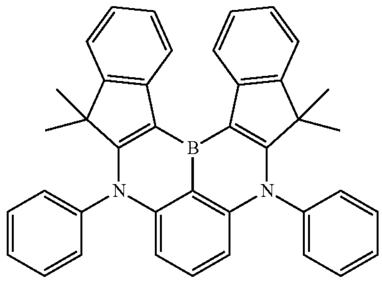
124
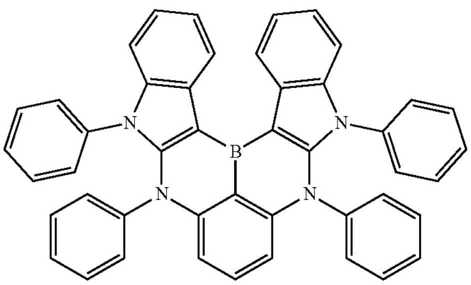
125
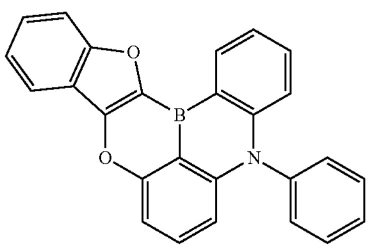
126
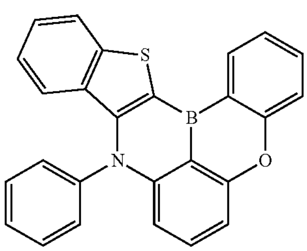
127
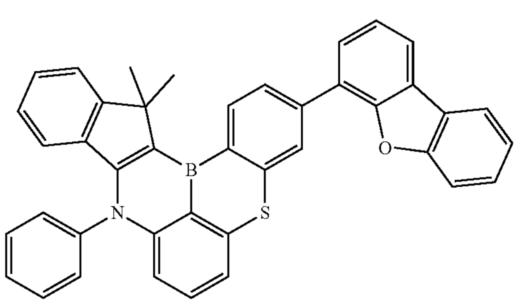
128
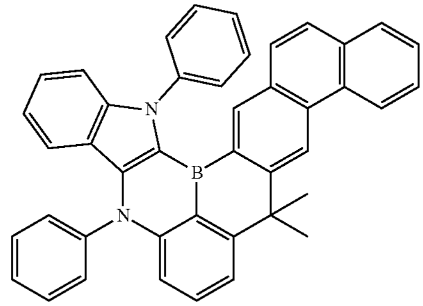
129
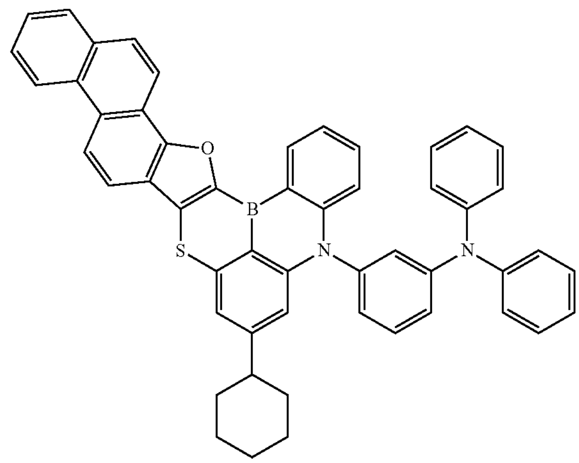
130
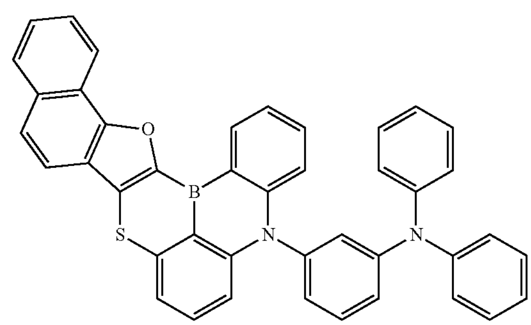
131
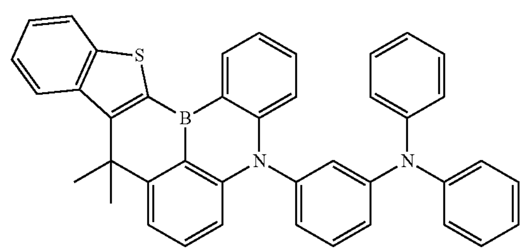

-continued
132
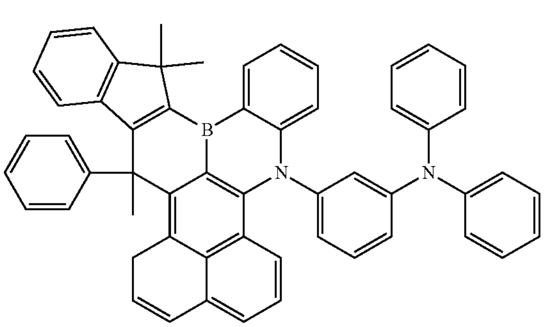
133
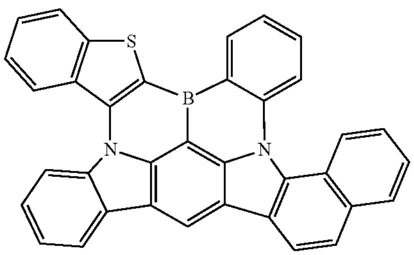
134
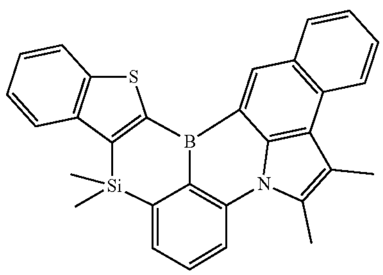
135
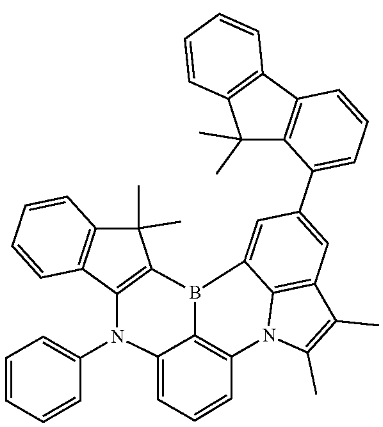
136
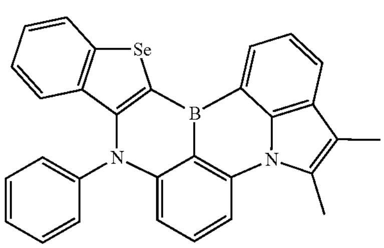
-continued
137
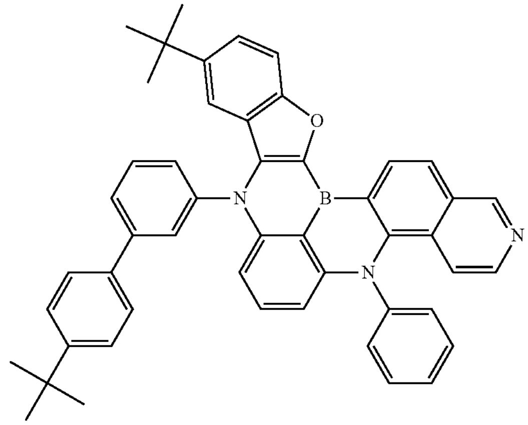
138
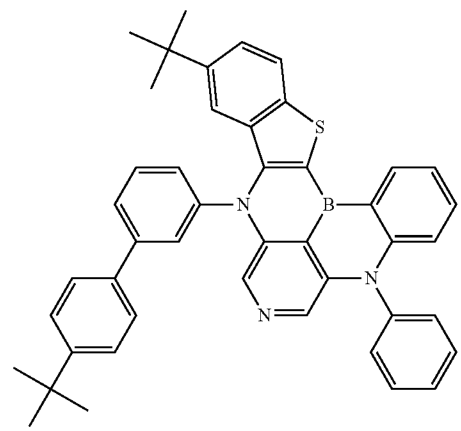
139
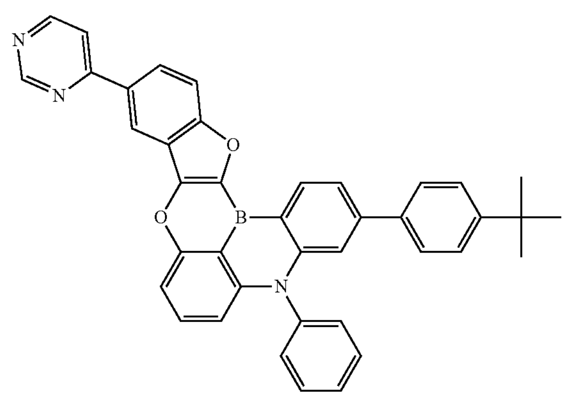

-continued
140
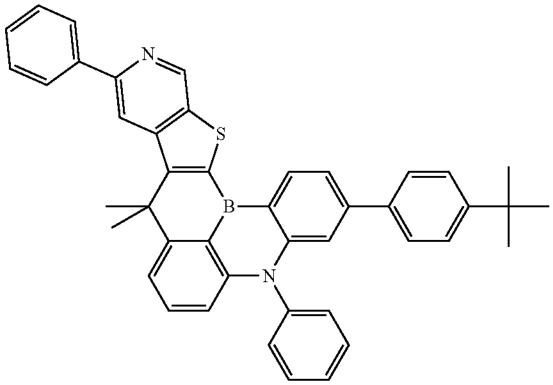
141
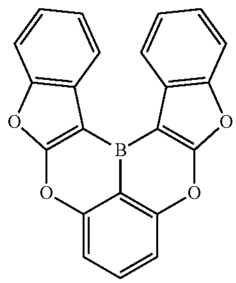
142
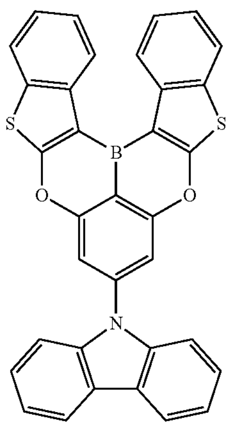
143
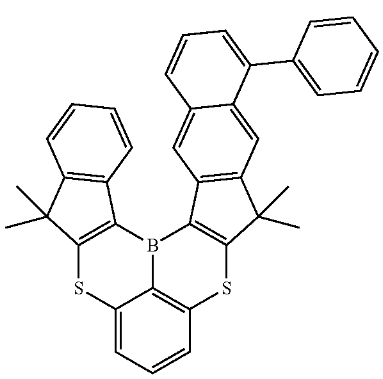
-continued
144
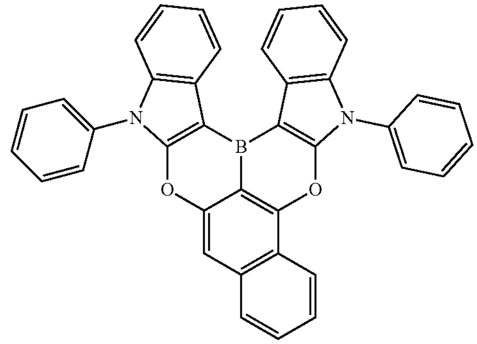
145
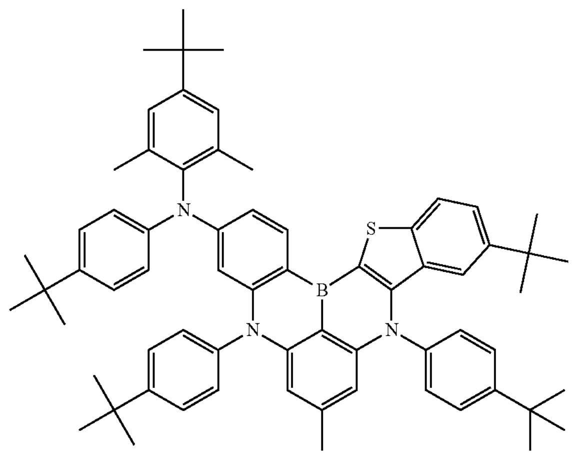
146
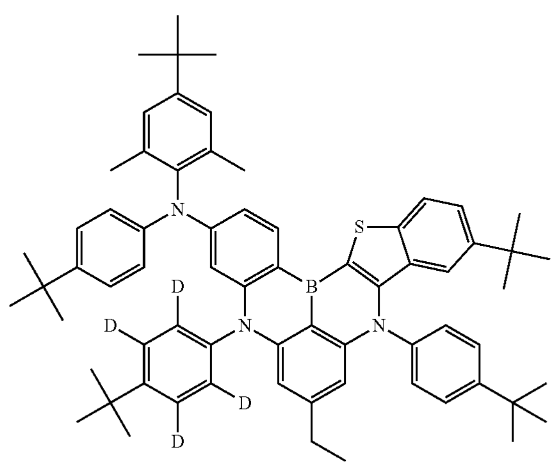

-continued
147
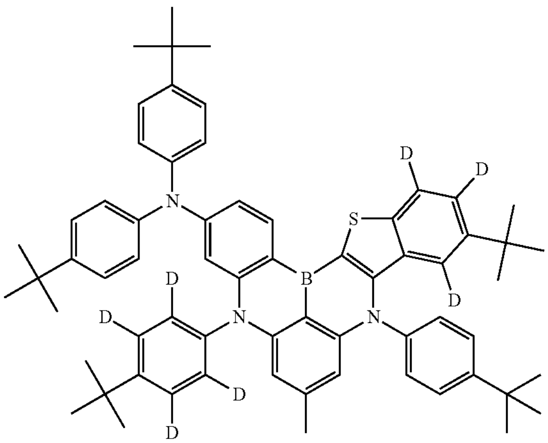
148
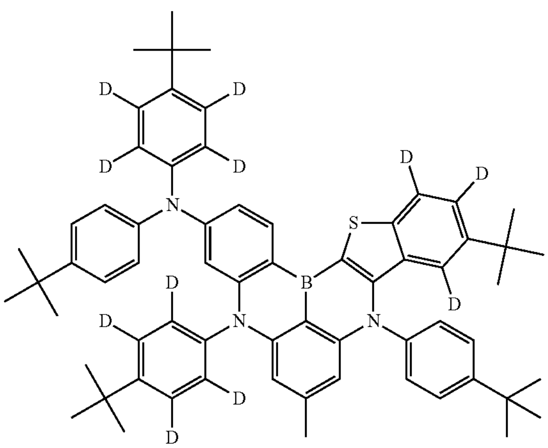
149
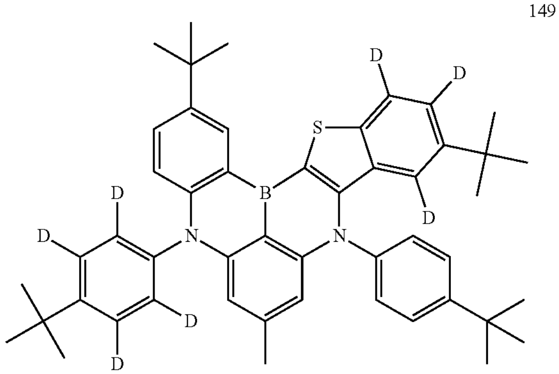
150
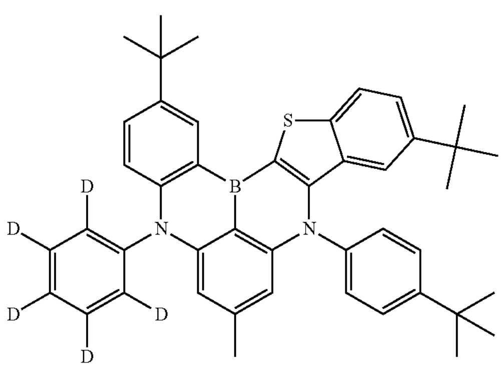
-continued
151
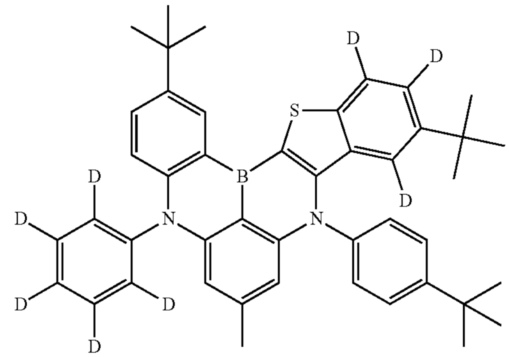
152
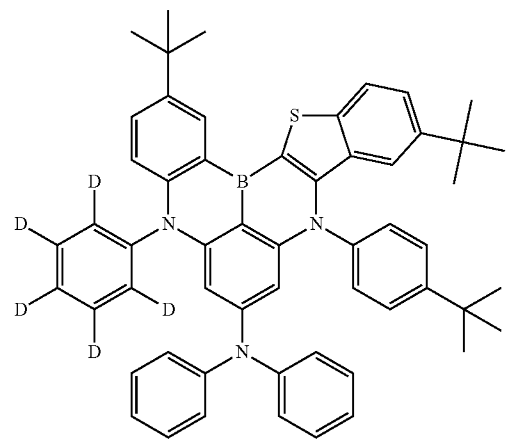
153
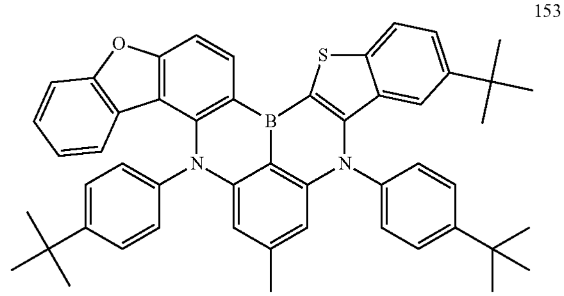
154
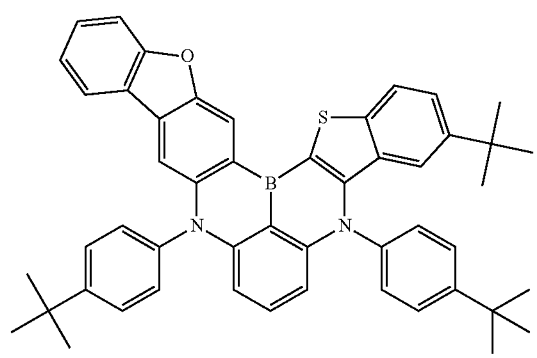

-continued
155
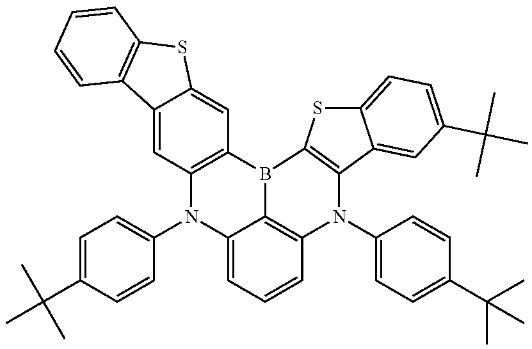
156
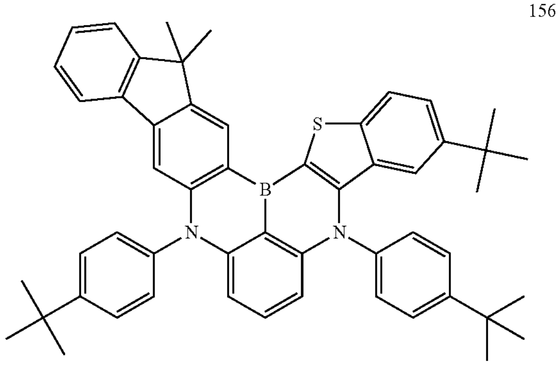
157
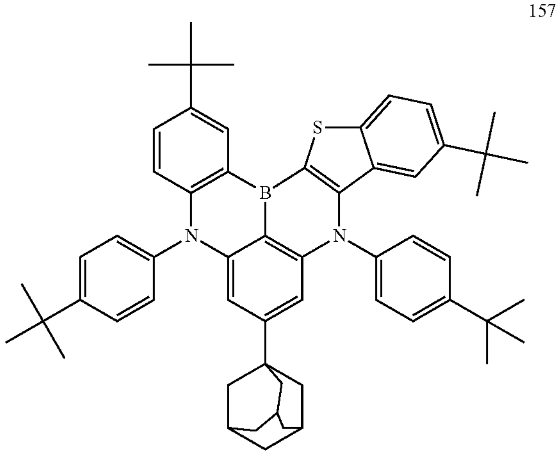
158
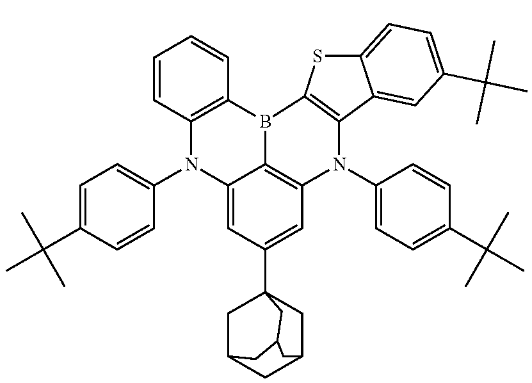
-continued
159
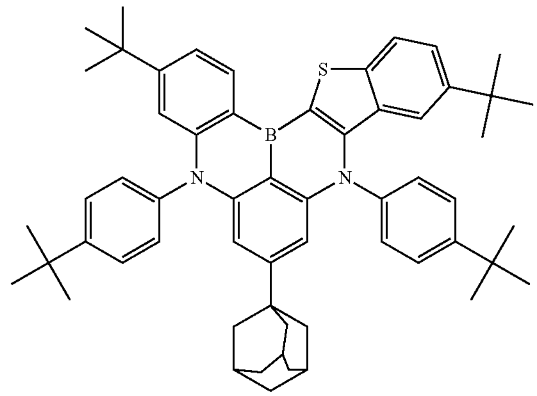
160
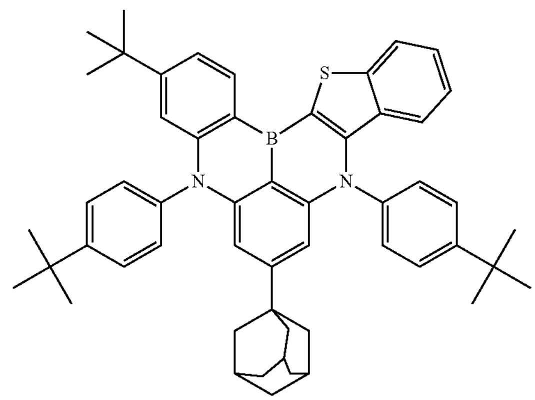
161
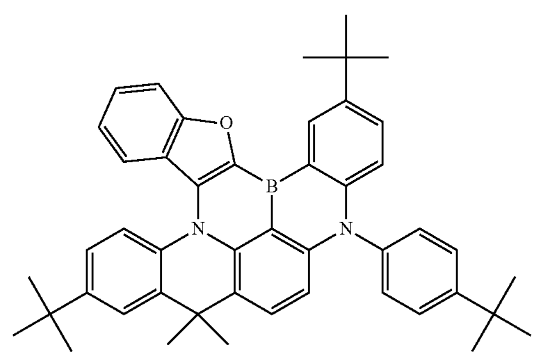
162
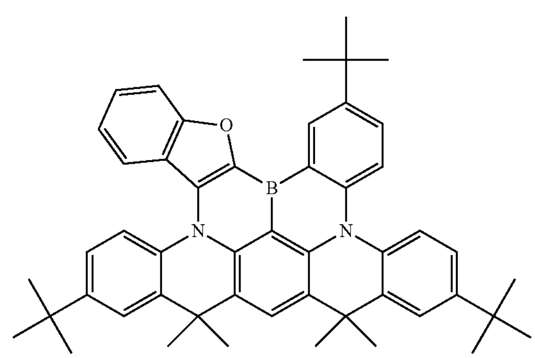

163
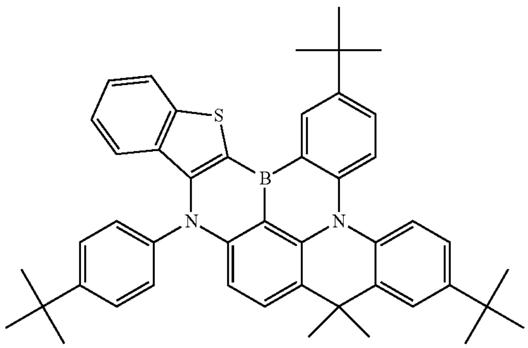
164
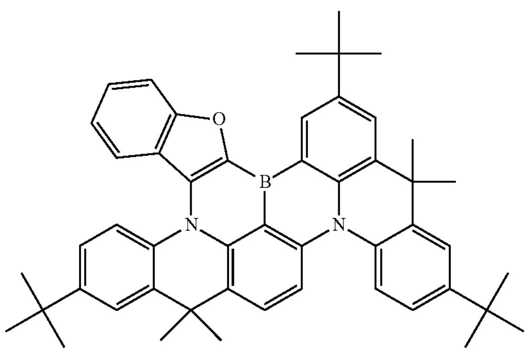
165
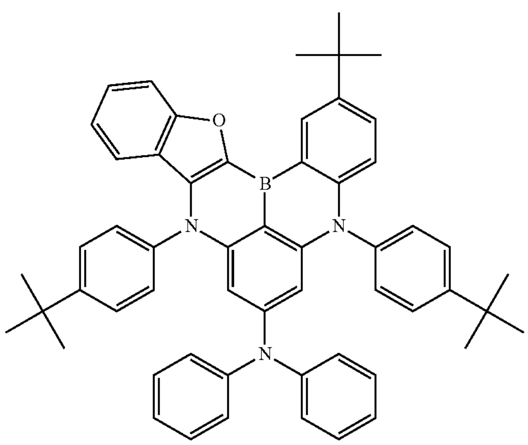
166
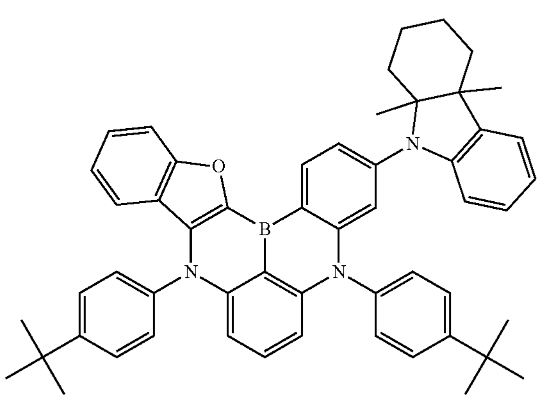
167
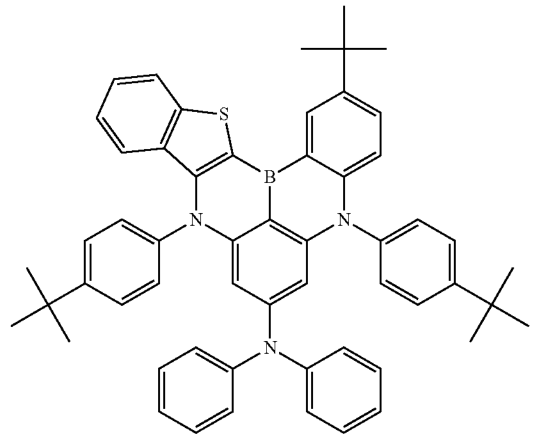
168
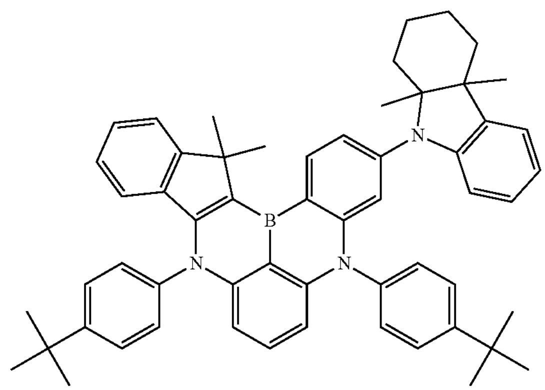
169
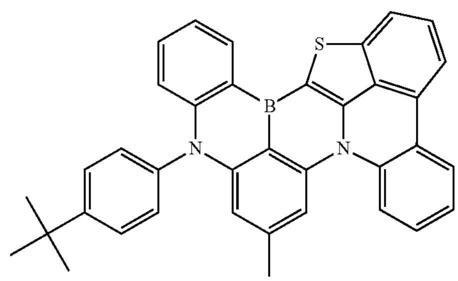
170
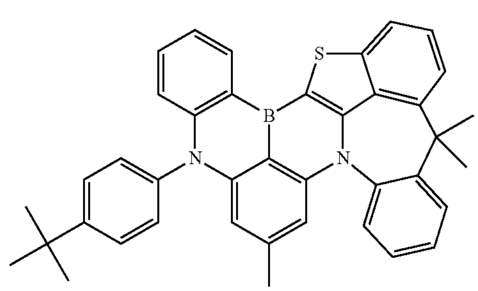

-continued

171

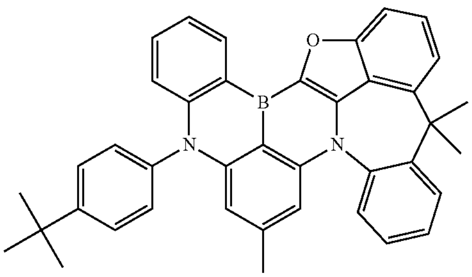

172

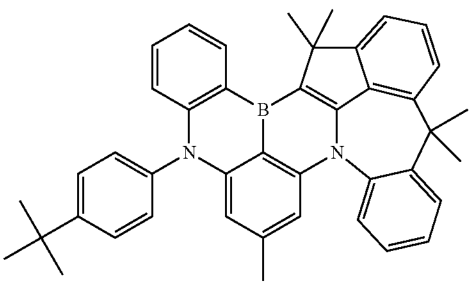

173

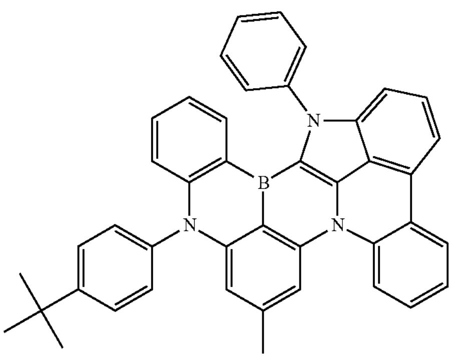

174

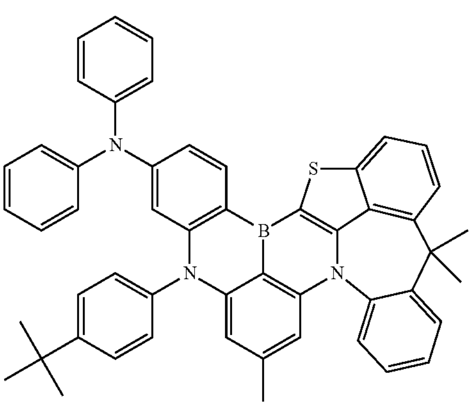

-continued

175

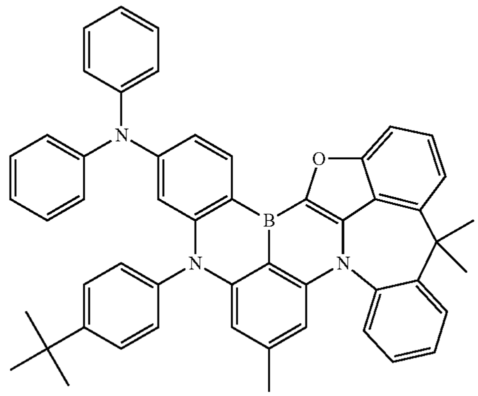

176

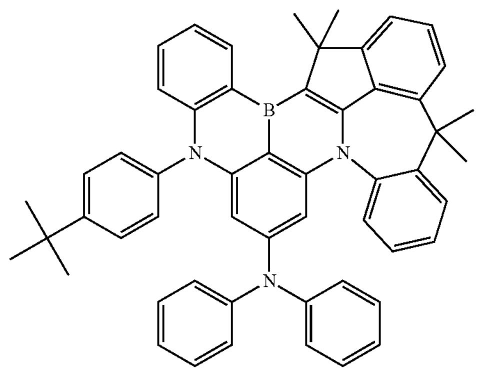

The specific examples of the substituents defined above can be found in the compounds of Formulae 1 to 176 but are not intended to limit the scope of the compound represented by Formula A-1 or A-2.

The introduction of substituents, including B, P or P═O, to form polycyclic aromatic structures allows the organic light emitting materials to have inherent characteristics of the substituents. For example, the introduced substituents may be those that are typically used in materials for hole injecting layers, hole transport layers, light emitting layers, electron transport layers, electron injecting layers, electron blocking layers, and hole blocking layers of organic electroluminescent devices. This introduction meets the requirements of the organic layers and enables the fabrication of highly efficient organic electroluminescent devices.

A further aspect of the present invention is directed to an organic electroluminescent device including a first electrode, a second electrode, and one or more organic layers interposed between the first and second electrodes wherein at least one of the organic layers includes the organic electroluminescent compound represented by Formula A-1 or A-2 and optionally another organic electroluminescent compound represented by Formula A-1 or A-2.

That is, according to one embodiment of the present invention, the organic electroluminescent device has a structure in which one or more organic layers are arranged between a first electrode and a second electrode. The organic electroluminescent device of the present invention may be fabricated by a suitable method known in the art using suitable materials known in the art, except that the organic electroluminescent compound of Formula A-1 or A-2 is used to form the corresponding organic layer.

The organic layers of the organic electroluminescent device according to the present invention may form a monolayer structure. Alternatively, the organic layers may have a multilayer laminate structure. For example, the structure of the organic layers may include a hole injecting layer, a hole transport layer, a hole blocking layer, a light emitting layer, an electron blocking layer, an electron transport layer, and an electron injecting layer, but is not limited thereto. The number of the organic layers is not limited and may be increased or decreased. Preferred structures of the organic layers of the organic electroluminescent device according to the present invention will be explained in more detail in the Examples section that follows.

A more detailed description will be given concerning exemplary embodiments of the organic electroluminescent device according to the present invention.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer. The organic electroluminescent device of the present invention may further include one or more organic layers such as a capping layer that have various functions depending on the desired characteristics of the device.

The light emitting layer of the organic electroluminescent device according to the present invention includes, as a host compound, an anthracene derivative represented by Formula C:

(C)

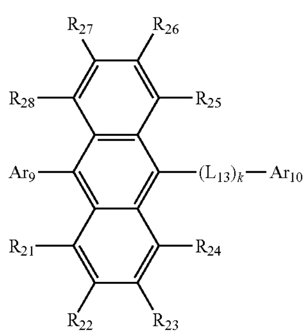

wherein $R_{21}$ to $R_{28}$ are identical to or different from each other and are as defined for $R_1$ to $R_5$ in Formula A-1 or A-2, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, preferably a single bond or substituted or unsubstituted $C_6$-$C_{20}$ arylene, and k is an integer from 1 to 3, provided that when k is 2 or more, the linkers $L_{13}$ are identical to or different from each other.

$Ar_9$ in Formula C is represented by Formula C-1:

(C-1)

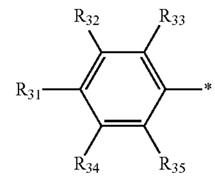

wherein $R_{31}$ to $R_{35}$ are identical to or different from each other and are as defined for $R_1$ to $R_5$ in Formula A-1 or A-2, and each of $R_{31}$ to $R_{35}$ is optionally bonded to an adjacent substituent to form a saturated or unsaturated ring.

The compound of Formula C employed in the organic electroluminescent device of the present invention may be specifically selected from the compounds of Formulae $C_1$ to $C_{48}$:

C1

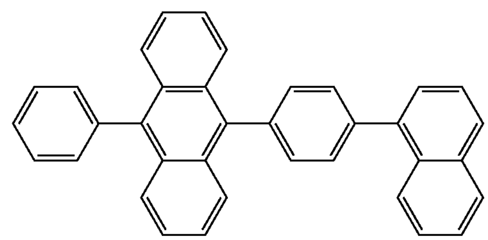

C2

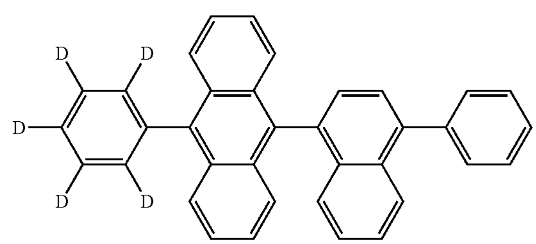

C3

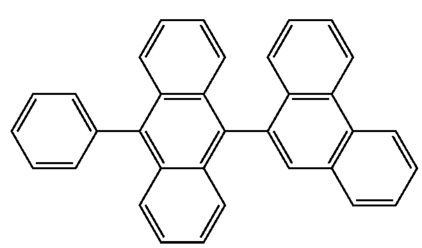

-continued
C4
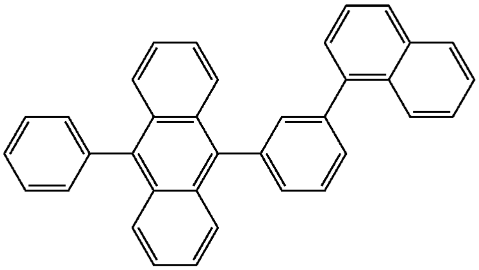
C5
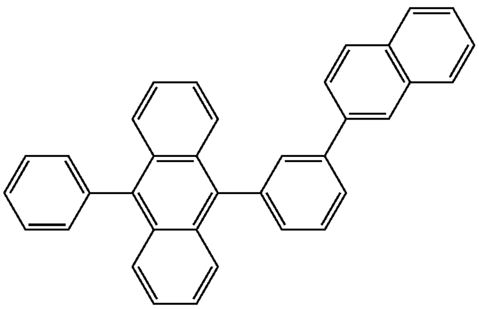
C6
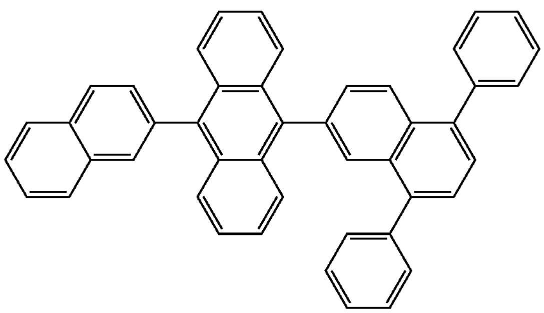
C7
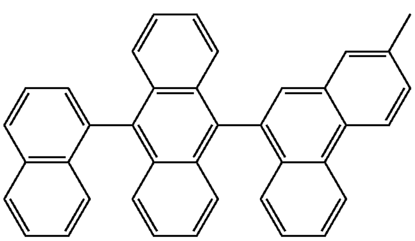
C8
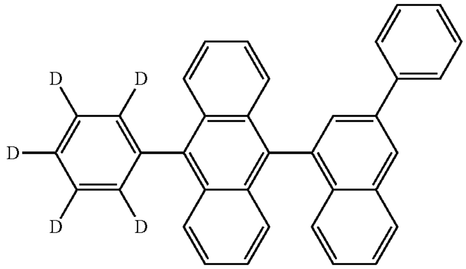
-continued
C9
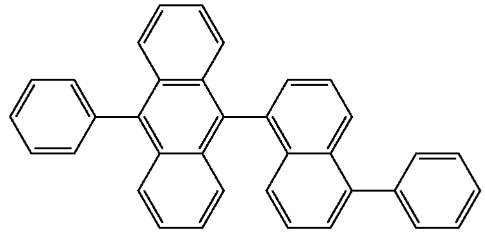
C10
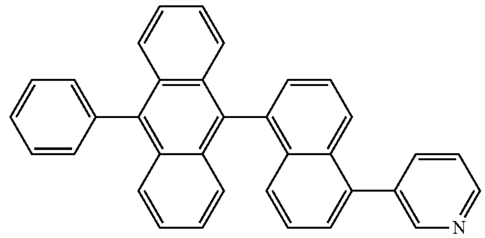
C11
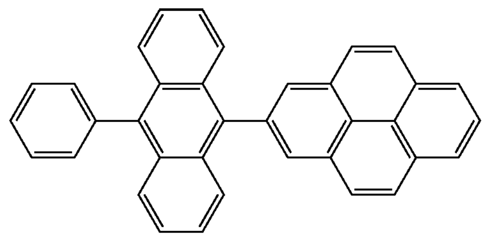
C12
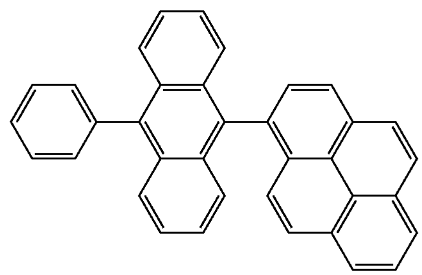
C13
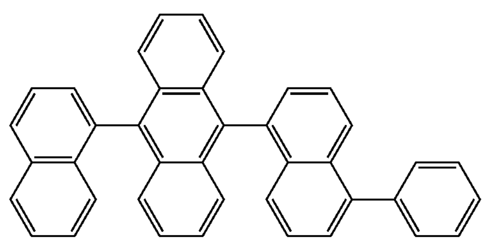
C14
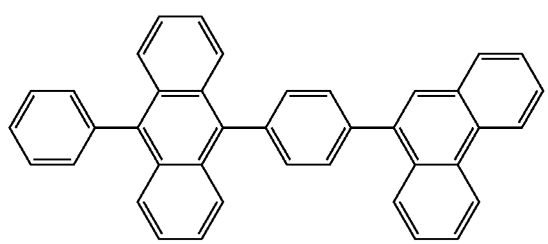

-continued
C15
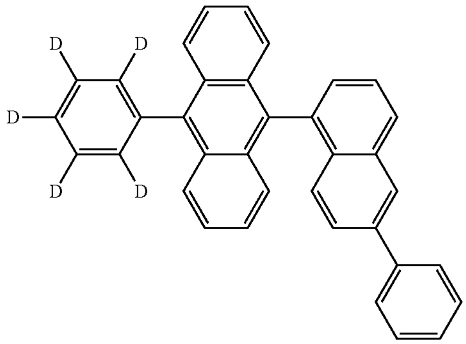
C16
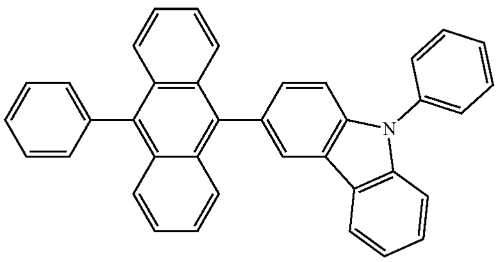
C17
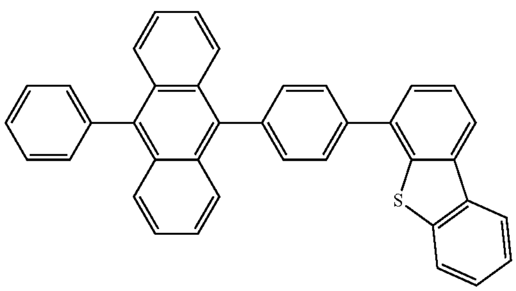
C18
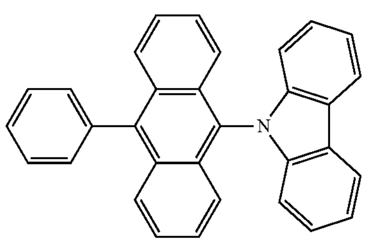
C19
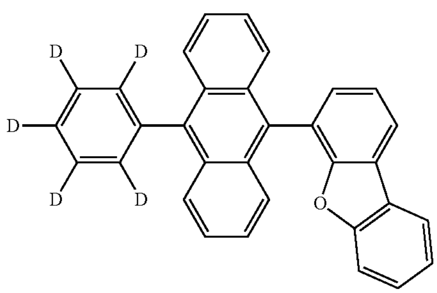
-continued
C20
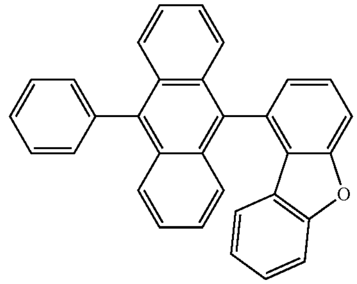
C21
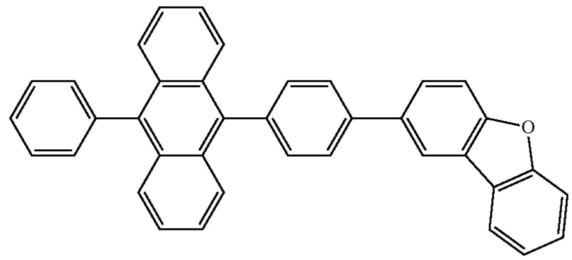
C22
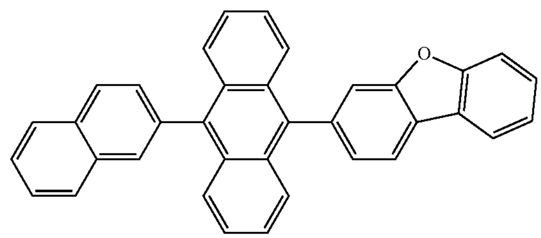
C23
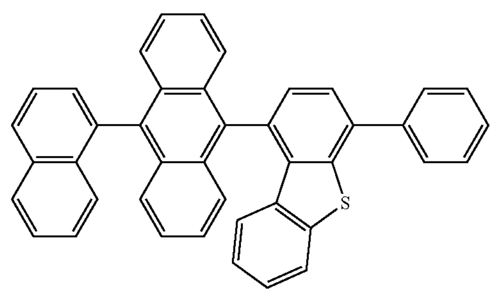
C24
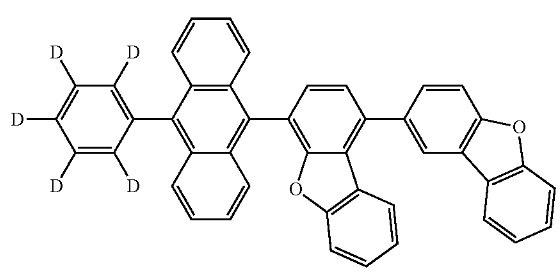

-continued
C25
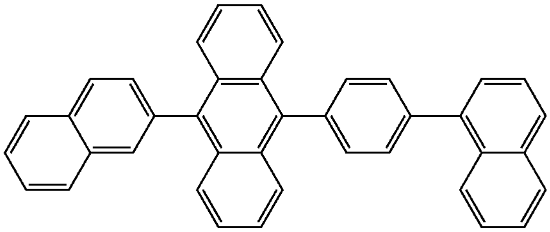
C26
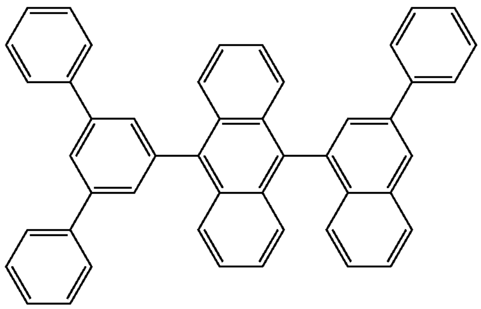
C27
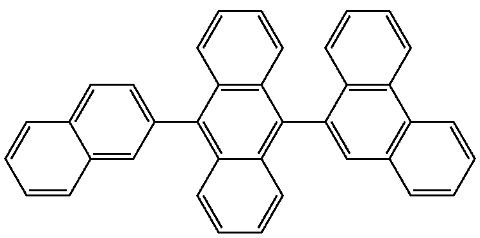
C28
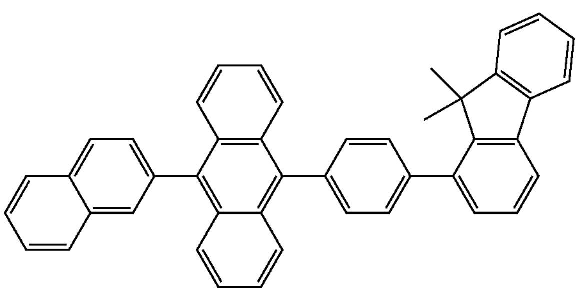
C29
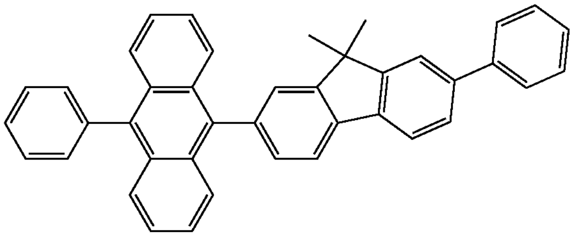
-continued
C30
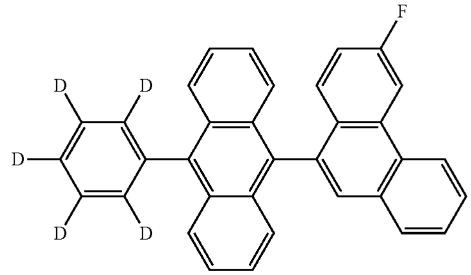
C31
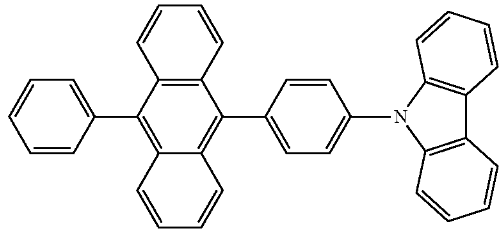
C32
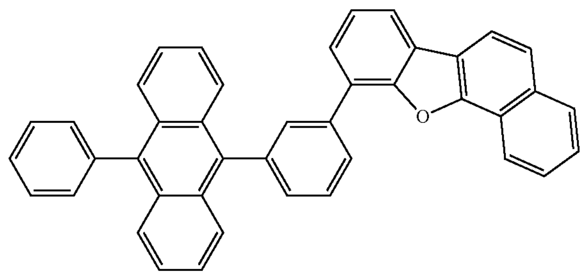
C33
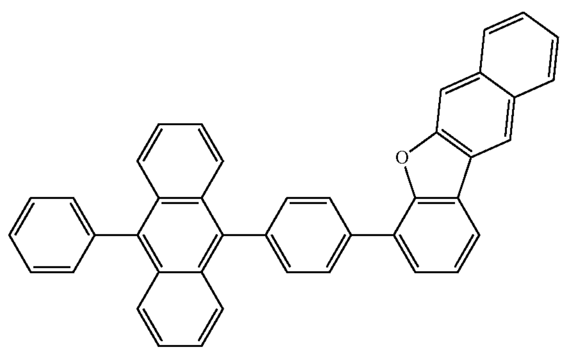
C34
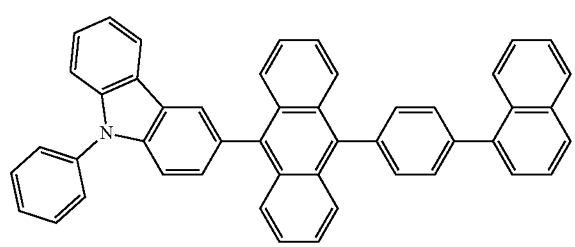

-continued
C35
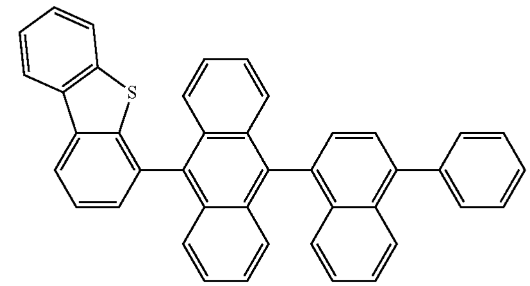
C36
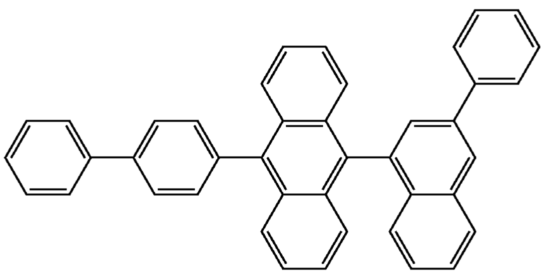
C37
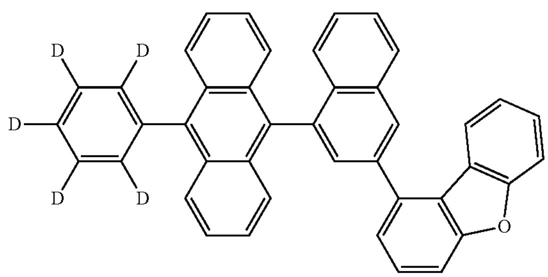
C38
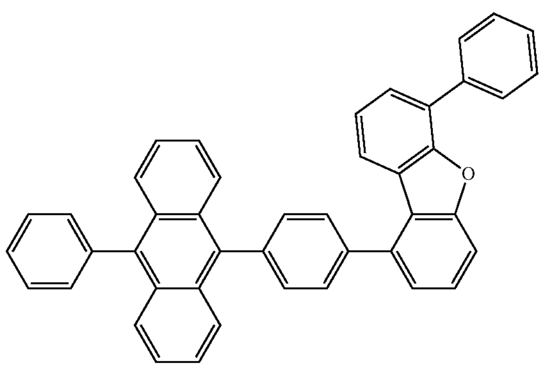
C39
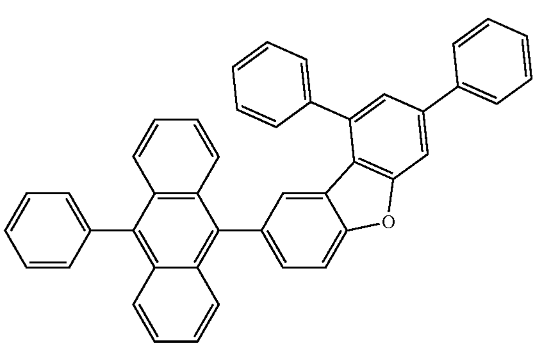
-continued
C40
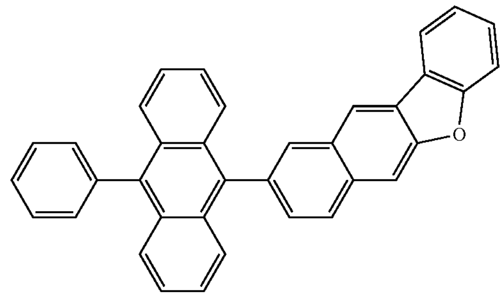
C41
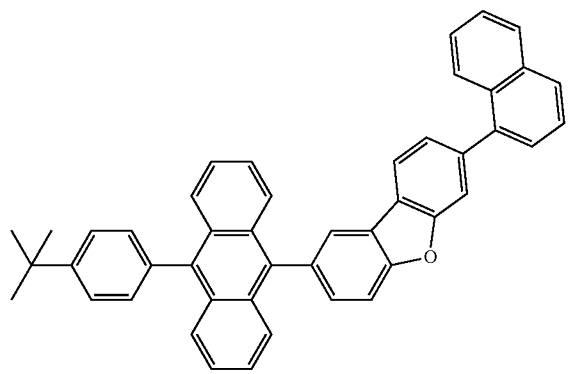
C42
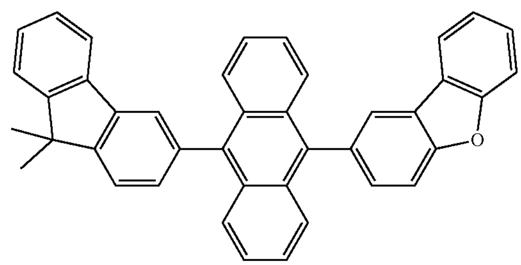
C43
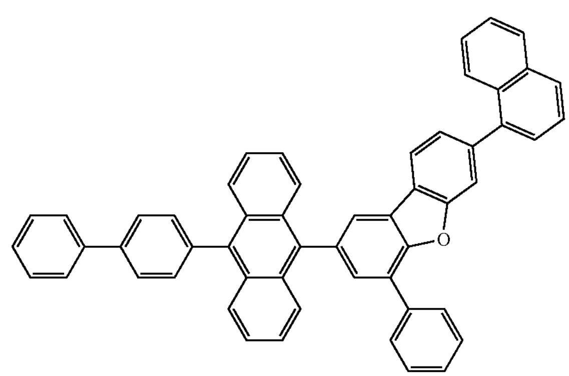

-continued

C44

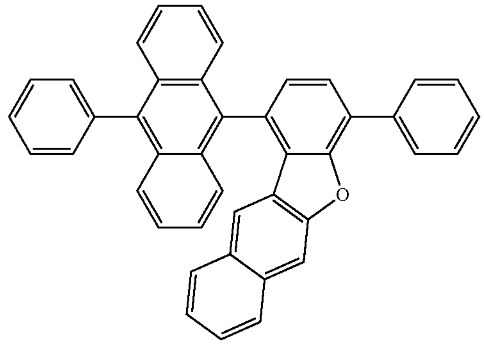

C45

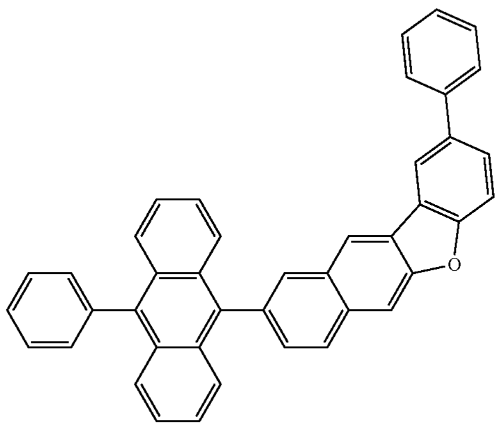

C46

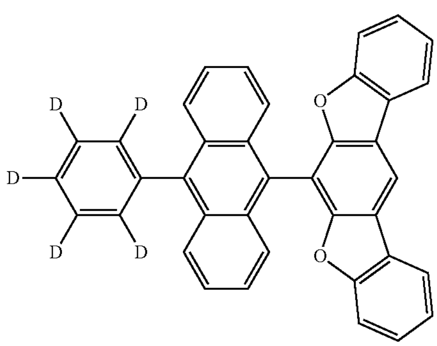

C47

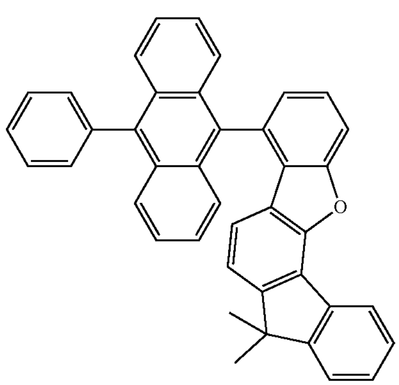

-continued

C48

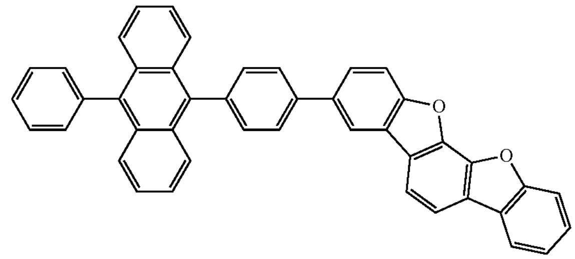

The organic electroluminescent device of the present invention may further include one or more organic layers, for example, a hole transport layer and an electron blocking layer, each of which may include a compound represented by Formula D:

(D)

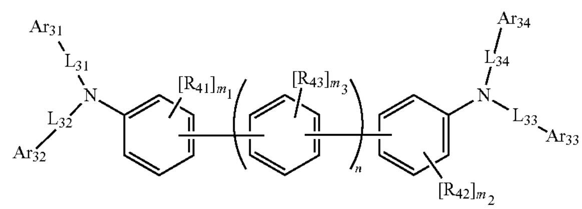

wherein $R_{41}$ to $R_{43}$ are identical to or different from each other and are each independently selected from hydrogen, deuterium, substituted or unsubstituted $C_1$-$C_{20}$ alkyl, substituted or unsubstituted $C_6$-$C_{50}$ aryl, substituted or unsubstituted $C_7$-$C_{50}$ arylalkyl, substituted or unsubstituted $C_3$-$C_{30}$ cycloalkyl, substituted or unsubstituted $C_1$-$C_{30}$ alkylsilyl, substituted or unsubstituted $C_6$-$C_{30}$ arylsilyl, and halogen, $L_{31}$ to $L_{34}$ are identical to or different from each other and are each independently single bonds or selected from substituted or unsubstituted $C_6$-$C_{50}$ arylene and substituted or unsubstituted $C_2$-$C_{50}$ heteroarylene, $Ar_{31}$ to $Ar_{34}$ are identical to or different from each other and are each independently selected from substituted or unsubstituted $C_6$-$C_{50}$ aryl and substituted or unsubstituted $C_2$-$C_{50}$ heteroaryl, n is an integer from 0 to 4, provided that when n is 2 or greater, the aromatic rings containing $R_{43}$ are identical to or different from each other, m1 to m3 are integers from 0 to 4, provided that when both m1 and m3 are 2 or more, the $R_{41}$, $R_{42}$, and $R_{43}$ groups are identical to or different from each other, and hydrogen or deuterium atoms are bonded to the carbon atoms of the aromatic rings to which $R_{41}$ to $R_{43}$ are not attached.

In Formula D, at least one of $Ar_{31}$ to $Ar_{34}$ is represented by Formula E:

(E)

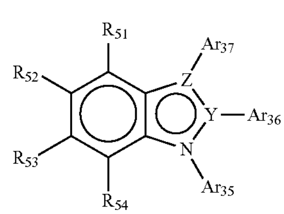

wherein $R_{51}$ to $R_{54}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, and $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $L_{31}$ to $L_{34}$ in Formula D.

The compound of Formula D employed in the organic electroluminescent device of the present invention may be specifically selected from the compounds of Formulae D1 to D79:

D1

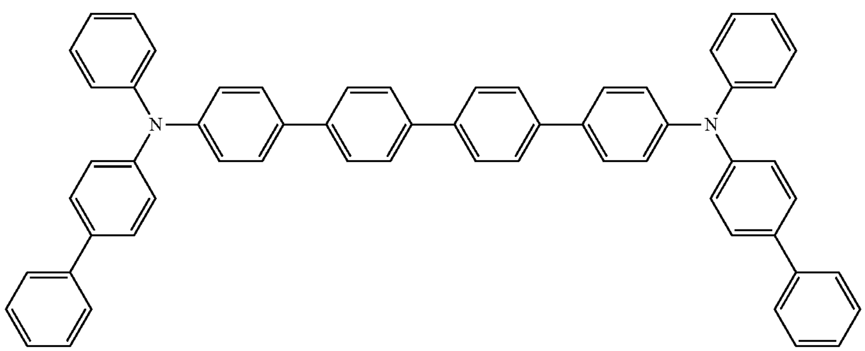

D2

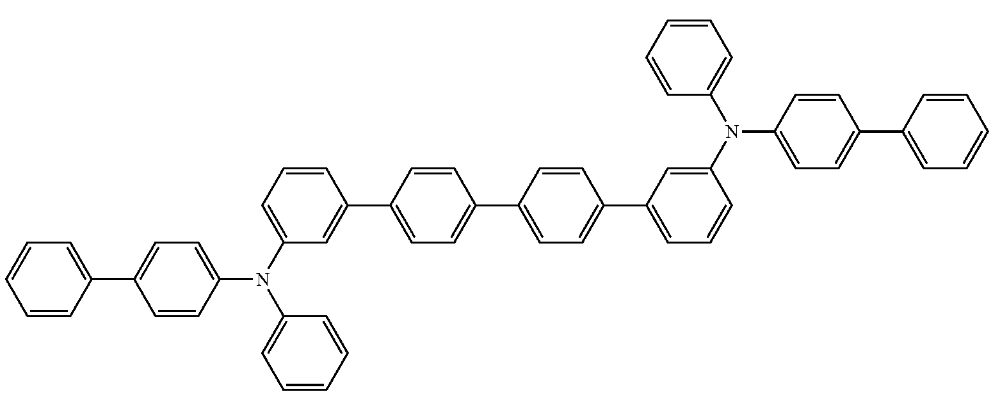

-continued
D3
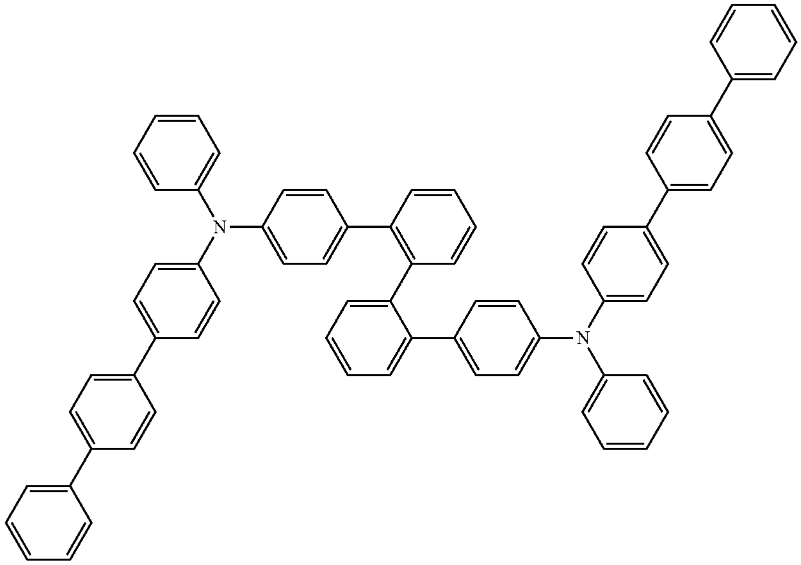
D4
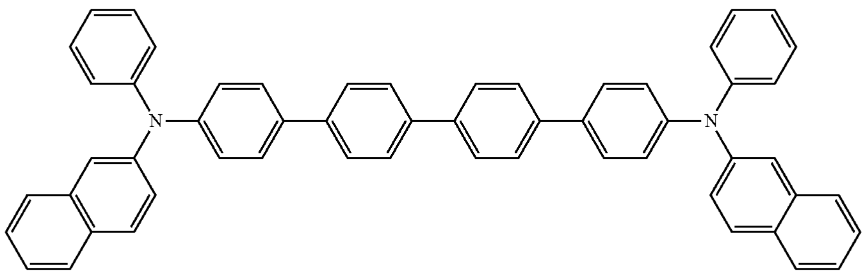
D5
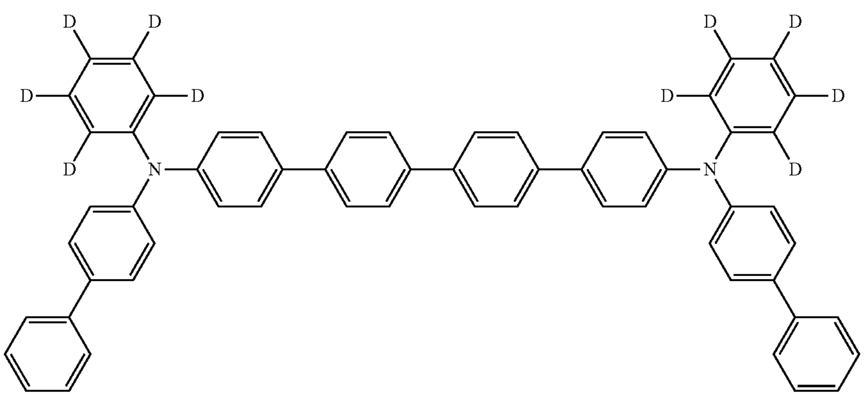
D6
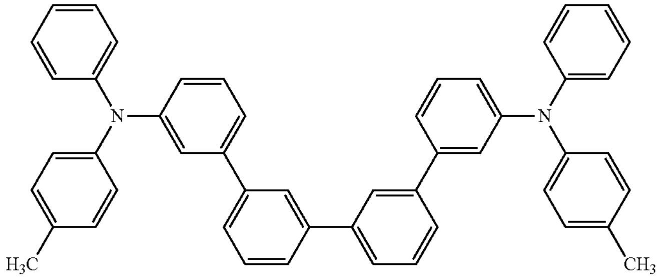

-continued
D7
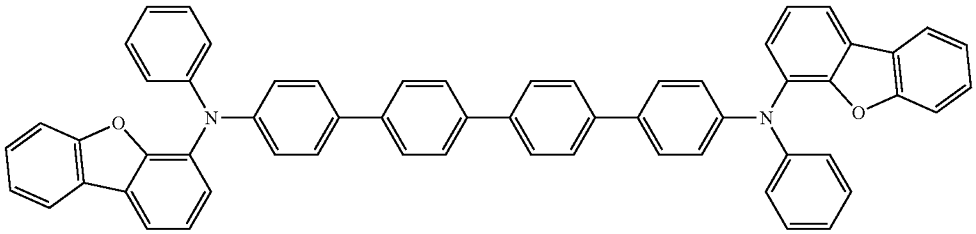
D8
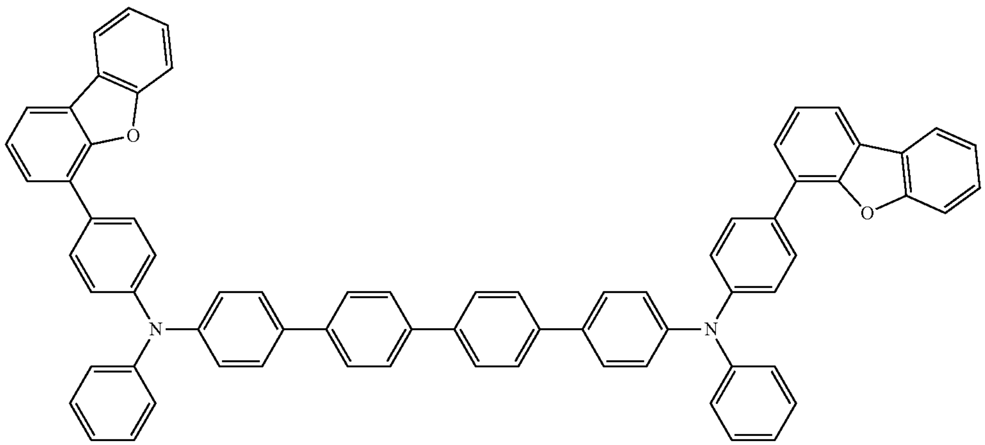
D9
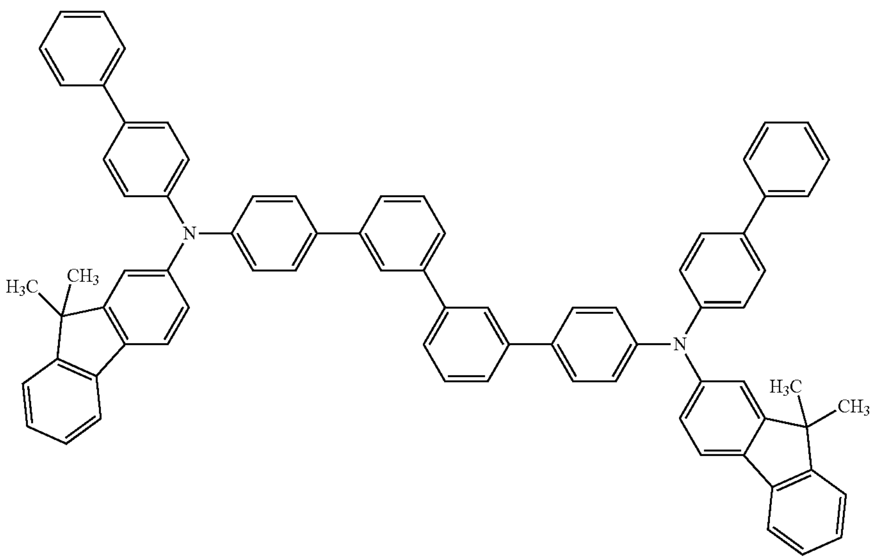
D10
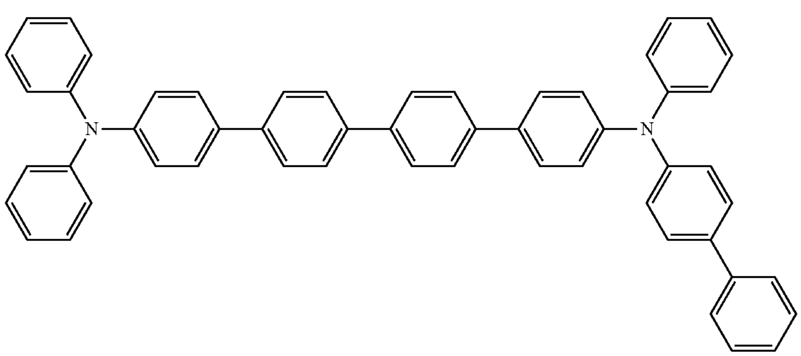

-continued
D11
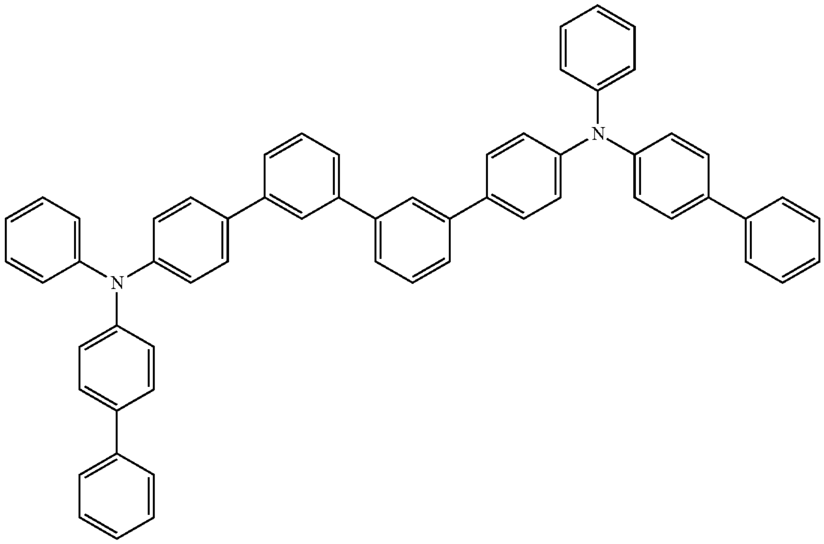
D12
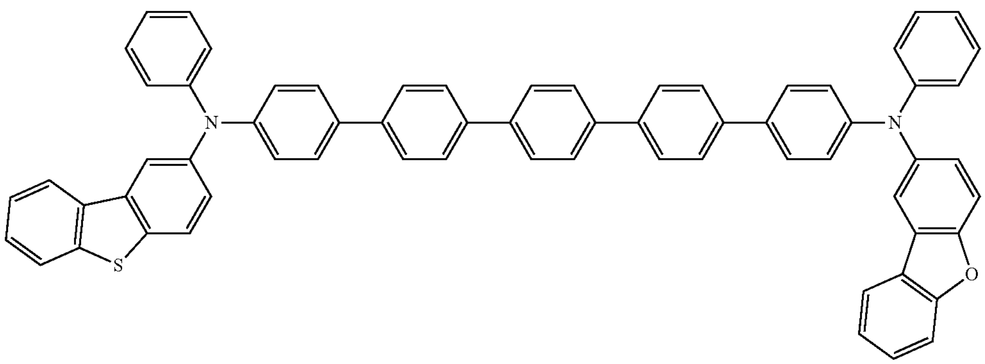
D13
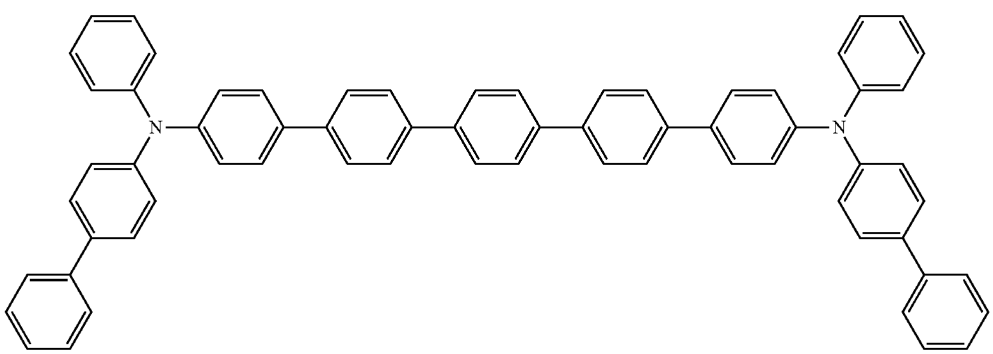
D14
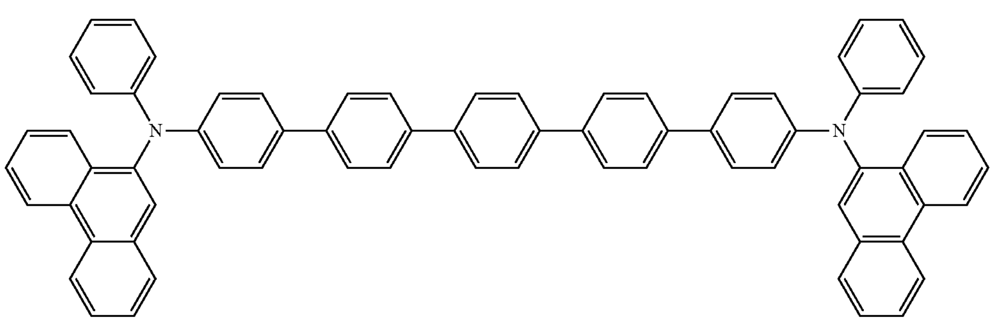

-continued
D15
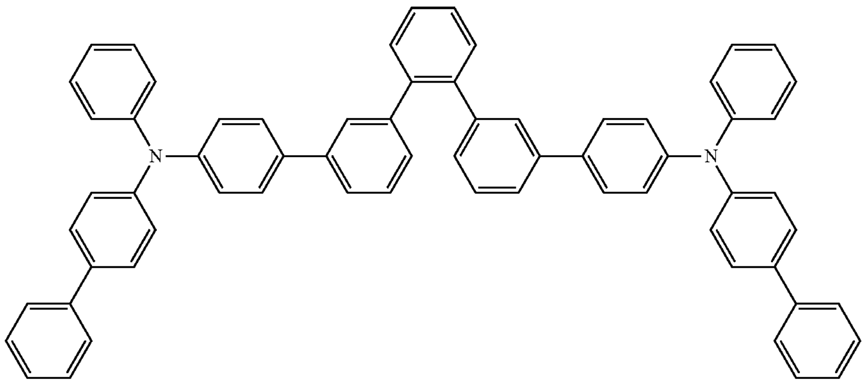
D16
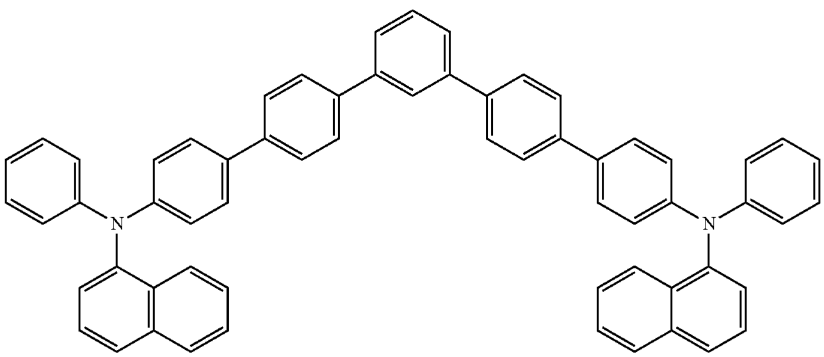
D17
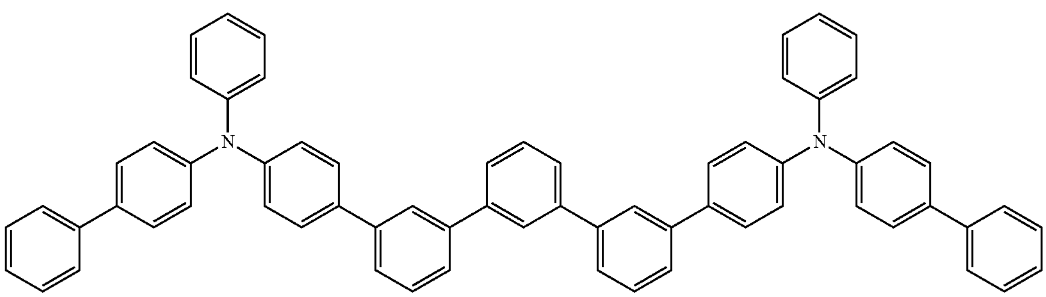
D18
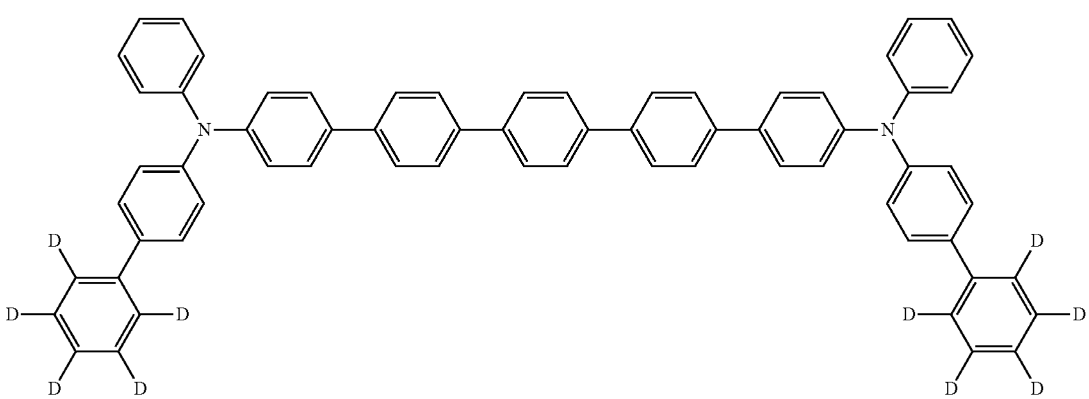

-continued
D19
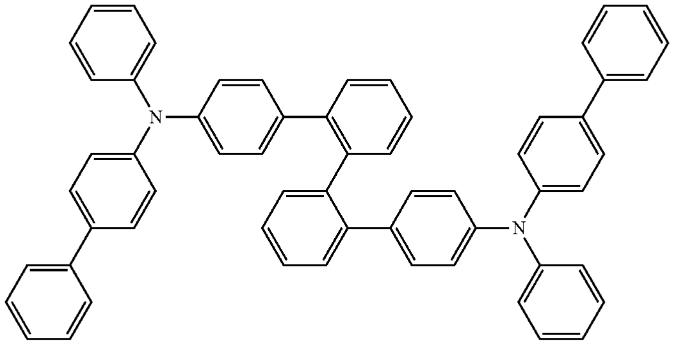
D20
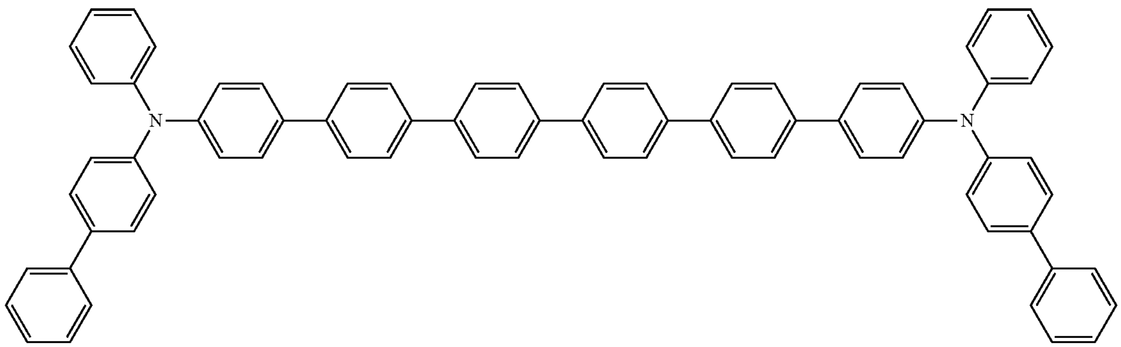
D21
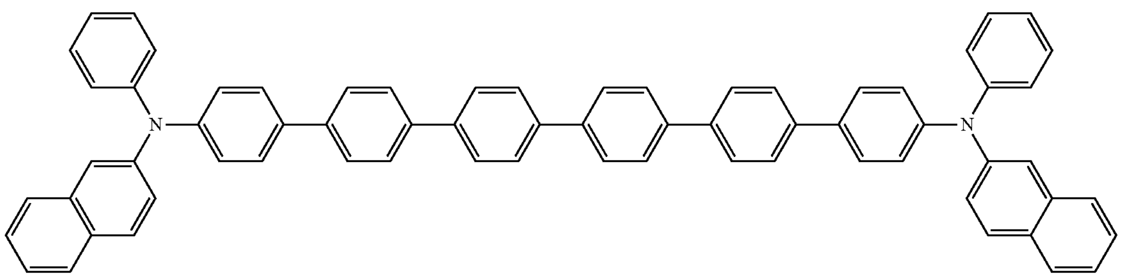
D22
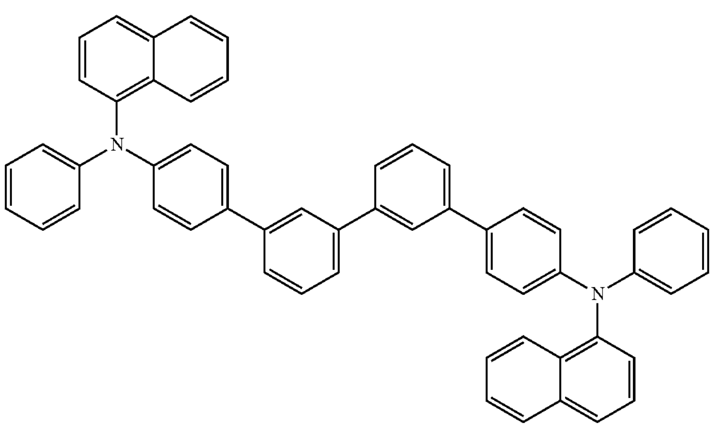

-continued
D23
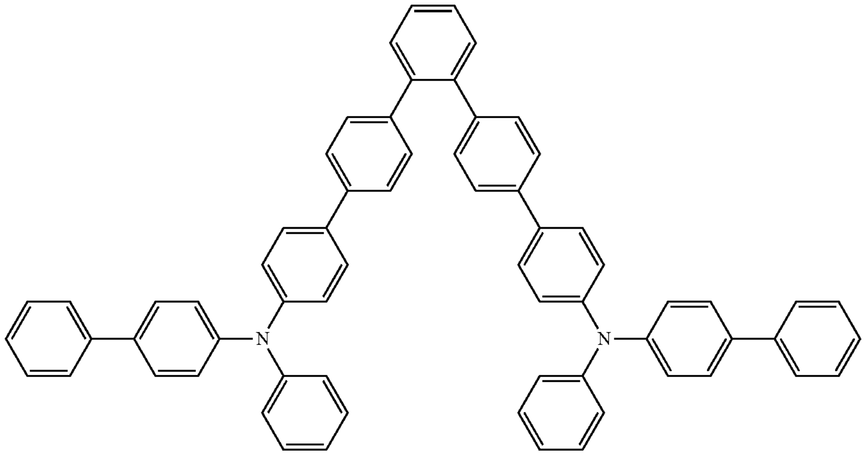
D24
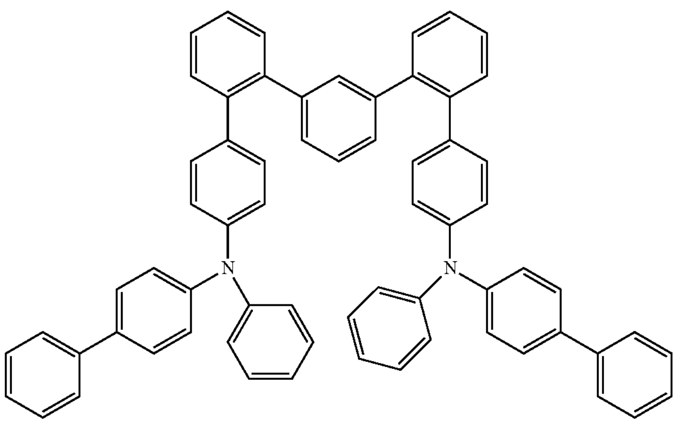
D25
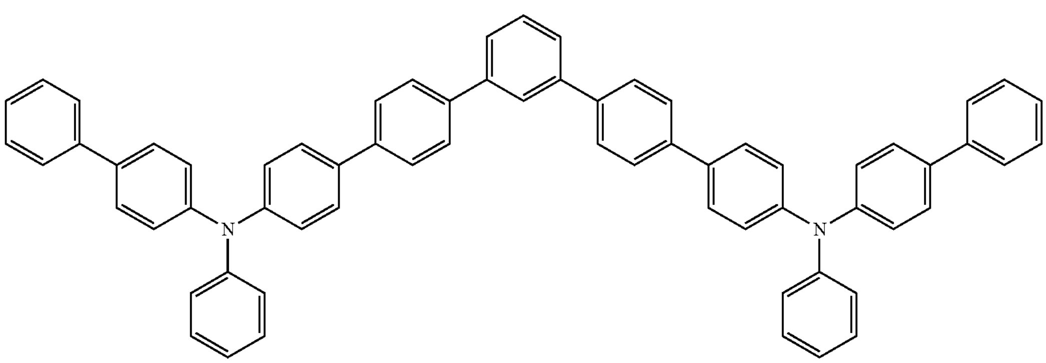

-continued
D26
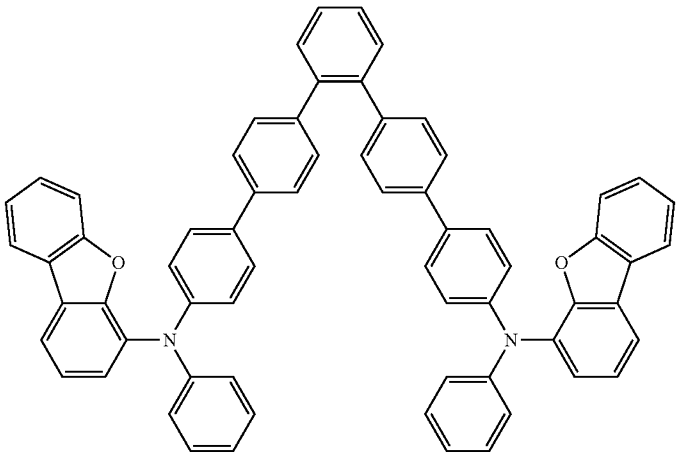
D27
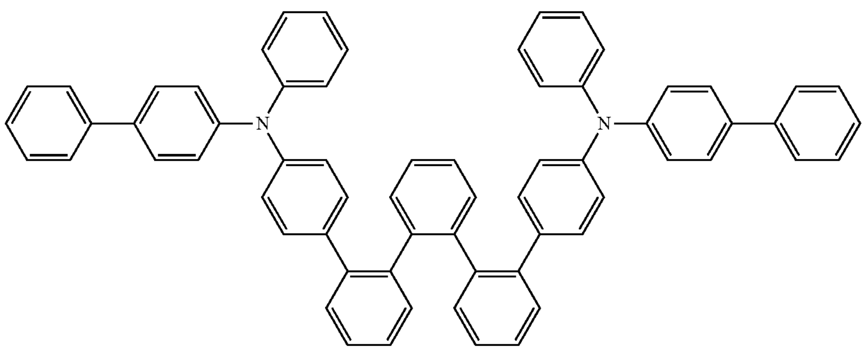
D28
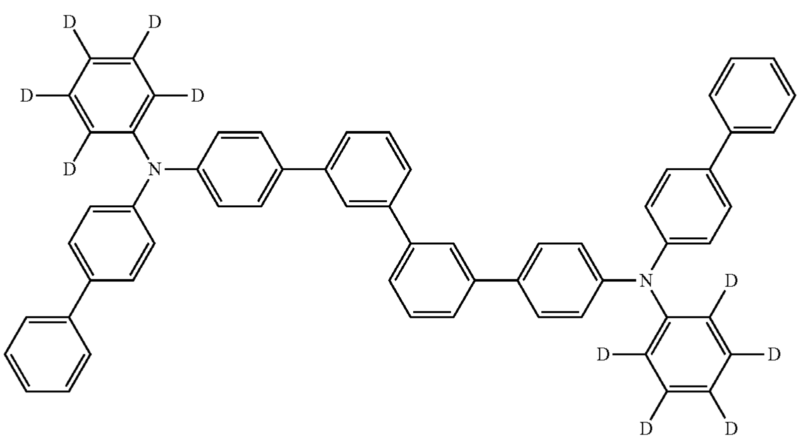
D29
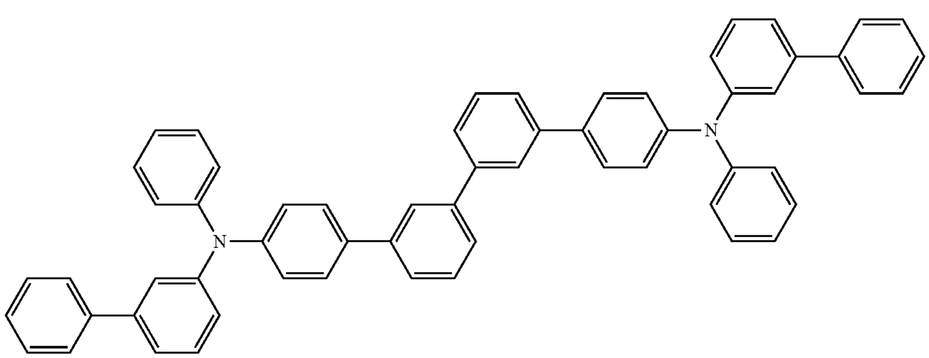

-continued
D30
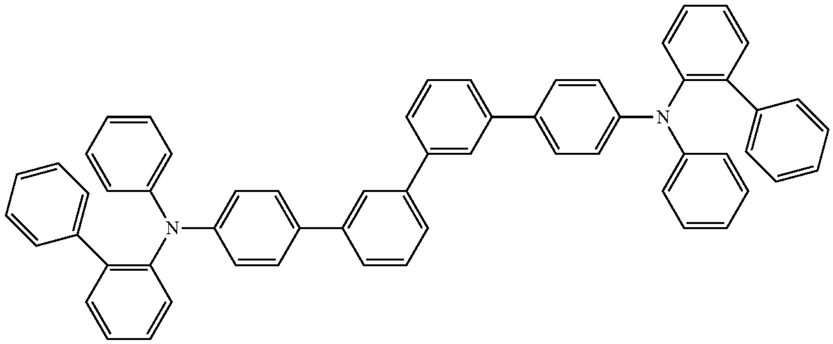
D31
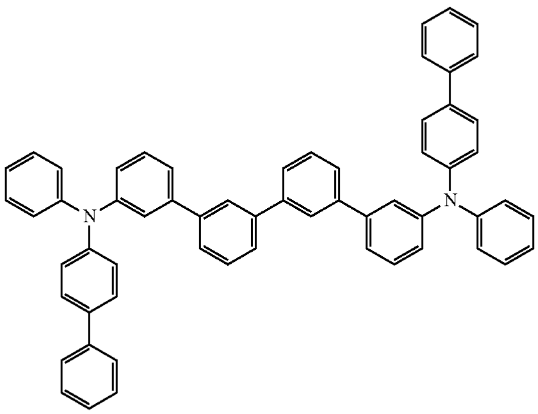
D32
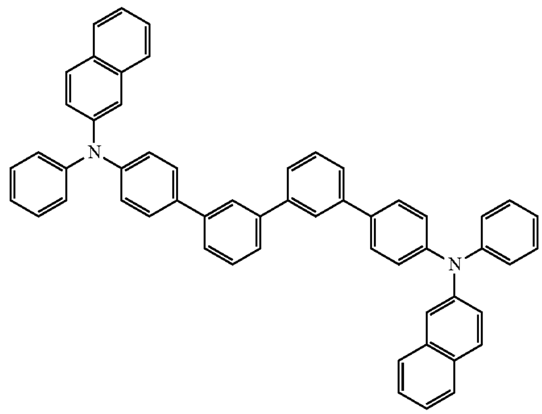
D33
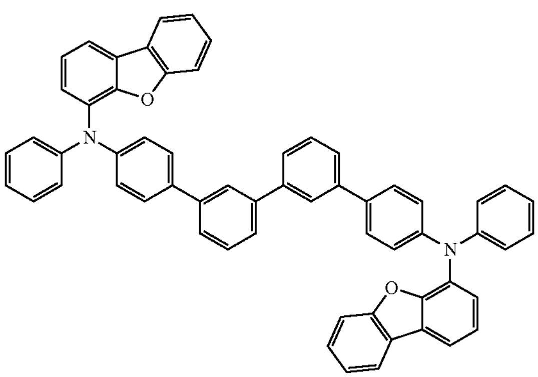
D34
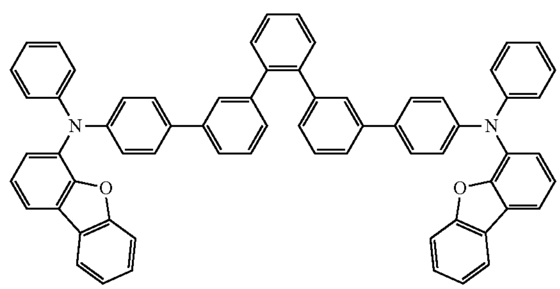
D35
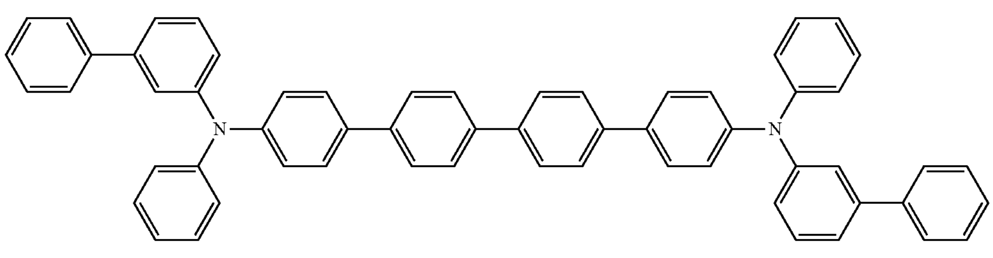
D36
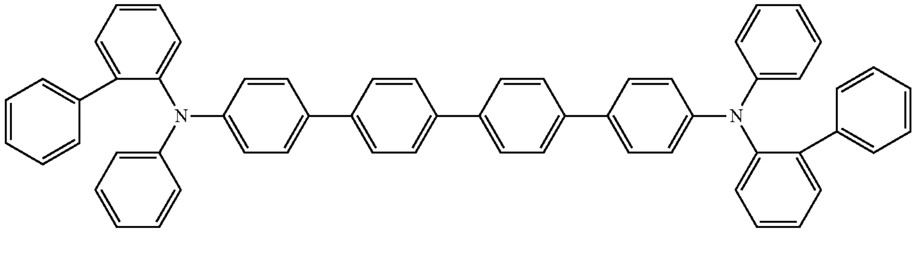

-continued
D37
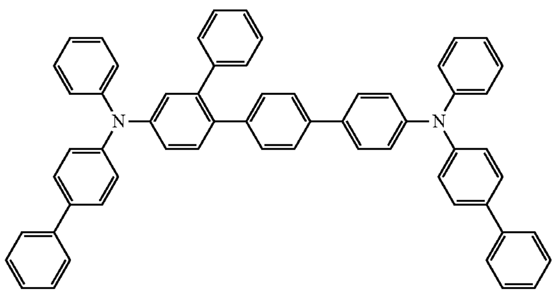
D38
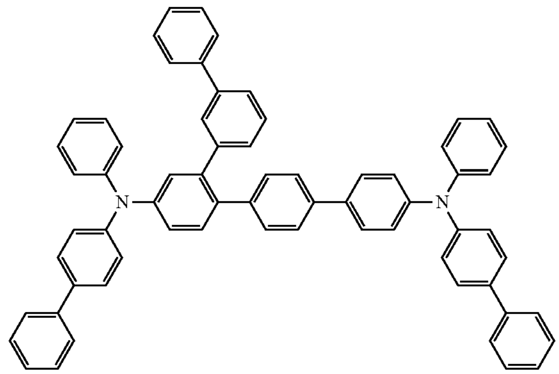
D39
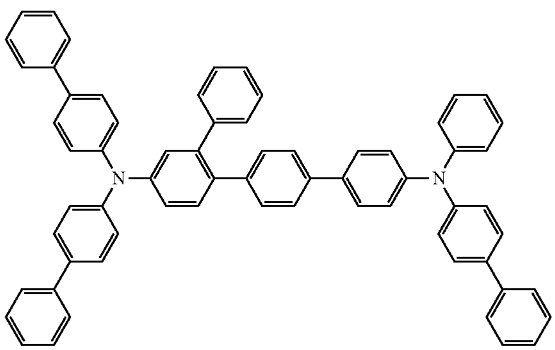
D40
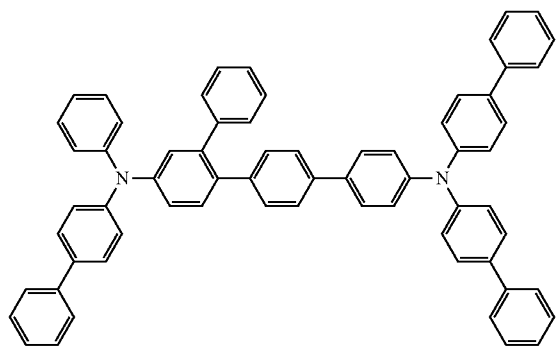
D41
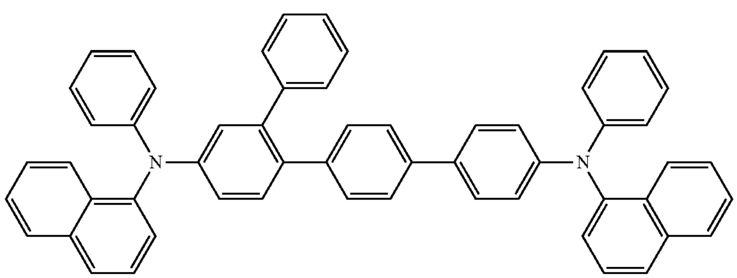
D42
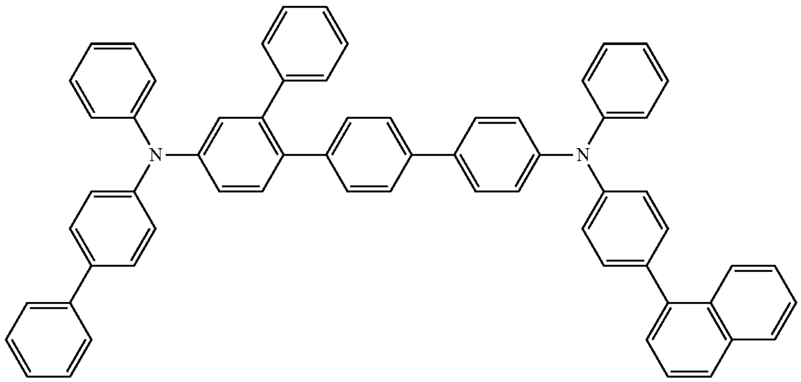

-continued
D43
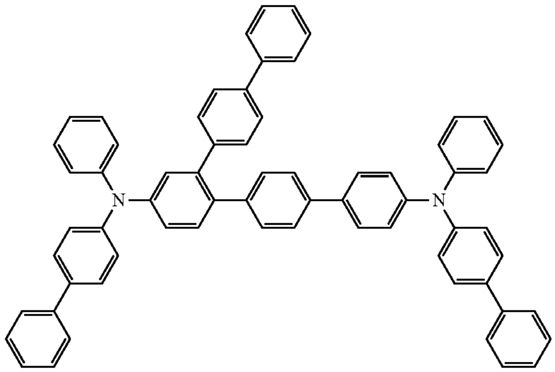
D44
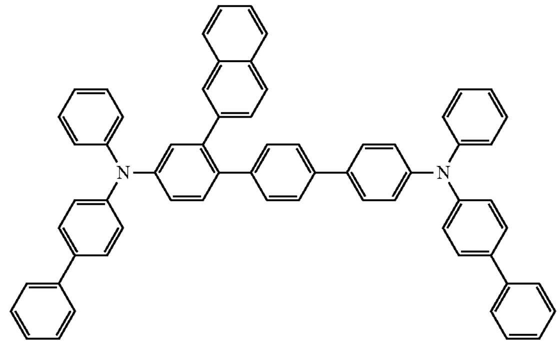
D45
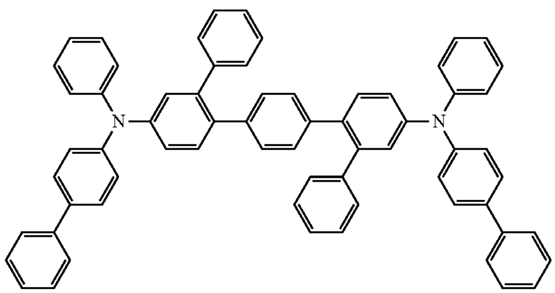
D46
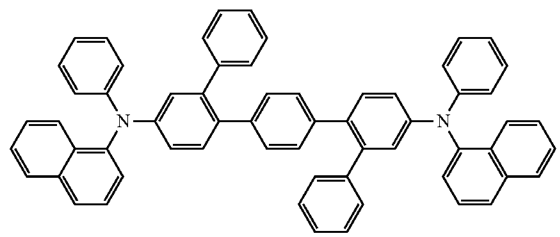
D47
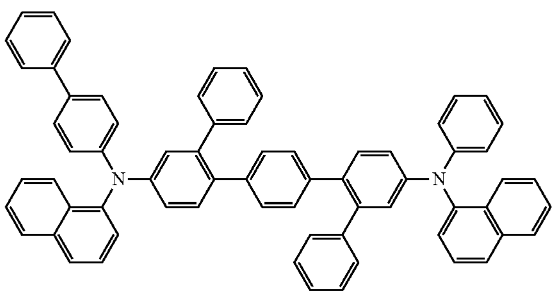
D48
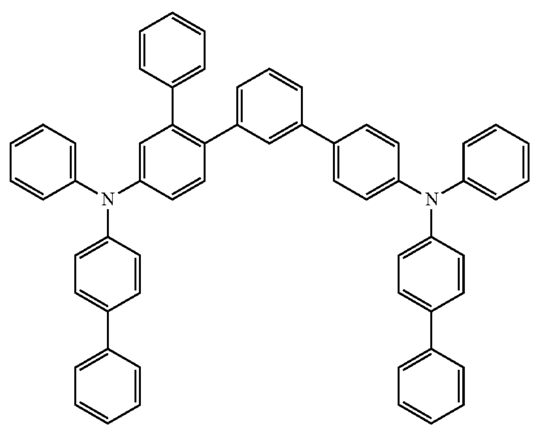
D49
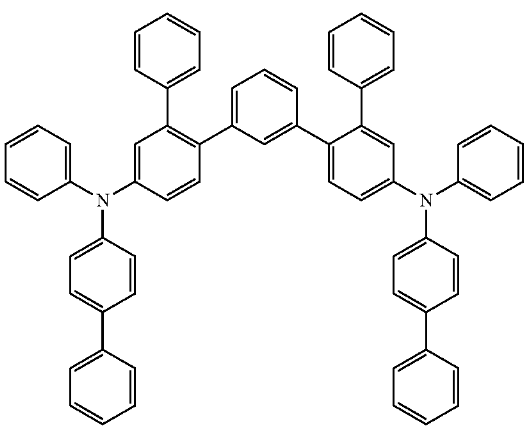
D50
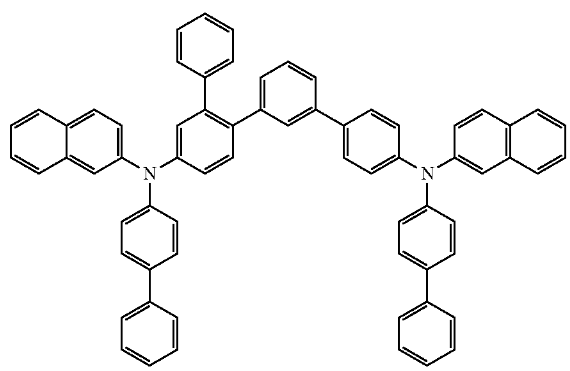

-continued
D51
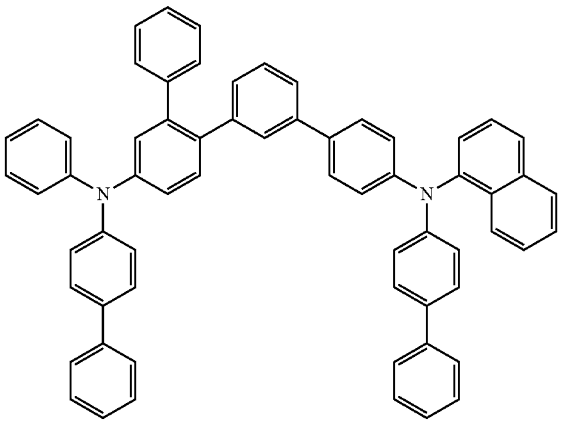
D52
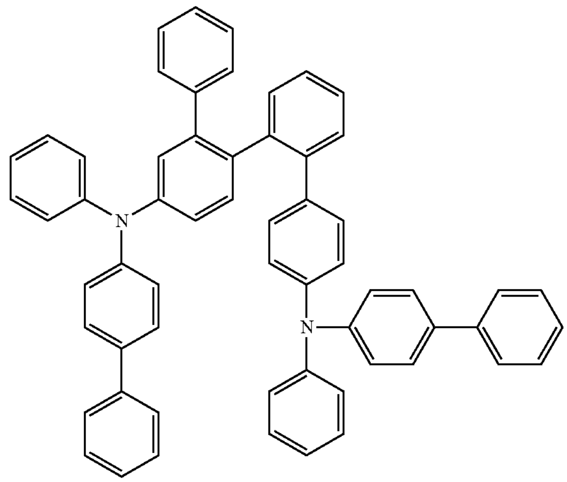
D53
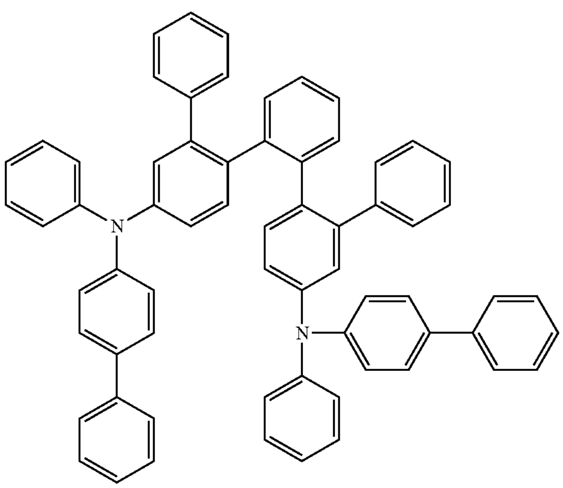
D54
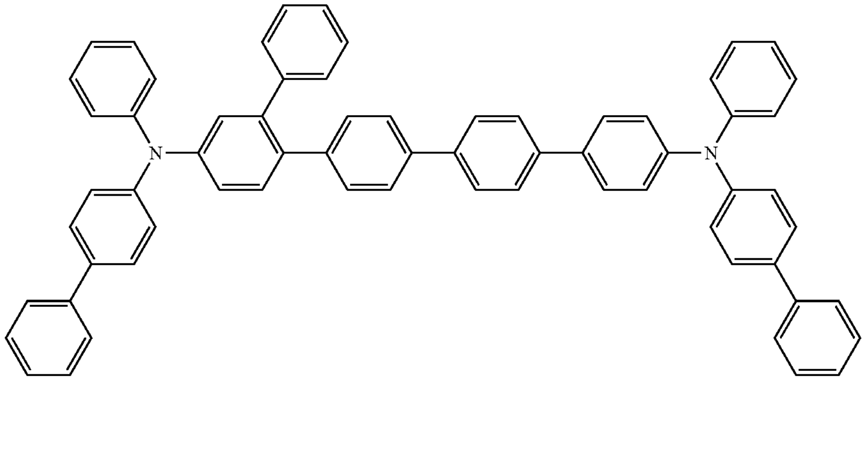

-continued
D55
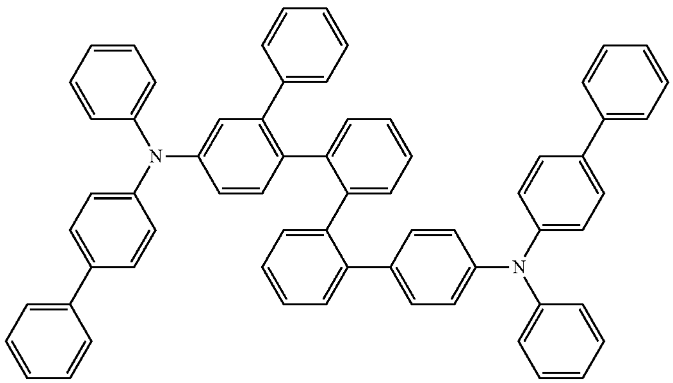
D56
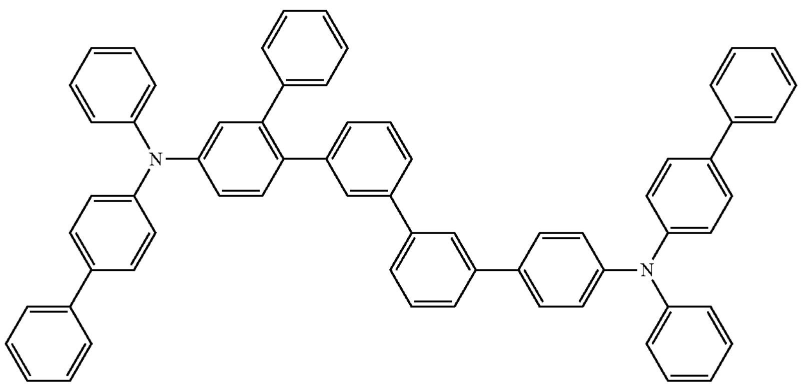
D57
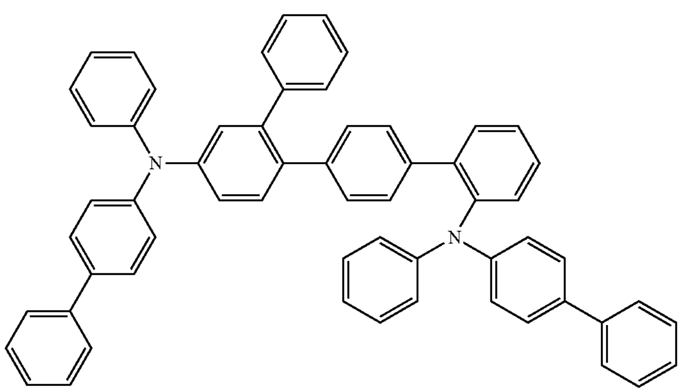
D58
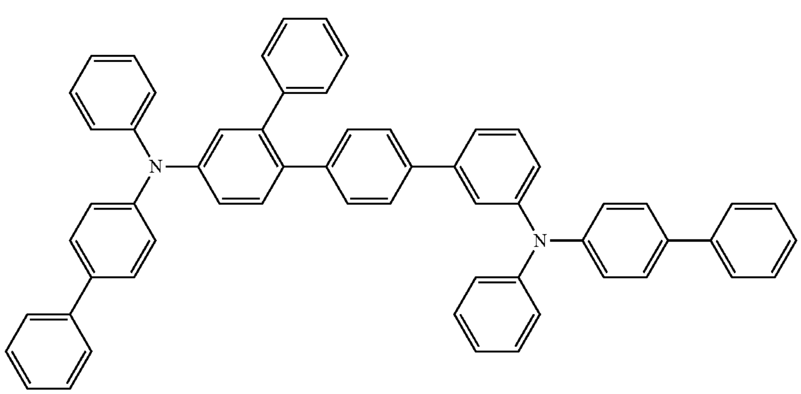

-continued
D59
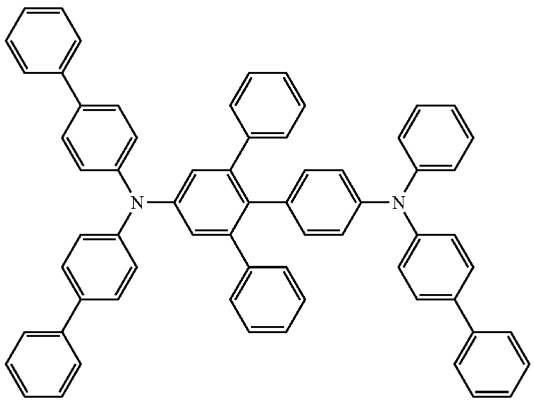
D60
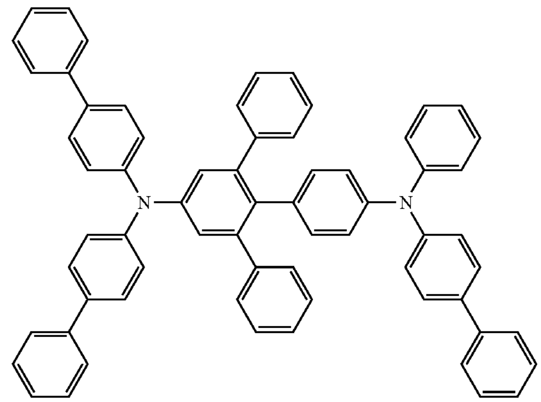
D61
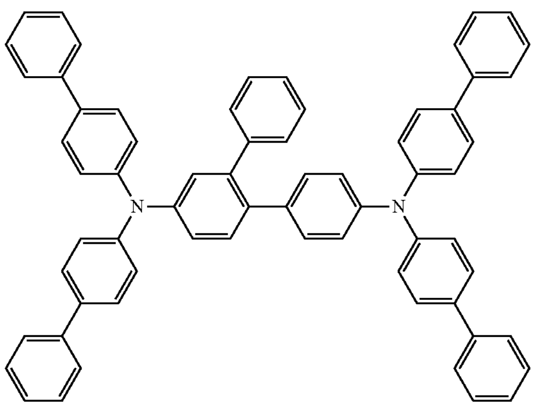
D62
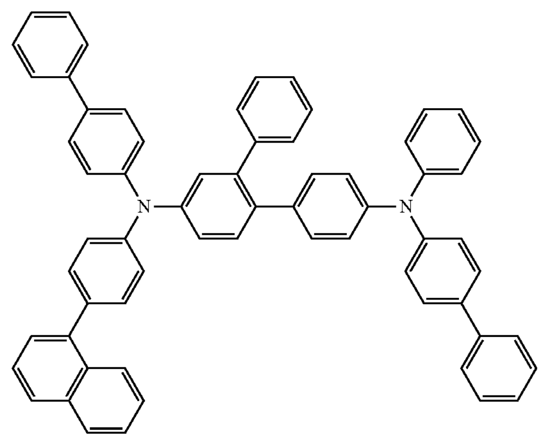
D63
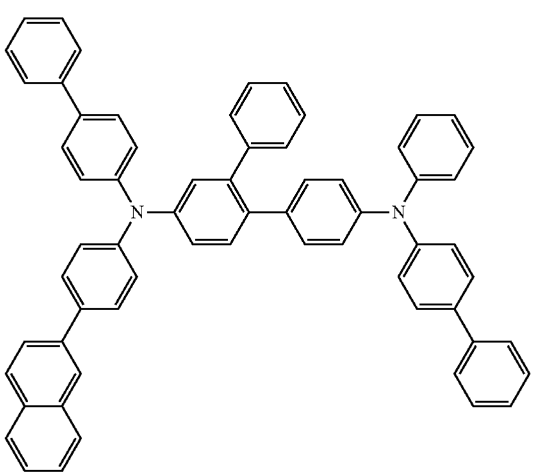
D64
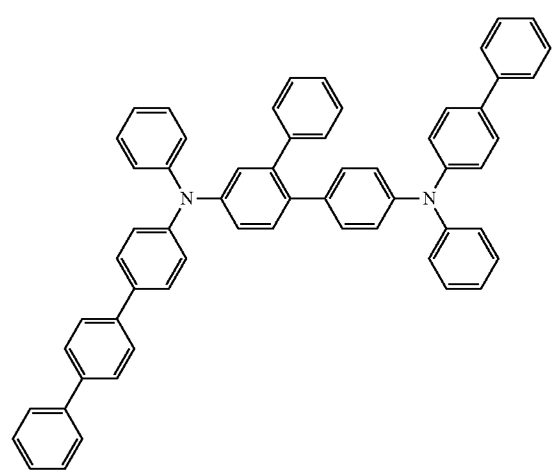

-continued
D65
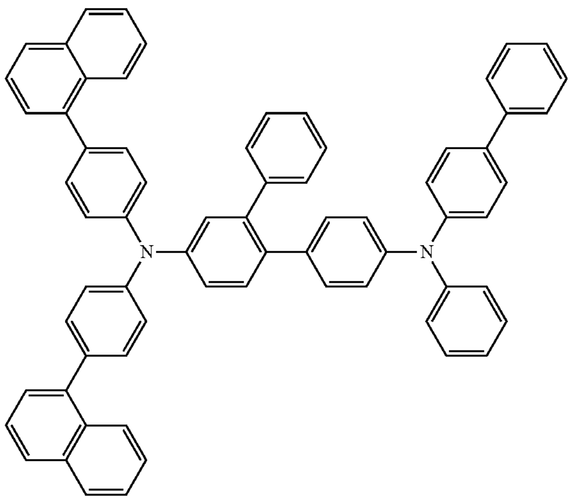
D66
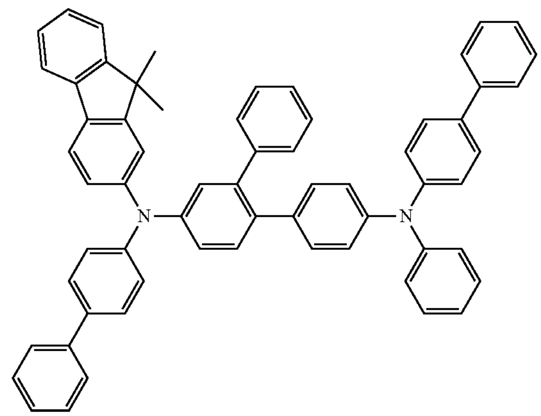
D67
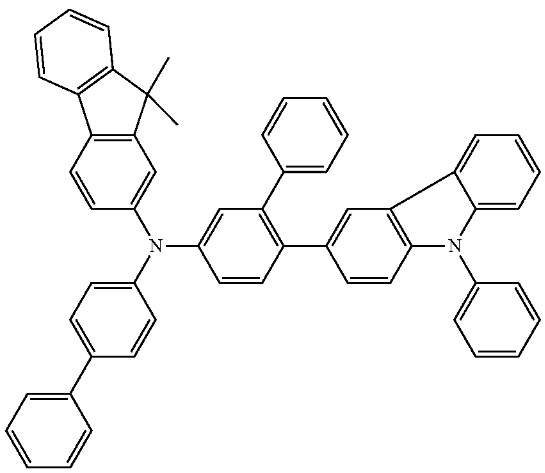
D68
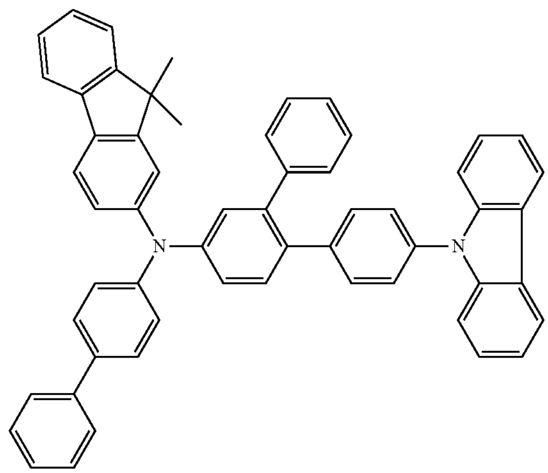
D69
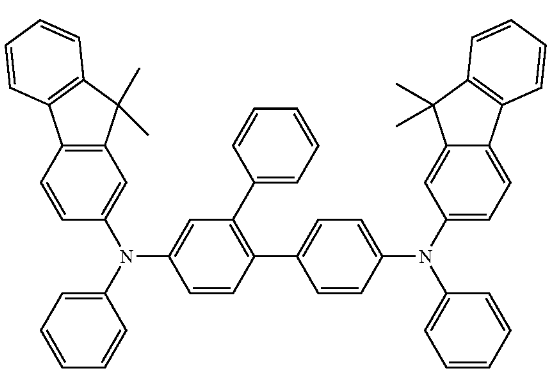
D70
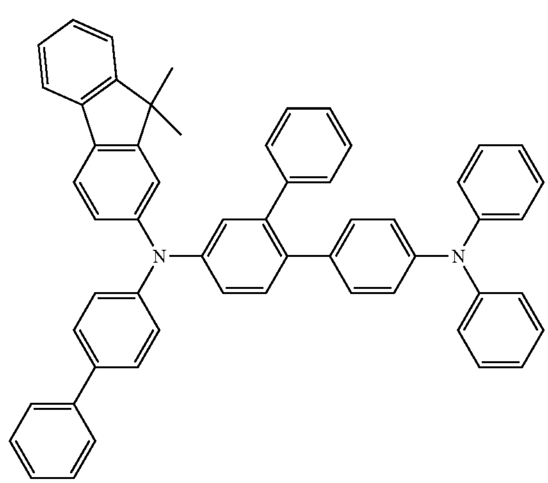

-continued
D71
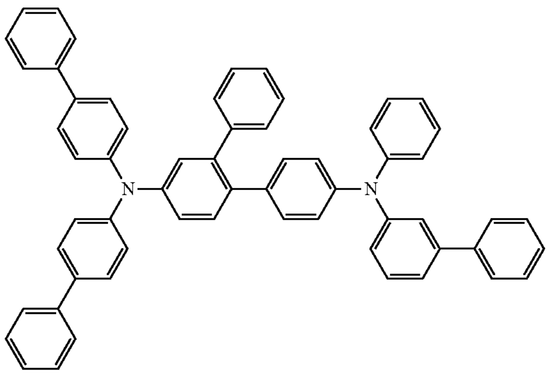
D72
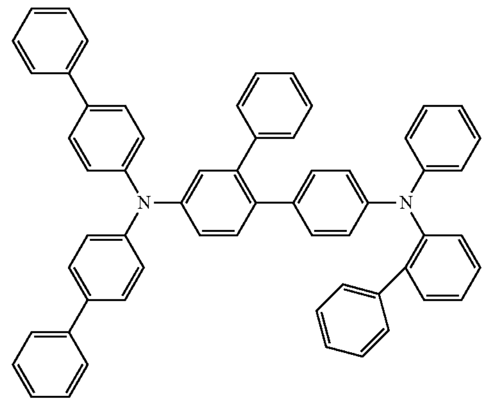
D73
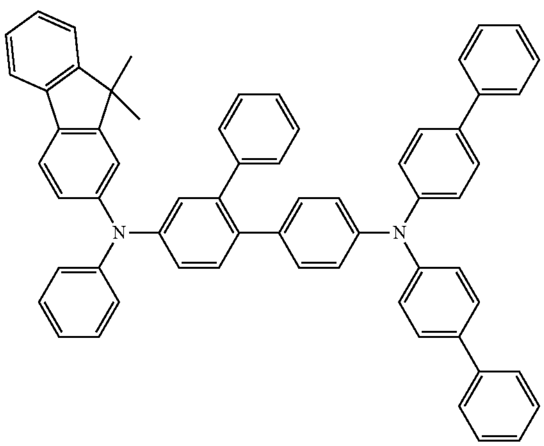
D74
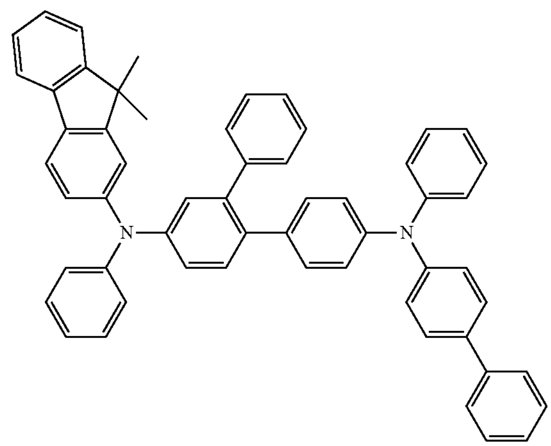
D75
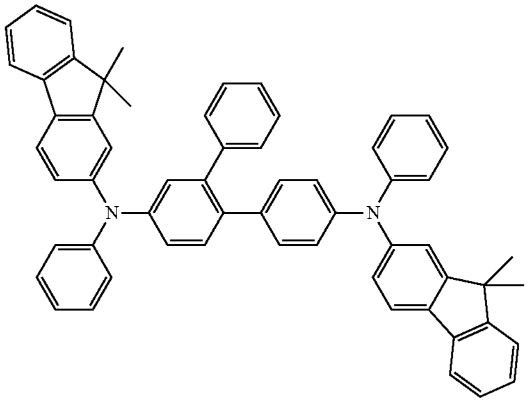
D76
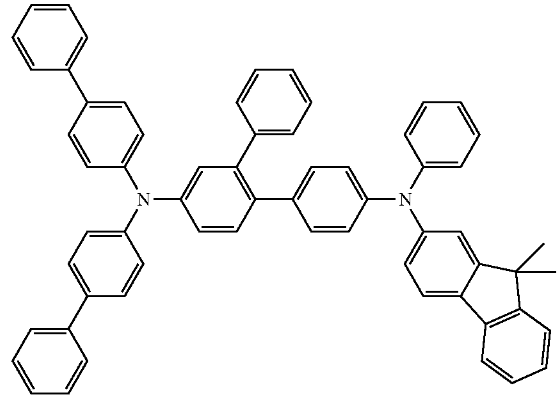

-continued
D77
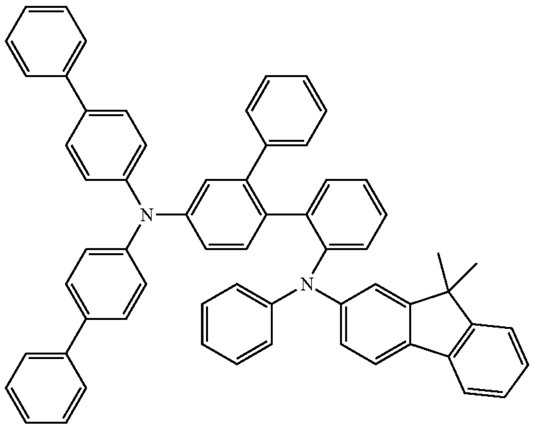
D78
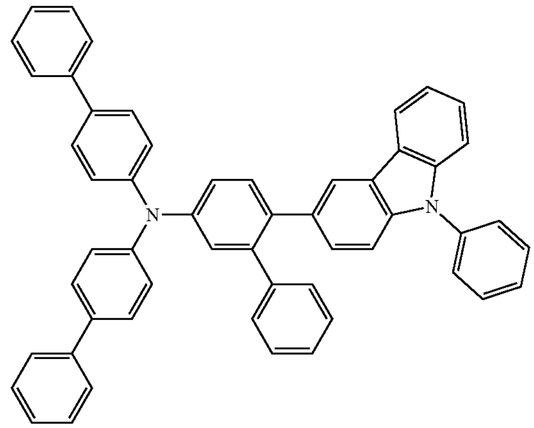
D79
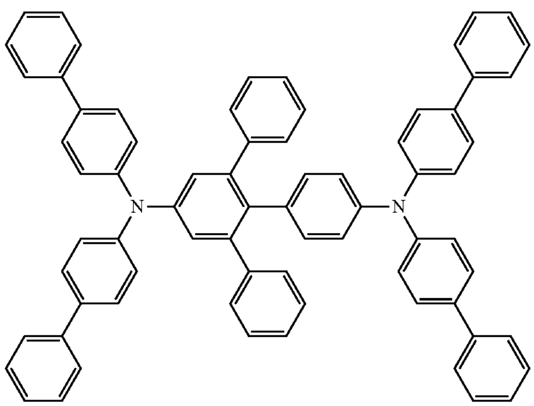
The compound of Formula D employed in the organic electroluminescent device of the present invention may be specifically selected from the compounds of Formulae D101 to D145:
D101
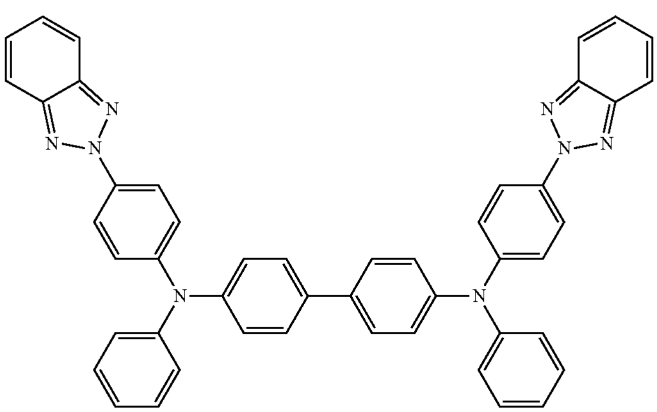

-continued
D102
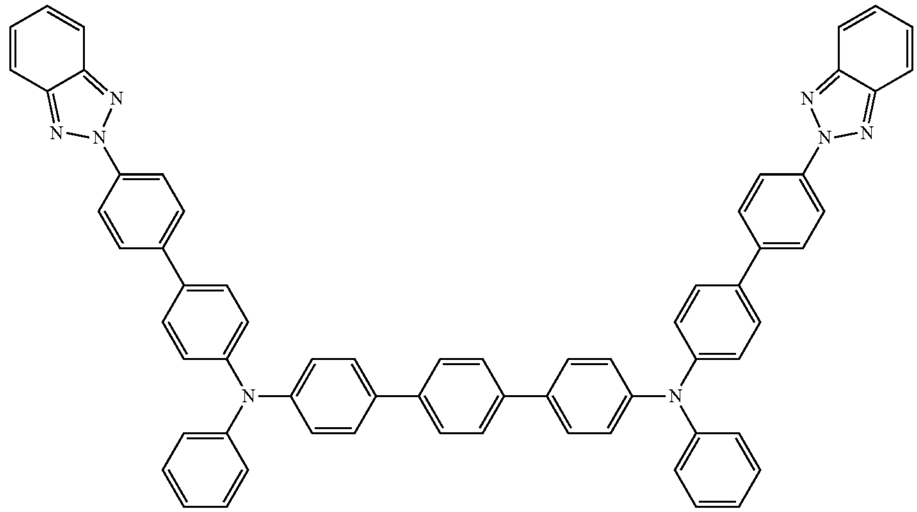
D103
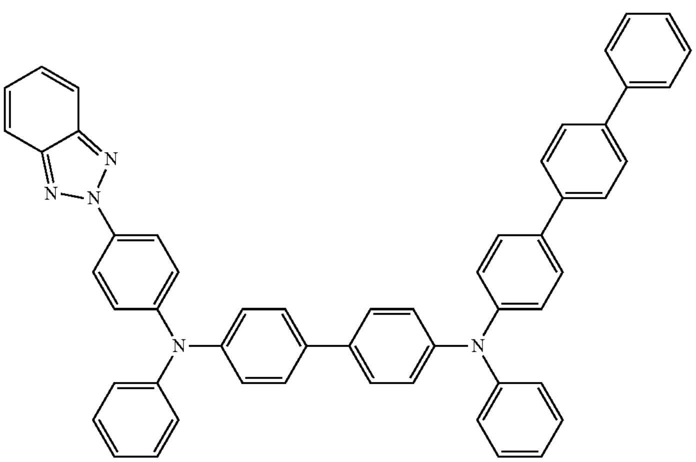
D104
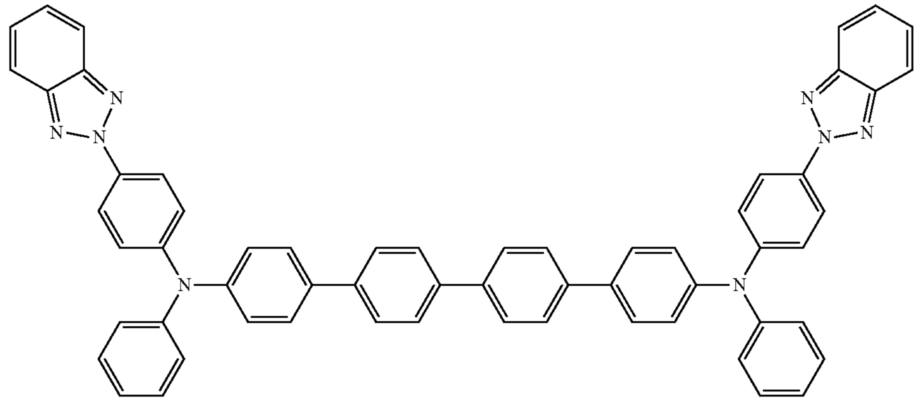

-continued
D105
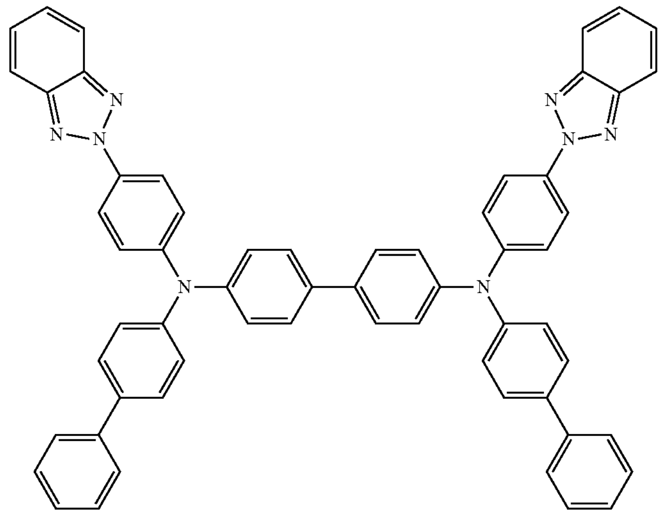
D106
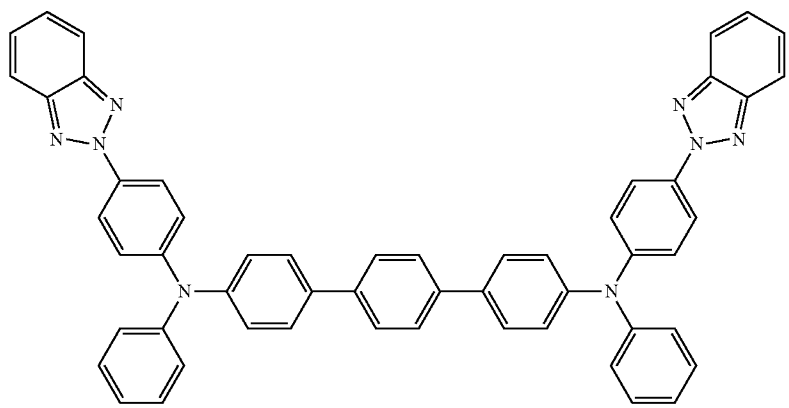
D107
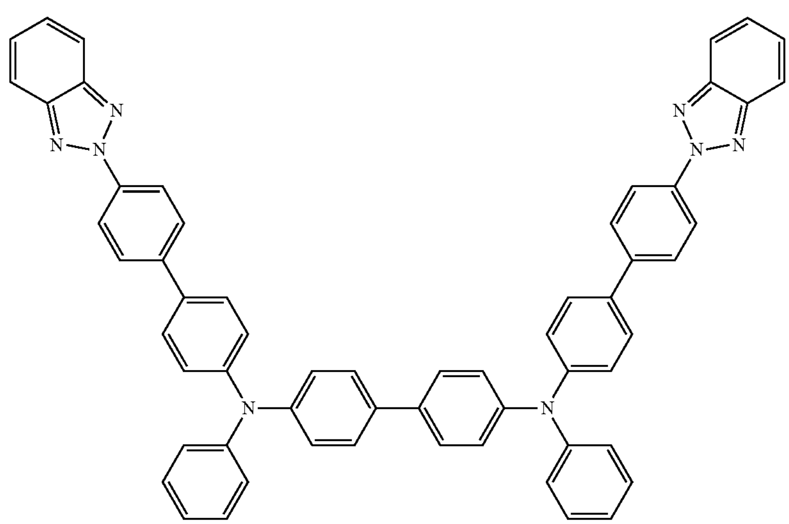

-continued
D108
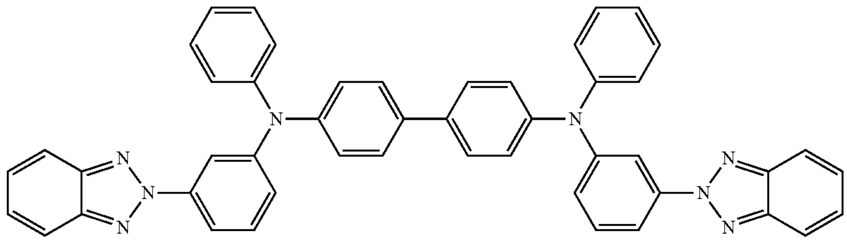
D109
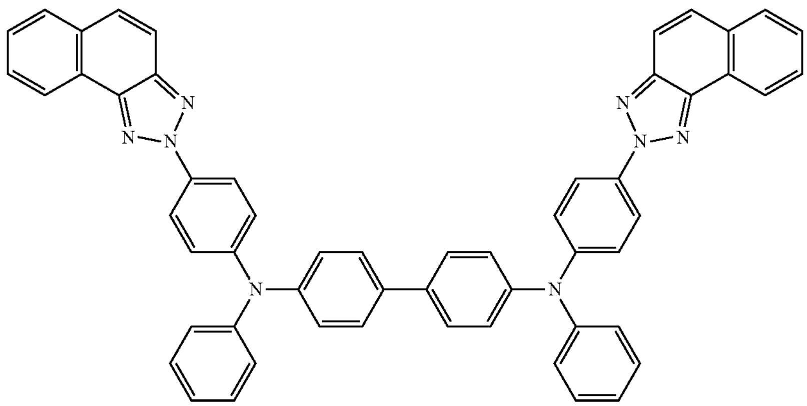
D110
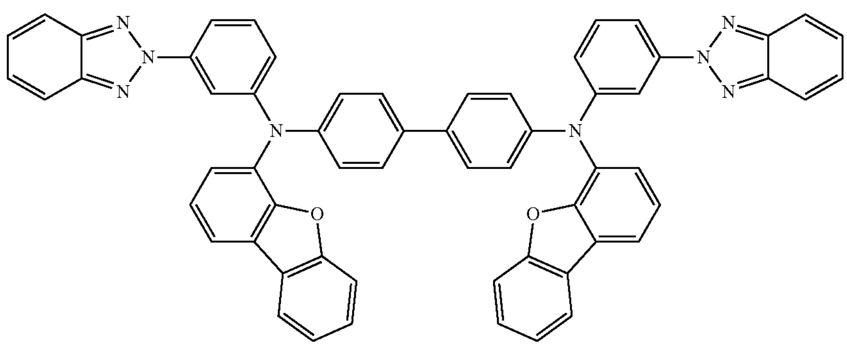
D111
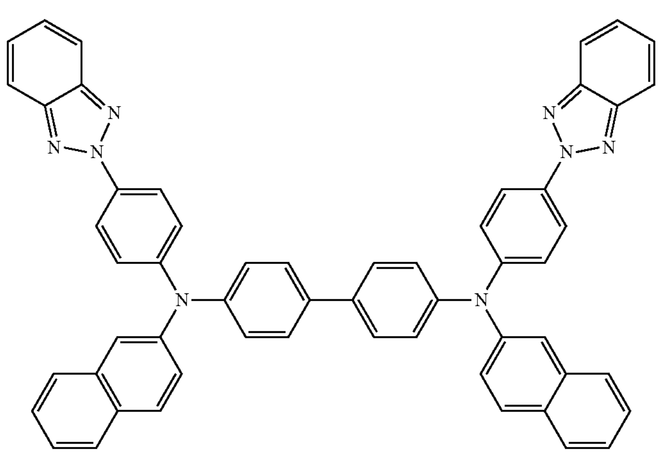

-continued
D112
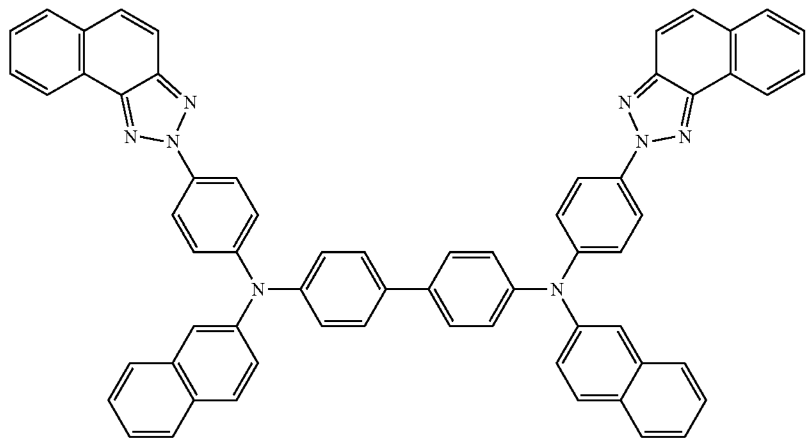
D113
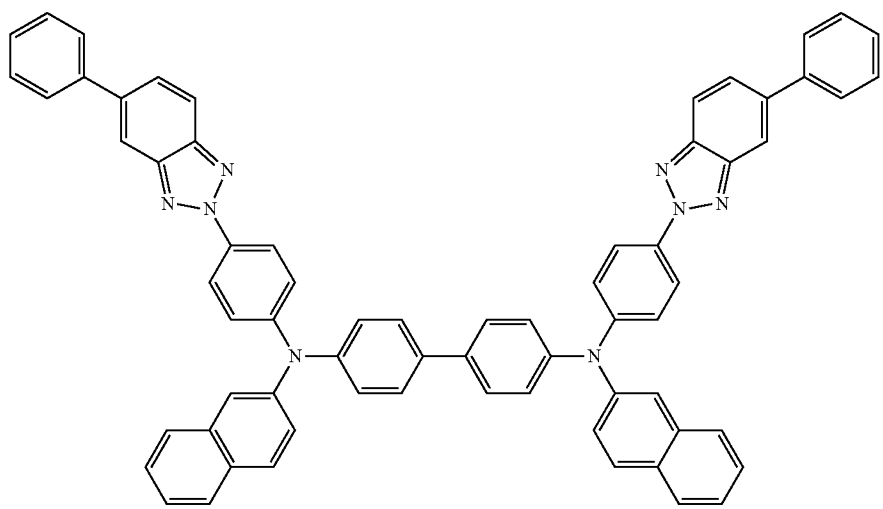
D114
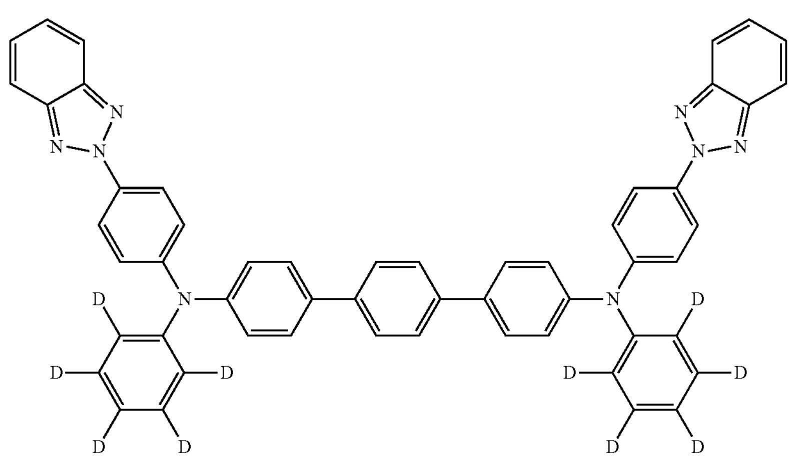

-continued
D115
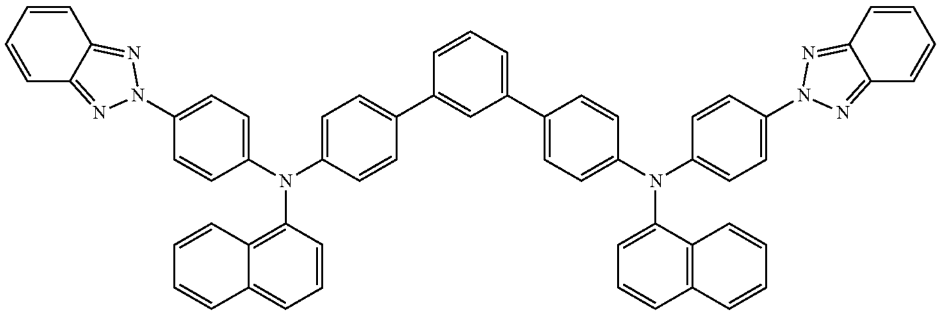
D116
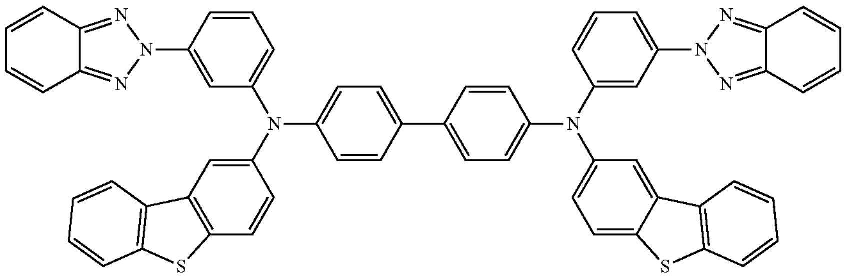
D117
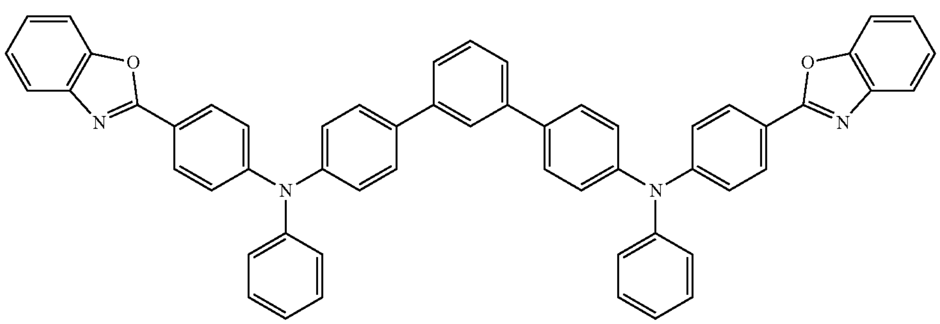
D118
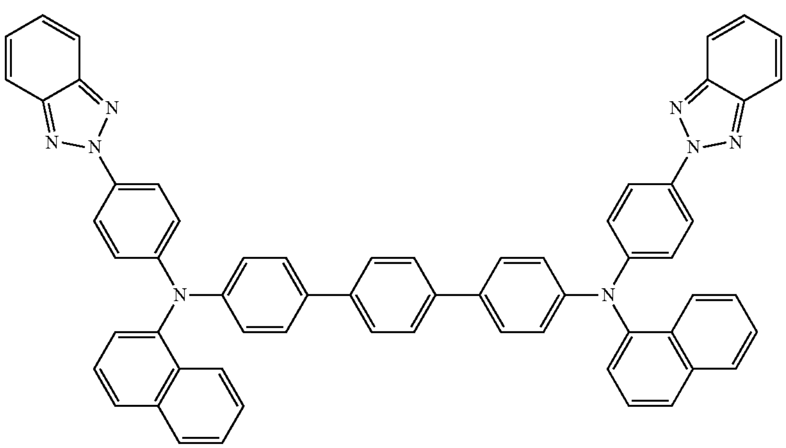

-continued
D119
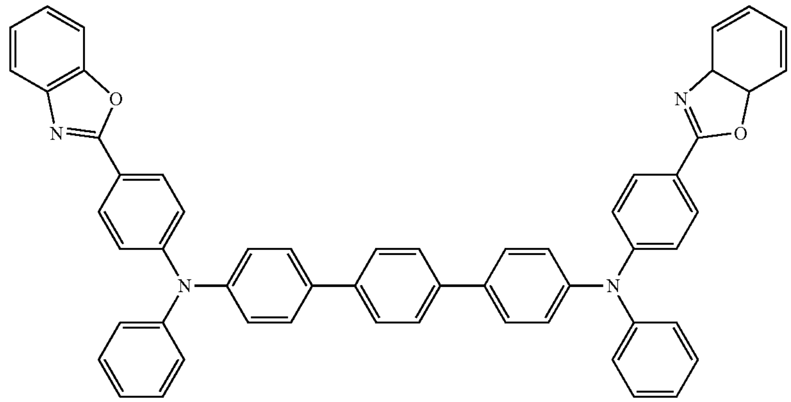
D120
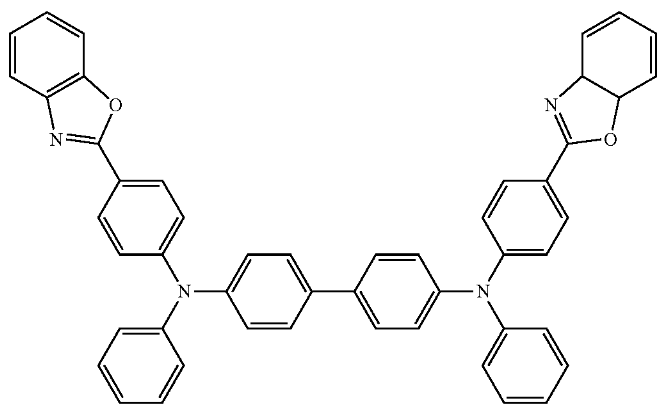
D121
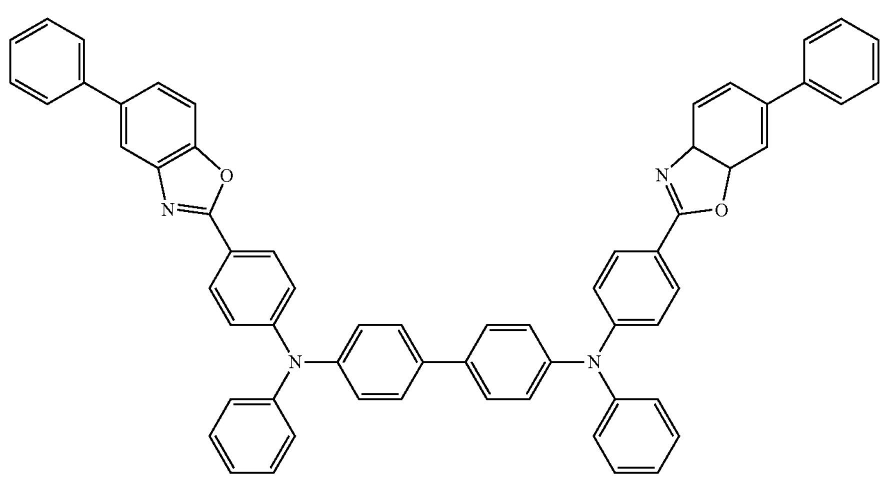

-continued
D122
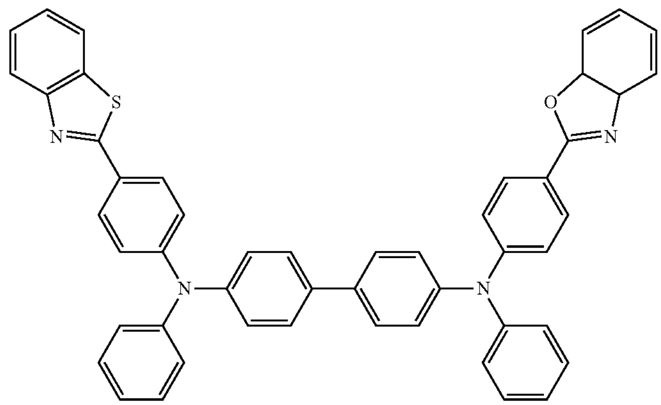
D123
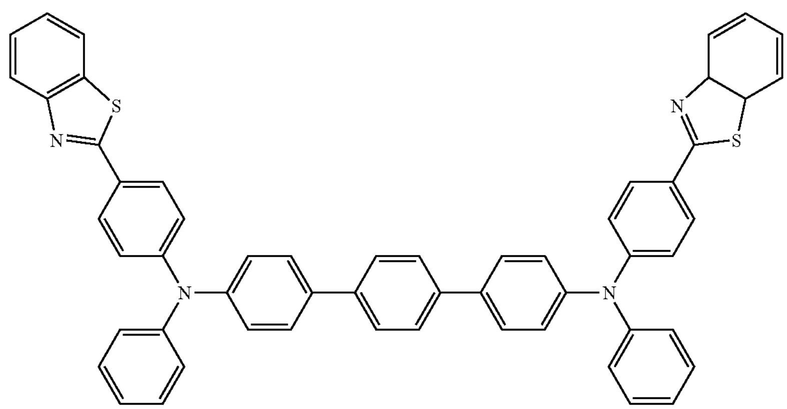
D124
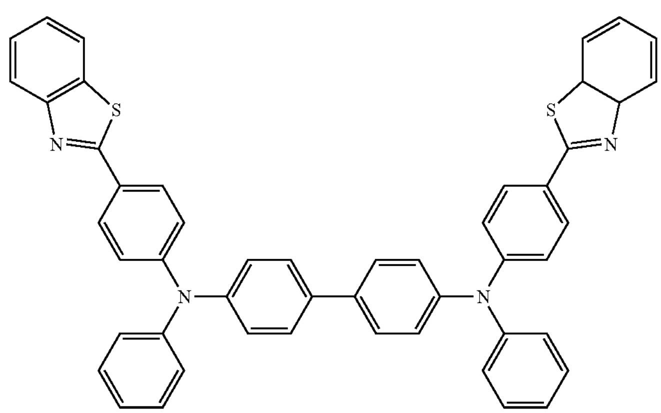
D125
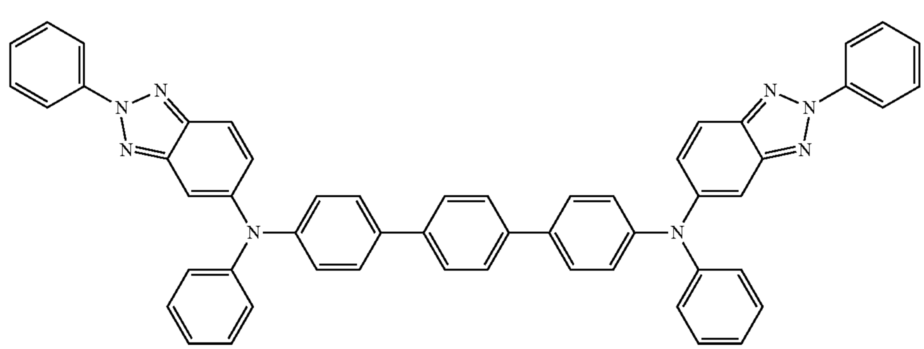

-continued
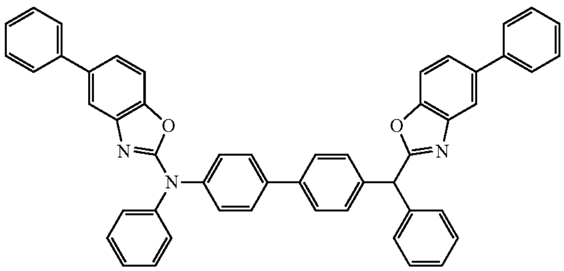
D126
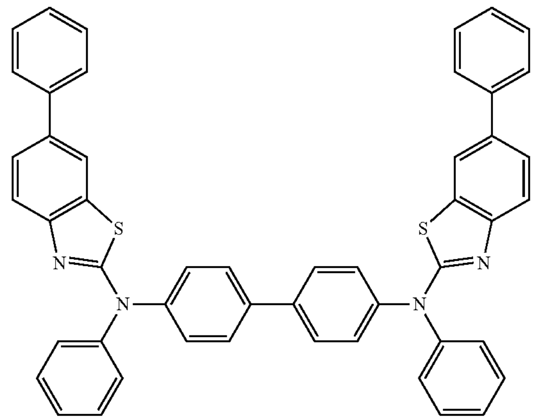
D127
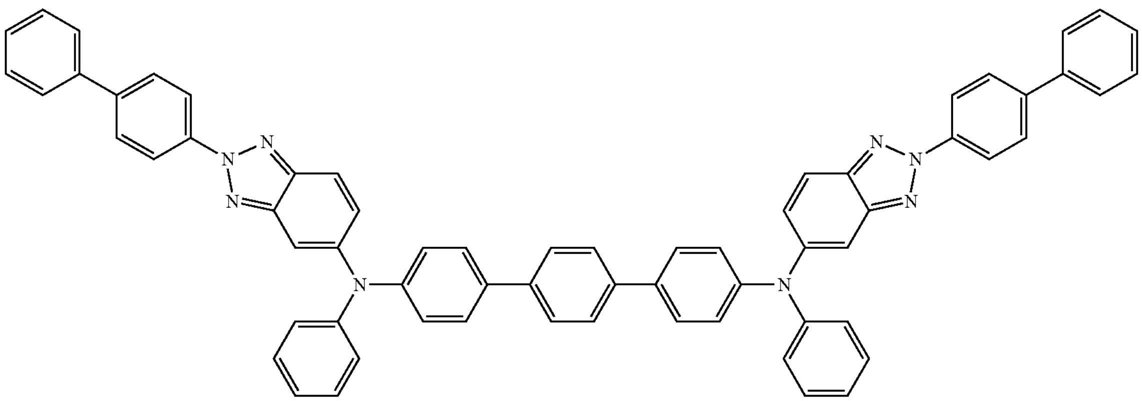
D128
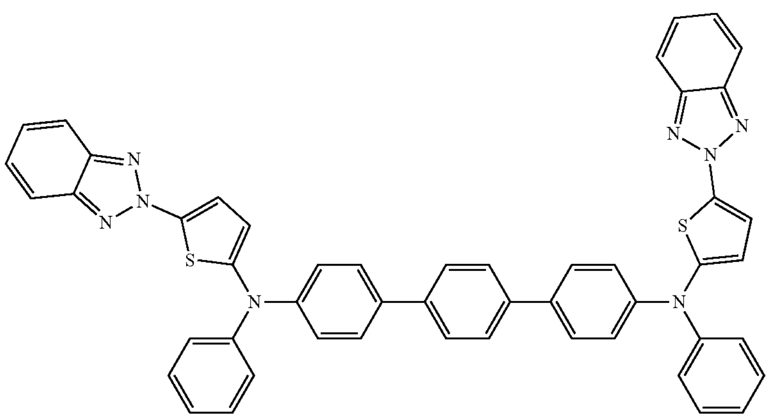
D129
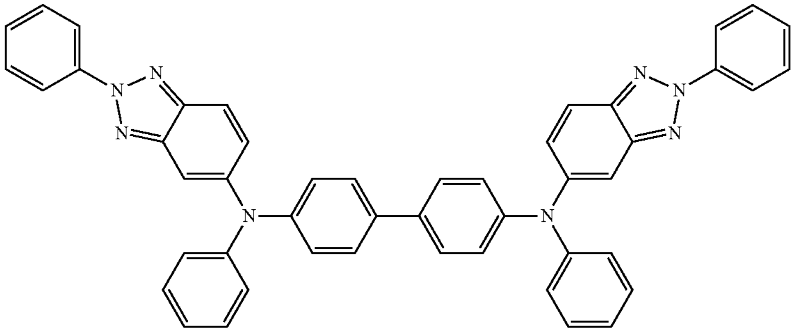
D130

-continued
D131
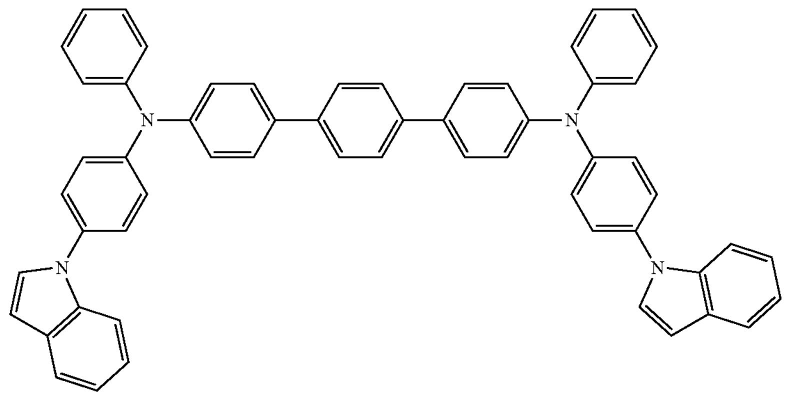
D132
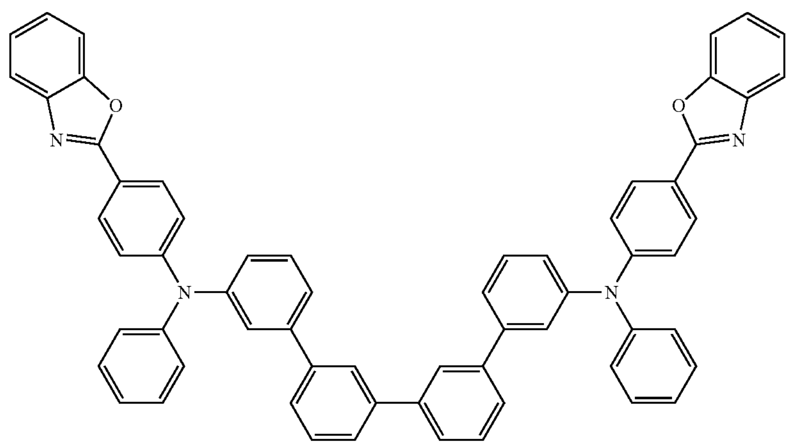
D133
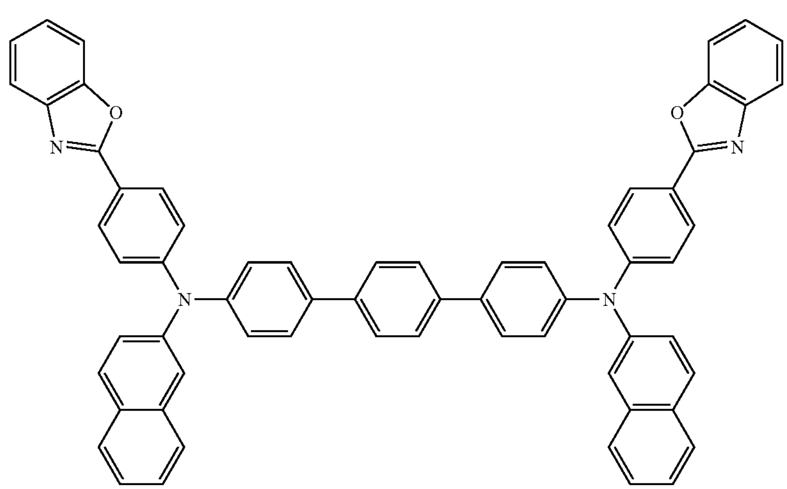

-continued
D134
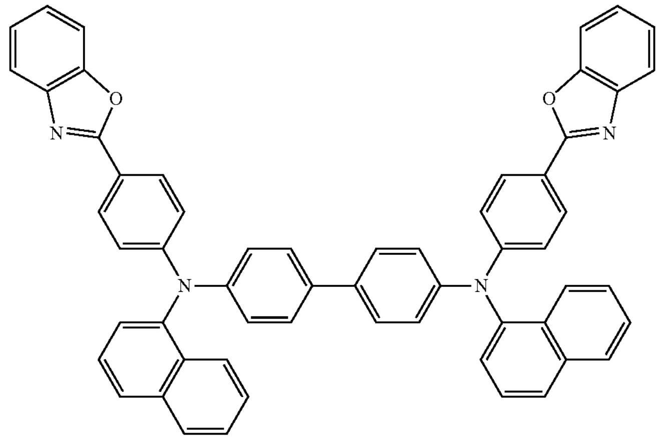
D135
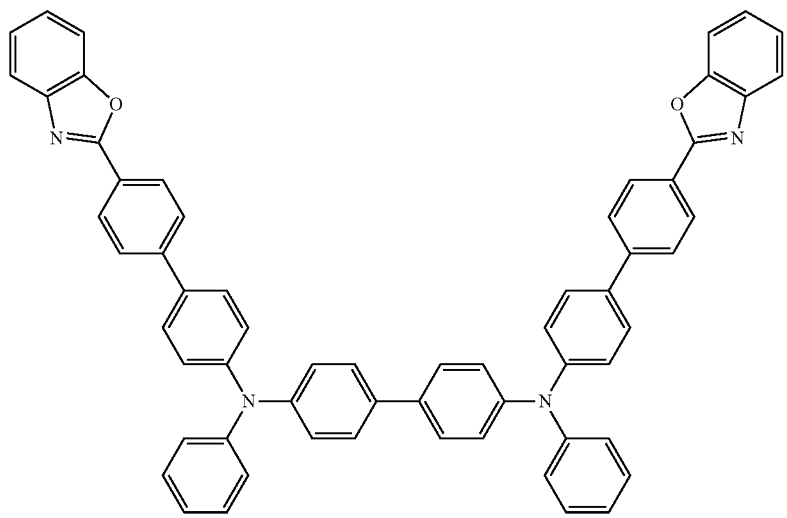
D136
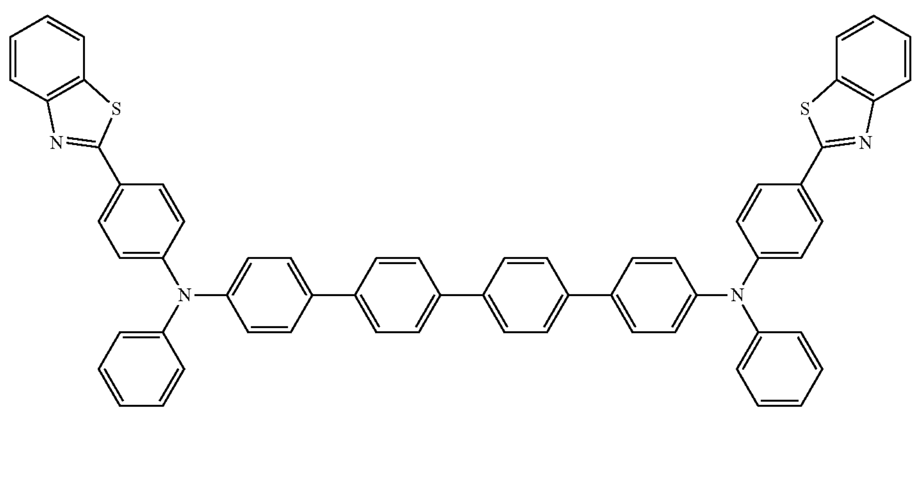

-continued
D137
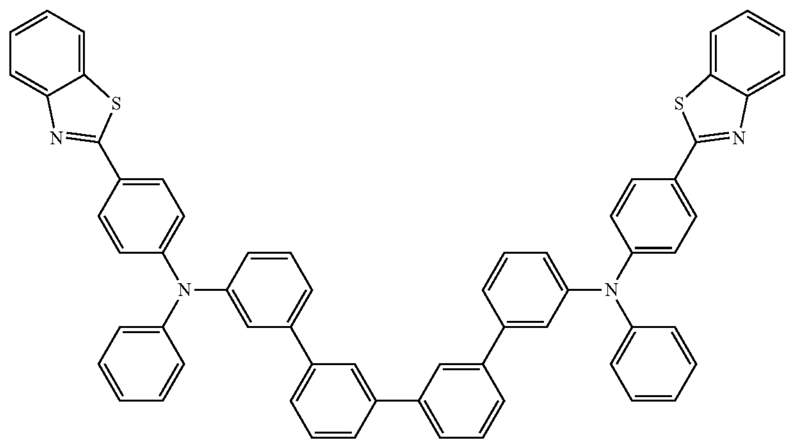
D138
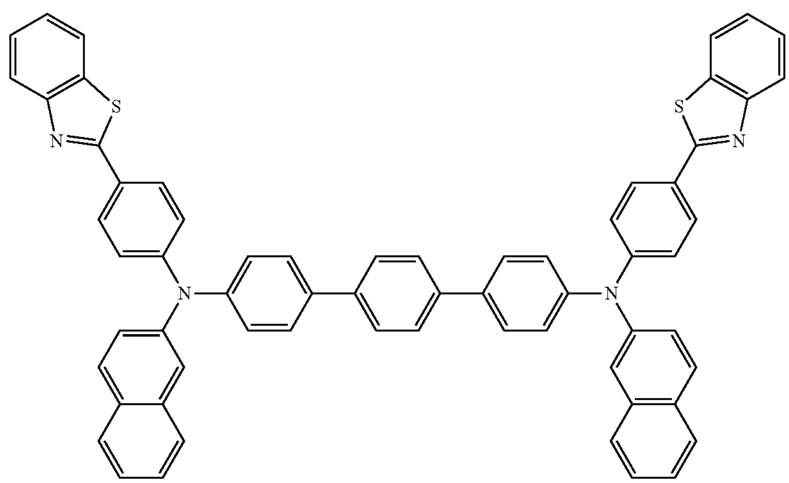
D139
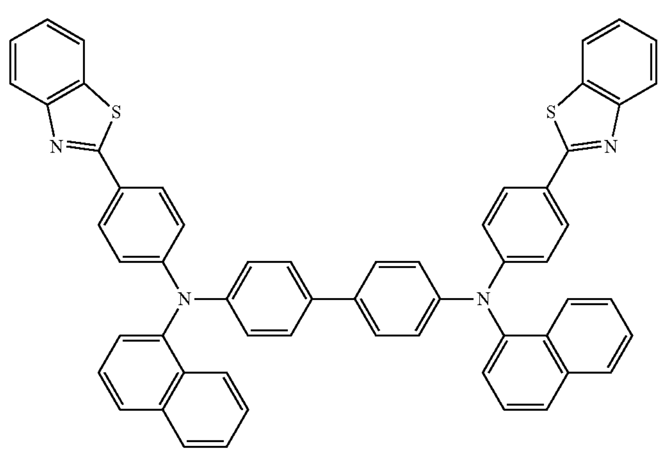

-continued
D140
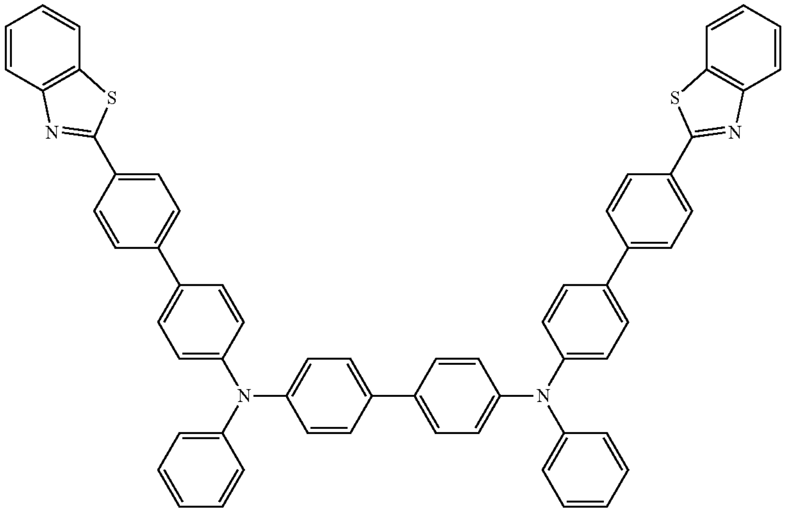
D141
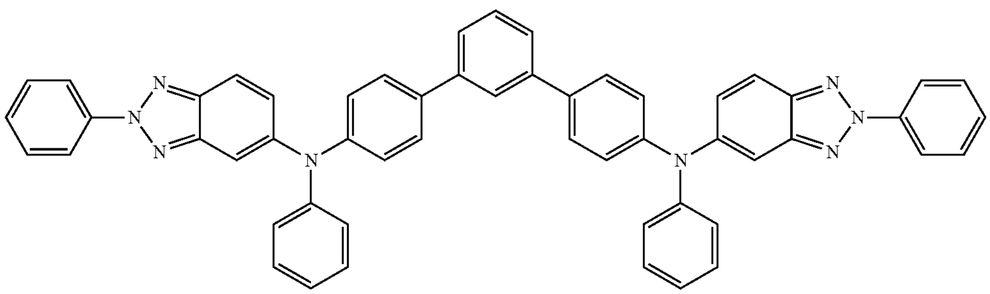
D142
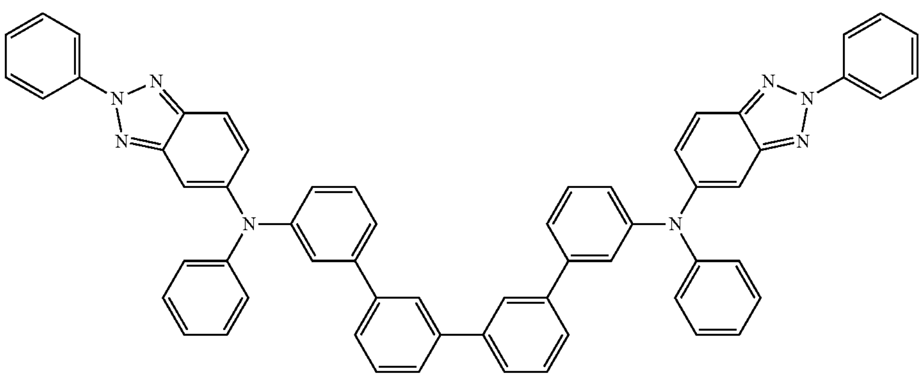
D143
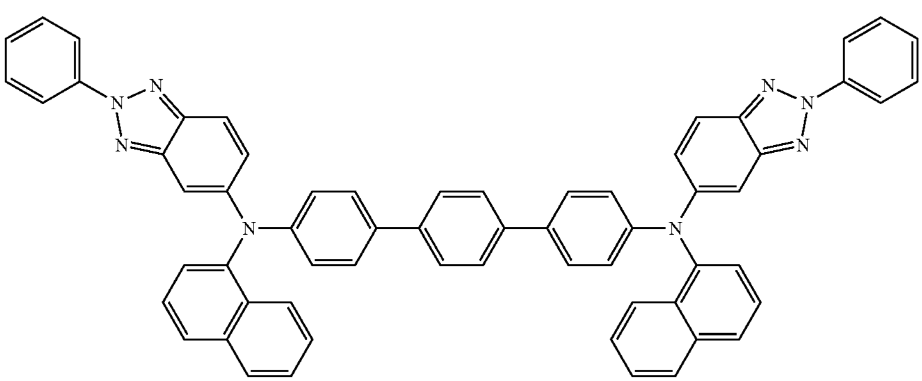

-continued

D144

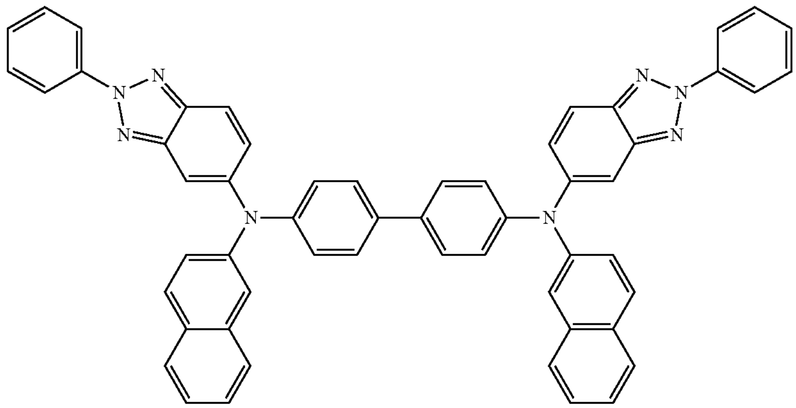

D145

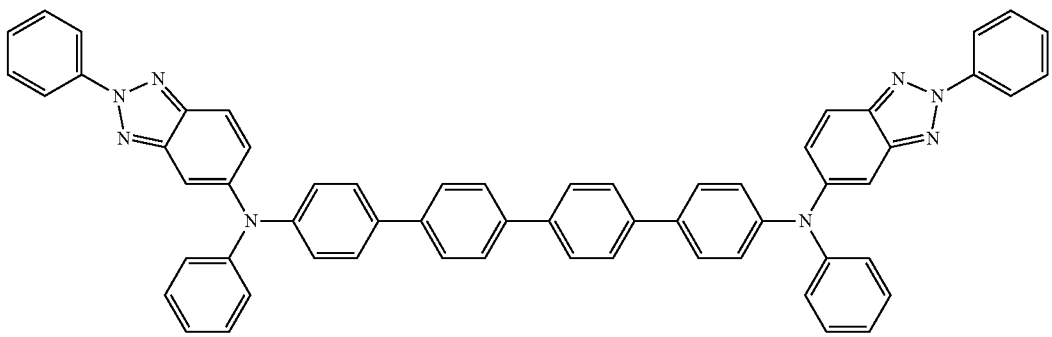

The organic electroluminescent device of the present invention may further include one or more organic layers, for example, a hole transport layer and an electron blocking layer, each of which may include a compound represented by Formula F:

(F)

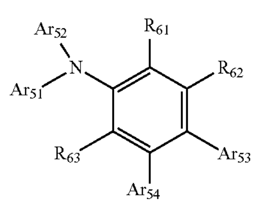

wherein $R_{61}$ to $R_{63}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, substituted or unsubstituted $C_1$-$C_{30}$ alkylgermanium, substituted or unsubstituted $C_1$-$C_{30}$ arylgermanium, cyano, nitro, and halogen, and $Ar_{51}$ to $Ar_{54}$ are identical to or different from each other and are each independently substituted or unsubstituted $C_6$-$C_{40}$ aryl or substituted or unsubstituted $C_2$-$C_{30}$ heteroaryl.

The compound of Formula F employed in the organic electroluminescent device of the present invention may be specifically selected from the compounds of Formulae F1 to F33:

F1

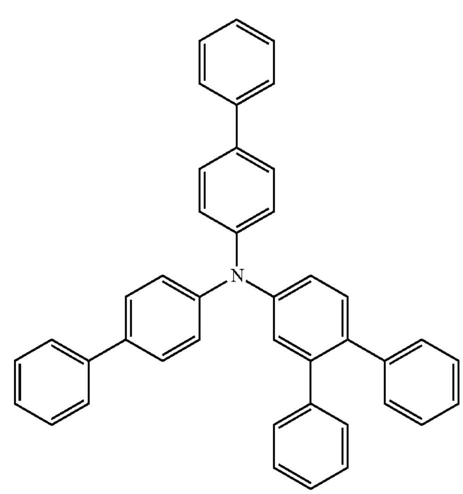

-continued
F2
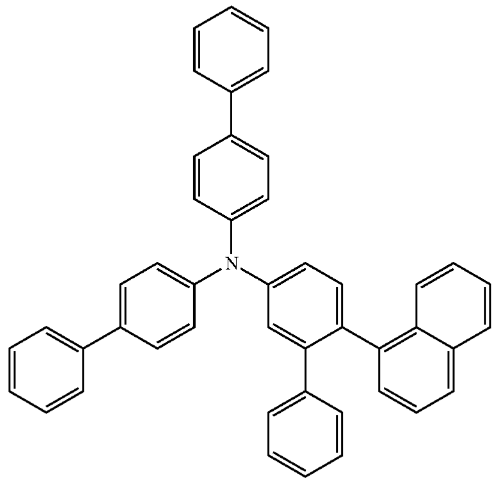
F3
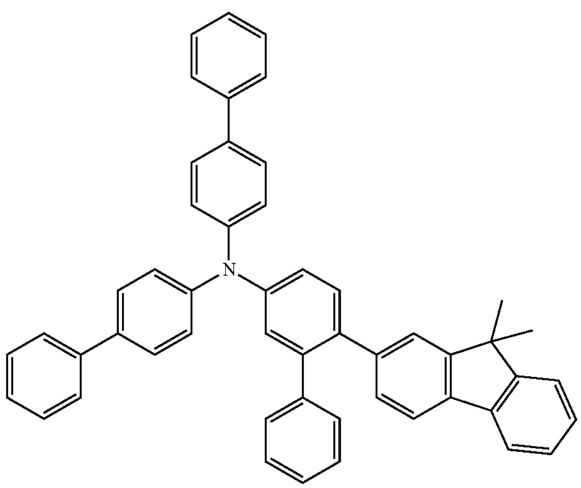
F4
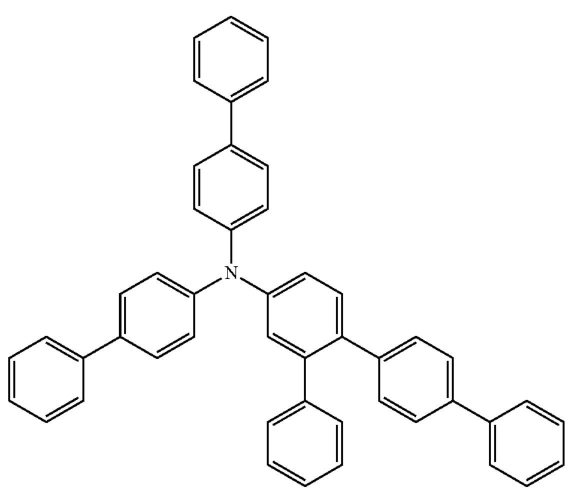
-continued
F5
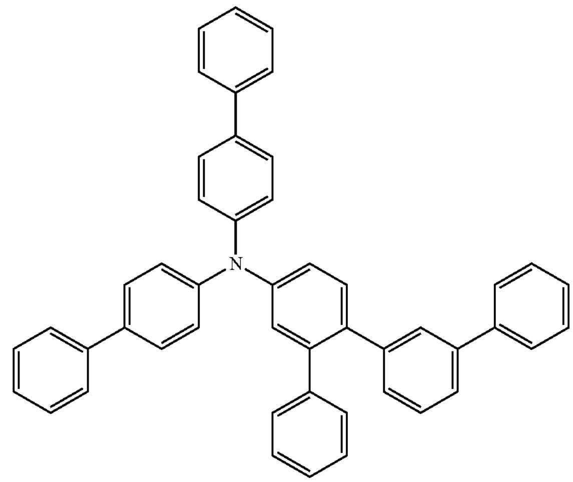
F6
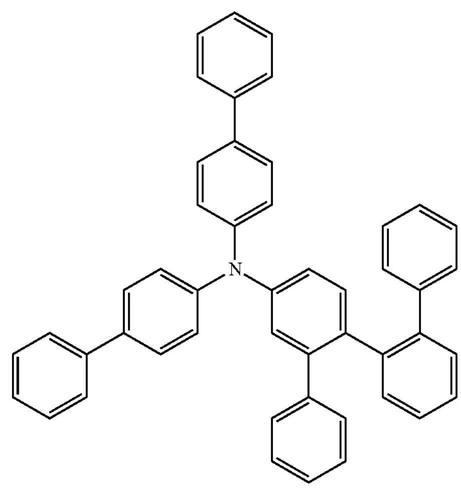
F7
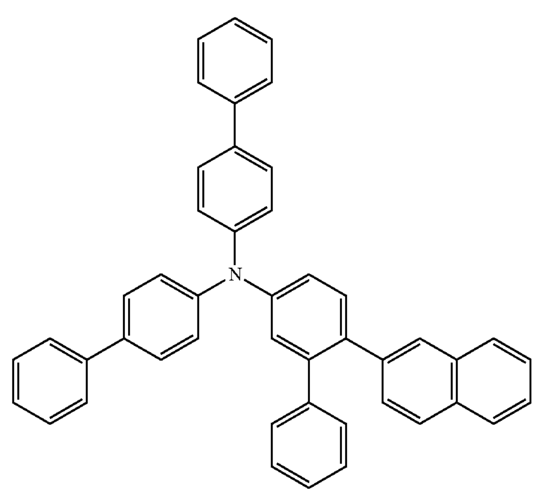

-continued
F8
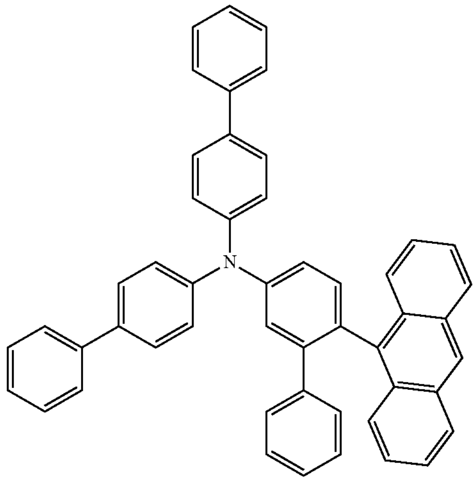
F9
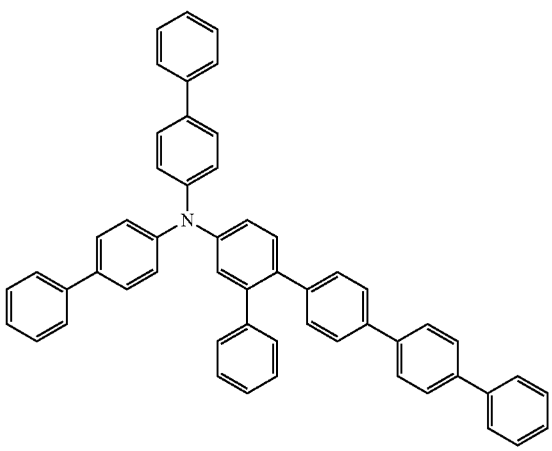
F10
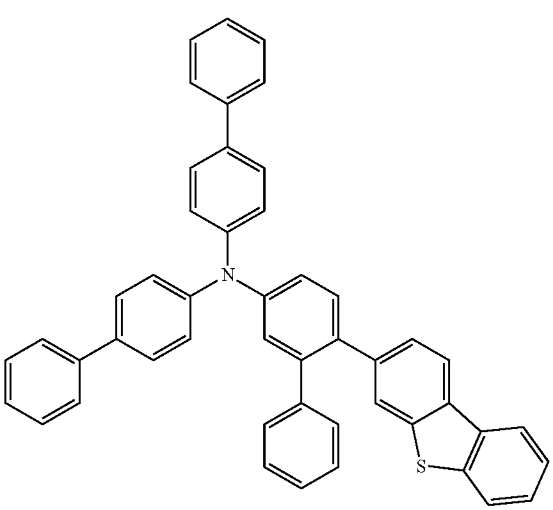
-continued
F11
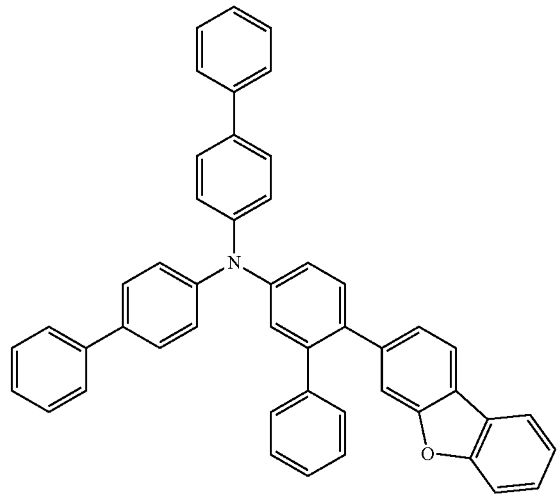
F12
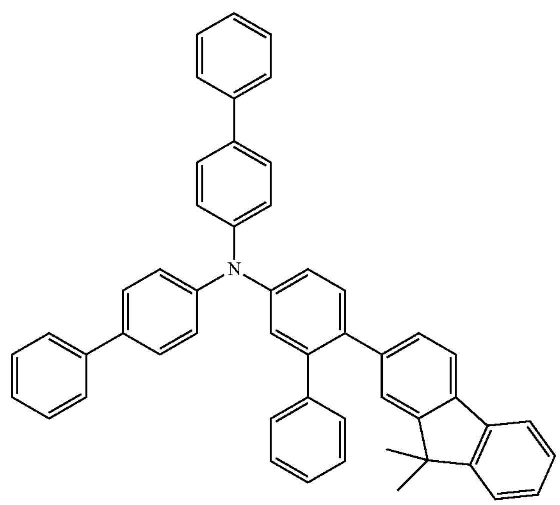
F13
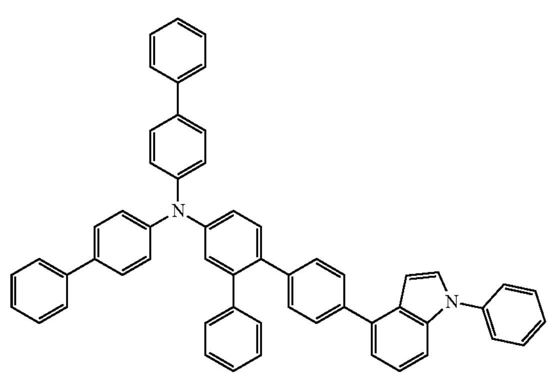

-continued
F14
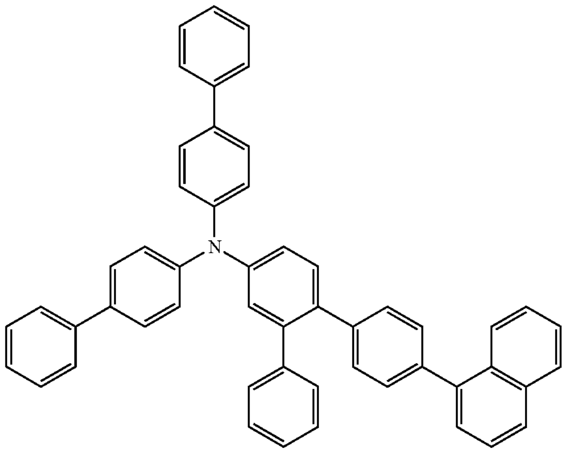
F15
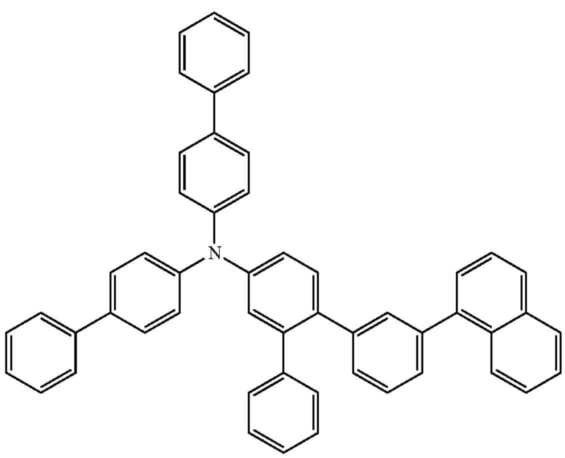
F16
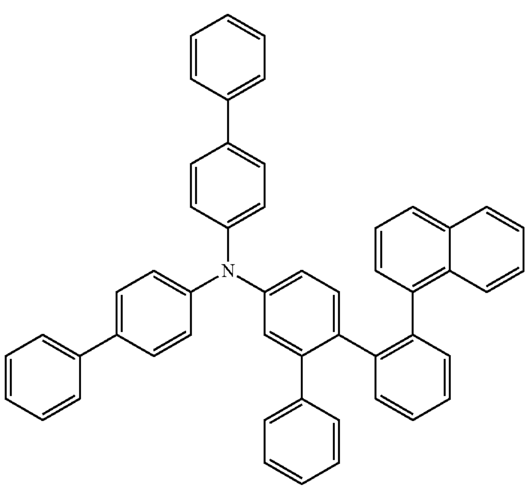
-continued
F17
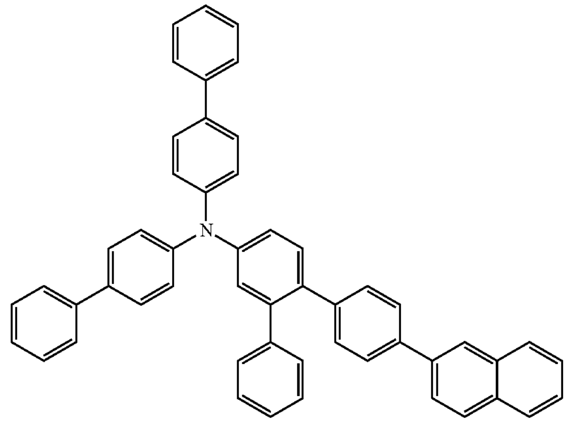
F18
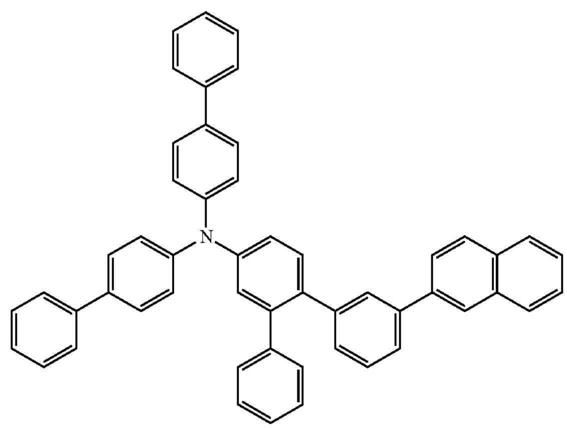
F19
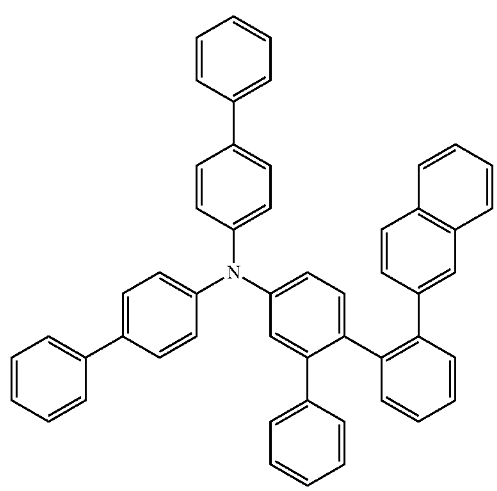

F20
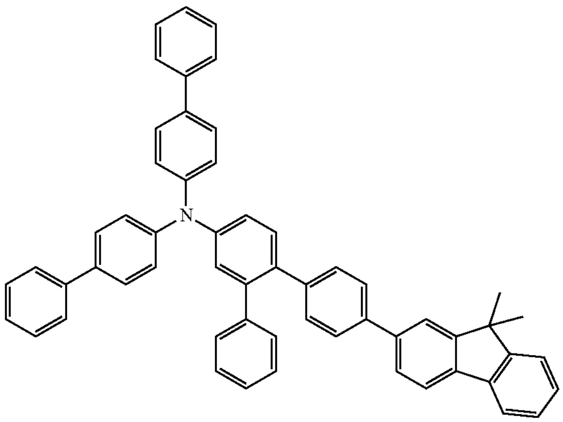
F21
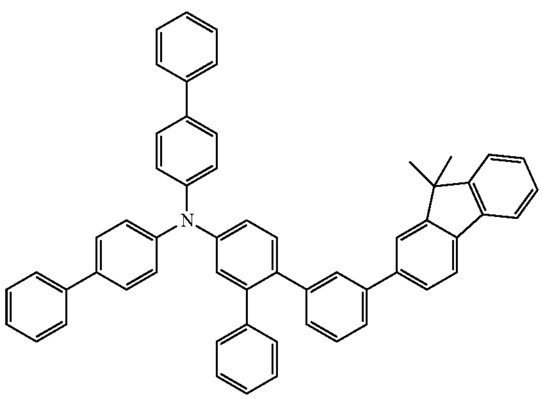
F22
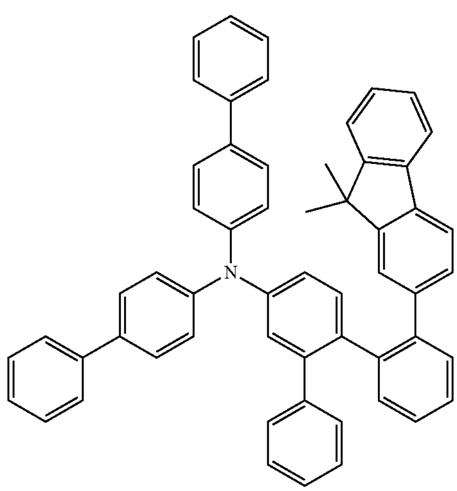
F23
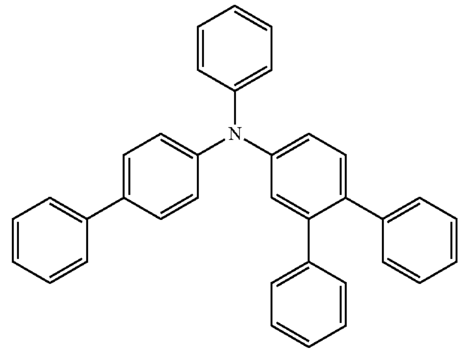
F24
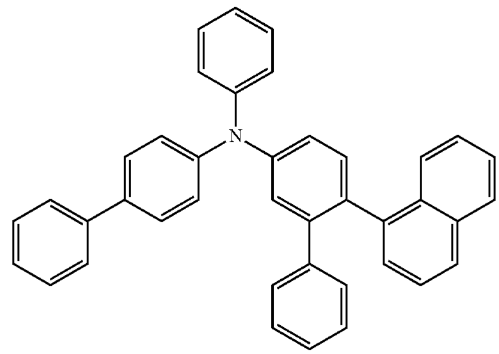
F25
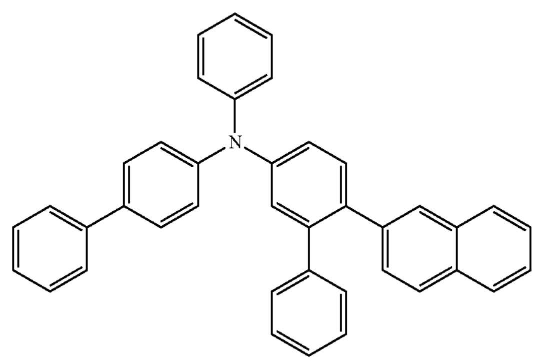
F26
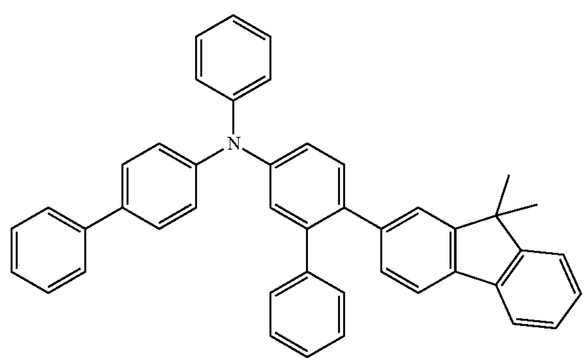

-continued
F27
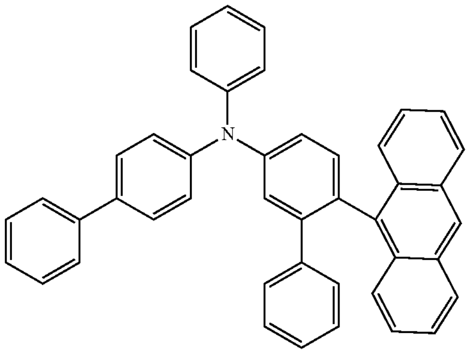
F28
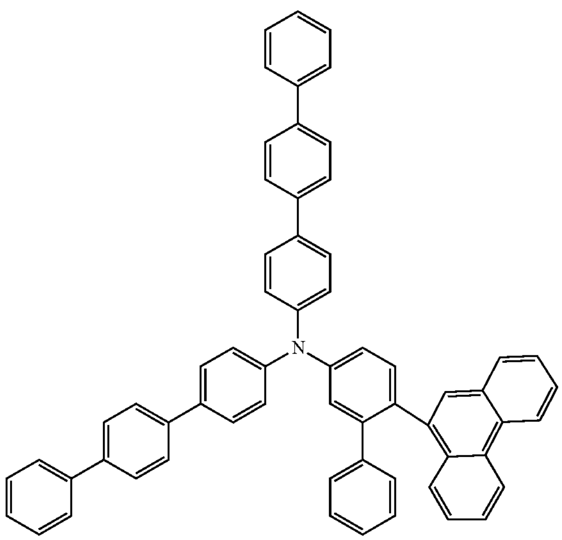
F29
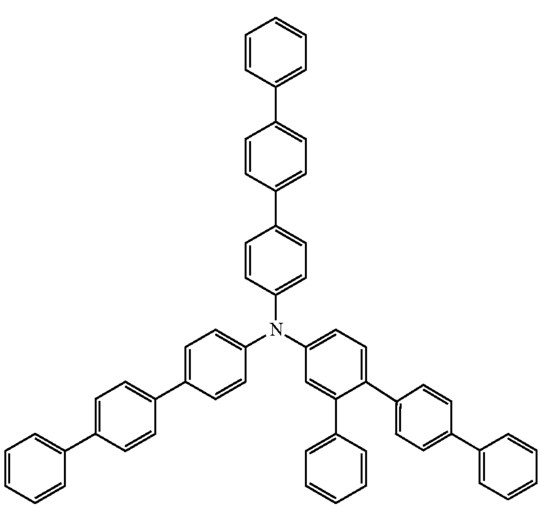
-continued
F30
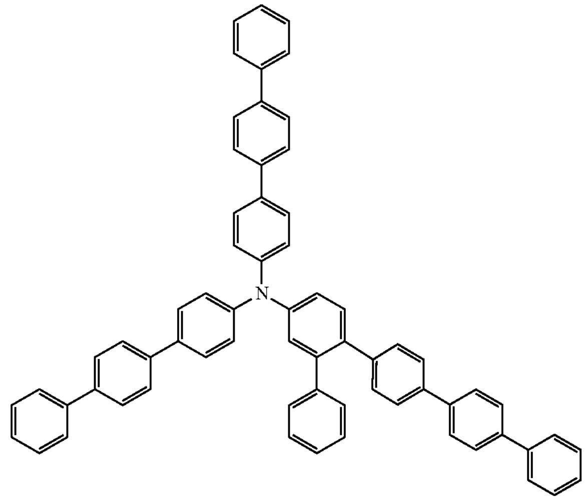
F31
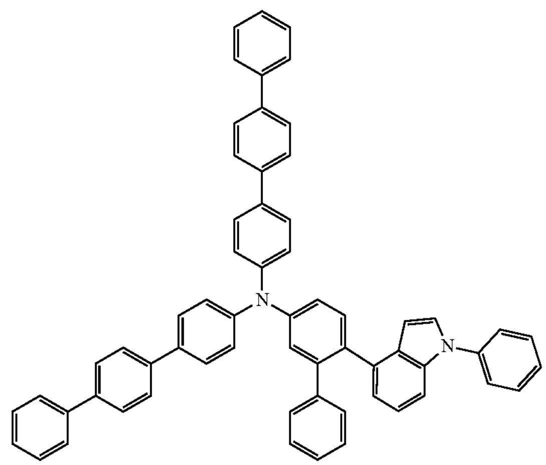
F32
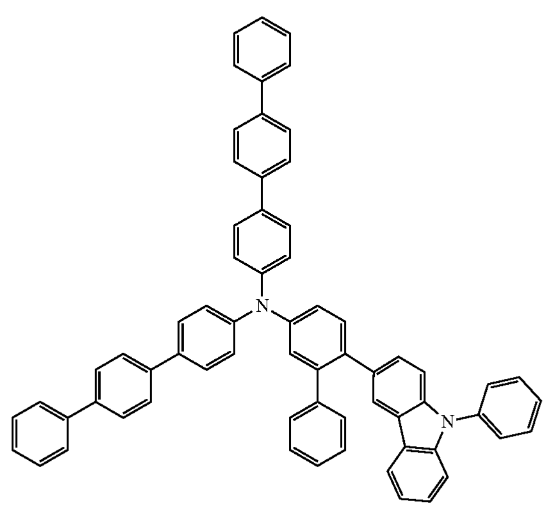

-continued

F33

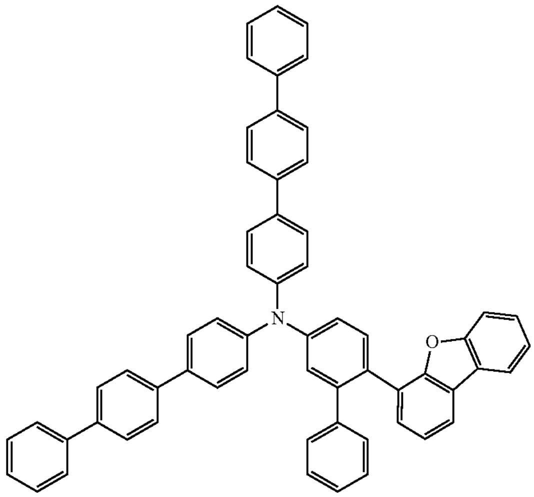

A specific structure of the organic electroluminescent device according to the present invention, a method for fabricating the device, and materials for the organic layers will be described below.

First, a material for the anode is coated on the substrate to form the anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide, such as indium tin oxide (ITO), indium zinc oxide (IZO), tin oxide ($SnO_2$) or zinc oxide (ZnO), is used as the anode material.

A material for the hole injecting layer is coated on the anode by vacuum thermal evaporation or spin coating to form the hole injecting layer. Then, a material for the hole transport layer is coated on the hole injecting layer by vacuum thermal evaporation or spin coating to form the hole transport layer.

The material for the hole injecting layer is not specially limited so long as it is usually used in the art. Specific examples of such materials include 4,4',4"-tris(2-naphthyl (phenyl)amino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), and N,N'-diphenyl-N,N'-bis[4-(phenyl-m-tolylamino)phenyl]biphenyl-4,4'-diamine (DNTPD).

The material for the hole transport layer is not specially limited so long as it is commonly used in the art. Examples of such materials include N,N'-bis(3-methylphenyl)-N,N'-diphenyl-[1,1-biphenyl]-4,4'-diamine (TPD) and N,N'-di (naphthalen-1-yl)-N,N'-diphenylbenzidine (α-NPD).

Subsequently, a hole auxiliary layer and the light emitting layer are sequentially laminated on the hole transport layer. A hole blocking layer may be optionally formed on the organic light emitting layer by vacuum thermal evaporation or spin coating. The hole blocking layer blocks holes from entering the cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited so long as it has the ability to transport electrons and a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, $BeBq_2$, OXD-7, and Liq.

The electron transport layer is deposited on the hole blocking layer by vacuum thermal evaporation or spin coating, and the electron injecting layer is formed thereon. A metal for the cathode is deposited on the electron injecting layer by vacuum thermal evaporation to form the cathode, completing the fabrication of the organic electroluminescent device.

As the metal for the formation of the cathode, there may be used, for example, lithium (Li), magnesium (Mg), aluminum (Al), aluminum-lithium (Al—Li), calcium (Ca), magnesium-indium (Mg—In) or magnesium-silver (Mg—Ag). The organic electroluminescent device may be of top emission type. In this case, a transmissive material, such as ITO or IZO, may be used to form the cathode.

The material for the electron transport layer functions to stably transport electrons injected from the cathode. The electron transport material may be any of those known in the art and examples thereof include, but are not limited to, quinoline derivatives, particularly, tris(8-quinolinolate)aluminum (Alq3), TAZ, Balq, beryllium bis(benzoquinolin-10-olate (Bebq2), ADN, and oxadiazole derivatives, such as PBD, BMD, and BND.

Each of the organic layers can be formed by a monomolecular deposition or solution process. According to the monomolecular deposition process, the material for each layer is evaporated under heat and vacuum or reduced pressure to form the layer in the form of a thin film. According to the solution process, the material for each layer is mixed with a suitable solvent, and then the mixture is formed into a thin film by a suitable method, such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

The present invention will be explained in more detail with reference to the following examples. However, it will be obvious to those skilled in the art that these examples are in no way intended to limit the scope of the invention.

Synthesis Example 1. Synthesis of Compound 1

Synthesis Example 1-1. Synthesis of Intermediate 1-a

Intermediate 1-a was Synthesized by Reaction 1:

[Reaction 1]

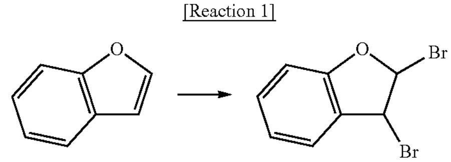

<Intermediate 1-a>

Benzofuran (50 g, 423 mmol) and dichloromethane (500 mL) were stirred in a 1 L reactor. The mixture was cooled to −10° C. and a dilute solution of bromine (67.7 g, 423 mmol) in dichloromethane (100 mL) was added dropwise thereto. The resulting mixture was stirred at 0° C. for 2 h. After completion of the reaction, the reaction mixture was added with an aqueous sodium thiosulfate solution, stirred, and extracted with ethyl acetate and $H_2O$. The organic layer was concentrated under reduced pressure and recrystallized from ethanol to afford Intermediate 1-a (100 g, yield 93%).

Synthesis Example 1-2. Synthesis of Intermediate 1-b

Intermediate 1-b was Synthesized by Reaction 2:

[Reaction 2]

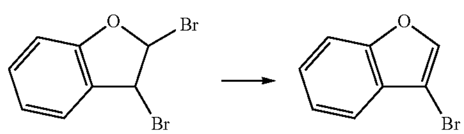

<Intermediate 1-a> <Intermediate 1-b>

Potassium hydroxide (48.6 g, 866 mmol) and ethanol (400 mL) were dissolved in a 1 L reactor and a solution of Intermediate 1-a (120 g, 433 mmol) in ethanol was added dropwise thereto at 0° C. After the dropwise addition was finished, the mixture was refluxed with stirring for 2 h. After completion of the reaction, the reaction mixture was concentrated under reduced pressure to remove the ethanol and extracted with ethyl acetate and water. The organic layer was concentrated and purified by column chromatography to afford Intermediate 1-b (42 g, yield 50%)

Synthesis Example 1-3. Synthesis of Intermediate 1-c

Intermediate 1-c was Synthesized by Reaction 3:

[Reaction 3]

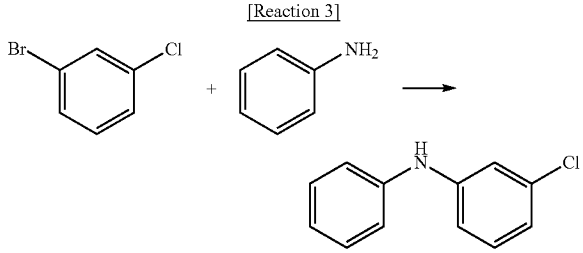

<Intermediate 1-c>

1-Bromo-3-iodobenzene (4.5 g, 16 mmol), aniline (5.8 g, 16 mmol), palladium acetate (0.1 g, 1 mmol), sodium tert-butoxide (3 g, 32 mmol), bis(diphenylphosphino)-1,1'-binaphthyl (0.2 g, 1 mmol), and toluene (45 mL) were placed in a 100 mL reactor.

The mixture was refluxed with stirring for 24 h. After completion of the reaction, the reaction mixture was filtered. The filtrate was concentrated and purified by column chromatography to afford Intermediate 1-c (5.2 g, yield 82%).

Synthesis Example 1-4. Synthesis of Intermediate 1-d

Intermediate 1-d was Synthesized by Reaction 4:

[Reaction 4]

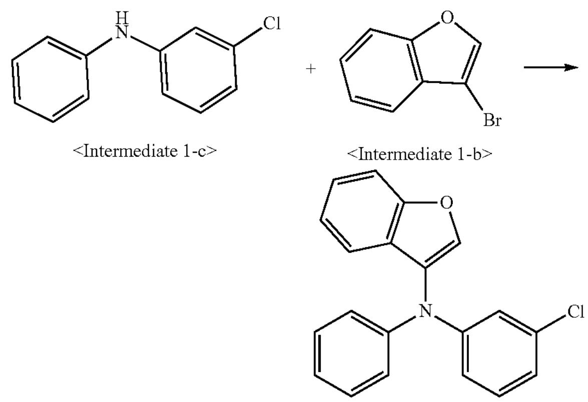

<Intermediate 1-c> <Intermediate 1-b>

<Intermediate 1-d>

Intermediate 1-c (20 g, 98 mmol), Intermediate 1-b (18.4 g, 98 mmol), palladium acetate (0.5 g, 2 mmol), sodium tert-butoxide (18.9 g, 196 mmol), tri-tert-butylphosphine (0.8 g, 4 mmol), and toluene (200 mL) were placed in a 250 mL reactor. The mixture was refluxed with stirring for 5 h. After completion of the reaction, the reaction mixture was filtered. The filtrate was concentrated and purified by column chromatography to afford Intermediate 1-d (22 g, yield 75%)

Synthesis Example 1-5. Synthesis of Intermediate 1-e

Intermediate 1-e was Synthesized by Reaction 5:

[Reaction 5]

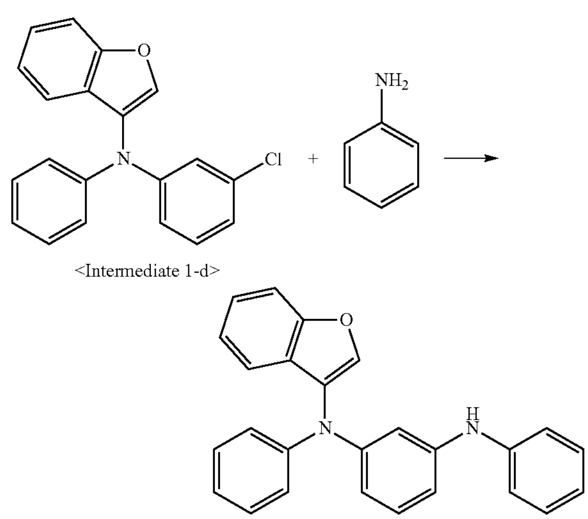

<Intermediate 1-d>

<Intermediate 1-e>

Intermediate 1-e (18.5 g, yield 74.1%) was synthesized in the same manner as in Synthesis Example 1-3, except that Intermediate 1-d was used instead of 1-bromo-4-iodobenzene.

Synthesis Example 1-6. Synthesis of Intermediate 1-f

Intermediate 1-f was Synthesized by Reaction 6:

[Reaction 6]

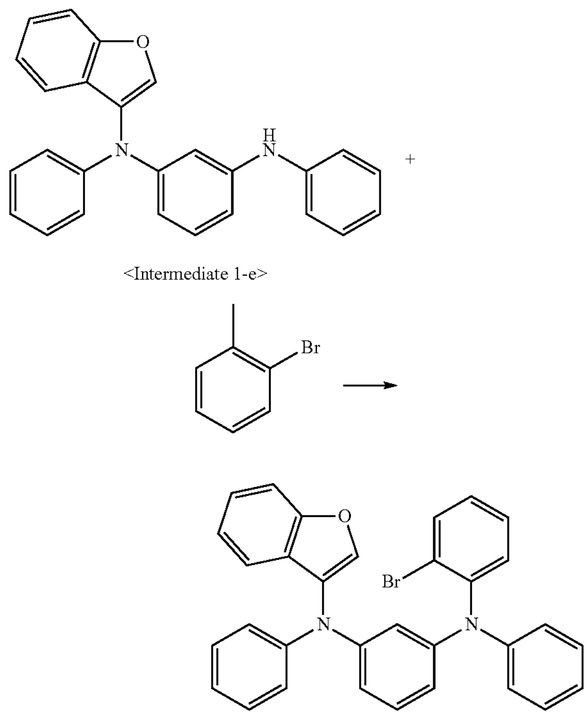

<Intermediate 1-e>

<Intermediate 1-f>

Intermediate 1-f (12 g, yield 84.1%) was synthesized in the same manner as in Synthesis Example 1-4, except that Intermediate 1-e and 1-bromo-2-iodobenzene were used instead of Intermediate 1-c and Intermediate 1-b.

Synthesis Example 1-7. Synthesis of Compound 1

Compound 1 was Synthesized by Reaction 7:

[Reaction 7]

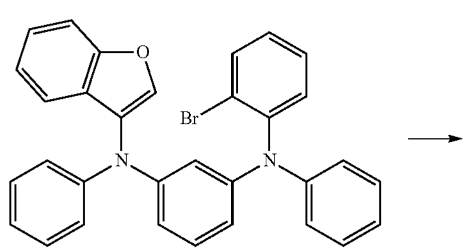

-continued

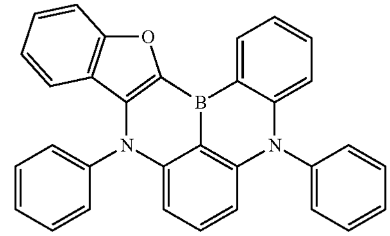

<Compound 1>

Intermediate 1-f (12 g, 23 mmol) and tert-butylbenzene (120 mL) were placed in a 300 mL reactor, and n-butyllithium (42.5 mL, 68 mmol) was added dropwise thereto at −78° C. After the dropwise addition was finished, the mixture was stirred at 60° C. for 3 h. Thereafter, the reactor was flushed with nitrogen at 60° C. to remove heptane. After dropwise addition of boron tribromide (11.3 g, 45 mmol) at −78° C., the resulting mixture was stirred at room temperature for 1 h and N,N-diisopropylethylamine (5.9 g, 45 mmol) was added dropwise thereto at 0° C. After the dropwise addition was finished, the mixture was stirred at 120° C. for 2 h. After completion of the reaction, the reaction mixture was added with an aqueous sodium acetate solution at room temperature, stirred, and extracted with ethyl acetate. The organic layer was concentrated and purified by column chromatography to give Compound 1 (0.8 g, yield 13%).

MS (MALDI-TOF): m/z 460.17 [$M^+$]

Synthesis Example 2. Synthesis of Compound 2

Synthesis Example 2-1. Synthesis of Intermediate 2-a

Intermediate 2-a was Synthesized by Reaction 8:

[Reaction 8]

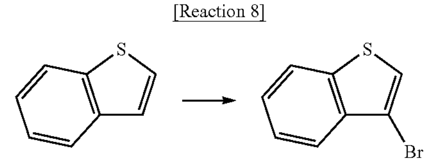

<Intermediate 2-a>

Benzothiophene (50 g, 373 mmol) and chloroform (500 mL) were stirred in a 1 L reactor. The mixture was cooled to −0° C. and a dilute solution of bromine (59.5 g, 373 mmol) in chloroform (100 mL) was added dropwise thereto. After the dropwise addition was finished, the resulting mixture was stirred at room temperature for 4 h. After completion of the reaction, the reaction mixture was added with an aqueous sodium thiosulfate solution, stirred, and extracted with ethyl acetate and $H_2O$. The organic layer was concentrated under reduced pressure and purified by column chromatography to afford Intermediate 2-a (70 g, yield 91%)

Synthesis Example 2-2. Synthesis of Intermediate 2-b

Intermediate 2-b was Synthesized by Reaction 9:

[Reaction 9]

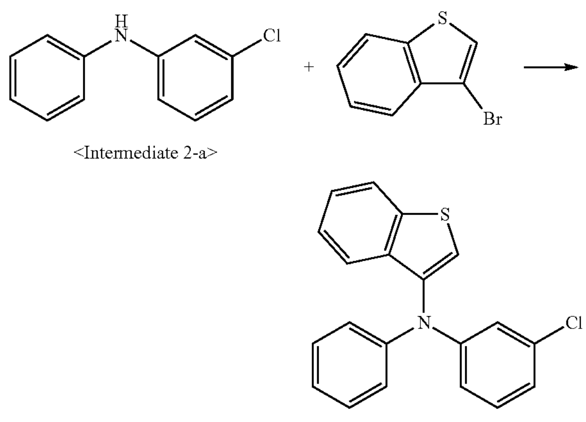

Intermediate 2-b (32 g, yield 75.4%) was synthesized in the same manner as in Synthesis Example 1-4, except that Intermediate 2-a was used instead of Intermediate 1-b.

Synthesis Example 2-3. Synthesis of Intermediate 2-c

Intermediate 2-c was Synthesized by Reaction 10:

[Reaction 10]

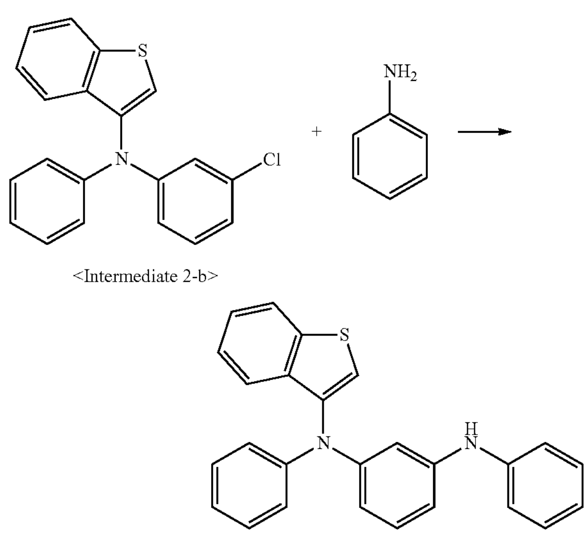

Intermediate 2-c (24.5 g, yield 73.1%) was synthesized in the same manner as in Synthesis Example 1-3, except that Intermediate 2-b was used instead of 1-bromo-4-iodobenzene.

Synthesis Example 2-4. Synthesis of Intermediate 2-d

Intermediate 2-d was Synthesized by Reaction 11:

[Reaction 11]

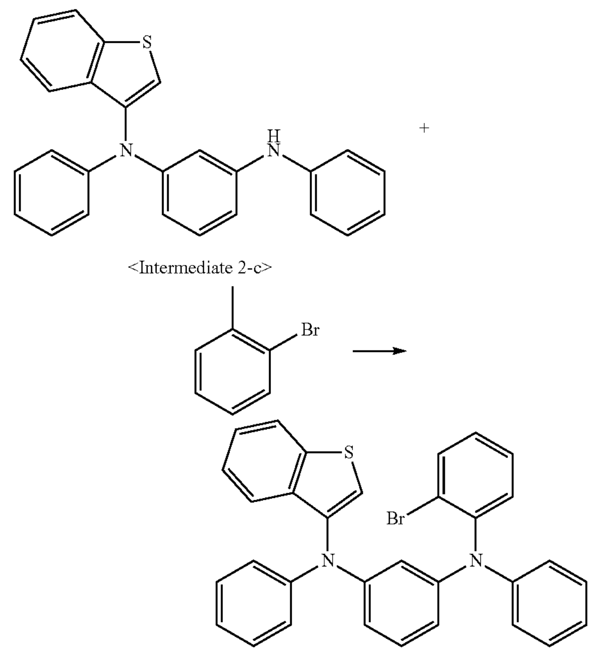

Intermediate 2-d (21 g, yield 77.5%) was synthesized in the same manner as in Synthesis Example 1-4, except that Intermediate 2-c and 1-bromo-2-iodobenzene were used instead of Intermediate 1-c and Intermediate 1-b.

Synthesis Example 2-5. Synthesis of Compound 2

Compound 2 was Synthesized by Reaction 12:

[Reaction 12]

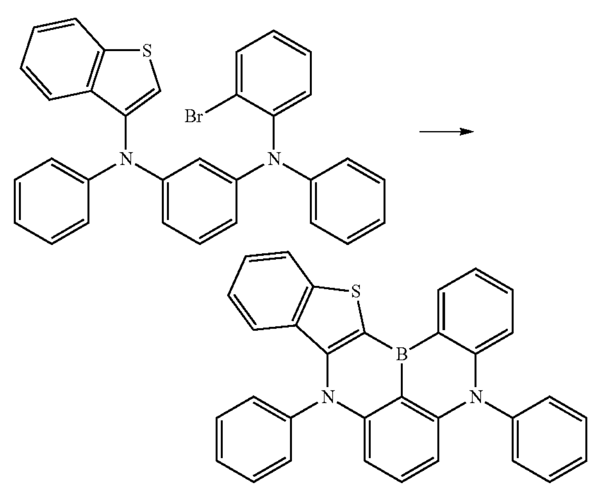

Compound 2 (1.5 g, yield 10.1%) was synthesized in the same manner as in Synthesis Example 1-7, except that Intermediate 2-d was used instead of Intermediate 1-f.

MS (MALDI-TOF): m/z 467.15 [M$^+$]

Synthesis Example 3. Synthesis of Compound 13

Synthesis Example 3-1. Synthesis of Intermediate 3-a

Intermediate 3-a was Synthesized by Reaction 13:

[Reaction 13]

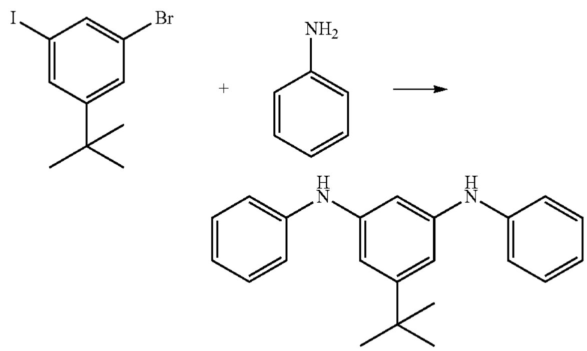

<Intermediate 3-a>

1-Bromo-3(tert-butyl)-5-iodobenzene (50 g, 177 mmol), aniline (36.2 g, 389 mmol), palladium acetate (1.6 g, 7 mmol), sodium tert-butoxide (51 g, 530 mmol), bis(diphenylphosphino)-1,1'-binaphthyl (4.4 g, 7 mmol), and toluene (500 mL) were placed in a 1 L reactor. The mixture was refluxed with stirring for 24 h. After completion of the reaction, the reaction mixture was filtered. The filtrate was concentrated and purified by column chromatography to afford Intermediate 3-a (42.5 g, yield 50%).

Synthesis Example 3-2. Synthesis of Intermediate 3-b

Intermediate 3-b was Synthesized by Reaction 14:

[Reaction 14]

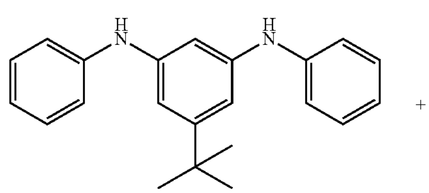

<Intermediate 3-a>

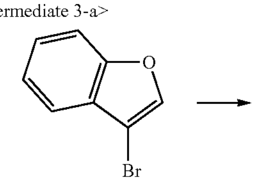

-continued

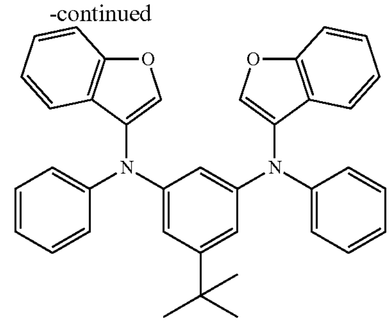

<Intermediate 3-b>

Intermediate 3-a (11 g, 42 mmol), Intermediate 1-b (20 g, 101 mmol), palladium acetate (1 g, 2 mmol), sodium tert-butoxide (12.2 g, 127 mmol), tri-tert-butylphosphine (0.7 g, 3 mmol), and toluene (150 mL) were placed in a 250 mL reactor. The mixture was refluxed with stirring for 5 h. After completion of the reaction, the reaction mixture was filtered. The filtrate was concentrated and purified by column chromatography to afford Intermediate 3-b (11 g, yield 65%)

Synthesis Example 3-3. Synthesis of Compound 13

Compound 13 was Synthesized by Reaction 15:

[Reaction 15]

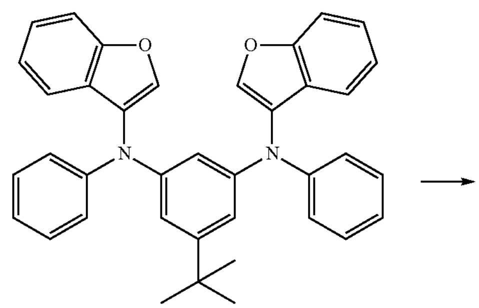

<Intermediate 3-b>

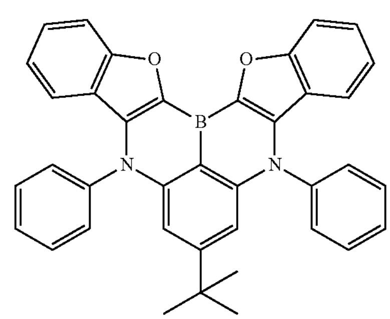

<Compound 13>

Compound 13 (0.5 g, yield 8%) was synthesized in the same manner as in Synthesis Example 1-7, except that Intermediate 3-b was used instead of Intermediate 1-f.

MS (MALDI-TOF): m/z 556.23 [M$^+$]

Synthesis Example 4. Synthesis of Compound 65

Synthesis Example 4-1. Synthesis of Intermediate 4-a

Intermediate 4-a was Synthesized by Reaction 16:

[Reaction 16]

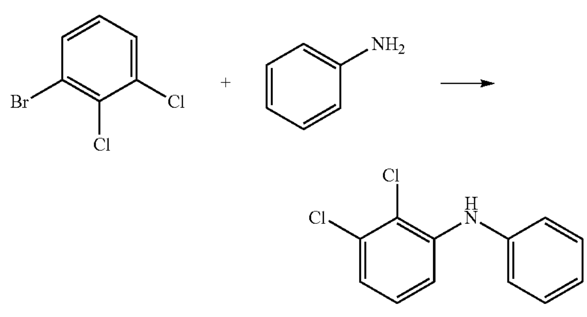

<Intermediate 4-a>

Intermediate 4-a (35.6 g, yield 71.2%) was synthesized in the same manner as in Synthesis Example 1-3, except that 1-bromo-2,3-dichlorobenzene was used instead of 1-bromo-4-iodobenzene.

Synthesis Example 4-2. Synthesis of Intermediate 4-b

Intermediate 4-b was Synthesized by Reaction 17:

[Reaction 17]

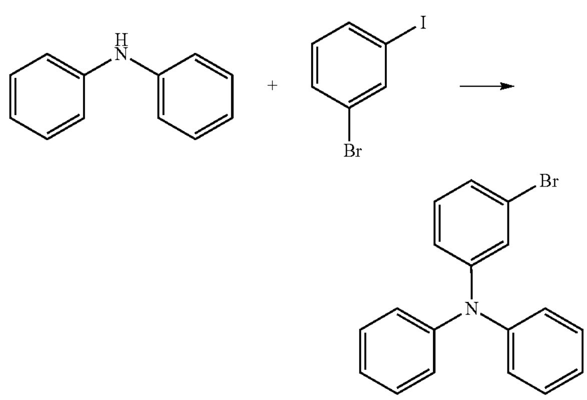

<Intermediate 4-b>

Diphenylamine (60.0 g, 355 mmol), 1-bromo-3-iodobenzene (100.3 g, 355 mmol), palladium acetate (0.8 g, 4 mmol), xantphos (2 g, 4 mmol), sodium tert-butoxide (68.2 g, 709 mmol), and toluene (700 mL) were placed in a 2 L reactor. The mixture was refluxed with stirring for 2 h. After completion of the reaction, the reaction mixture was filtered at room temperature, concentrated under reduced pressure, and purified by column chromatography to afford Intermediate 4-b (97 g, yield 91.2%).

Synthesis Example 4-3. Synthesis of Intermediate 4-c

Intermediate 4-c was Synthesized by Reaction 18:

[Reaction 18]

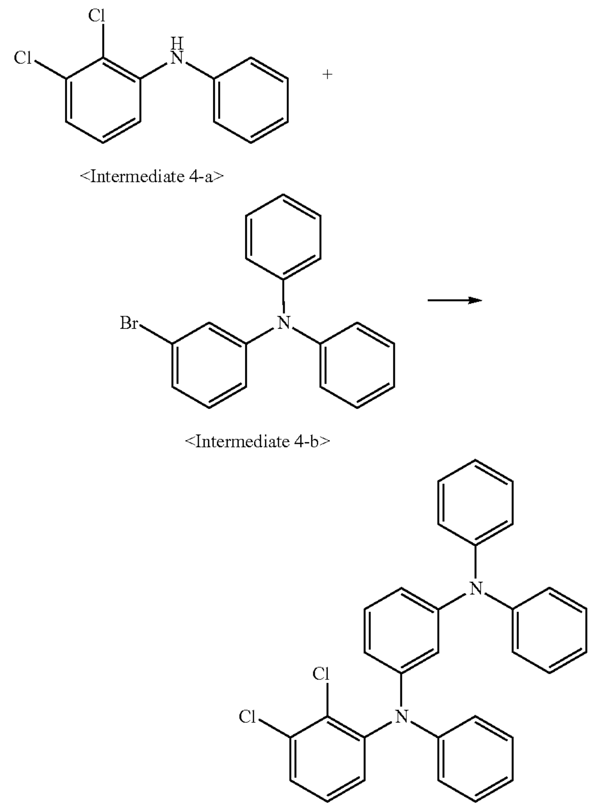

<Intermediate 4-c>

Intermediate 4-c (31 g, yield 77.7%) was synthesized in the same manner as in Synthesis Example 1-4, except that Intermediate 4-a and Intermediate 4-b were used instead of Intermediate 1-c and Intermediate 1-b.

Synthesis Example 4-4. Synthesis of Intermediate 4-d

Intermediate 4-d was Synthesized by Reaction 19:

[Reaction 19]

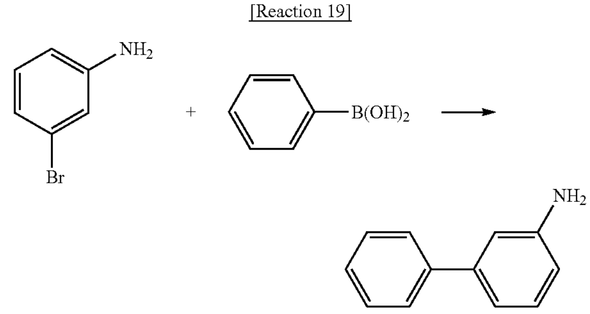

<Intermediate 4-d>

3-Bromoaniline (30 g, 174 mmol), phenylboronic acid (25.5 g, 209 mmol), tetrakis(triphenylphosphine)palladium (4 g, 3 mmol), potassium carbonate (48.2 g, 349 mmol), 1,4-dioxane (150 mL), toluene (150 mL), and distilled water (90 mL) were placed in a 1 L reactor. The mixture was refluxed with stirring for 4 h. After completion of the reaction, the reaction mixture was allowed to stand at room temperature for layer separation. The organic layer was concentrated under reduced pressure and purified by column chromatography to afford Intermediate 4-d (24 g, yield 80%).

Synthesis Example 4-5. Synthesis of Intermediate 4-e

Intermediate 4-e was Synthesized by Reaction 20:

[Reaction 20]

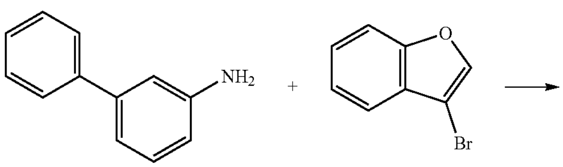

<Intermediate 4-d> <Intermediate 1-b>

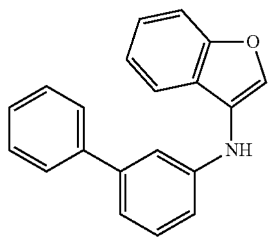

<Intermediate 4-e>

Intermediate 4-e (31.6 g, yield 68.2%) was synthesized in the same manner as in Synthesis Example 1-3, except that Intermediate 4-d and Intermediate 1-b were used instead of 1-bromo-4-iodobenzene and aniline.

Synthesis Example 4-6. Synthesis of Intermediate 4-f

Intermediate 4-f was Synthesized by Reaction 21:

[Reaction 21]

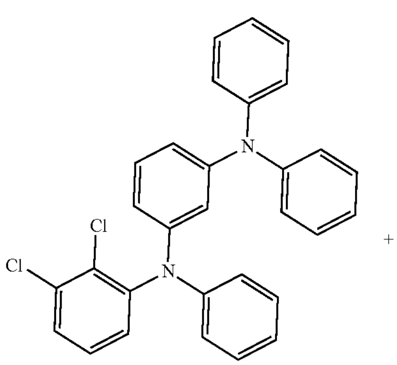

<Intermediate 4-c>

-continued

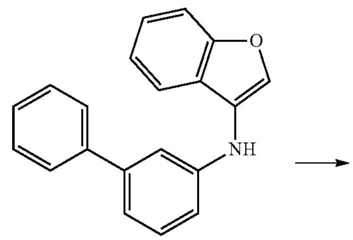

<Intermediate 4-e>

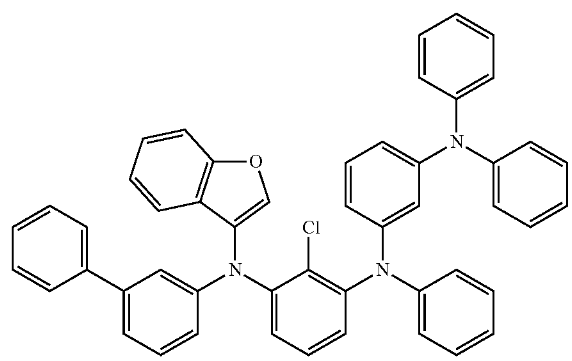

<Intermediate 4-f>

Intermediate 4-f (21 g, yield 67.7%) was synthesized in the same manner as in Synthesis Example 1-4, except that Intermediate 4-c and Intermediate 4-e were used instead of Intermediate 1-c and Intermediate 1-b.

Synthesis Example 4-7. Synthesis of Compound 65

Compound 65 was Synthesized by Reaction 22:

[Reaction 22]

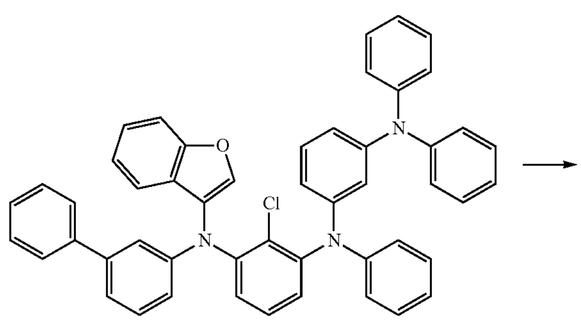

<Intermediate 4-f>

-continued

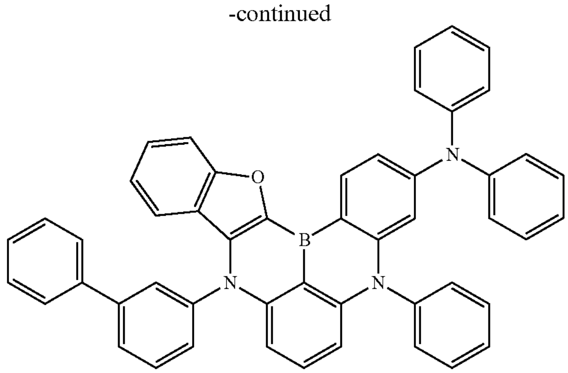

<Compound 65>

Intermediate 4-f (21 g, 37 mmol) and tert-butylbenzene were placed in a 250 mL reactor, and tert-butyllithium (42.4 mL, 74 mmol) was added dropwise thereto at −78° C. After the dropwise addition was finished, the mixture was stirred at 60° C. for 3 h. Thereafter, the reactor was flushed with nitrogen at 60° C. to remove pentane. After dropwise addition of boron tribromide (7.1 mL, 74 mmol) at −78° C., the resulting mixture was stirred at room temperature for 1 h and N,N-diisopropylethylamine (6 g, 74 mmol) was added dropwise thereto at 0° C. After the dropwise addition was finished, the mixture was stirred at 120° C. for 2 h. After completion of the reaction, the reaction mixture was added with an aqueous sodium acetate solution at room temperature, stirred, and extracted with ethyl acetate. The organic layer was concentrated and purified by column chromatography to give Compound 65 (2.0 g, yield 17.4%).

MS (MALDI-TOF): m/z 703.28 [$M^+$]

Synthesis Example 5. Synthesis of Compound 73

Synthesis Example 5-1. Synthesis of Intermediate 5-a

Intermediate 5-a was Synthesized by Reaction 23:

[Reaction 23]

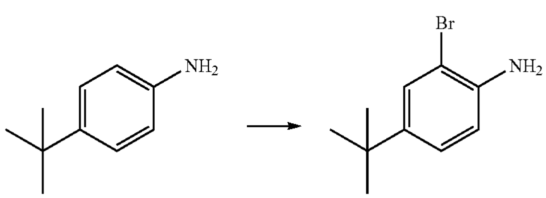

<Intermediate 5-a>

4-tert-butylaniline (40 g, 236 mmol) was dissolved in methylene chloride (400 mL) in a 1 L reactor. The mixture was stirred at 0° C. Thereafter, N-bromosuccinimide (42 g, 236 mmol) was slowly added to the reactor. The resulting mixture was stirred at room temperature for 4 h. After completion of the reaction, $H_2O$ was added dropwise to the reaction mixture at room temperature, followed by extraction with methylene chloride. The organic layer was concentrated and purified by column chromatography to afford Intermediate 5-a (48 g, yield 80%).

Synthesis Example 5-2. Synthesis of Intermediate 5-b

Intermediate 5-b was Synthesized by Reaction 24:

[Reaction 24]

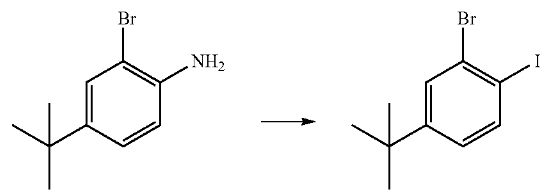

<Intermediate 5-a> <Intermediate 5-b>

Intermediate 5-a (80 g, 351 mmol) and water (450 mL) were stirred in a 2 L reactor. The mixture was added with sulfuric acid (104 mL) and a solution of sodium nitrite (31.5 g, 456 mmol) in water (240 mL) was added dropwise thereto at 0° C. After the dropwise addition was finished, the resulting mixture was stirred at 0° C. for 2 h. After dropwise addition of a solution of potassium iodide (116.4 g, 701 mmol) in water (450 mL) at 0° C., the mixture was stirred at room temperature for 6 h. After completion of the reaction, the reaction mixture was added with an aqueous sodium thiosulfate solution at room temperature, stirred, and extracted with ethyl acetate. The organic layer was concentrated and purified by column chromatography to afford Intermediate 5-b (58 g, yield 51%).

Synthesis Example 5-3. Synthesis of Intermediate 5-c

Intermediate 5-c was Synthesized by Reaction 25:

[Reaction 25]

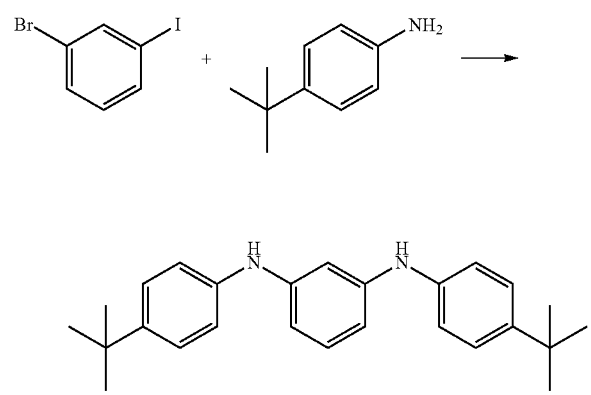

<Intermediate 5-c>

Intermediate 5-c (95 g, yield 80.4%) was synthesized in the same manner as in Synthesis Example 3-1, except that 4-tert-butylaniline was used instead of aniline.

Synthesis Example 5-4. Synthesis of Intermediate 5-d

Intermediate 5-d was Synthesized by Reaction 26:

[Reaction 26]

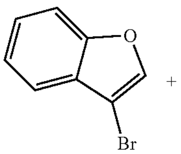

<Intermediate 1-a>

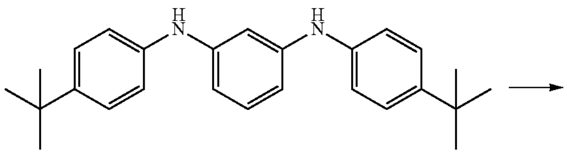

<Intermediate 5-c>

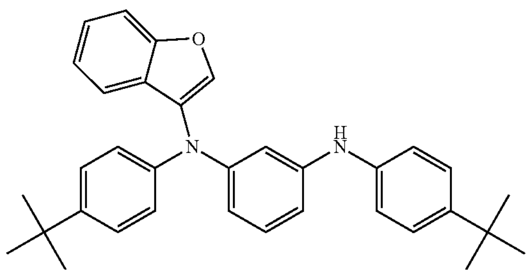

<Intermediate 5-d>

Intermediate 5-d (31 g, yield 71.5%) was synthesized in the same manner as in Synthesis Example 1-4, except that Intermediate 5-c was used instead of Intermediate 1-c.

Synthesis Example 5-5. Synthesis of Intermediate 5-e

Intermediate 5-e was Synthesized by Reaction 27:

[Reaction 27]

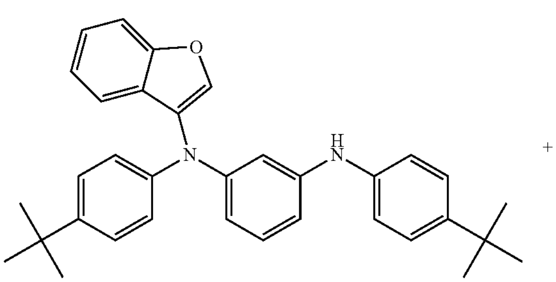

<Intermediate 5-d>

-continued

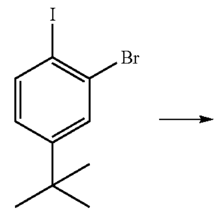

<Intermediate 5-b>

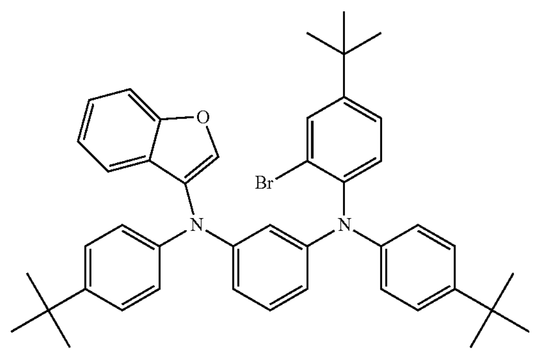

<Intermediate 5-e>

Intermediate 5-e (24 g, yield 67.1%) was synthesized in the same manner as in Synthesis Example 1-4, except that Intermediate 5-d and Intermediate 5-b were used instead of Intermediate 1-c and Intermediate 1-b.

Synthesis Example 5-6. Synthesis of Compound 73

Compound 73 was Synthesized by Reaction 28:

[Reaction 28]

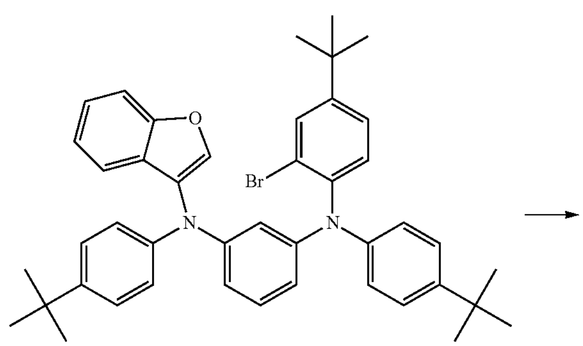

<Intermediate 5-e>

-continued

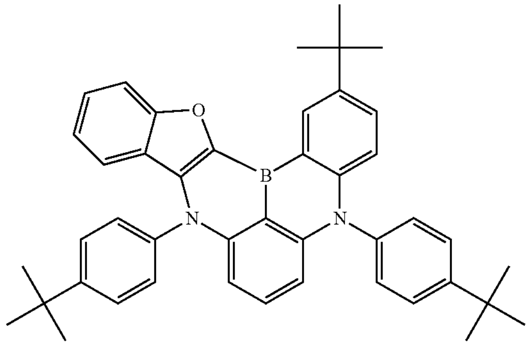

<Compound 73>

Compound 73 (2.4 g, yield 15%) was synthesized in the same manner as in Synthesis Example 1-7, except that Intermediate 5-e was used instead of Intermediate 1-f.

MS (MALDI-TOF): m/z 628.36 [$M^+$]

Synthesis Example 6. Synthesis of Compound 109

Synthesis Example 6-1. Synthesis of Intermediate 6-a

Intermediate 6-a was Synthesized by Reaction 29:

[Reaction 29]

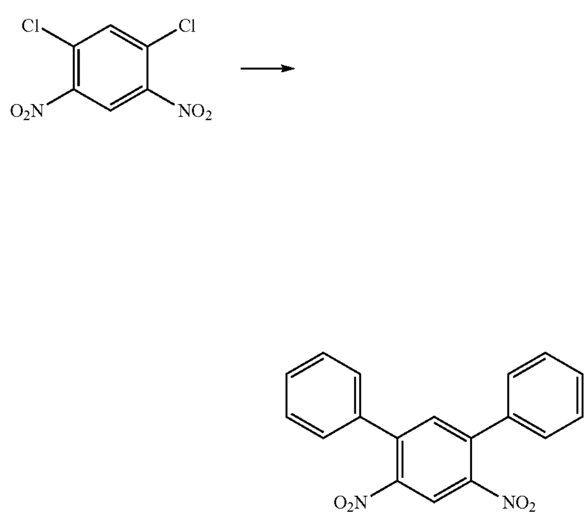

<Intermediate 6-a>

1,5-Dichloro-2,4-dinitrobenzene (40.0 g, 123 mmol), phenylboronic acid (44.9 g, 368 mmol), tetrakis(triphenylphosphine)palladium (2.8 g, 2.5 mmol), potassium carbonate (50.9 g, 368 mmol), 1,4-dioxane (120 mL), toluene (200 mL), and water (120 mL) were placed in a 1 L reactor. The mixture was refluxed with stirring. After completion of the reaction, the reaction mixture was extracted with water and ethyl acetate. The organic layer was concentrated and purified by column chromatography to afford Intermediate 6-a (27.5 g, yield 70%).

Synthesis Example 6-2. Synthesis of Intermediate 6-b

Intermediate 6-b was Synthesized by Reaction 30:

[Reaction 30]

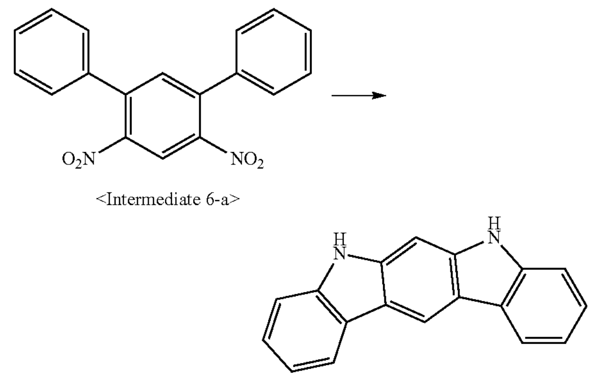

<Intermediate 6-a>

<Intermediate 6-b>

Intermediate 6-a (27.5 g, 86 mmol), triphenylphosphine (57.8 g, 348 mmol), and dichlorobenzene (300 mL) were placed in a 1 L reactor. The mixture was refluxed with stirring for 3 days. After completion of the reaction, the dichlorobenzene was removed, followed by column chromatography to afford Intermediate 6-b (10.8 g, yield 49.0%).

Synthesis Example 6-3. Synthesis of Intermediate 6-c

Intermediate 6-c was Synthesized by Reaction 31:

[Reaction 31]

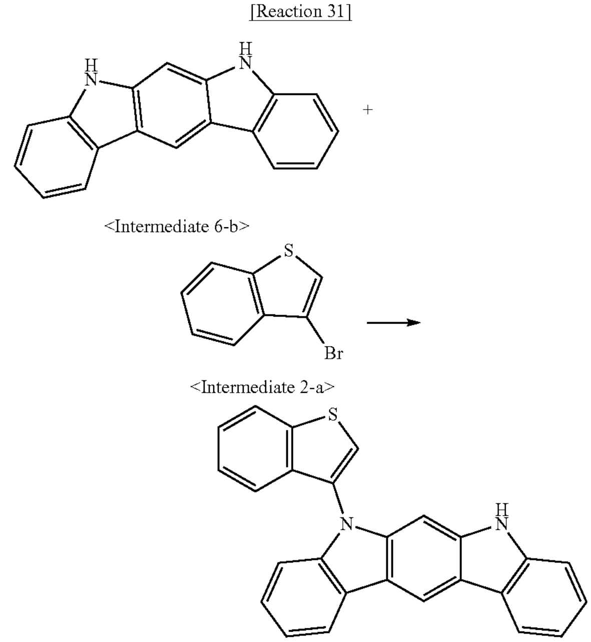

<Intermediate 6-b>

<Intermediate 2-a>

<Intermediate 6-c>

Intermediate 6-b (10.8 g, 42 mmol), Intermediate 2-a (11.0 g, 10.8 mmol), a copper powder (10.7 g, 1 mmol), 18-crown-6-ether (4.5 g, 17 mmol), and potassium carbonate (34.9 g, 253 mmol) were placed in a 250 mL reactor, and dichlorobenzene (110 mL) was added thereto. The mixture was refluxed with stirring at 180° C. for 24 h. After completion of the reaction, the dichlorobenzene was removed, followed by column chromatography to afford Intermediate 6-c (9.5 g, yield 52%).

Synthesis Example 6-4. Synthesis of Intermediate 6-d

Intermediate 6-d was Synthesized by Reaction 32:

[Reaction 32]

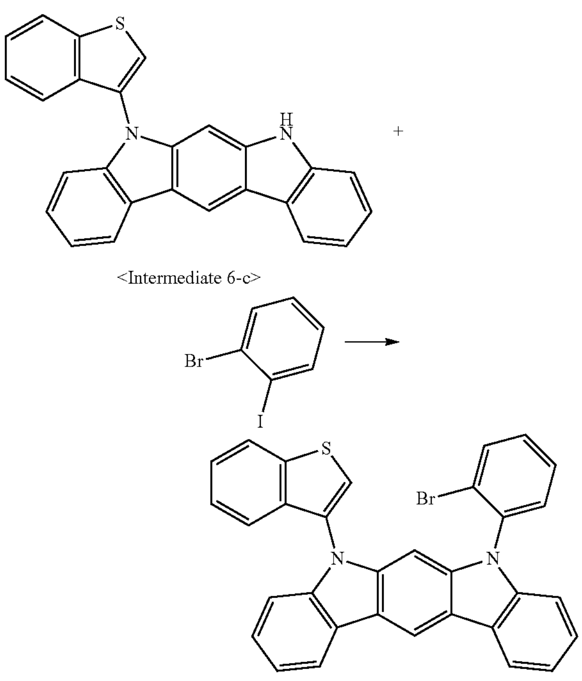

<Intermediate 6-c>

<Intermediate 6-d>

Intermediate 6-d (14 g, yield 67.1%) was synthesized in the same manner as in Synthesis Example 6-3, except that Intermediate 6-c and 1-bromo-2-iodobenzene were used instead of Intermediate 1-c and Intermediate 2-a.

Synthesis Example 6-5. Synthesis of Compound 109

Compound 109 was Synthesized by Reaction 33:

[Reaction 33]

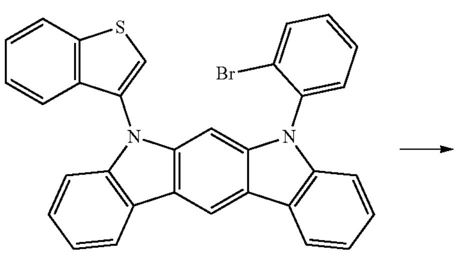

<Intermediate 6-d>

-continued

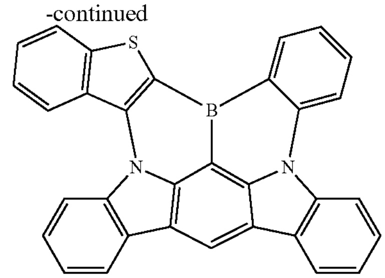

<Compound 109>

Compound 109 (2.1 g, yield 14%) was synthesized in the same manner as in Synthesis Example 1-7, except that Intermediate 6-d was used instead of Intermediate 1-f.

MS (MALDI-TOF): m/z 472.12 [$M^+$]

Synthesis Example 7. Synthesis of Compound 126

Synthesis Example 7-1. Synthesis of Intermediate 7-a

Intermediate 7-a was Synthesized by Reaction 34:

[Reaction 34]

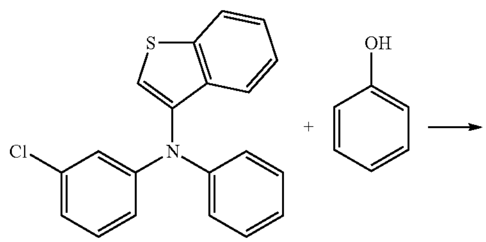

<Intermediate 2-b>

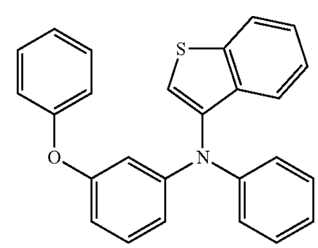

<Intermediate 7-a>

Intermediate 2-b (30.0 g, 150 mmol), phenol (31.2 g, 160 mmol), potassium carbonate (45.7 g, 300 mmol), and NMP (250 mL) were placed in a 500 mL reactor. The mixture was refluxed with stirring at 160° C. for 12 h. After completion of the reaction, the reaction mixture was cooled to room temperature, distilled under reduced pressure to remove the NMP, and extracted with water and ethyl acetate. The organic layer was concentrated under reduced pressure and purified by column chromatography to afford Intermediate 7-a (22 g, yield 68%).

Synthesis Example 7-2. Synthesis of Compound 126

Compound 126 was Synthesized by Reaction 35:

[Reaction 35]

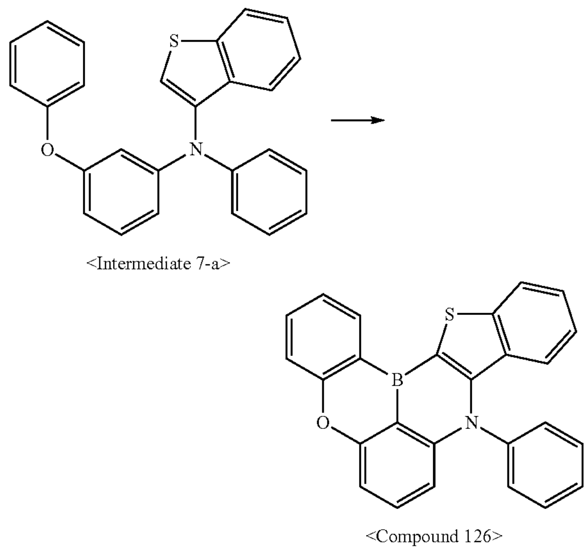

Compound 126 (1.2 g, yield 13.4%) was synthesized in the same manner as in Synthesis Example 1-7, except that Intermediate 7-a was used instead of Intermediate 1-f.

MS (MALDI-TOF): m/z 401.10 [$M^+$]

Synthesis Example 8. Synthesis of Compound 145

Synthesis Example 8-1. Synthesis of 8-a 8-a was Synthesized by Reaction 36:

[Reaction 36]

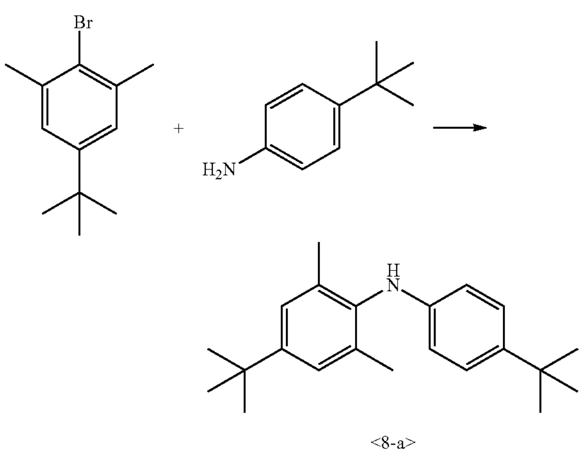

8-a (41.6 g, yield 88.2%) was synthesized in the same manner as in Synthesis Example 1-3, except that 2-bromo-5-tert-butyl-1,3-dimethylbenzene and 4-tert-butylaniline were used instead of 1-bromo-3-iodobenzene and aniline.

Synthesis Example 8-2. Synthesis of 8-b 8-b was Synthesized by Reaction 37:

[Reaction 37]

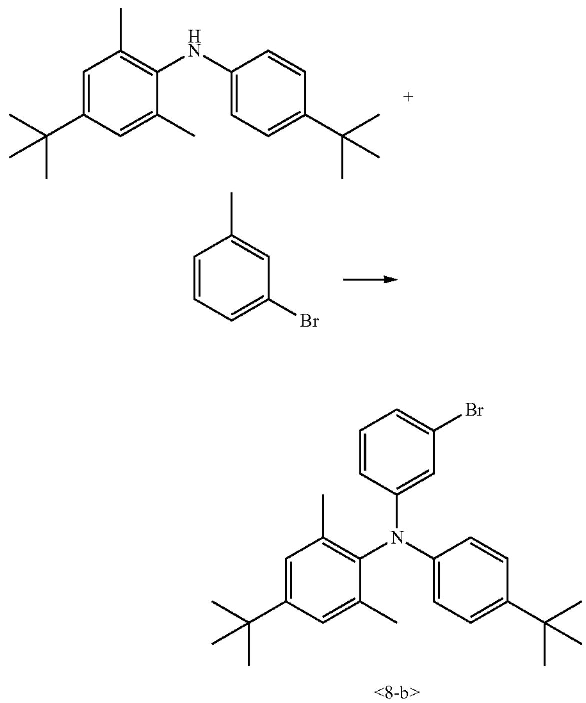

8-b (37.6 g, yield 78.4%) was synthesized in the same manner as in Synthesis Example 4-2, except that 8-a was used instead of diphenylamine.

Synthesis Example 8-3. Synthesis of 8-c 8-c was Synthesized by Reaction 38:

[Reaction 38]

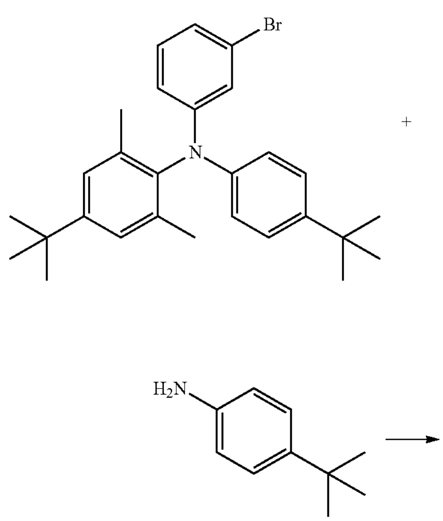

-continued

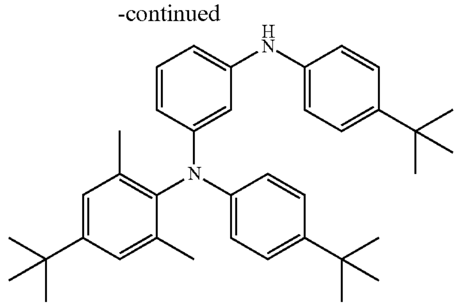

<8-c>

8-c (31.2 g, yield 74.2%) was synthesized in the same manner as in Synthesis Example 1-3, except that 8-b and 4-tert-butylaniline were used instead of 1-bromo-3-iodobenzene and aniline.

Synthesis Example 8-4. Synthesis of 8-d 8-d was Synthesized by Reaction 39:

[Reaction 39]

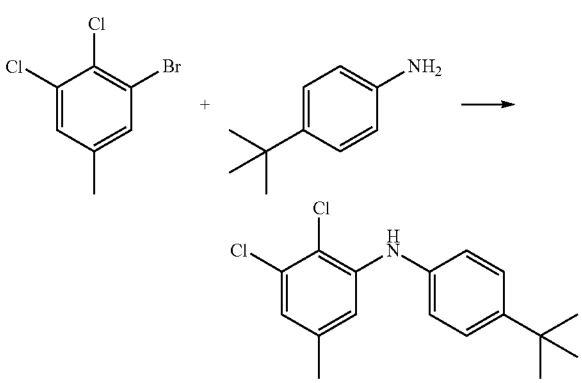

<8-d>

8-d (30.3 g, yield 89.8%) was synthesized in the same manner as in Synthesis Example 1-3, except that 1-bromo-2,3-dichloro-5-ethylbenzene and 4-tert-butylaniline were used instead of 1-bromo-3-iodobenzene and aniline.

Synthesis Example 8-5. Synthesis of 8-e 8-e was Synthesized by Reaction 40:

[Reaction 40]

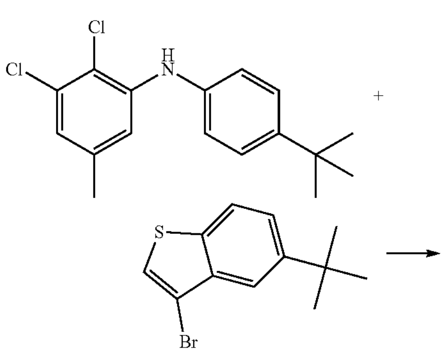

-continued

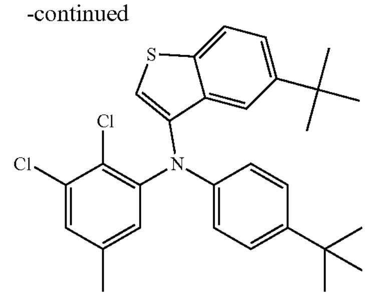

<8-e>

8-e (27.4 g, yield 77.1%) was synthesized in the same manner as in Synthesis Example 1-4, except that 8-d and 3-bromo-5-tert-butylbenzothiophene were used instead of 1-c and 1-b.

Synthesis Example 8-6. Synthesis of 8-f 8-f was Synthesized by Reaction 41:

[Reaction 41]

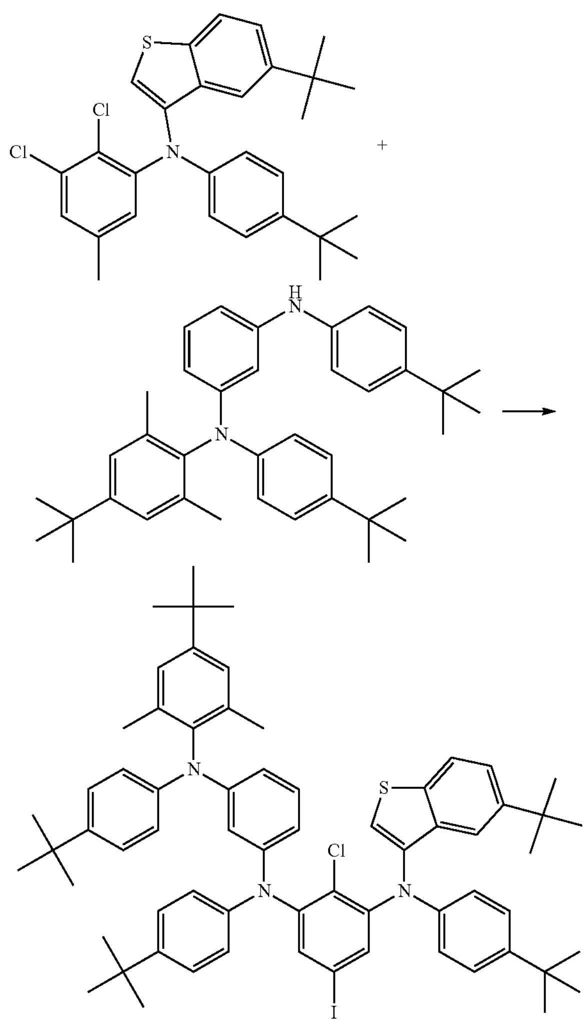

<8-f>

8-f (21 g, yield 74.1%) was synthesized in the same manner as in Synthesis Example 1-4, except that 8-e and 8-c were used instead of 1-c and 1-b.

Synthesis Example 8-7. Synthesis of Compound 145

Compound 145 was Synthesized by Reaction 42:

[Reaction 42]

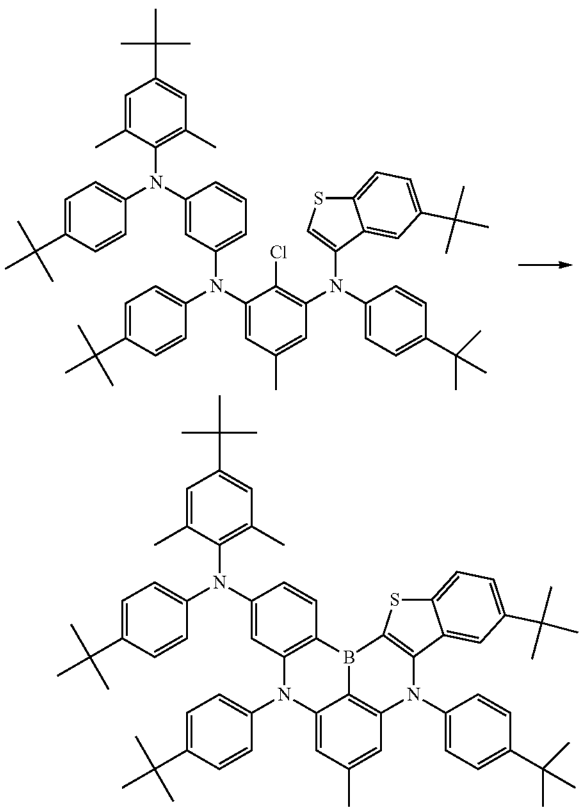

<Compound 145>

Compound 145 (3.4 g, yield 19.4%) was synthesized in the same manner as in Synthesis Example 1-7, except that 8-f was used instead of 1-f.

MS $[M]^+$ 979.60

Synthesis Example 9. Synthesis of Compound 150

Synthesis Example 9-1. Synthesis of 9-a 9-a was Synthesized by Reaction 43:

[Reaction 43]

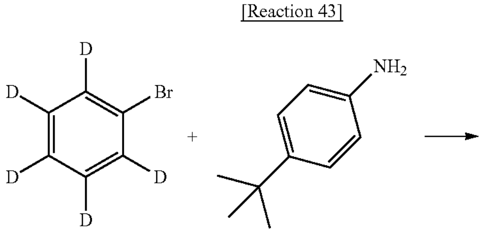

-continued

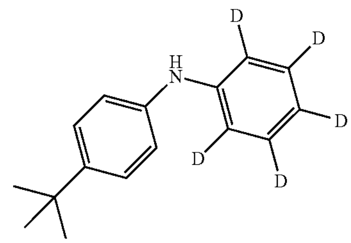

<9-a>

9-a (32.7 g, yield 78.2%) was synthesized in the same manner as in Synthesis Example 1-3, except that 1-bromobenzene-d5 and 4-tert-butylaniline were used instead of 1-bromo-3-iodobenzene and aniline.

Synthesis Example 9-2. Synthesis of 9-b 9-b was Synthesized by Reaction 44:

[Reaction 44]

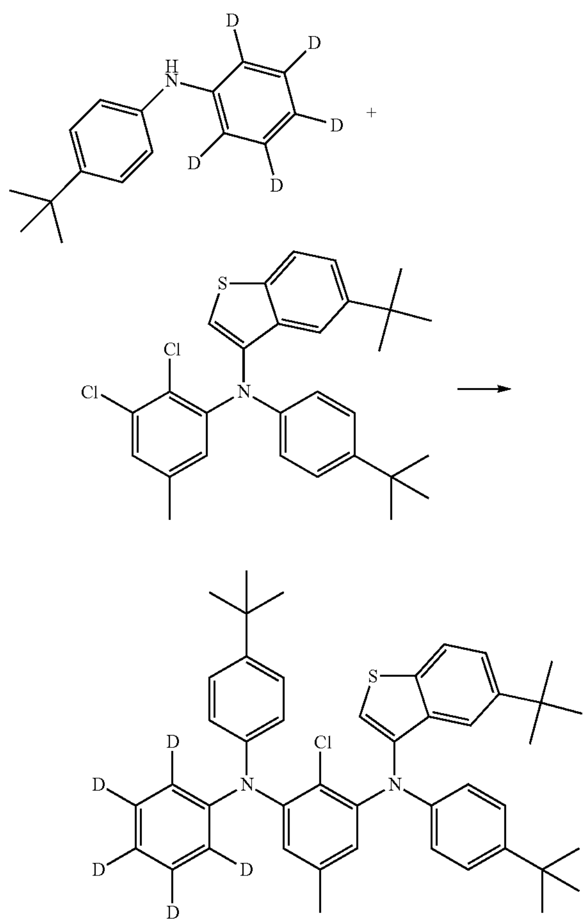

<9-b>

9-b (34.2 g, yield 84.1%) was synthesized in the same manner as in Synthesis Example 1-4, except that 8-e and 9-a were used instead of 1-c and 1-b.

Synthesis Example 9-3. Synthesis of Compound 150

Compound 150 was Synthesized by Reaction 45:

[Reaction 45]

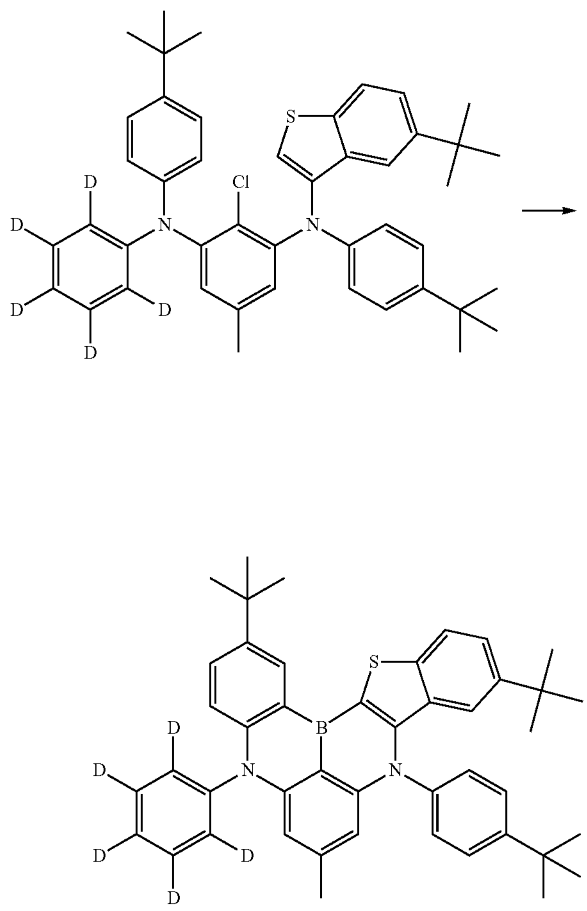

<Compound 150>

Compound 150 (2.7 g, yield 11.4%) was synthesized in the same manner as in Synthesis Example 1-7, except that 9-b was used instead of 1-f.

MS $[M]^+$ 663.39

Synthesis Example 10. Synthesis of Compound 153

Synthesis Example 10-1. Synthesis of 10-a 10-a was Synthesized by Reaction 46:

[Reaction 46]

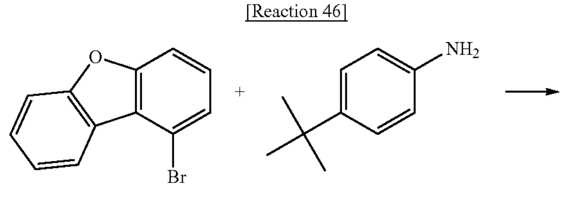

-continued

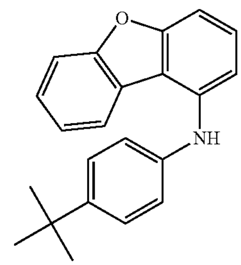

<10-a>

10-a (25.6 g, yield 79.2%) was synthesized in the same manner as in Synthesis Example 1-3, except that 1-bromodibenzofuran and 4-tert-butylaniline were used instead of 1-bromo-3-iodobenzene and aniline.

Synthesis Example 10-2. Synthesis of 10-b 10-b was Synthesized by Reaction 47:

[Reaction 47]

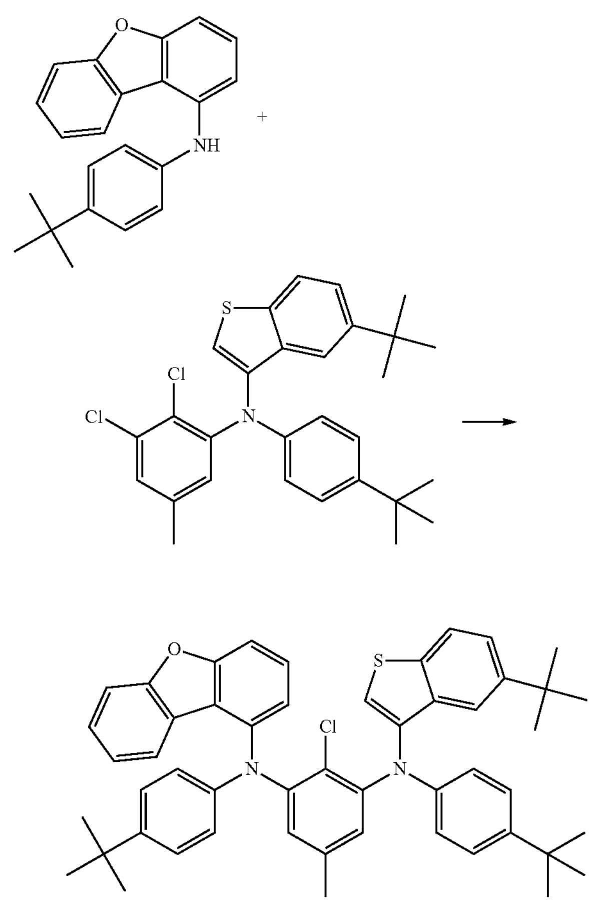

<10-b>

10-b (18.6 g, yield 74.1%) was synthesized in the same manner as in Synthesis Example 1-4, except that 8-e and 10-a were used instead of 1-c and 1-b.

Synthesis Example 10-3. Synthesis of Compound 153

Compound 153 was Synthesized by Reaction 48:

[Reaction 48]

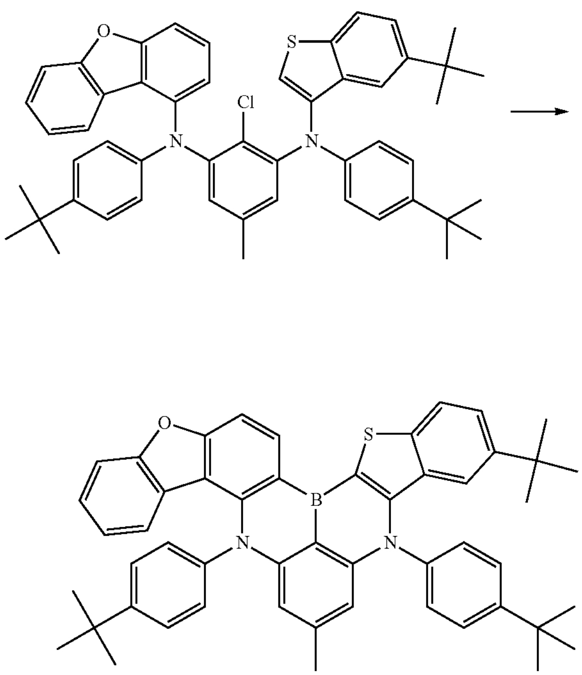

<Compound 153>

Compound 153 (3.4 g, yield 15.4%) was synthesized in the same manner as in Synthesis Example 1-7, except that 10-b was were used instead of 1-f.

MS $[M]^+$ 748.37

Examples 1-10: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. DNTPD (700 Å) and the compound of Formula H (250 Å) were deposited in this order on the ITO. A mixture of BH1 as a host and each of Compound 1, 2, 13, 49, 65, 73, 109, 120, 126, and 141 (3 wt %) was used to form a 250 Å thick light emitting layer. Thereafter, the compound of Formula E-1 and the compound of Formula E-2 in a ratio of 1:1 were used to form a 300 Å thick electron transport layer on the light emitting layer. The compound of Formula E-1 was used to form a 5 Å thick electron injecting layer on the electron transport layer. Al was deposited on the electron injecting layer to form a 1000 Å thick Al electrode, completing the fabrication of an organic electroluminescent device. The luminescent properties of the organic electroluminescent device were measured at 0.4 mA.

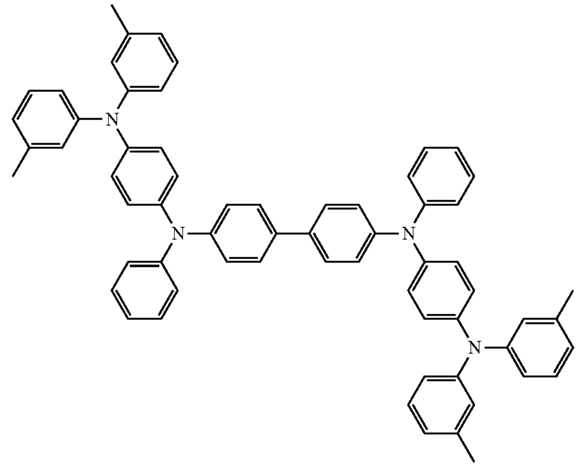

[DNTPD]

[Formula H]

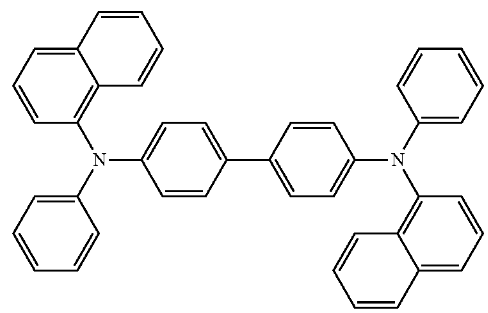

[Formula E-1]

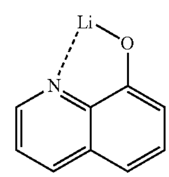

[Formula E-2]

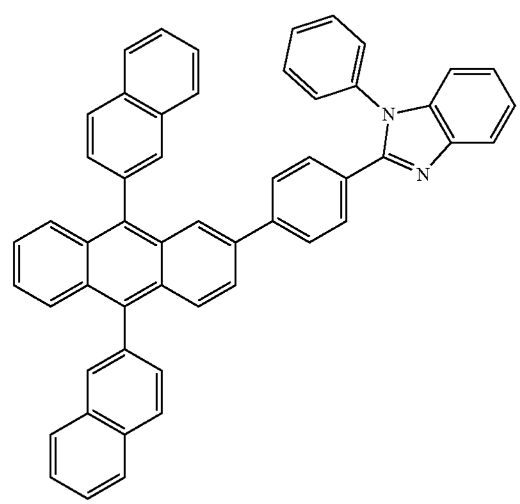

Comparative Examples 1-3

Organic electroluminescent devices were fabricated in the same manner as in Example 1, except that BD1, BD2, and BD3 were used instead of Compound 1. The luminescent properties of the organic electroluminescent device were measured at 0.4 mA. The structures of BH1, BD1, BD2, and BD3 are as follows.

[BH1]

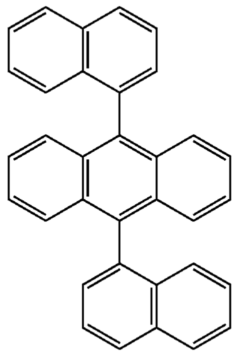

[BD1]

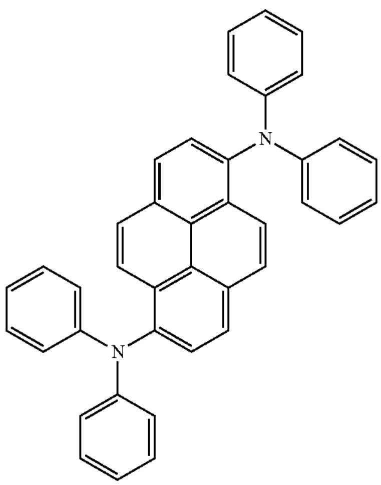

[BD2]

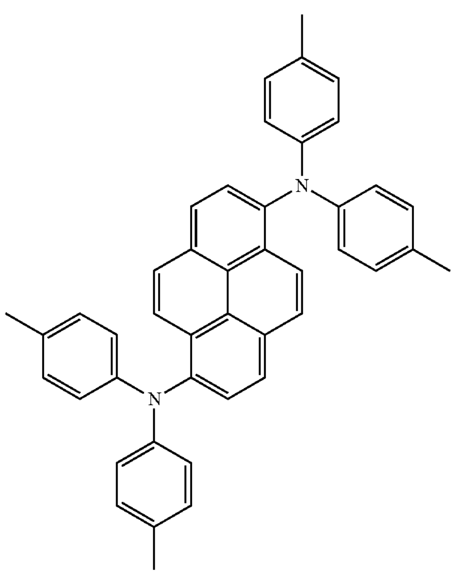

-continued

[BD 3]

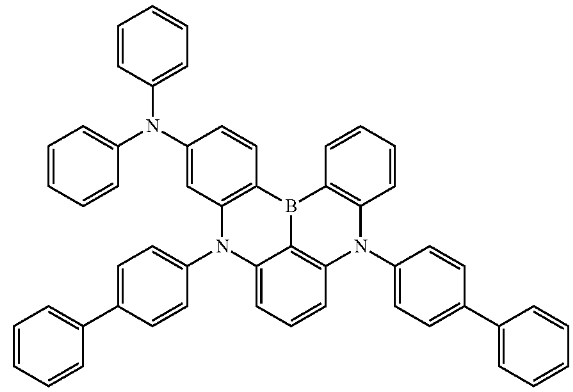

The organic electroluminescent devices of Examples 1-10 and Comparative Examples 1-3 were measured for voltage, current, luminance, color coordinates, and lifetime. The results are shown in Table 1.

TABLE 1

| Example No. | Dopant | Current density ($mA/cm^2$) | Voltage (V) | External quantum efficiency (%) | T90 (hr) |
|---|---|---|---|---|---|
| Example 1 | Compound 1 | 10 | 3.89 | 8.9 | 185 |
| Example 2 | Compound 2 | 10 | 3.95 | 8.8 | 175 |
| Example 3 | Compound 13 | 10 | 3.69 | 8.9 | 153 |
| Example 4 | Compound 49 | 10 | 3.75 | 8.3 | 191 |
| Example 5 | Compound 65 | 10 | 3.81 | 8.8 | 185 |
| Example 6 | Compound 73 | 10 | 3.92 | 8.7 | 166 |
| Example 7 | Compound 109 | 10 | 3.81 | 8.5 | 189 |
| Example 8 | Compound 120 | 10 | 3.92 | 8.9 | 178 |
| Example 9 | Compound 126 | 10 | 4.01 | 9.1 | 177 |
| Example 10 | Compound 141 | 10 | 3.95 | 8.9 | 195 |
| Comparative Example 1 | BD1 | 10 | 4.17 | 7.5 | 142 |
| Comparative Example 2 | BD2 | 10 | 4.22 | 7.1 | 137 |
| Comparative Example 3 | BD3 | 10 | 4.15 | 5.8 | 88 |

As can be seen from the results in Table 1, the organic electroluminescent devices employing the inventive boron compounds (Examples 1-10) showed higher quantum efficiencies and longer lifetimes than the organic electroluminescent devices of Comparative Examples 1-3.

Examples 11-19: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. DNTPD (700 Å) and the compound of Formula F (250 Å) were deposited in this order on the ITO. A mixture of BH2 as a host and each of Compound 145, 146, 153, 155, 157, 159, 164, 165, and 167 (3 wt %) was used to form a 250 Å thick light emitting layer. Thereafter, the compound of Formula E-1 and the compound of Formula E-2 in a ratio of 1:1 were used to form a 300 Å thick electron transport layer on the light emitting layer. The compound of Formula E-1 was used to form a 5 Å thick electron injecting layer on the electron transport layer. Al was deposited on the electron injecting layer to form a 1000 Å thick Al electrode, completing the fabrication of an organic electroluminescent device. The luminescent properties of the organic electroluminescent device were measured at 0.4 mA.

[DNTPD}

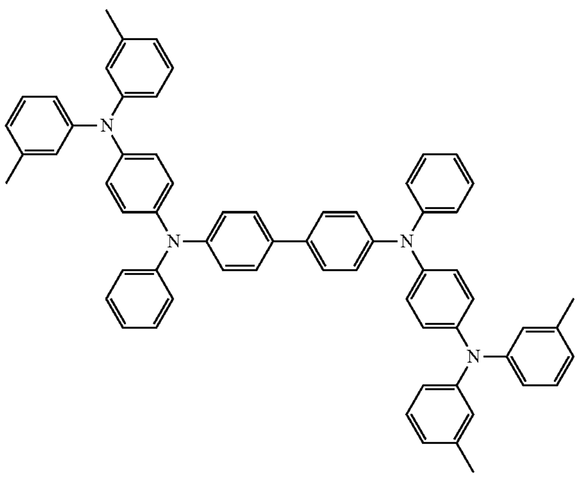

[Formula F]

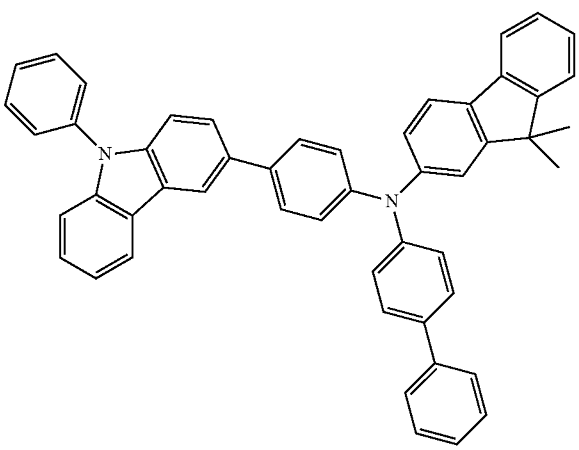

[Formula E-1]

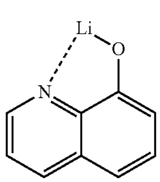

-continued

[Formula E-2]

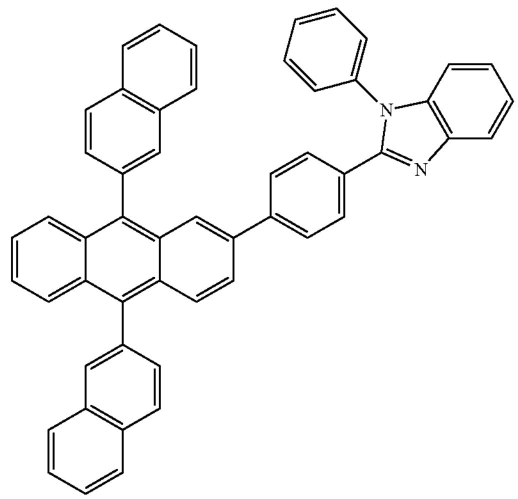

[BH2]

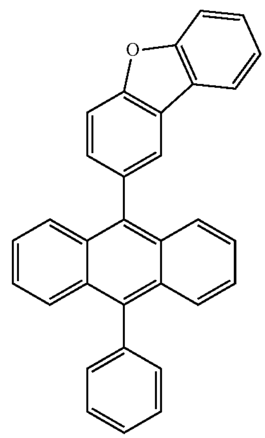

Comparative Examples 4-5

Organic electroluminescent devices were fabricated in the same manner as in Example 1, except that BD3, BD4, and BD5 were used instead of Compound 1. The luminescent properties of the organic electroluminescent device were measured at 0.4 mA. The structures of BD3, BD4, and BD5 are as follows.

[BD3]

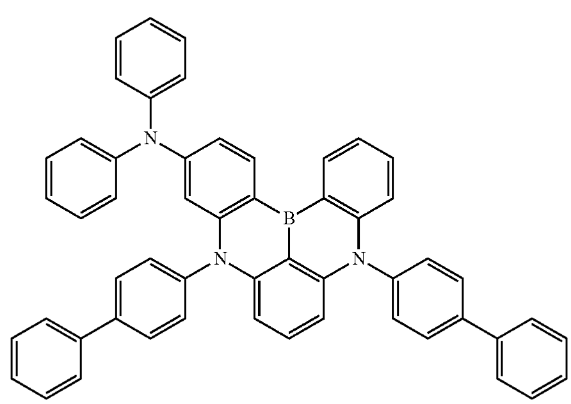

-continued

[BD4]

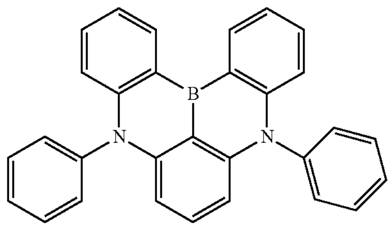

[BD5]

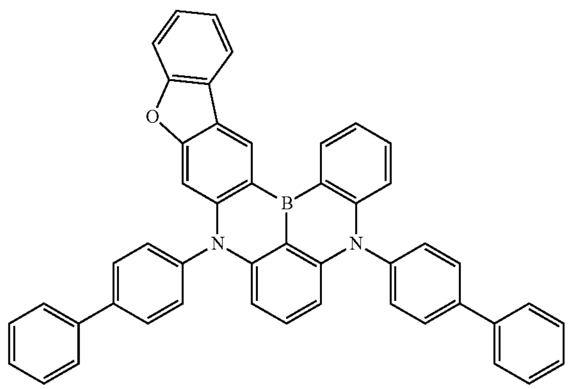

TABLE 2

| Example No. | Dopant | Driving voltage | External quantum efficiency (%) | T97 (hr) |
|---|---|---|---|---|
| Example 11 | Compound 145 | 3.8 | 8.36 | 180 |
| Example 12 | Compound 146 | 3.8 | 9.24 | 145 |
| Example 13 | Compound 153 | 3.8 | 8.54 | 160 |
| Example 14 | Compound 155 | 3.8 | 8.09 | 186 |
| Example 15 | Compound 157 | 3.8 | 8.18 | 180 |
| Example 16 | Compound 159 | 3.8 | 8.88 | 206 |
| Example 17 | Compound 164 | 3.8 | 7.92 | 165 |
| Example 18 | Compound 165 | 3.8 | 8.45 | 180 |
| Example 19 | Compound 167 | 3.8 | 8.53 | 213 |
| Comparative Example 4 | BD3 | 3.8 | 4.95 | 53 |
| Comparative Example 5 | BD4 | 3.7 | 5.45 | 26 |
| Comparative Example 6 | BD5 | 3.7 | 5.28 | 35 |

As can be seen from the results in Table 2, the organic electroluminescent devices employing the inventive boron compounds (Examples 11-19) showed higher quantum efficiencies and longer lifetimes than the organic electroluminescent devices of Comparative Examples 4-6.

What is claimed is:

1. An organic electroluminescent compound represented by Formula A-3, A-4, A-5 or A-6:

(A-3)

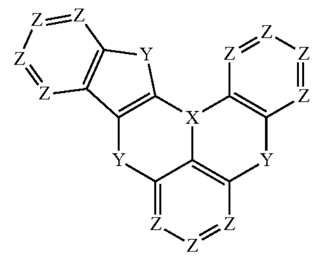

(A-4)

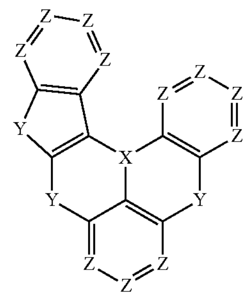

(A-5)

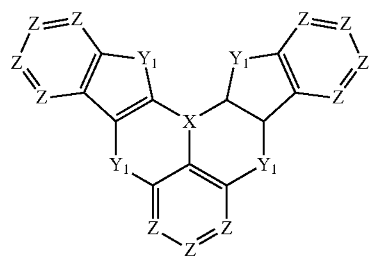

(A-6)

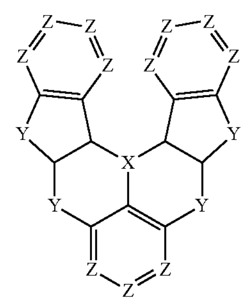

wherein X is B, Y are identical to or different from each other and are each independently selected from N-$R_1$, $CR_2R_3$, O, S, Se, and $SiR_4R_5$, $R_1$ to $R_5$ are identical to or different from each other and are each independently selected from hydrogen, deuterium, substituted or unsubstituted $C_3$-$C_{30}$ alkyl, substituted or unsubstituted $C_2$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, $Y_1$ are identical to or different from each other and are each independently selected from $CR_2R_3$, O, S, Se, and $SiR_4R_5$, $R_2$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that $R_2$ and $R_3$ are optionally linked to each other to form an alicyclic or aromatic monocyclic or polycyclic ring, $R_4$ and $R_5$ are optionally linked to each other to form an alicyclic or aromatic monocyclic or polycyclic ring, each Z is independently CR or N, the substituents R are identical to or different from each other and are independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the substituents R are optionally bonded to each other or are optionally linked to other adjacent substituents to form alicyclic or aromatic monocyclic or polycyclic rings whose carbon atoms are optionally substituted with one or more heteroatoms selected from N, S, and O atoms.

2. The organic electroluminescent compound according to claim 1, wherein the organic electroluminescent compound represented by Formula A-3, A-4, A-5 or A-6 is selected from the following compounds:

1

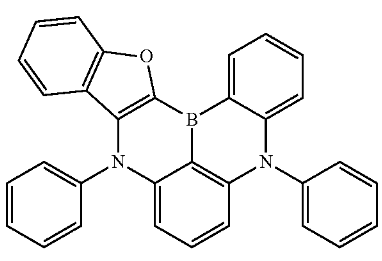

2

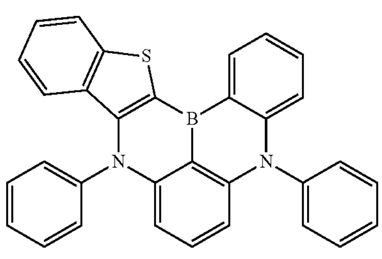

-continued

3

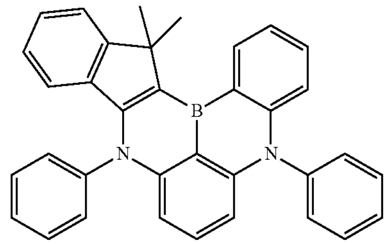

4

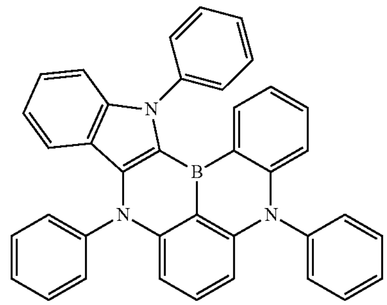

5

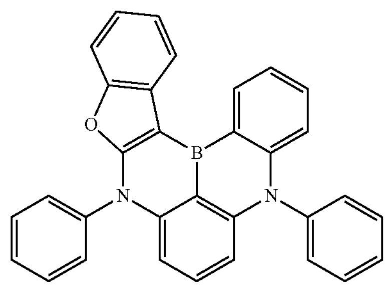

6

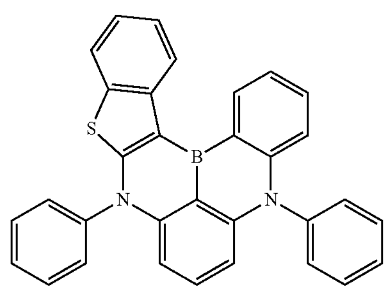

7

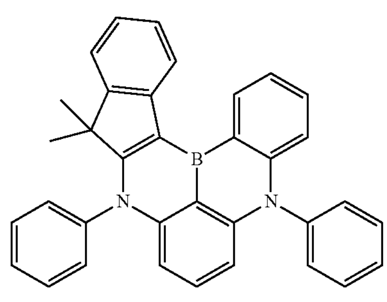

8
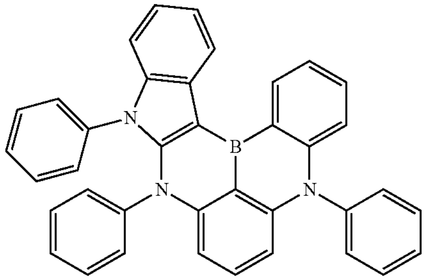
9
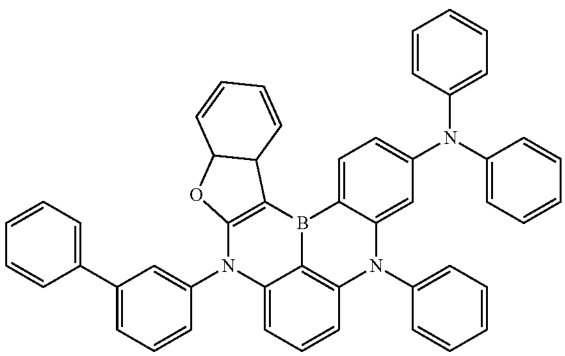
10
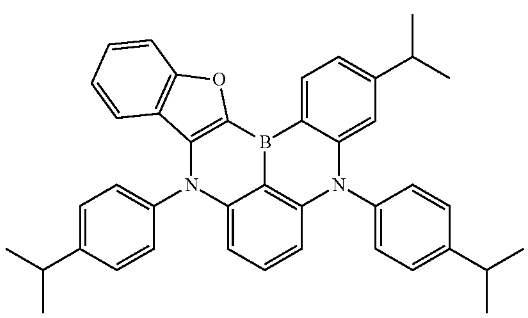
11
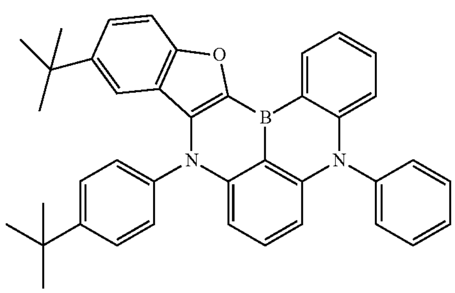
12
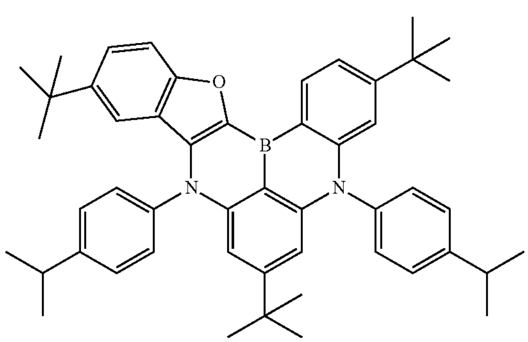
14
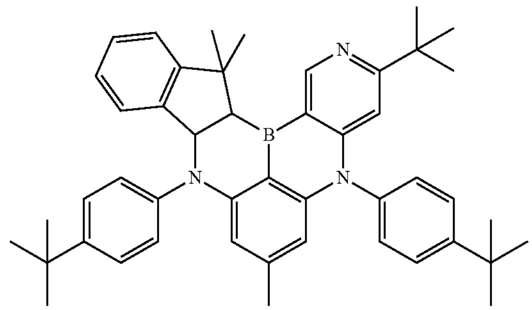
15
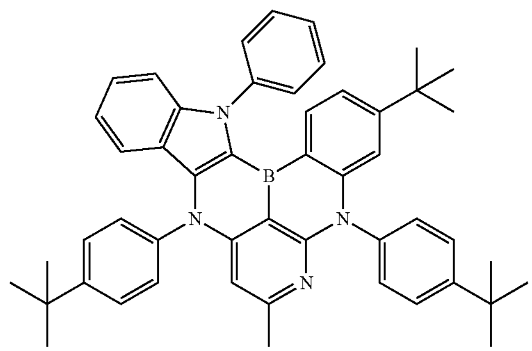
16
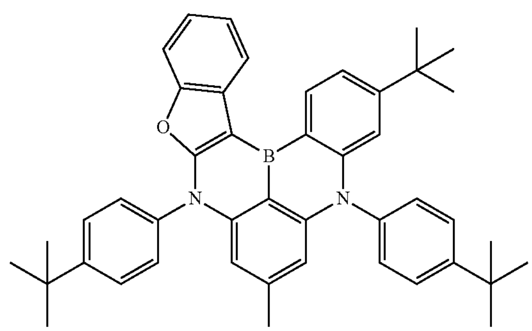
17
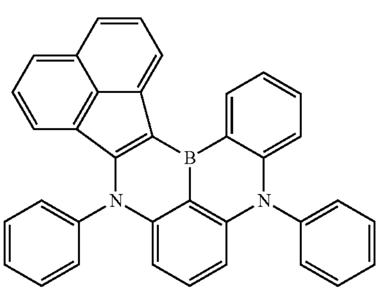

-continued
18
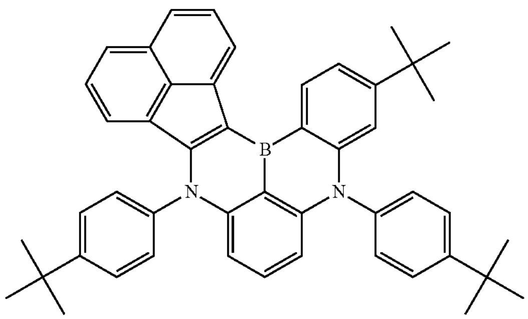
19
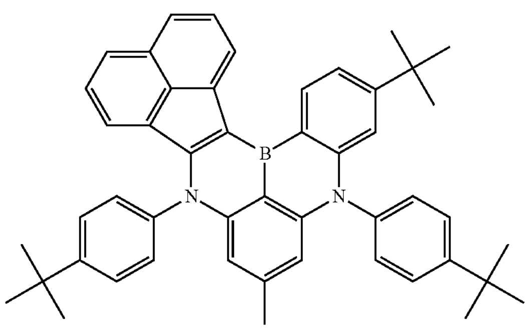
20
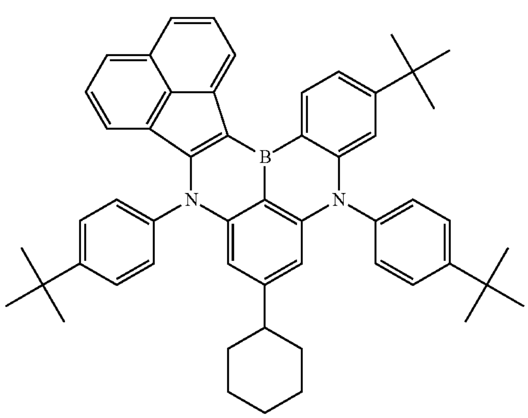
21
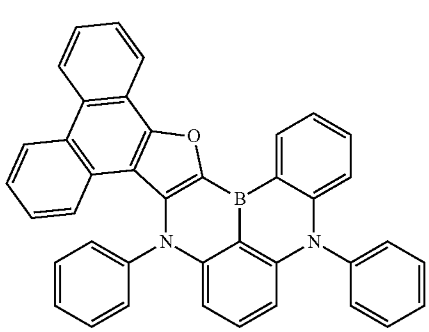
-continued
22
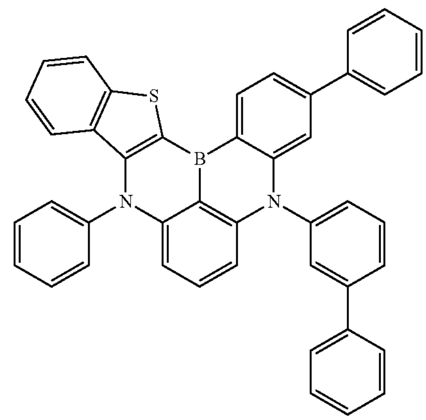
23
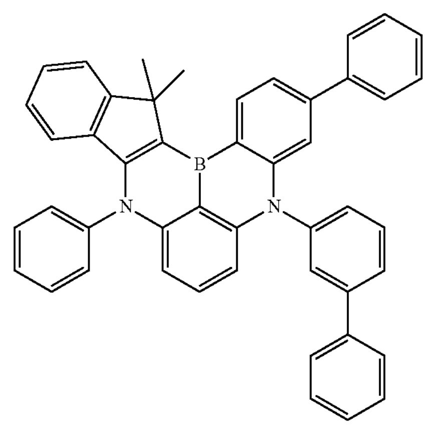
24
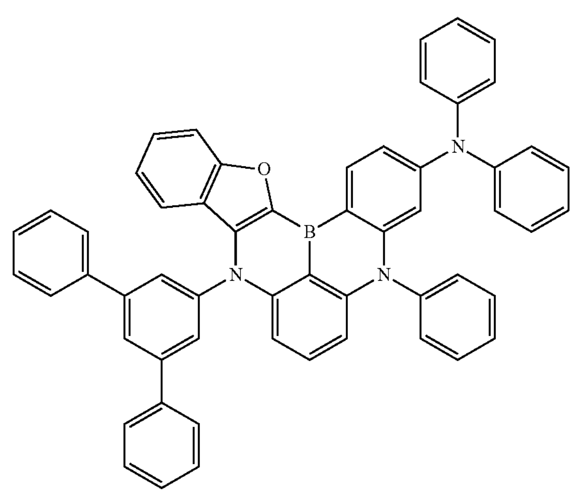

-continued
25
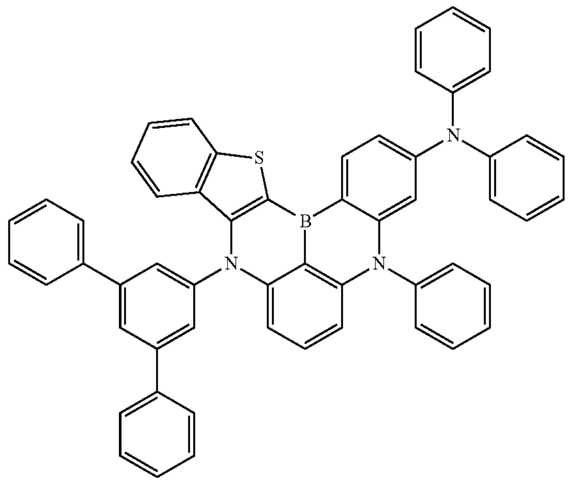
26
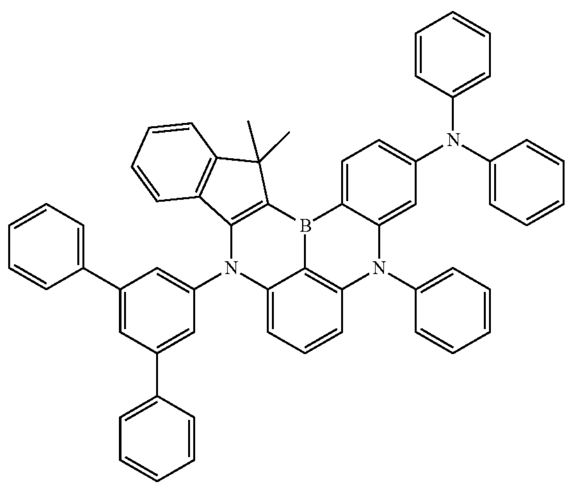
27
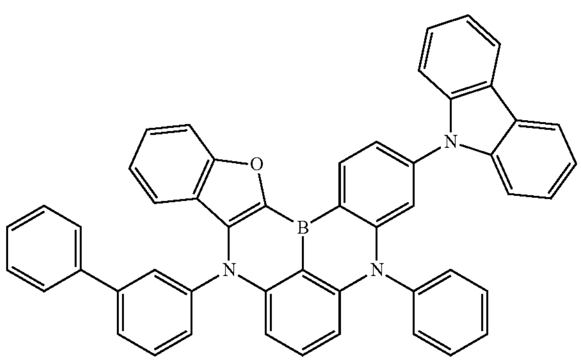
-continued
28
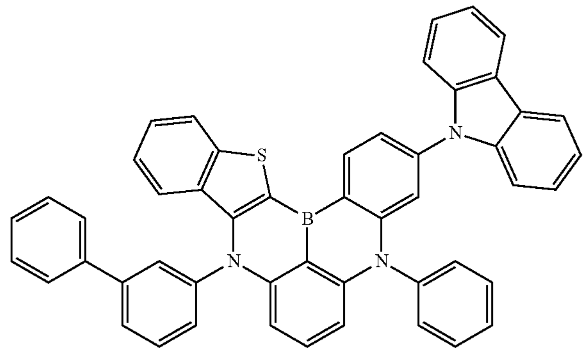
29
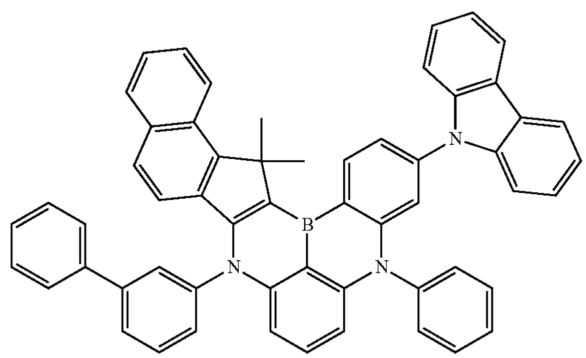
30
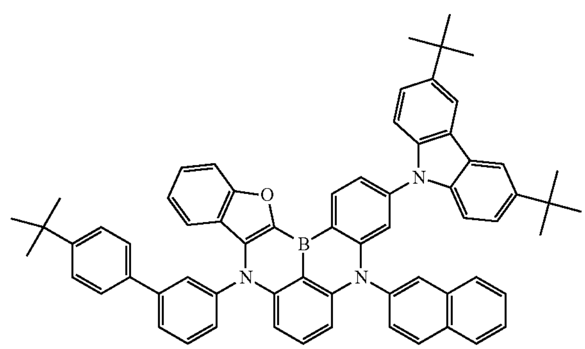
31
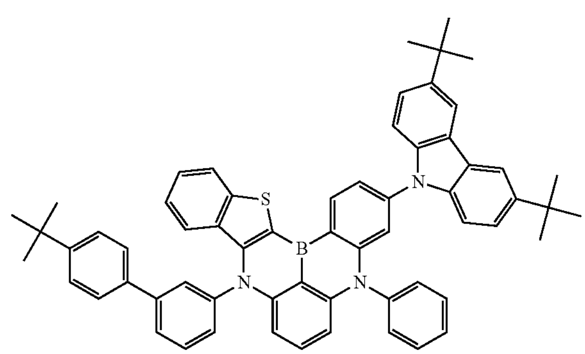

-continued
32
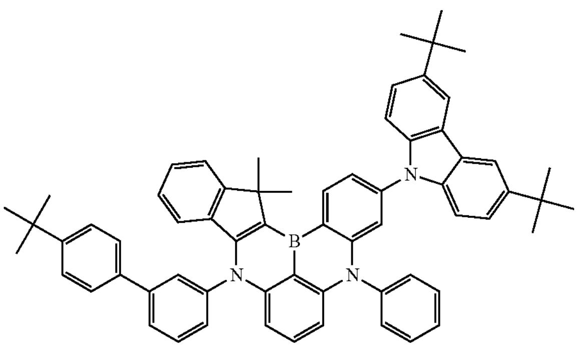
33
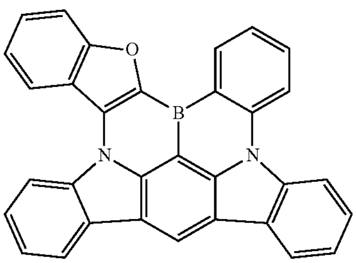
34
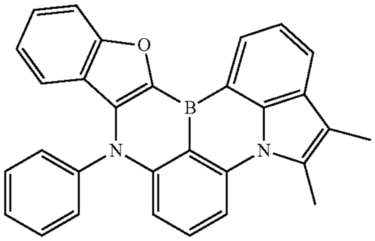
35
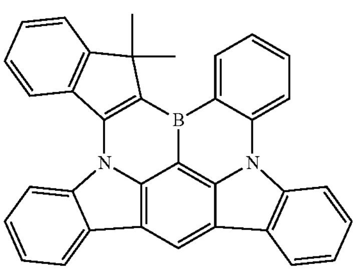
36
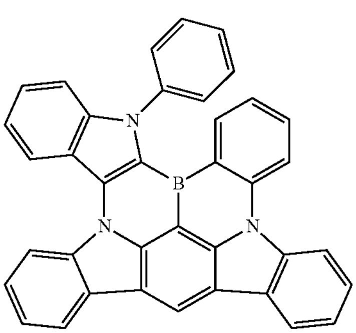
-continued
37
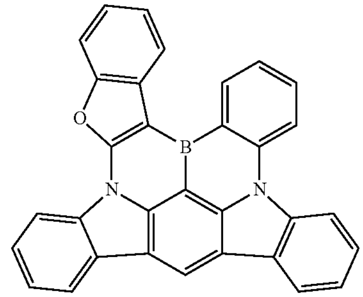
38
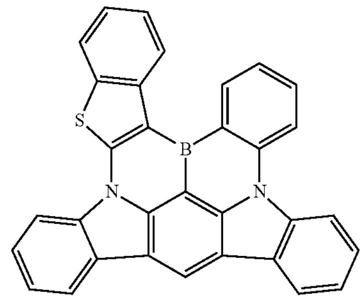
39
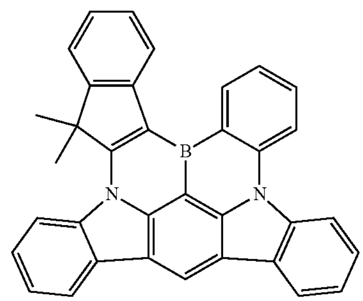
40
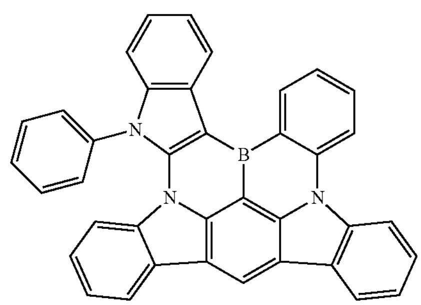
41
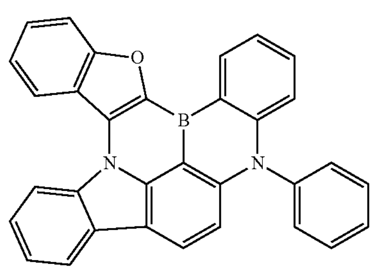

-continued
42
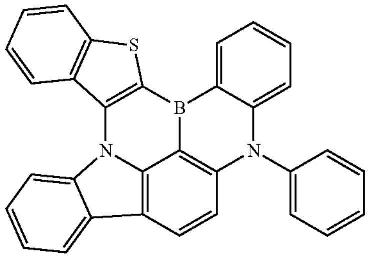
43
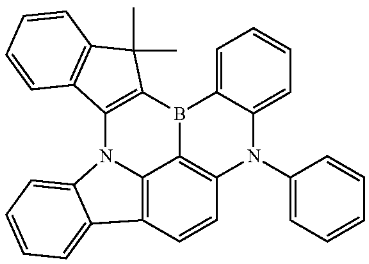
44
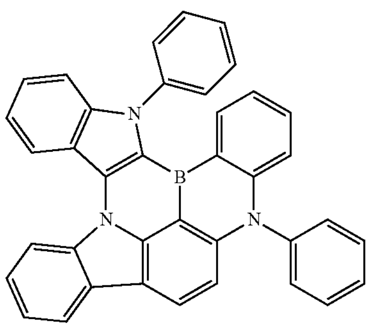
45
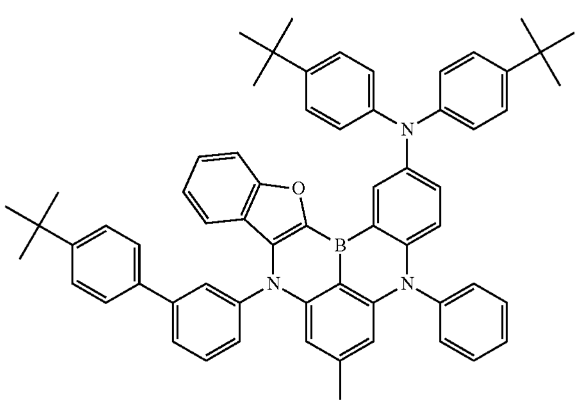
-continued
46
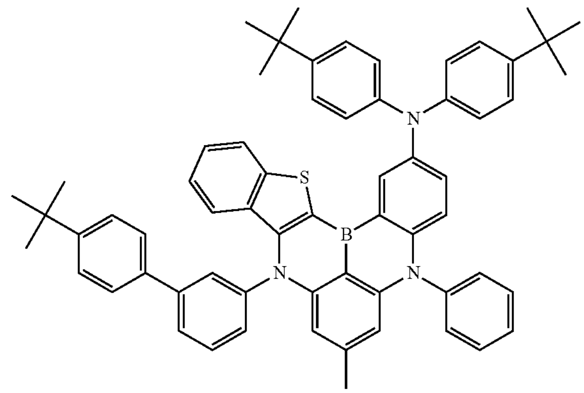
47
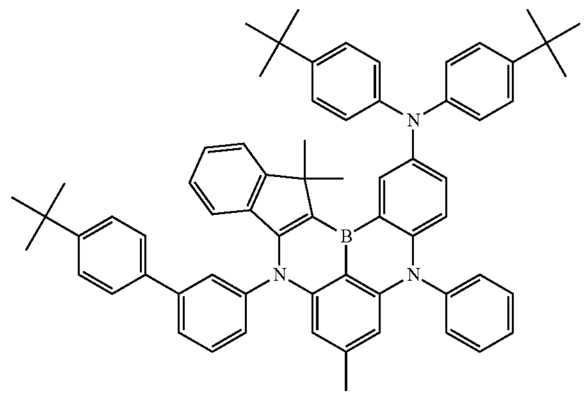
48
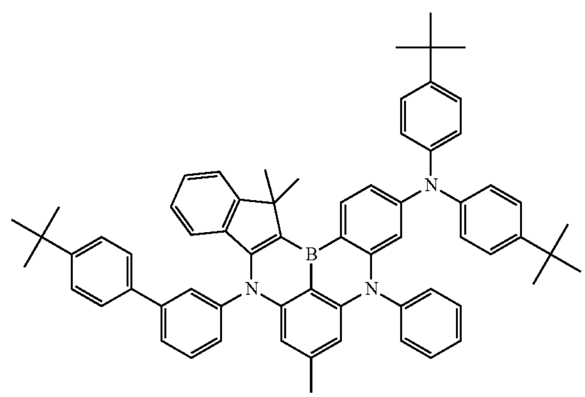
49
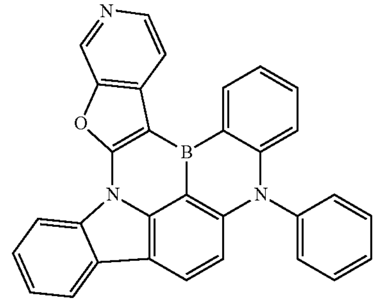

-continued
50
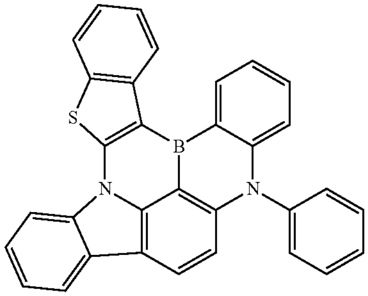
51
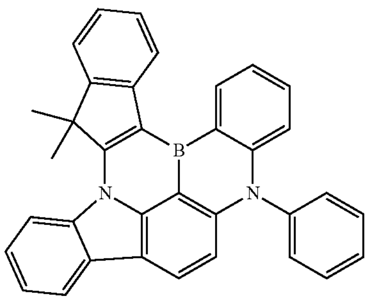
52
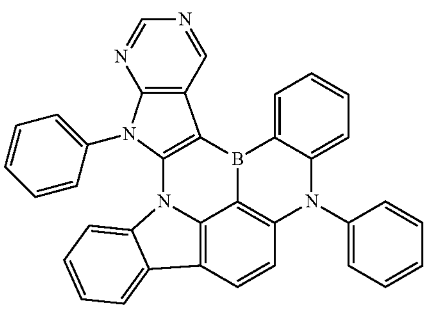
53
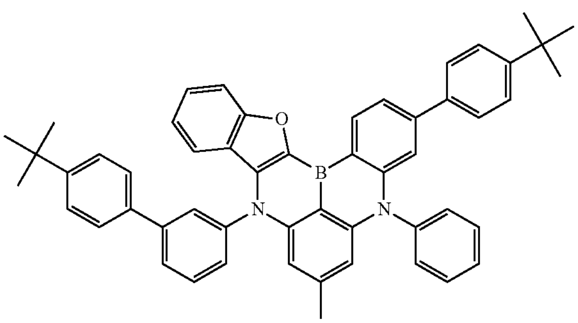
54
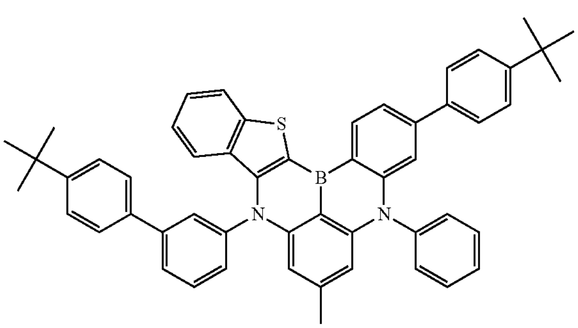
-continued
55
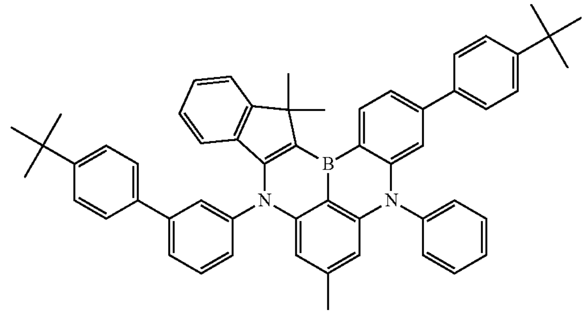
56
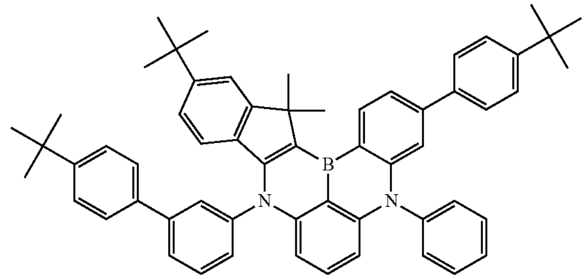
57
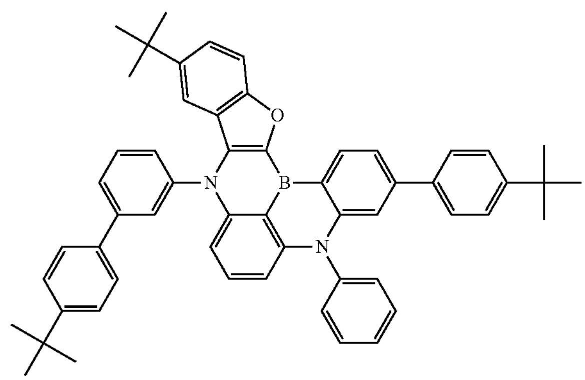
58
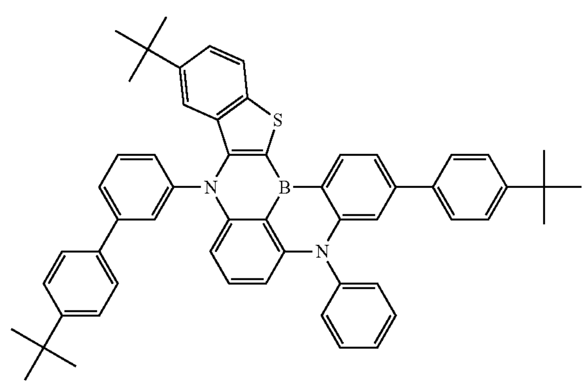

-continued
59
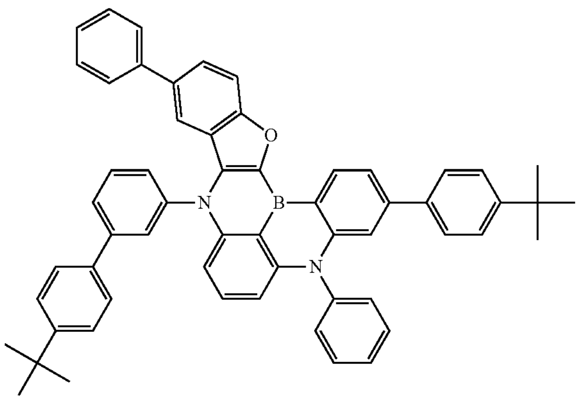
60
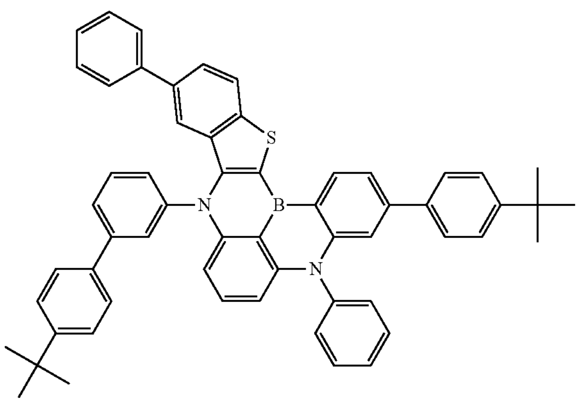
61
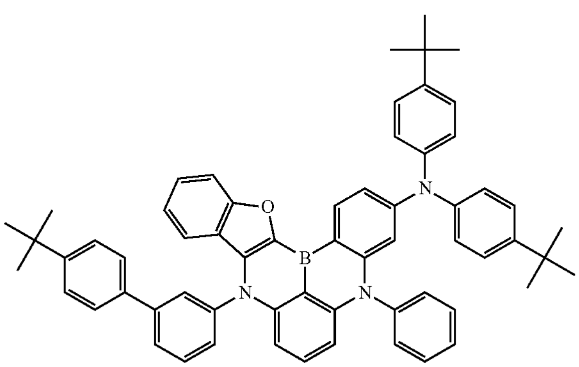
62
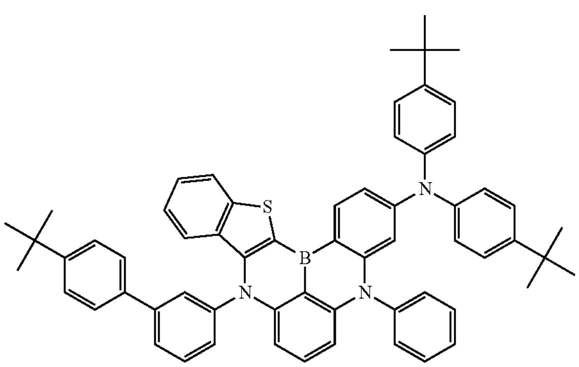
-continued
63
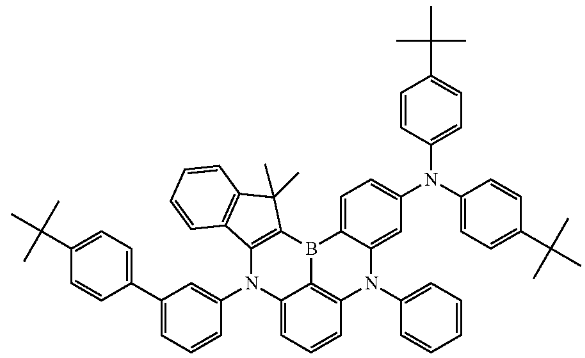
64
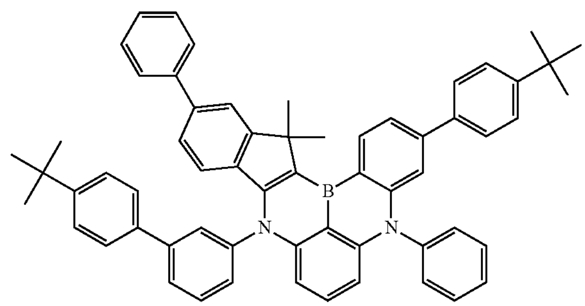
65
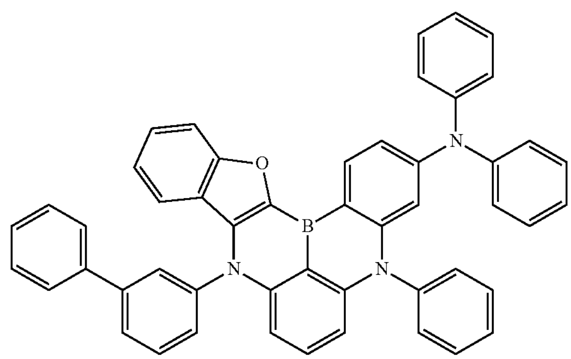
66
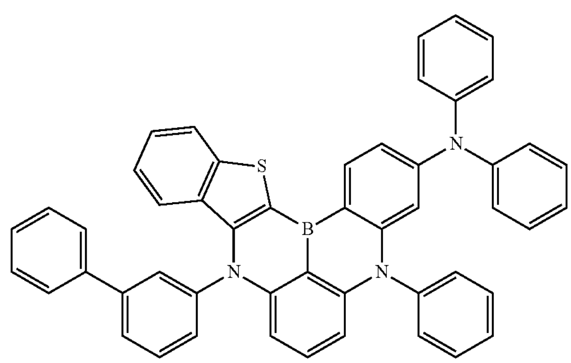

-continued
67
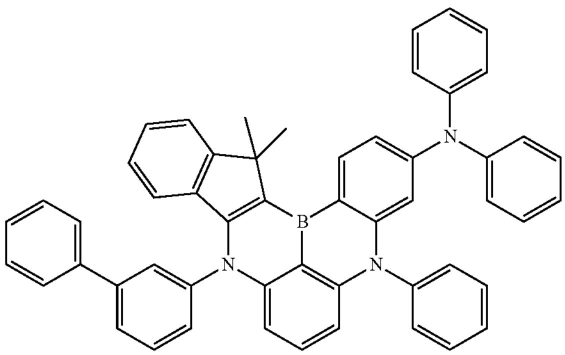
68
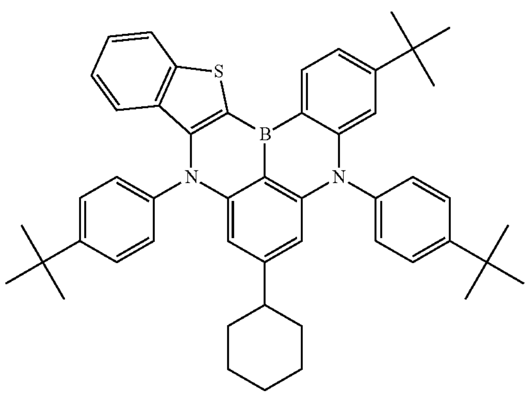
69
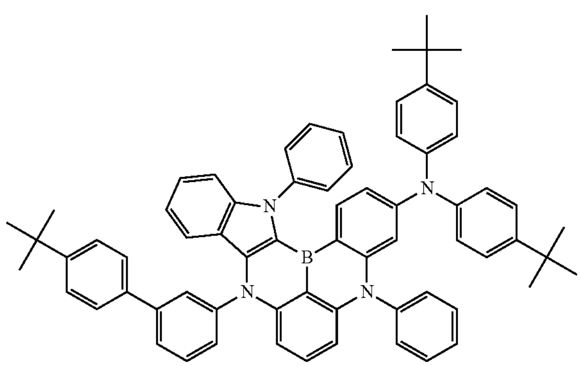
70
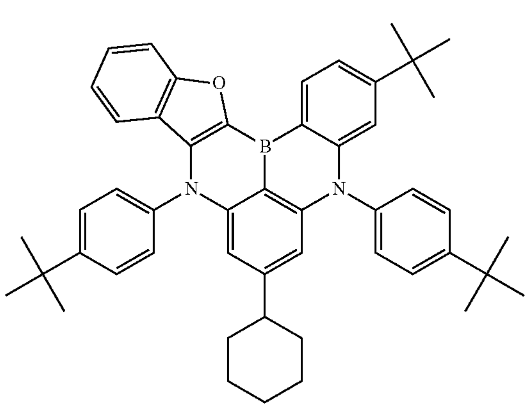
-continued
71
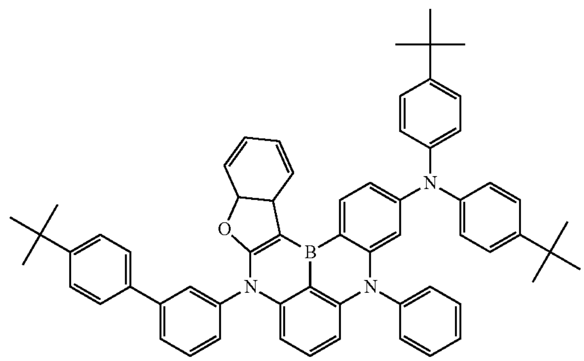
72
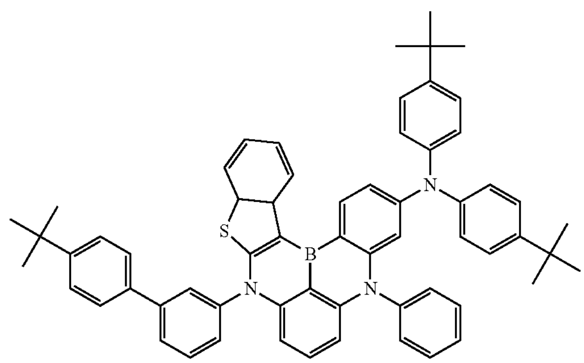
73
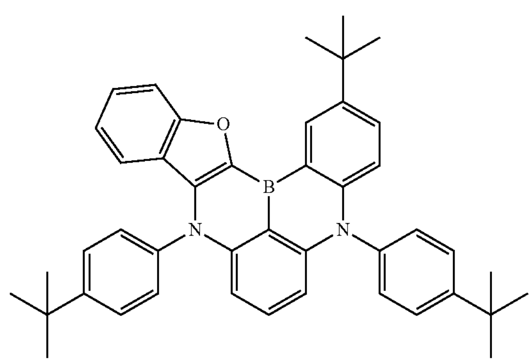
74
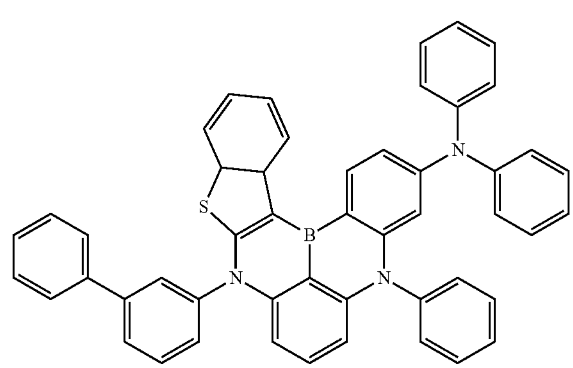

-continued
75
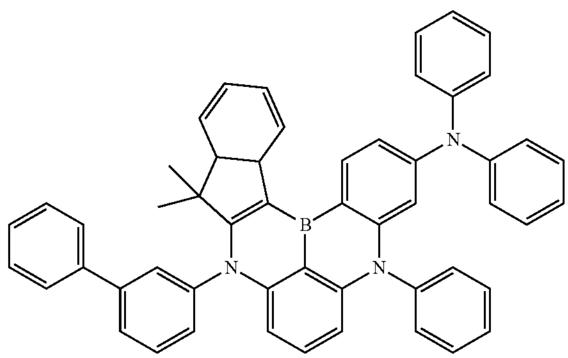
76
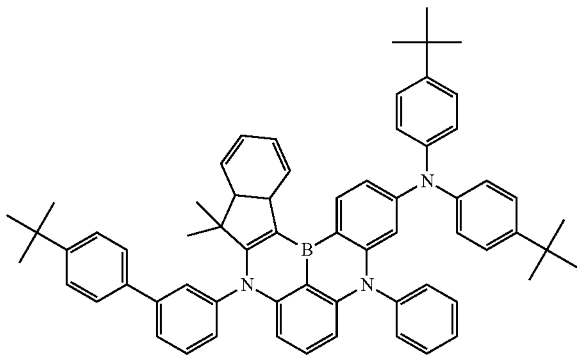
77
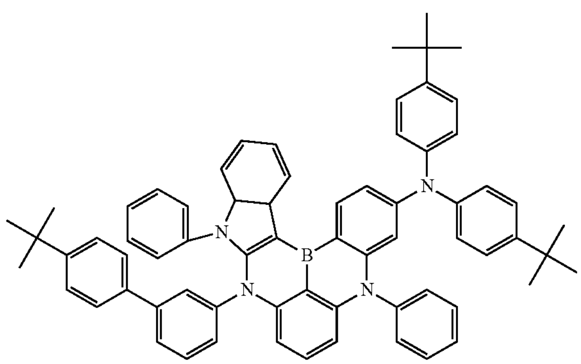
78
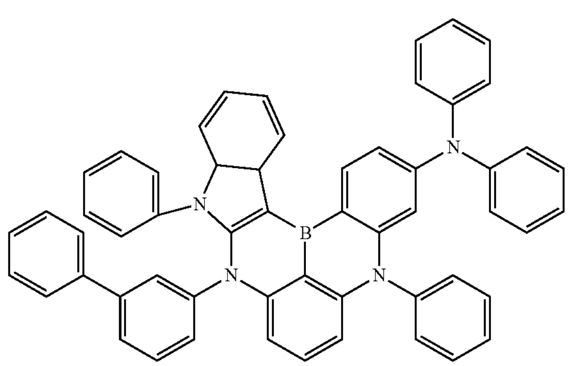
-continued
79
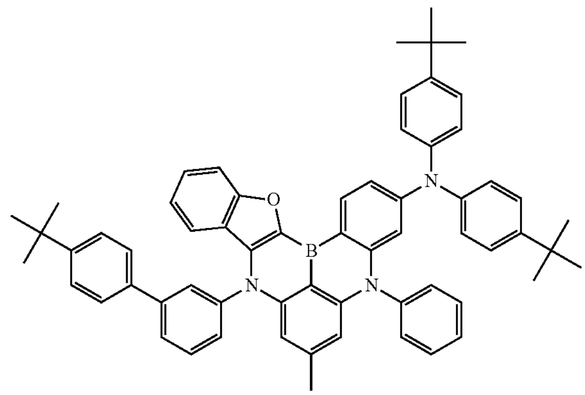
80
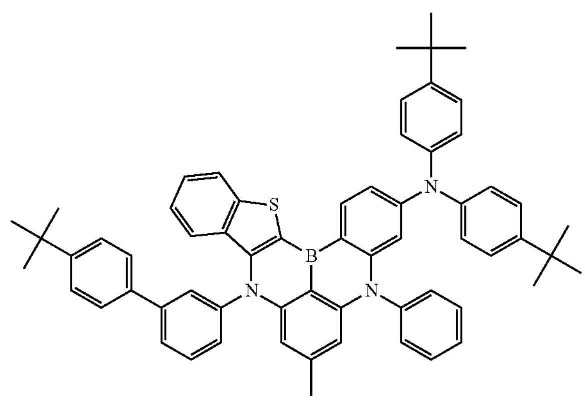
81
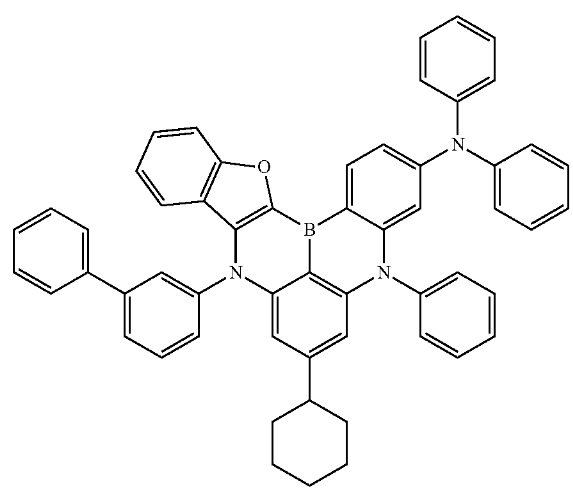

-continued
82
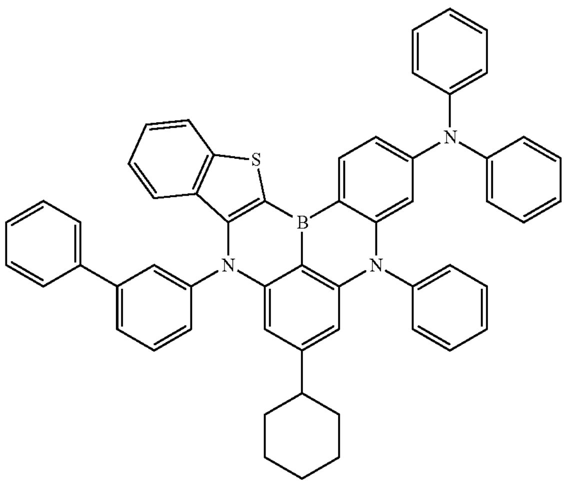
83
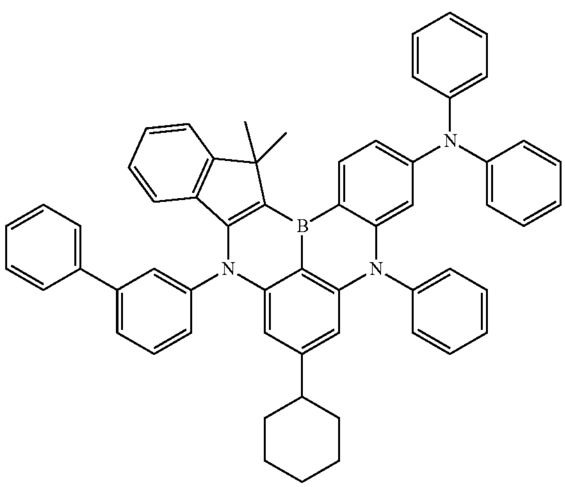
84
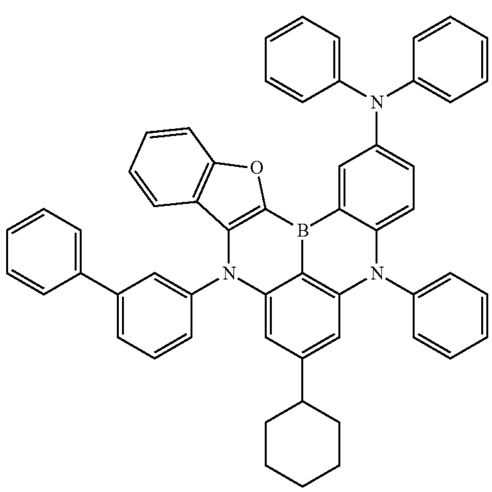
-continued
85
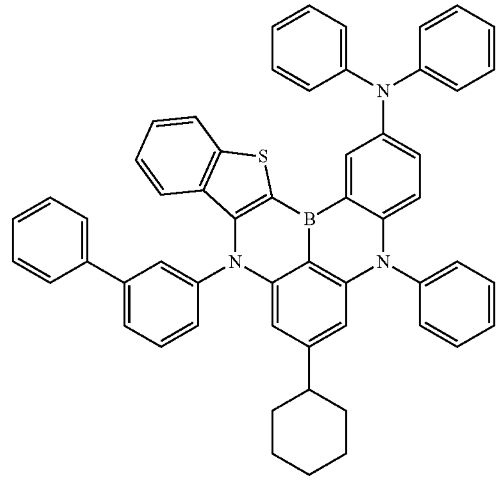
86
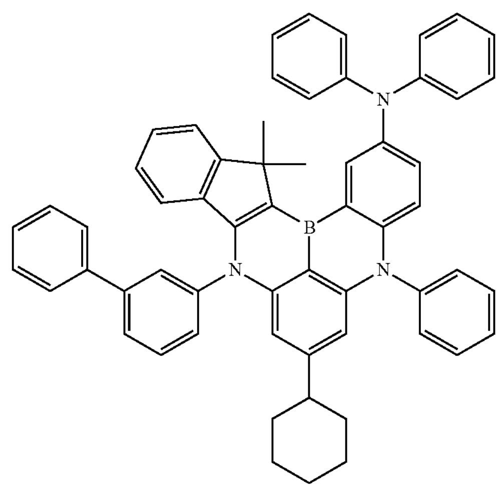
87
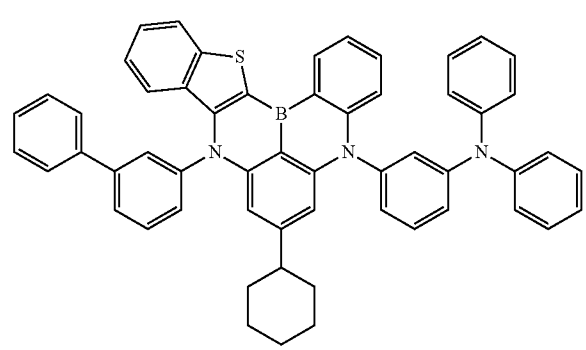

-continued
88
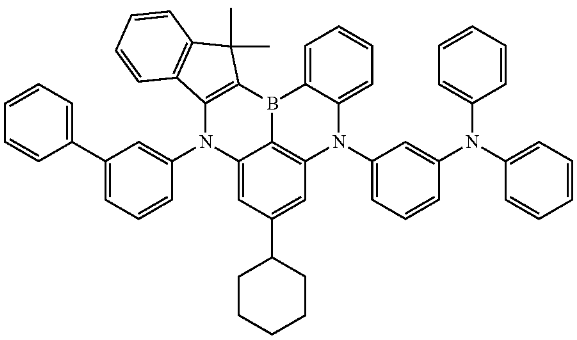
89
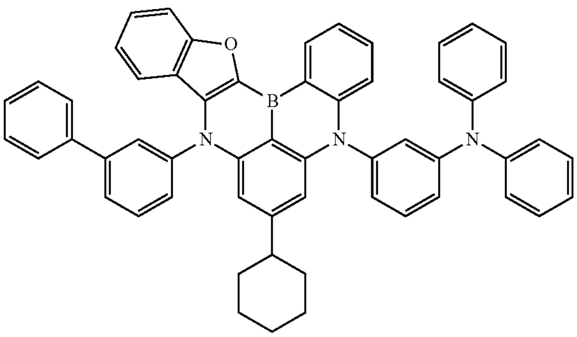
90
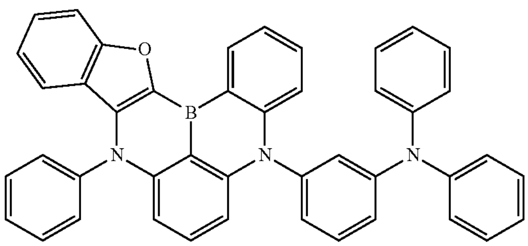
91
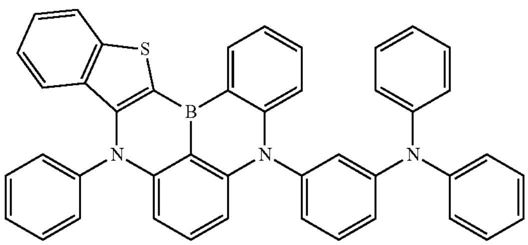
92
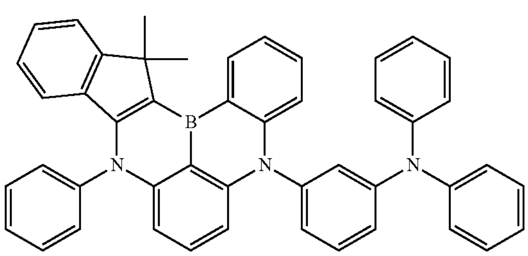
-continued
93
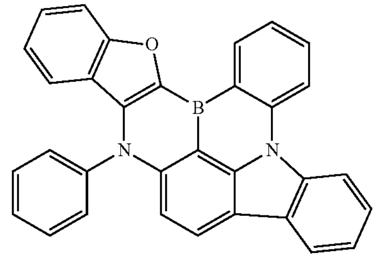
94
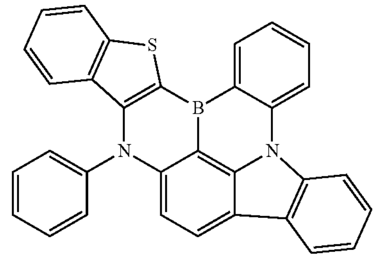
95
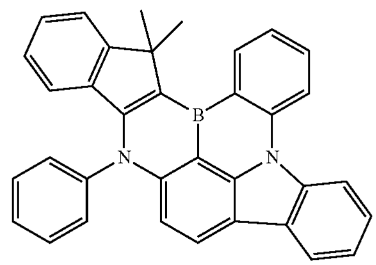
96
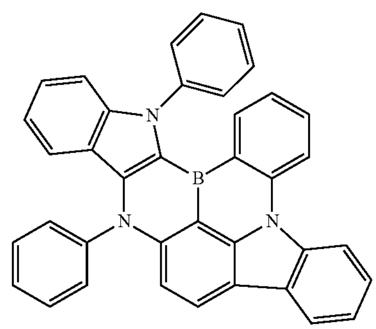
97
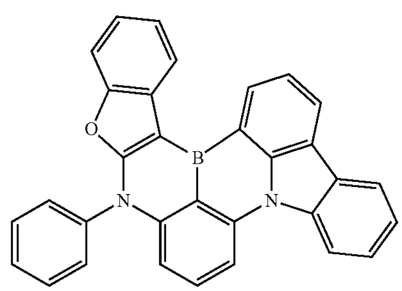

-continued
98
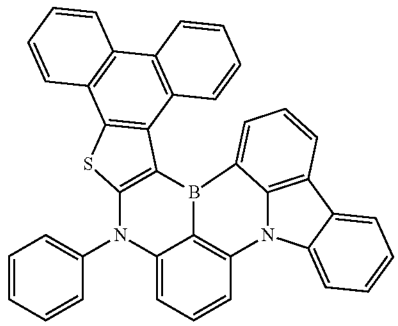
99
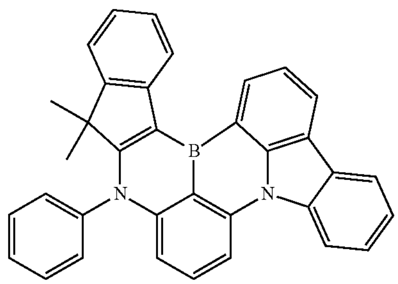
100
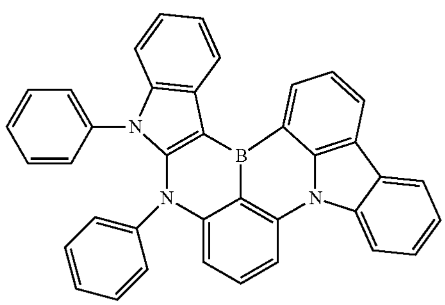
101
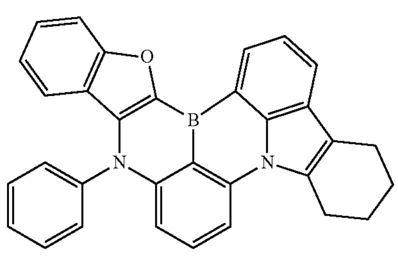
102
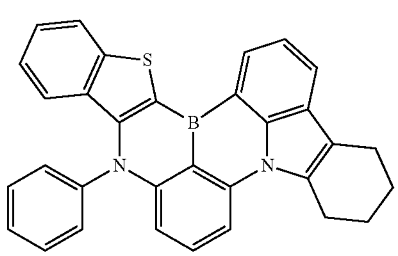
-continued
103
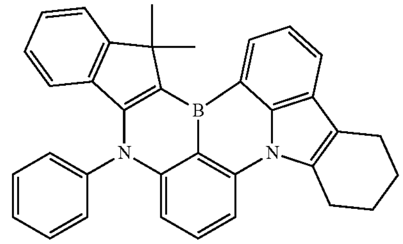
104
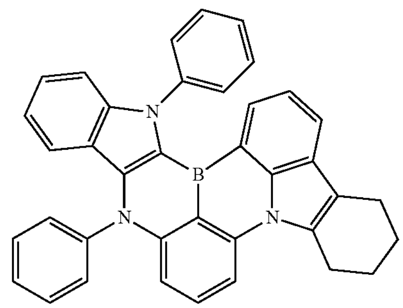
105
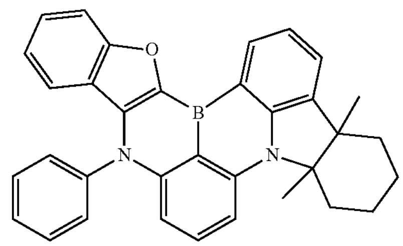
106
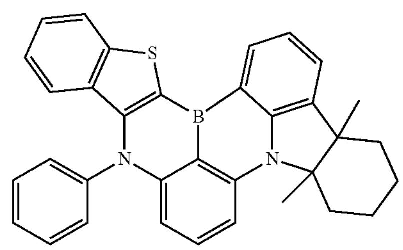
107
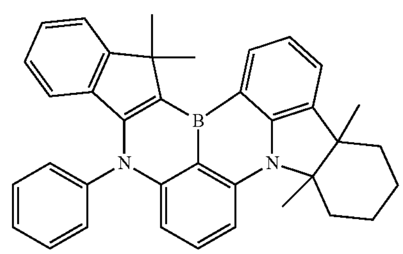
108
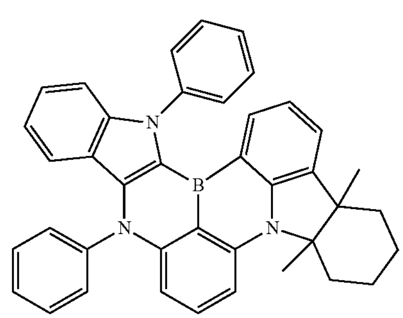

-continued
109
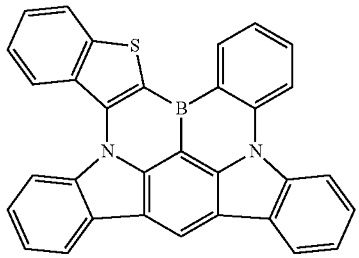
110
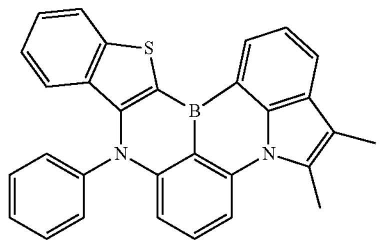
111
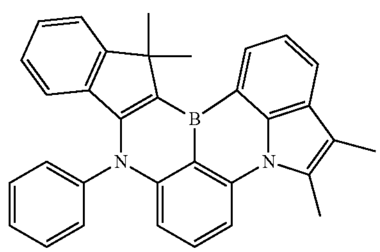
112
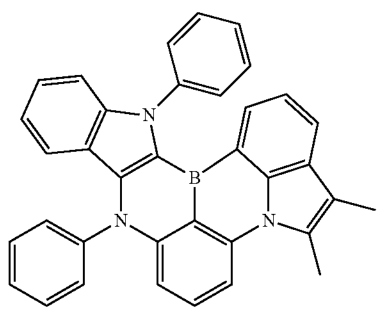
113
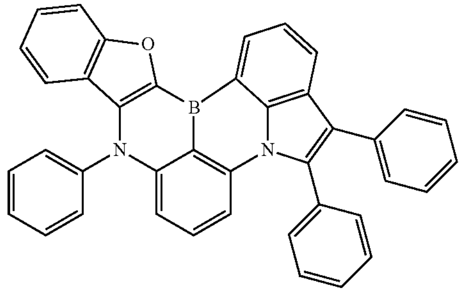
-continued
114
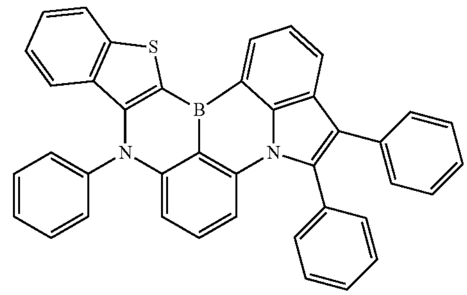
115
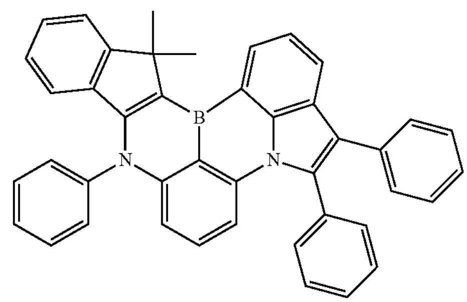
116
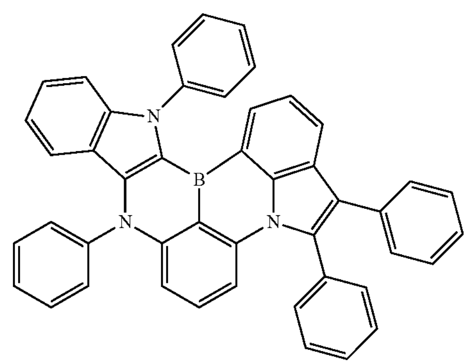
117
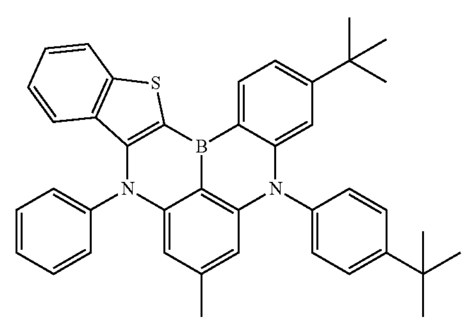
121
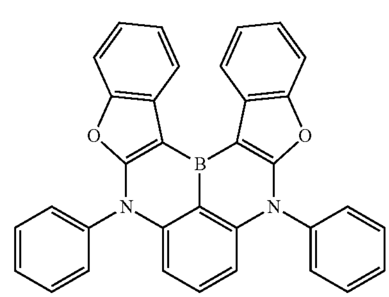

-continued
122
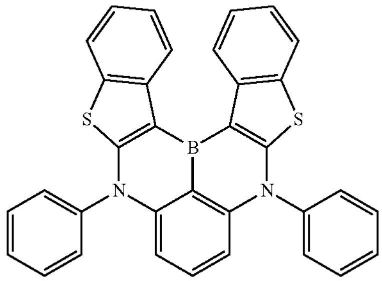
123
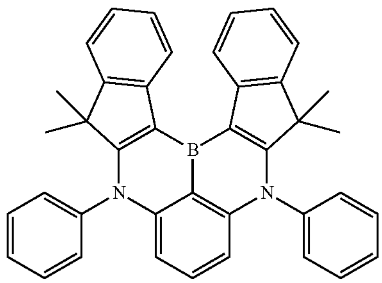
124
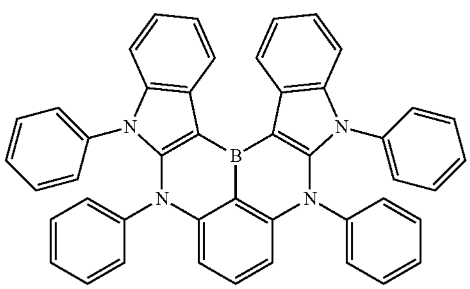
125
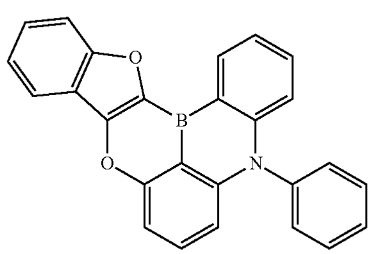
126
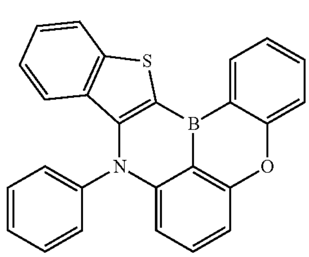
-continued
127
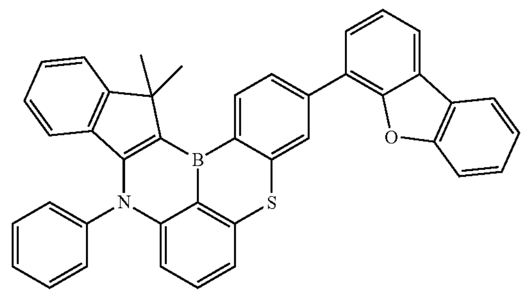
128
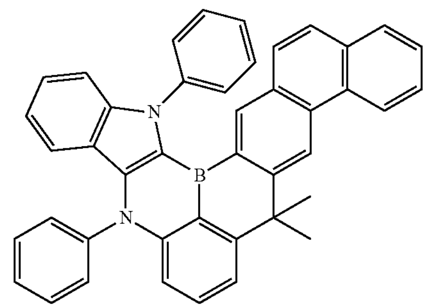
129
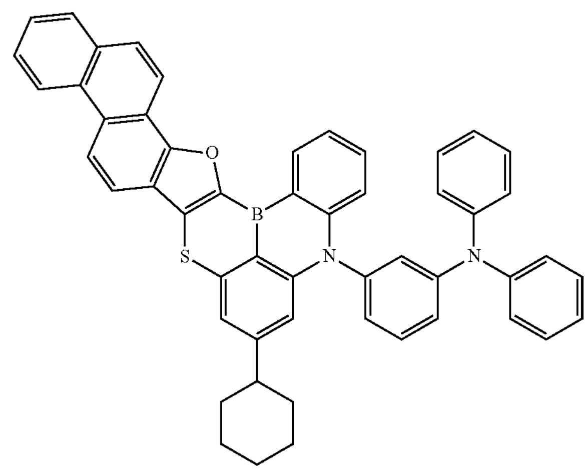
130
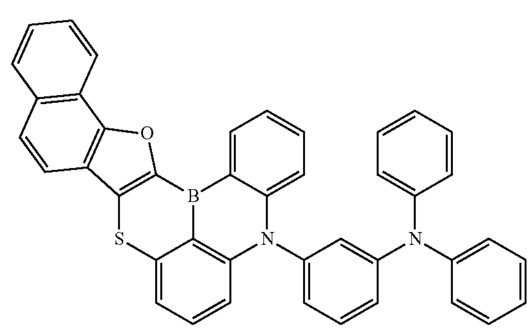

-continued
131
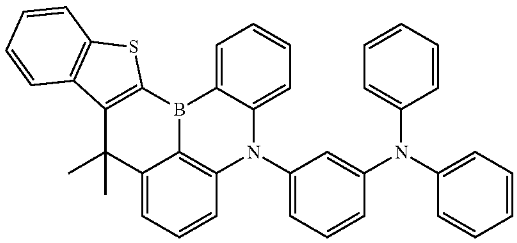
132
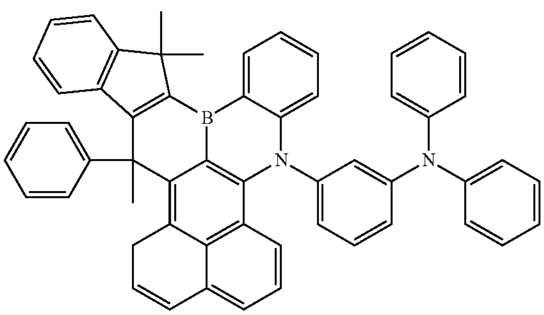
133
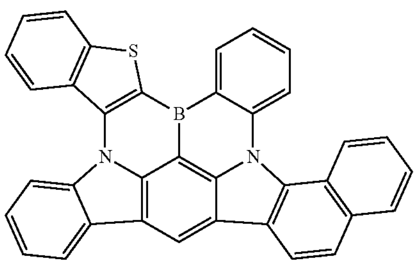
134
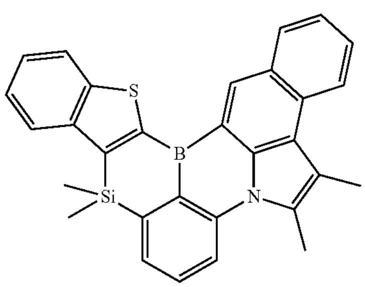
135
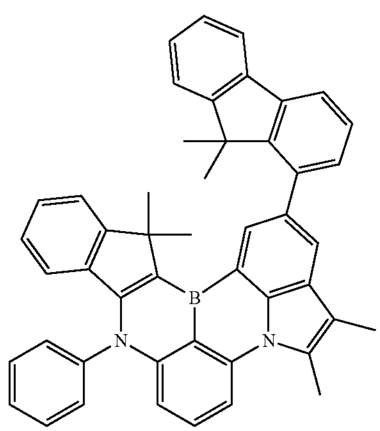
-continued
136
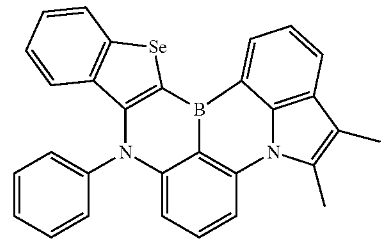
137
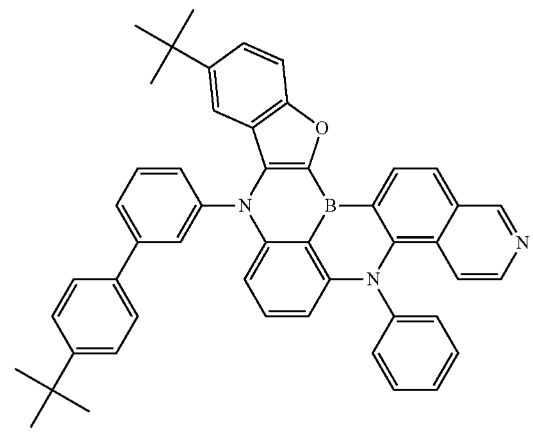
138
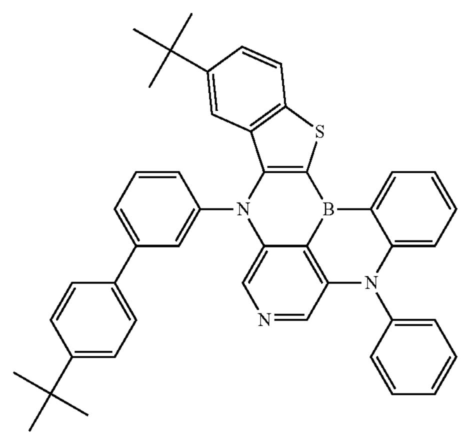
139
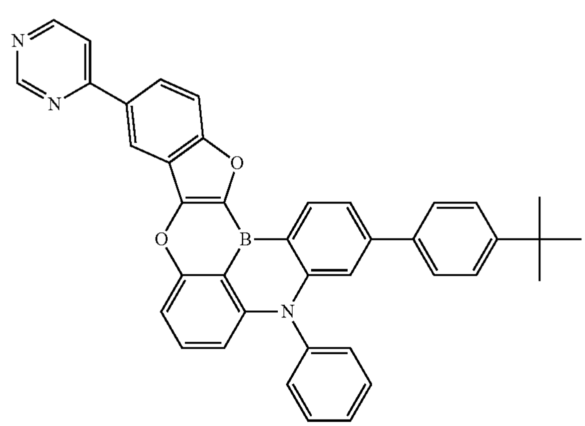

-continued
140
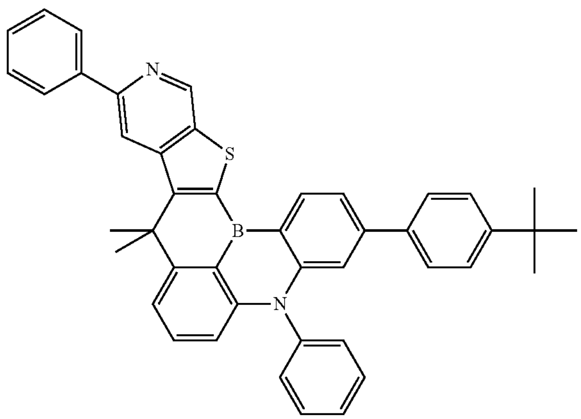
141
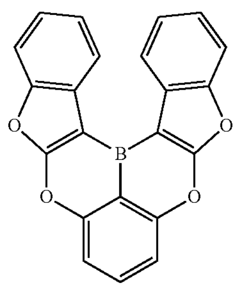
142
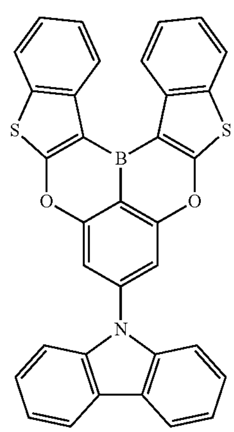
143
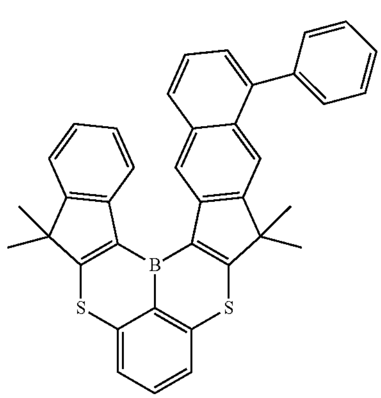
-continued
144
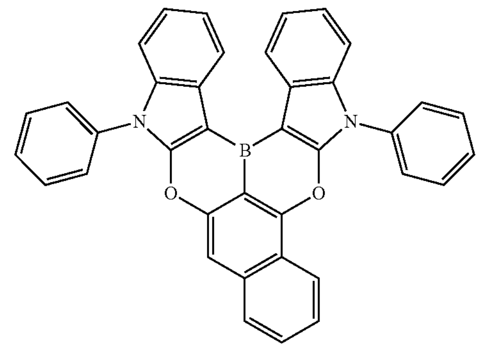
146
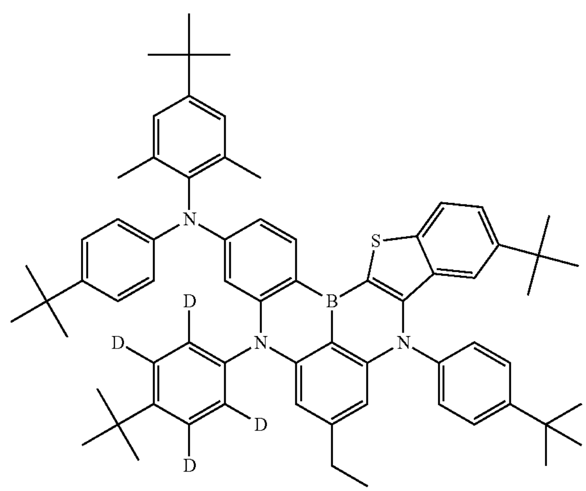
147
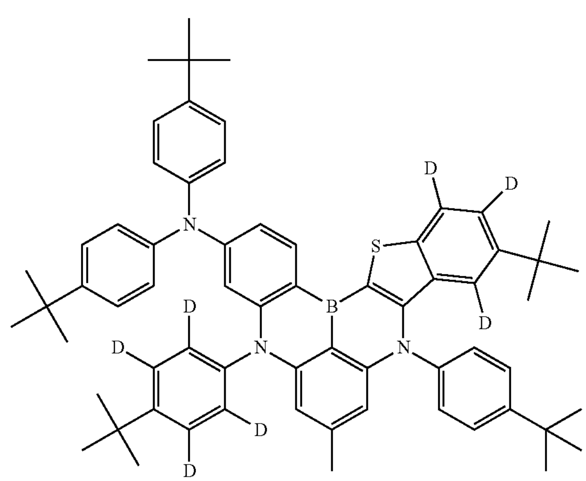

-continued
148
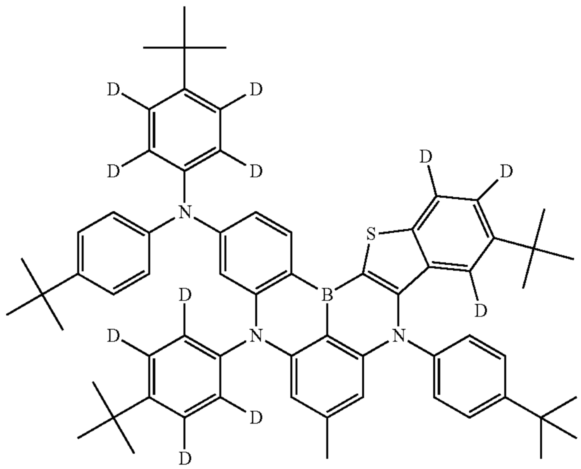
149
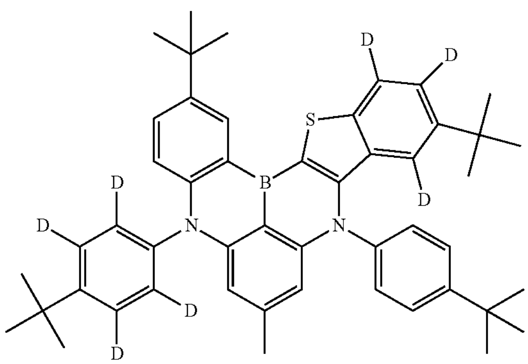
150
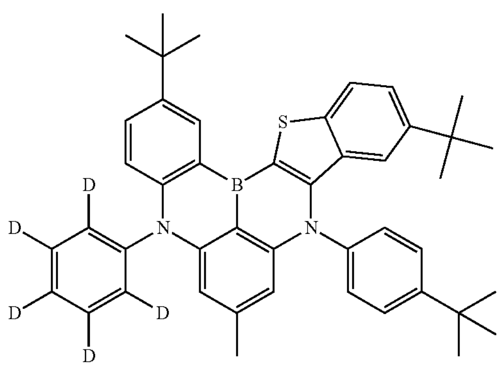
151
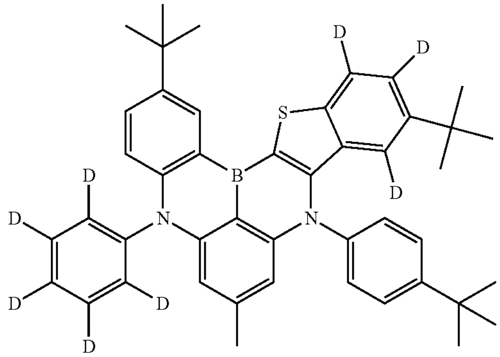
-continued
152
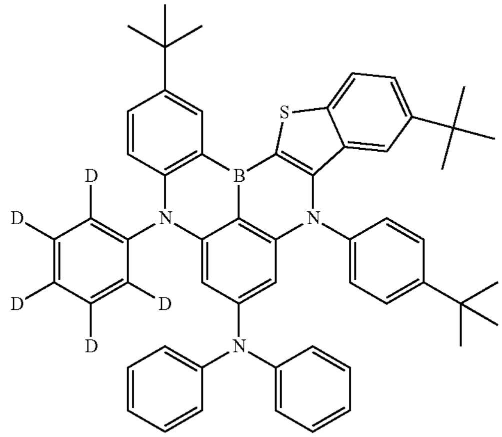
153
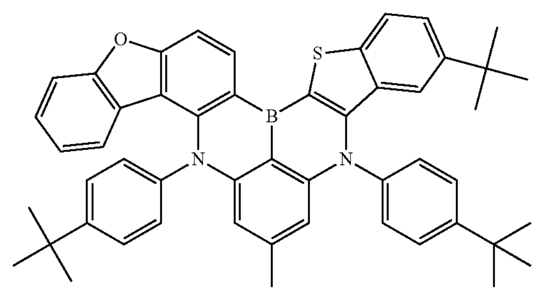
154
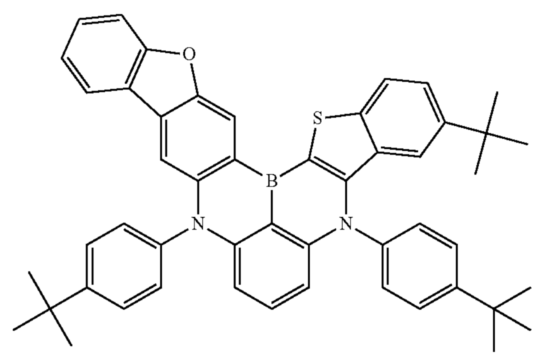
155
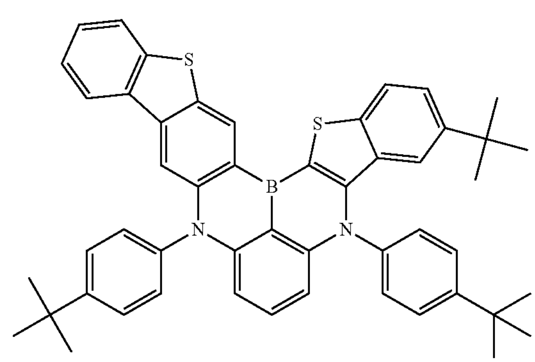

156
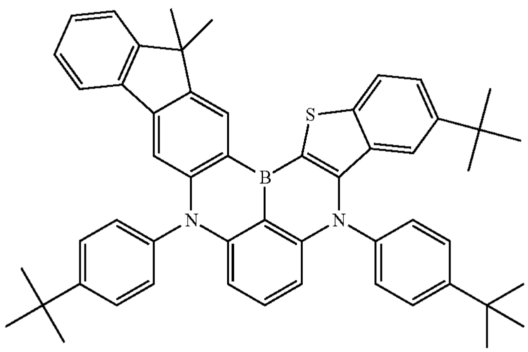
157
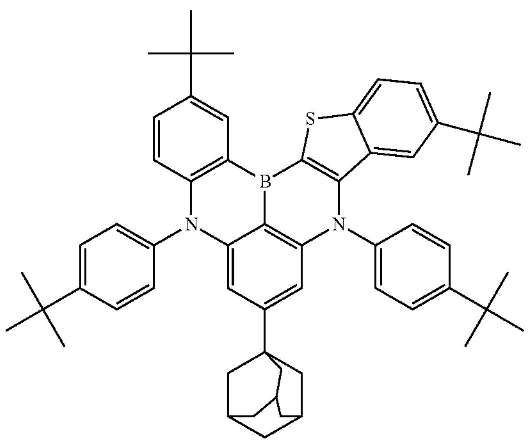
158
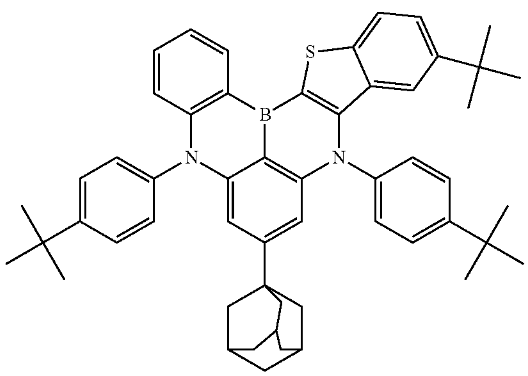
159
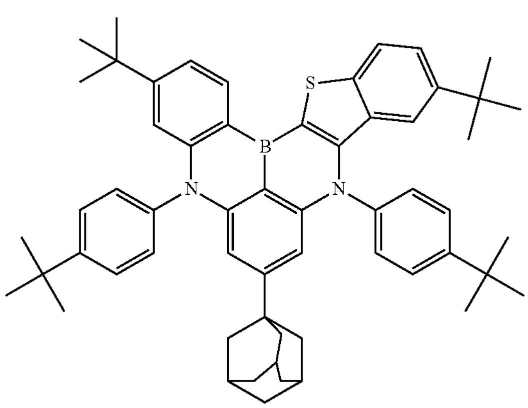
160
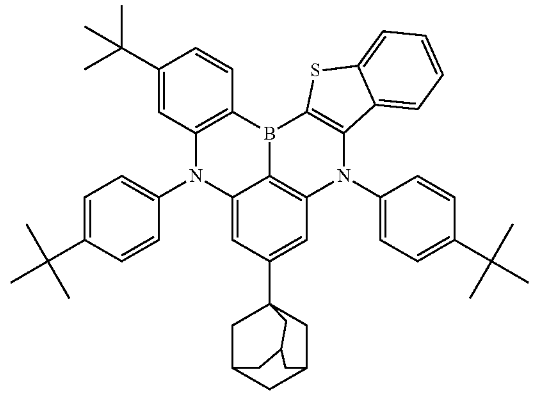
161
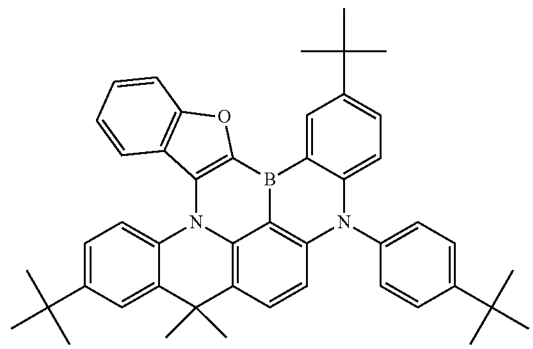
162
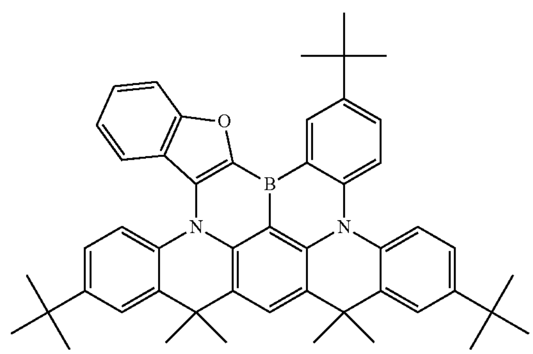
163
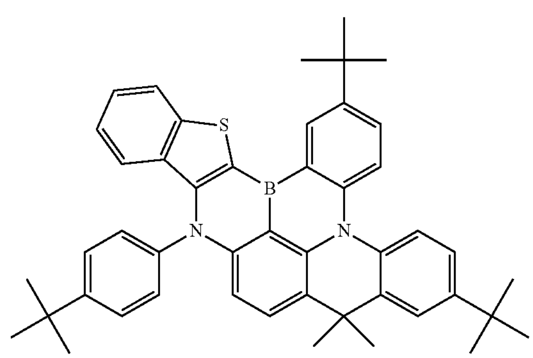

-continued
164
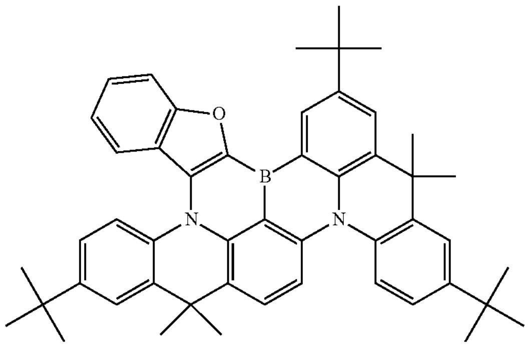
165
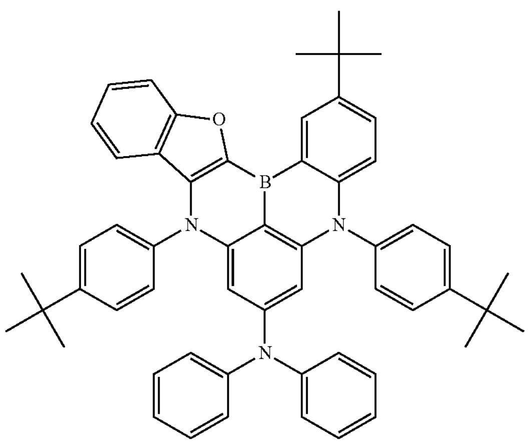
166
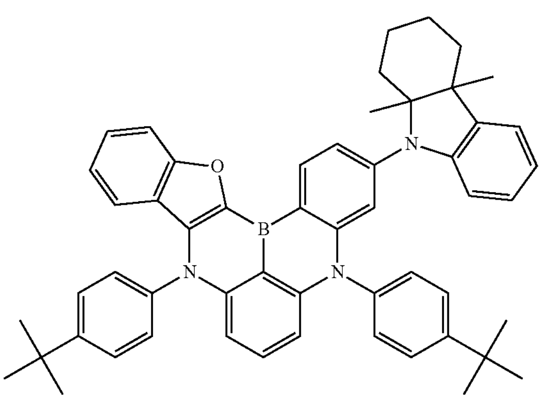
-continued
167
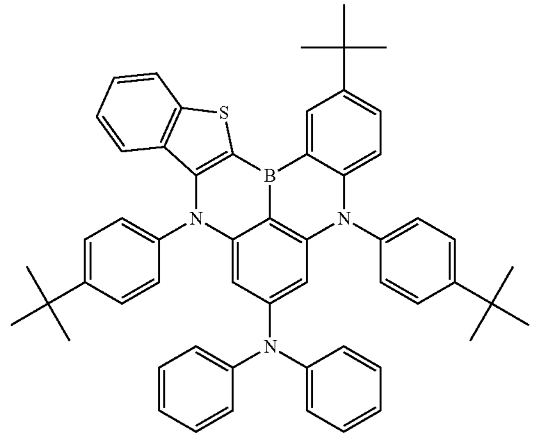
168
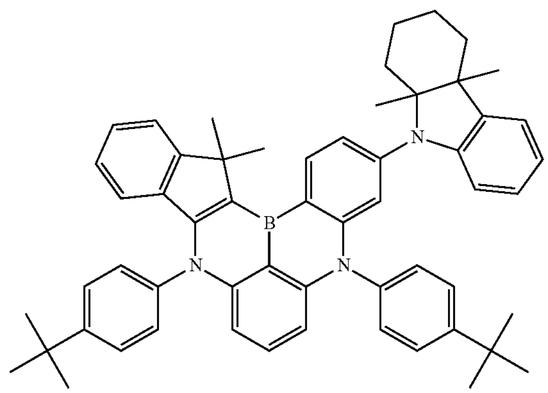
169
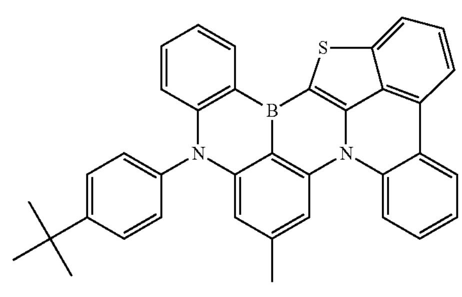
170
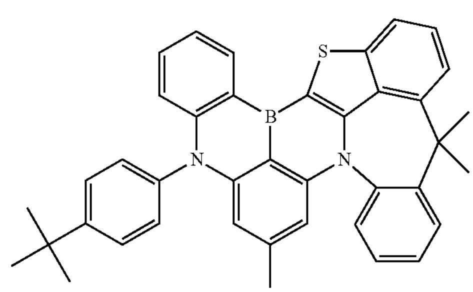

-continued

171

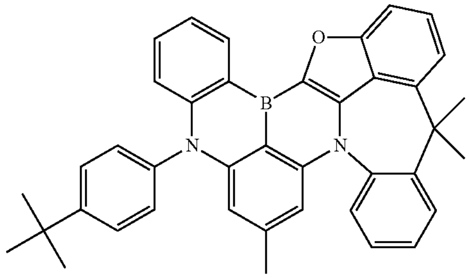

172

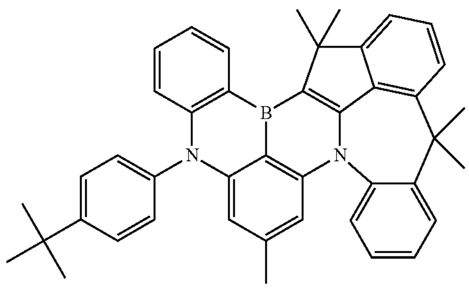

173

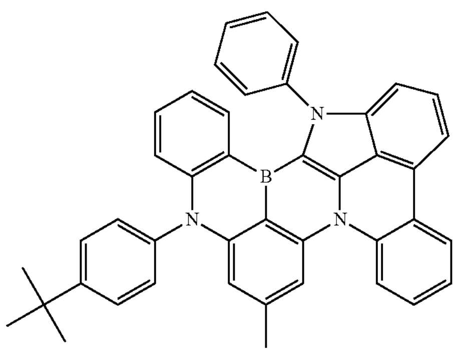

174

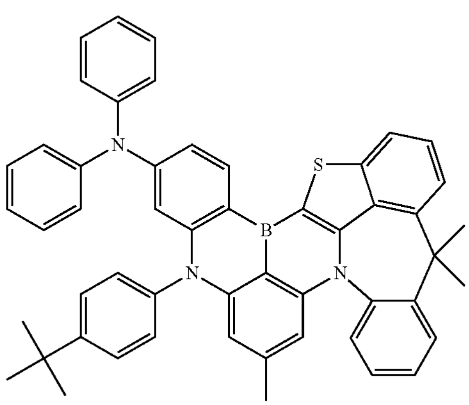

-continued

175

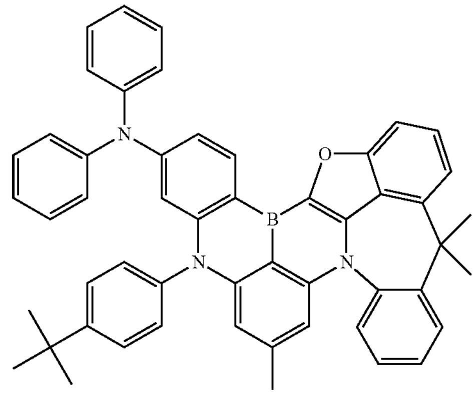

176

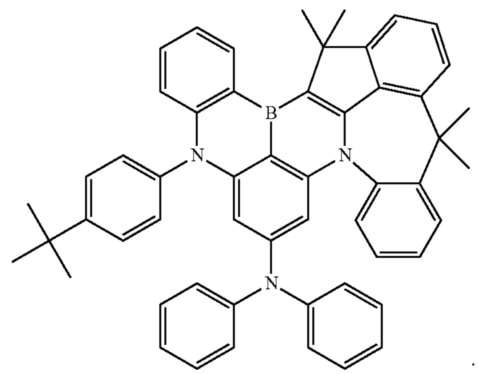

3. An organic electroluminescent device comprising a first electrode, a second electrode opposite to the first electrode, and one or more organic layers interposed between the first and second electrodes wherein at least one of the organic layers comprises the organic electroluminescent compound represented by Formula A-3, A-4, A-5 or A-6 according to claim 1 and optionally another organic electroluminescent compound represented by Formula A-3, A-4, A-5 or A-6.

4. The organic electroluminescent according to claim 3, wherein the organic layers comprise an electron injecting layer, an electron transport layer, a hole injecting layer, a hole transport layer, an electron blocking layer, a hole blocking layer, and a light emitting layer, and at least one of the organic layers comprises the organic electroluminescent compound represented by Formula A-3, A-4, A-5 or A-6.

5. The organic electroluminescent according to claim 4, wherein the light emitting layer comprises, as a host compound, an anthracene derivative represented by Formula C:

(C)

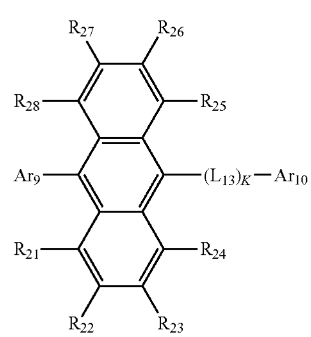

wherein $R_{21}$ to $R_{28}$ are identical to or different from each other and are as defined for $R_1$ to $R_4$ in Formula A-3, A-4, A-5 or A-6 representing the organic electroluminescent compound according to claim 1, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_2$-$C_{30}$ cycloalkenyl, substituted or unsubstituted $C_1$-$C_{30}$ heteroaryl, substituted or unsubstituted $C_6$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

6. The organic electroluminescent according to claim 5, wherein $Ar_9$ in Formula C is represented by Formula C-1:

(C-1)

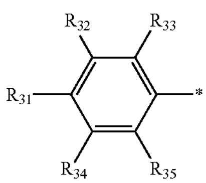

wherein $R_{31}$ to $R_{35}$ are identical to or different from each other and are as defined for $R_1$ to $R_4$ in Formula A-3, A-4, A-5 or A-6 representing the organic electroluminescent compound according to claim 1 and each of $R_{31}$ to $R_{35}$ is optionally bonded to an adjacent substituent to form a saturated or unsaturated ring.

7. The organic electroluminescent according to claim 5, wherein $L_{13}$ in Formula C is a single bond or is substituted or unsubstituted $C_6$-$C_{20}$ arylene.

8. The organic electroluminescent according to claim 5, wherein the compound of Formula C is selected from the compounds of Formulae C1 to C48:

C1

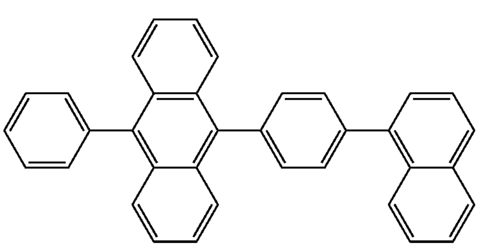

-continued

C2

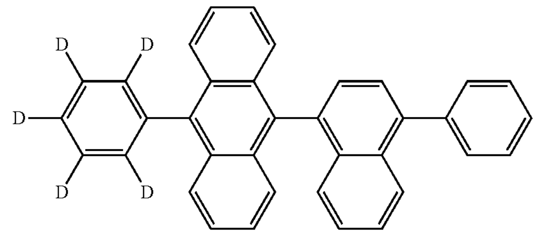

C3

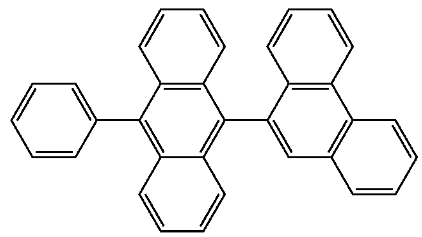

C4

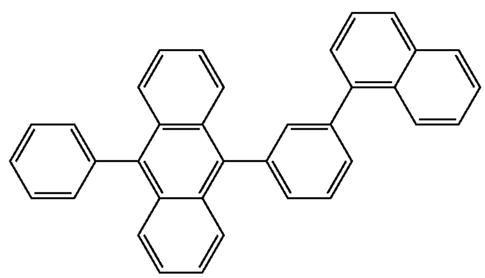

C5

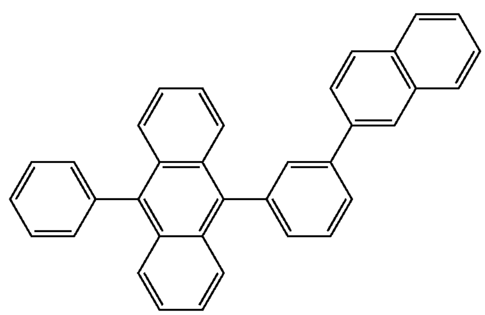

C6

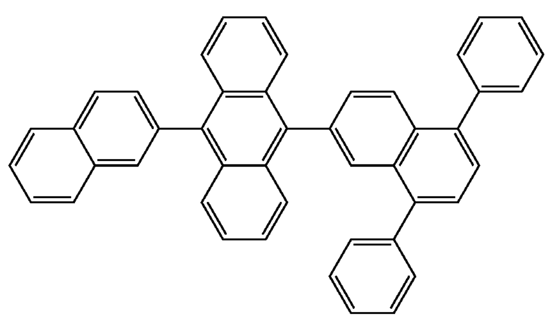

-continued
C7
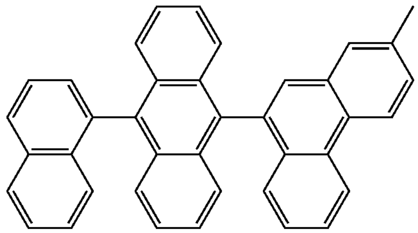
C8
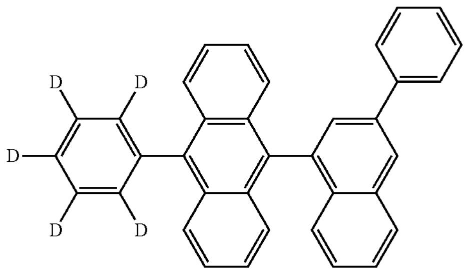
C9
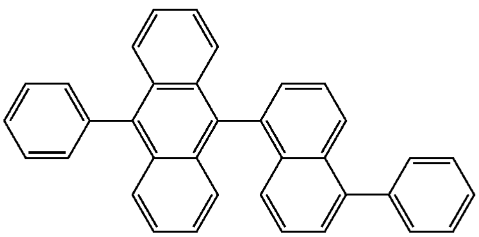
C10
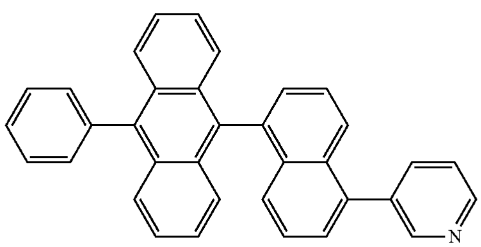
C11
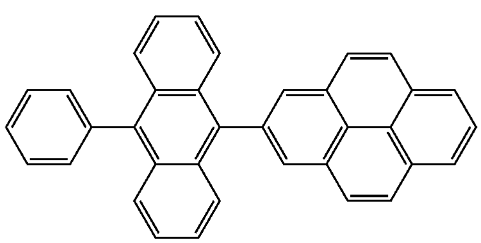
C12
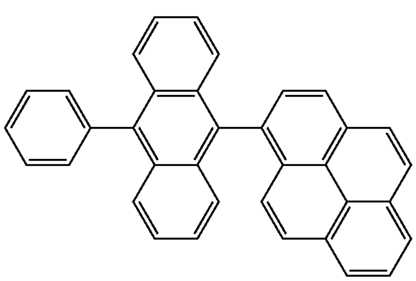
-continued
C13
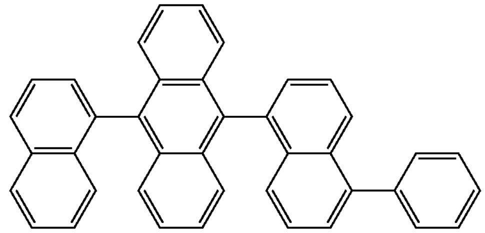
C14
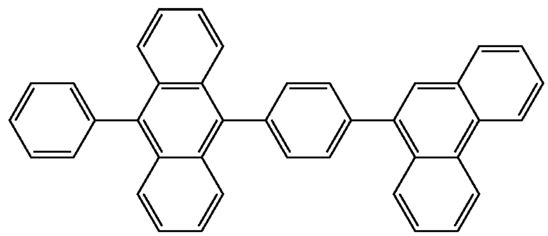
C15
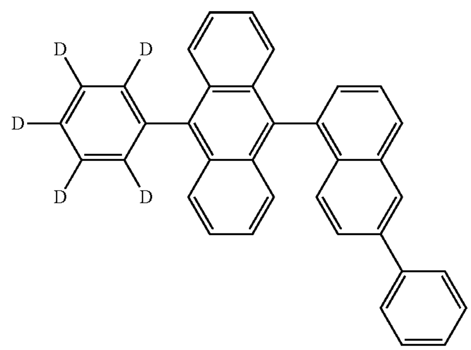
C16
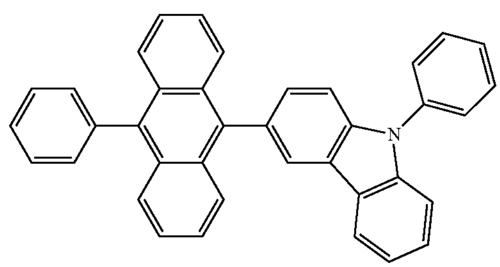
C17
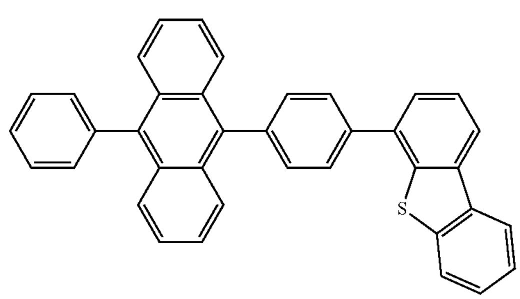

-continued
C18
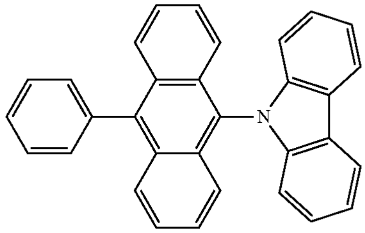
C19
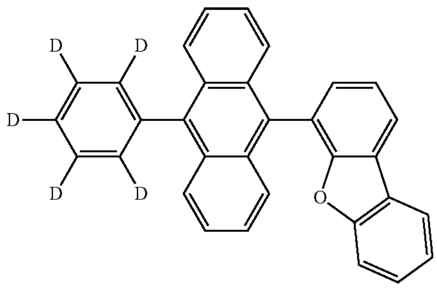
C20
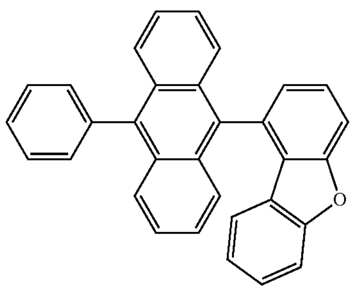
C21
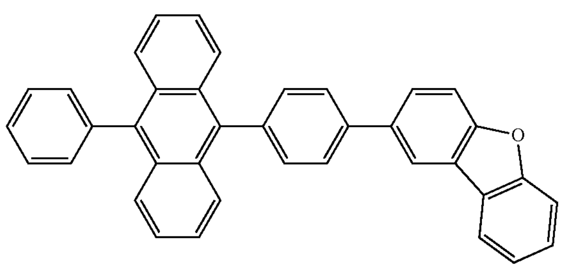
C22
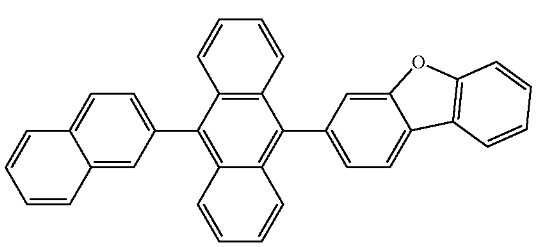
-continued
C23
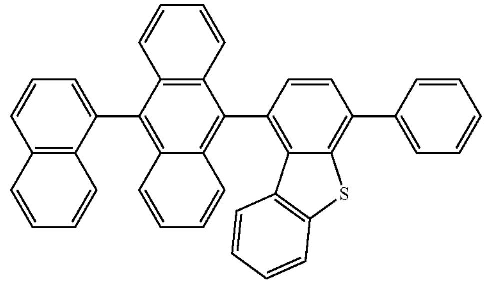
C24
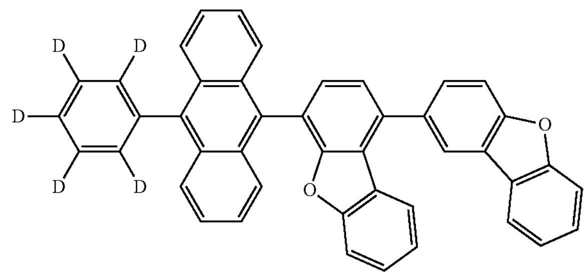
C25
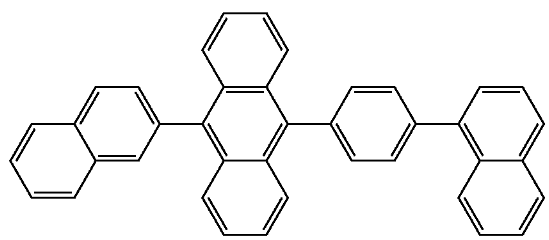
C26
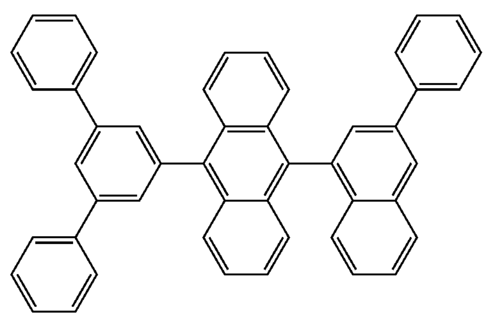
C27
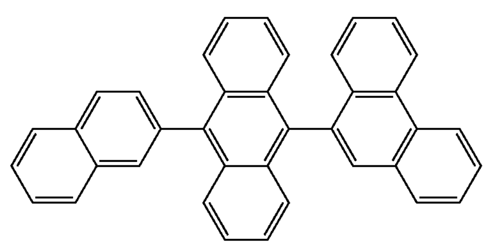

-continued
C28
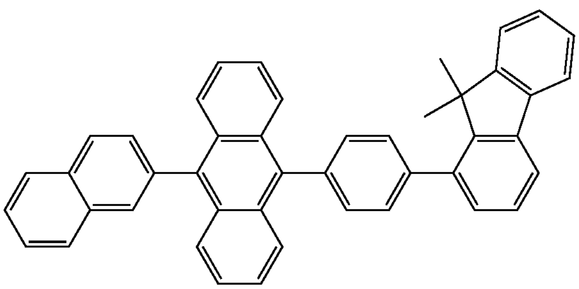
C29
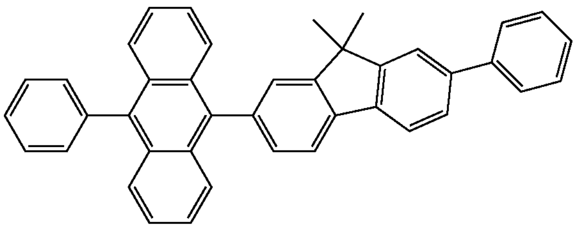
C30
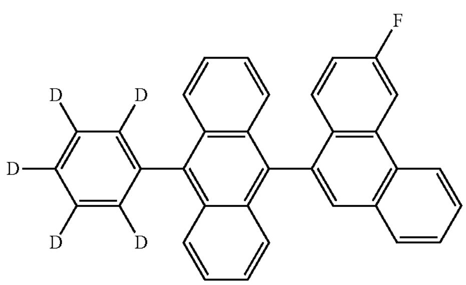
C31
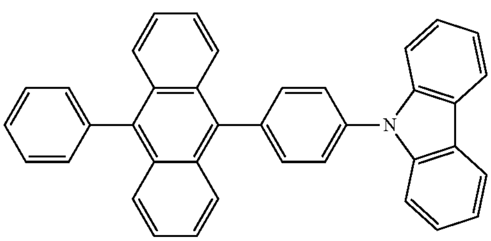
C32
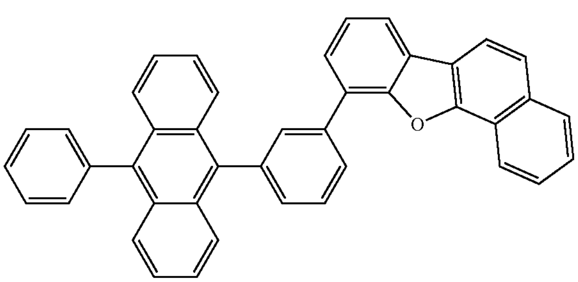
-continued
C33
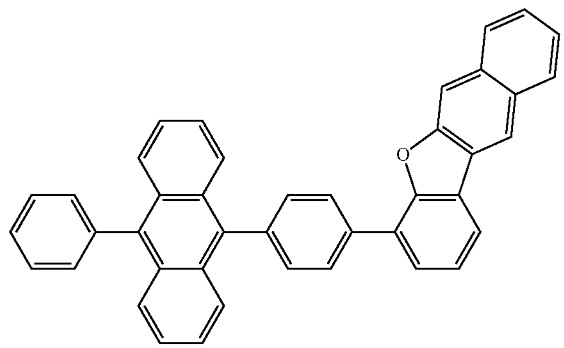
C34
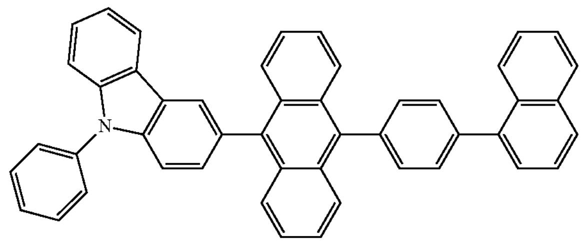
C35
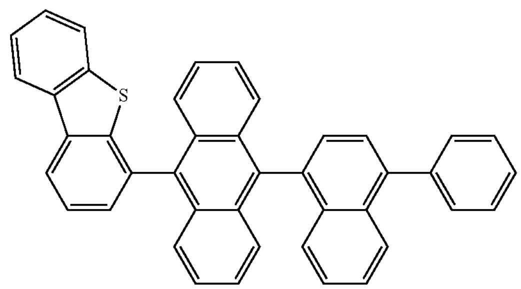
C36
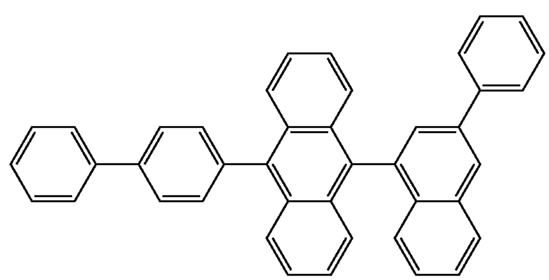
C37
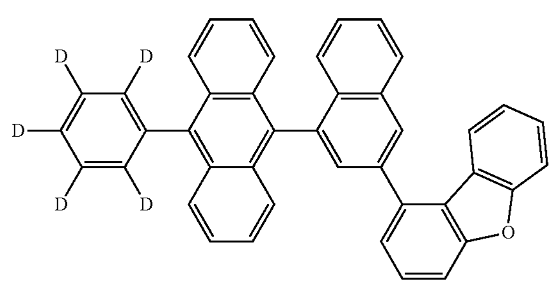

C38
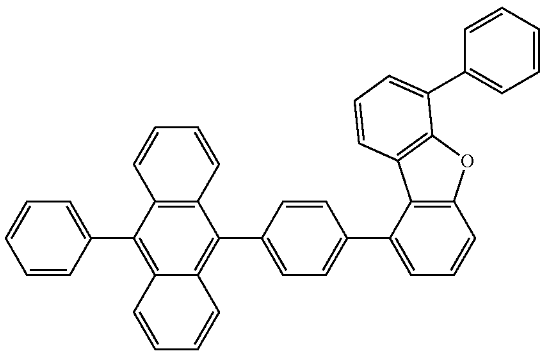
C39
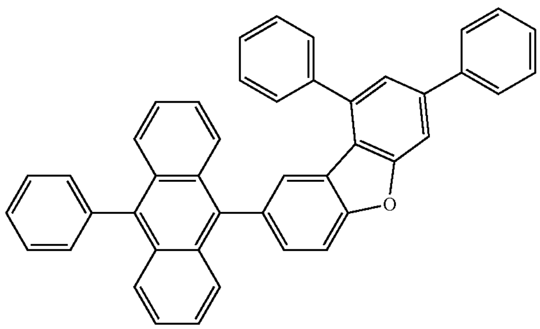
C40
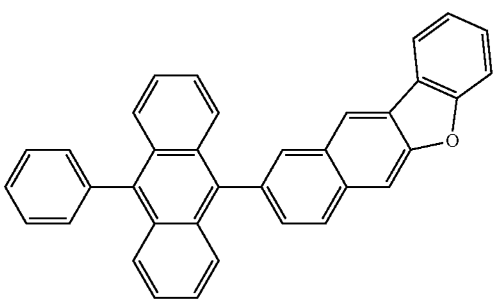
C41
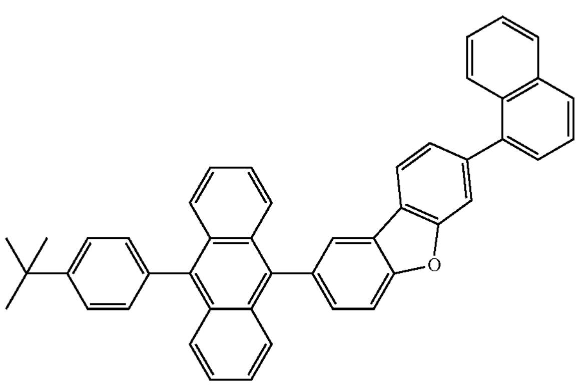
C42
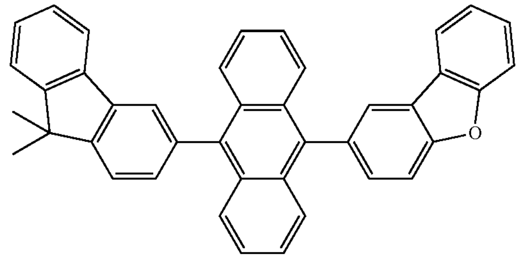
C43
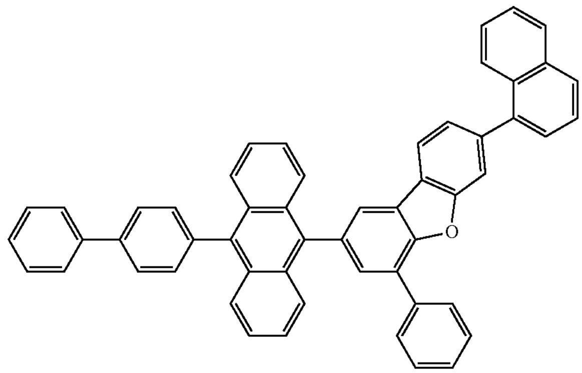
C44
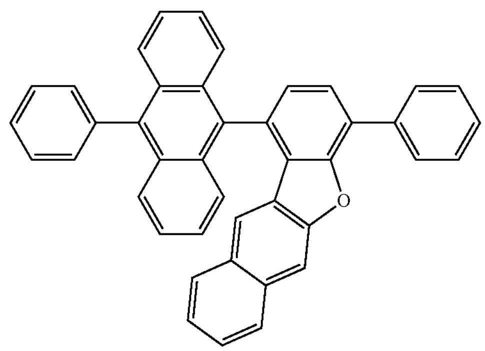
C45
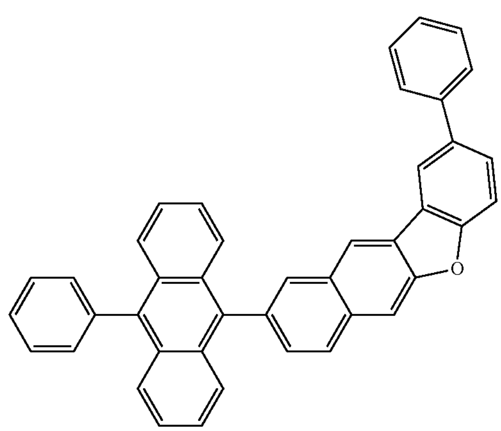

-continued

C46

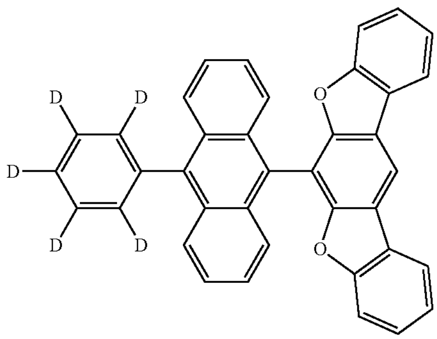

C47

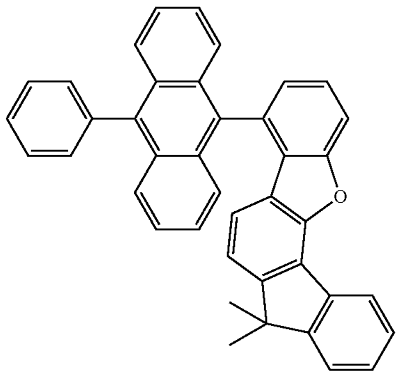

C48

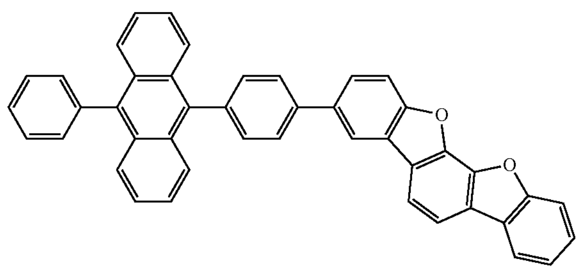

9. The organic electroluminescent according to claim 4, wherein each of the hole transport layer and the electron blocking layer comprises a compound represented by Formula D:

(D)

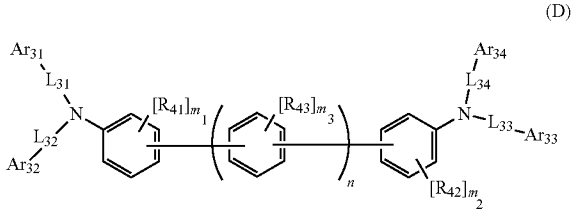

wherein $R_{41}$ to $R_{43}$ are identical to or different from each other and are each independently selected from hydrogen, deuterium, substituted or unsubstituted $C_1$-$C_{20}$ alkyl, substituted or unsubstituted $C_6$-$C_{50}$ aryl, substituted or unsubstituted $C_7$-$C_{50}$ arylalkyl, substituted or unsubstituted $C_3$-$C_{30}$ cycloalkyl, substituted or unsubstituted $C_1$-$C_{30}$ alkylsilyl, substituted or unsubstituted $C_6$-$C_{30}$ arylsilyl, and halogen, $L_{31}$ to $L_{34}$ are identical to or different from each other and are each independently single bonds or selected from substituted or unsubstituted $C_6$-$C_{50}$ arylene and substituted or unsubstituted $C_2$-$C_{50}$ heteroarylene, $Ar_{31}$ to $Ar_{34}$ are identical to or different from each other and are each independently selected from substituted or unsubstituted $C_6$-$C_{50}$ aryl and substituted or unsubstituted $C_2$-$C_{50}$ heteroaryl, n is an integer from 0 to 4, provided that when n is 2 or greater, the aromatic rings containing $R_{43}$ are identical to or different from each other, $m_1$ to $m_3$ are integers from 0 to 4, provided that when both $m_1$ and $m_3$ are 2 or more, the $R_{41}$, $R_{42}$, and $R_{43}$ groups are identical to or different from each other, and hydrogen or deuterium atoms are bonded to the carbon atoms of the aromatic rings to which $R_{41}$ to $R_{43}$ are not attached.

10. The organic electroluminescent according to claim 9, wherein at least one of $Ar_{31}$ to $Ar_{34}$ in Formula D is represented by Formula E:

(E)

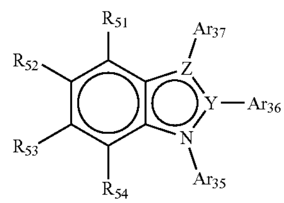

wherein $R_{51}$ to $R_{54}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, and $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $L_{31}$ to $L_{34}$ in Formula D.

11. The organic electroluminescent according to claim 9, wherein the compound of Formula D is selected from the compounds of Formulae D1 to D79:

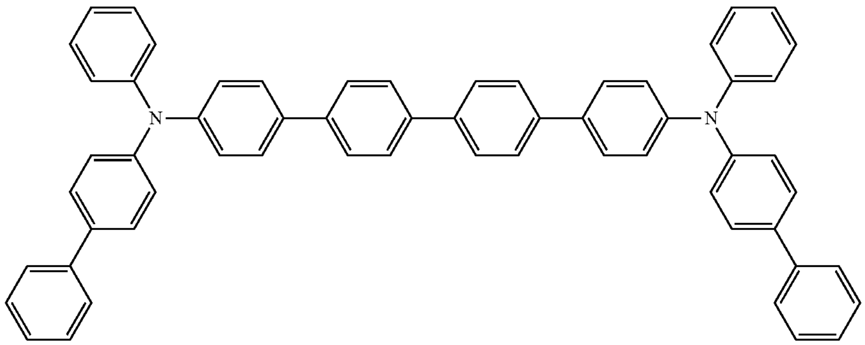
D1
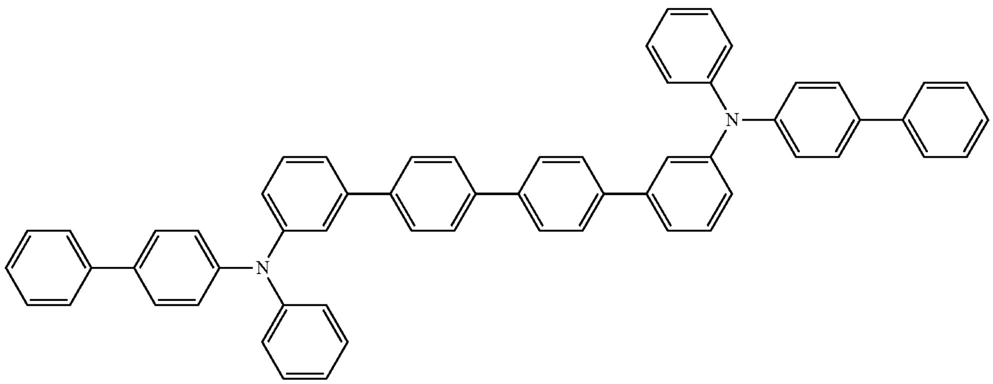
D2
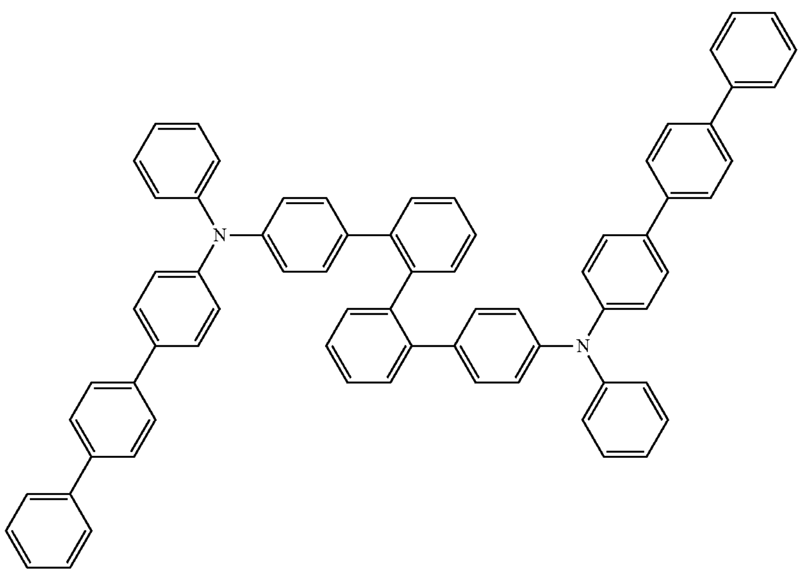
D3
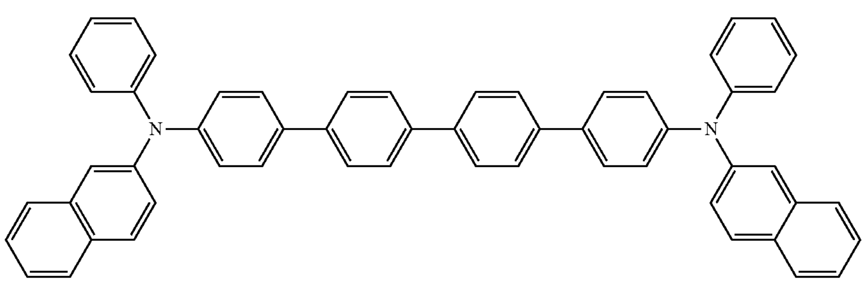
D4

-continued
D5
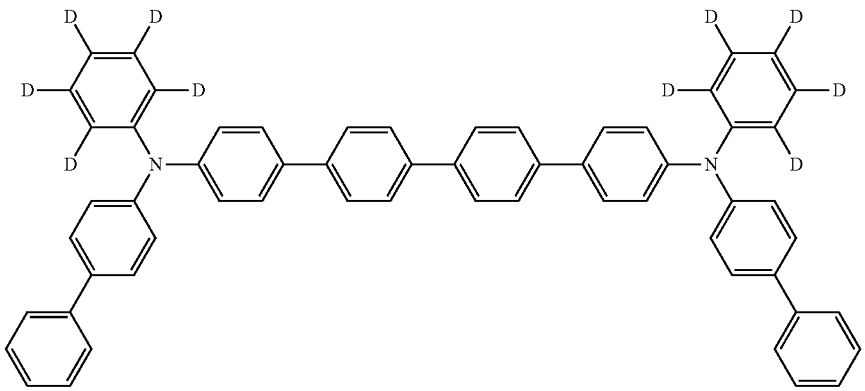
D6
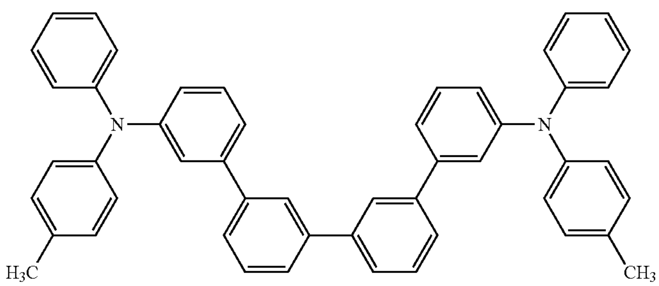
D7
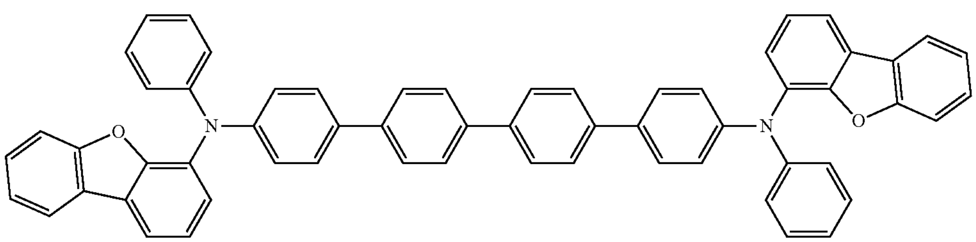
D8
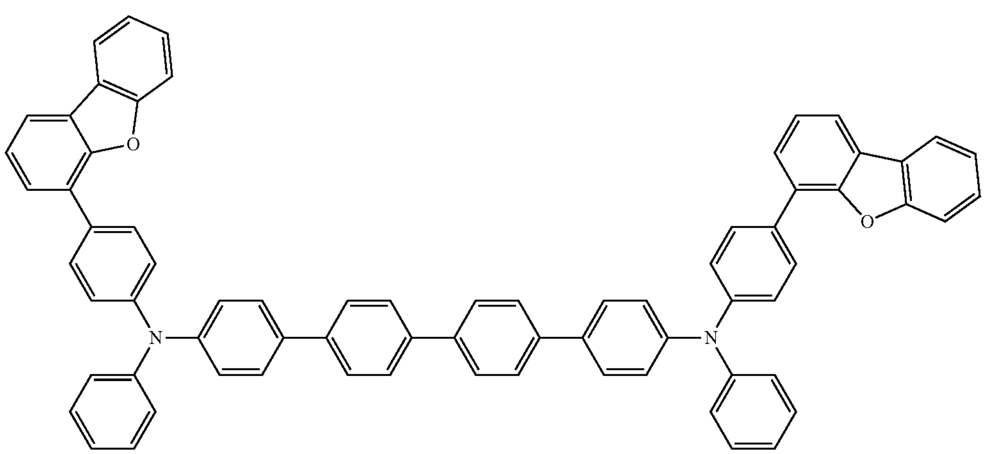

-continued
D9
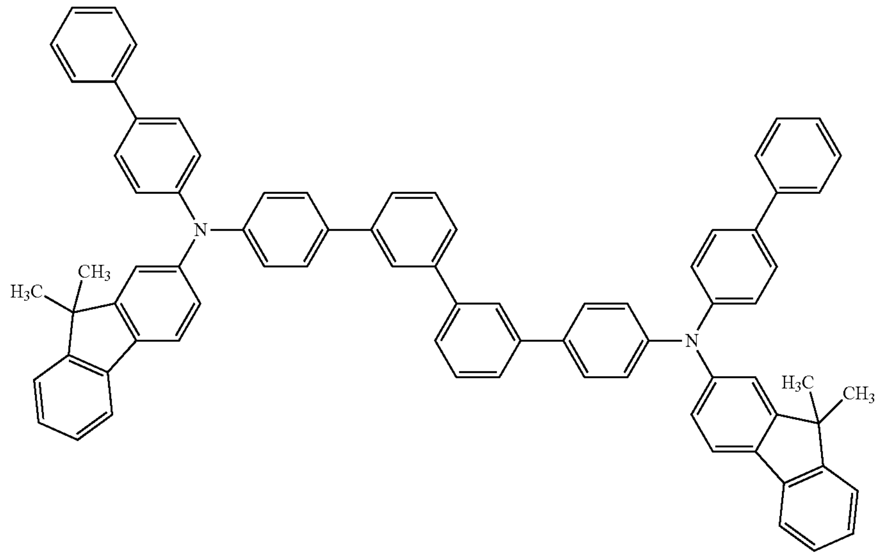
D10
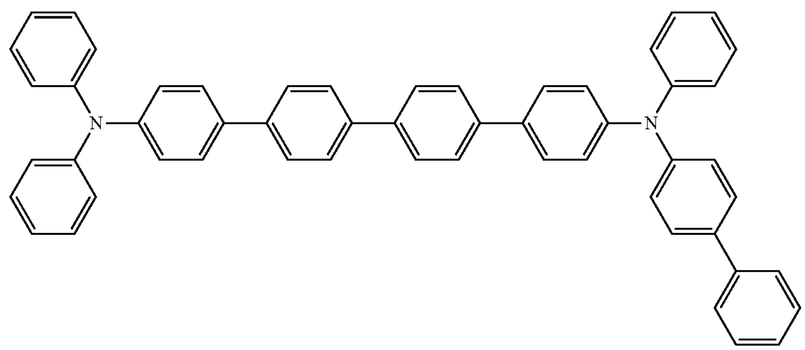
D11
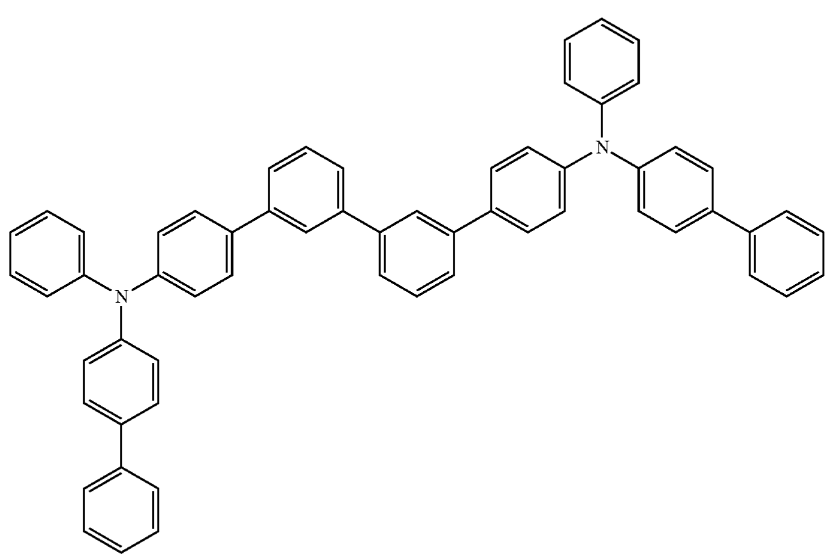

-continued
D12
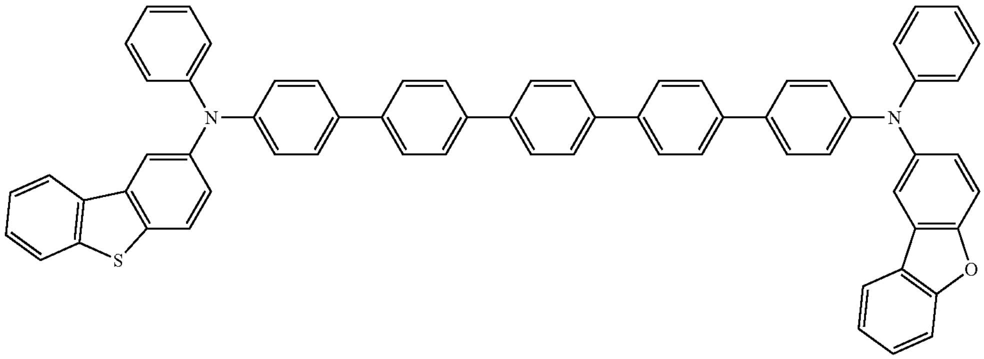
D13
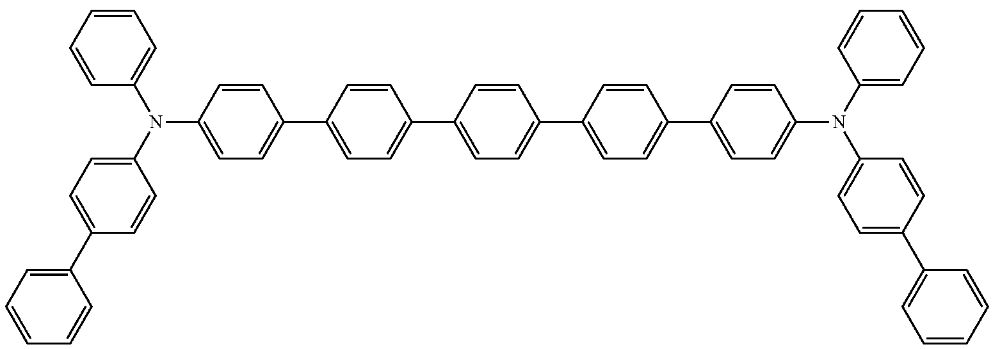
D14
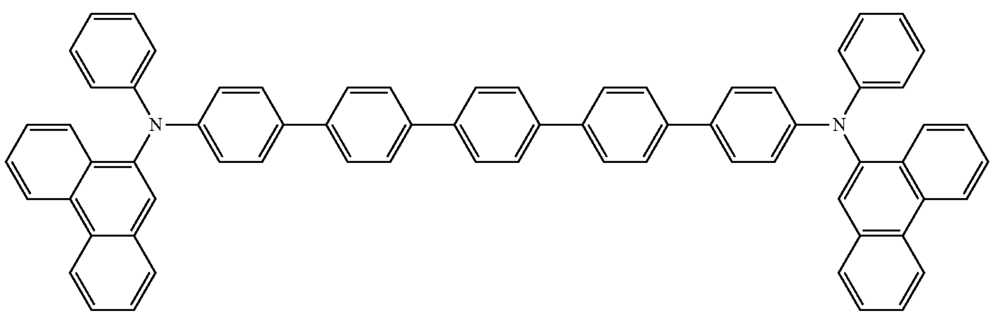
D15
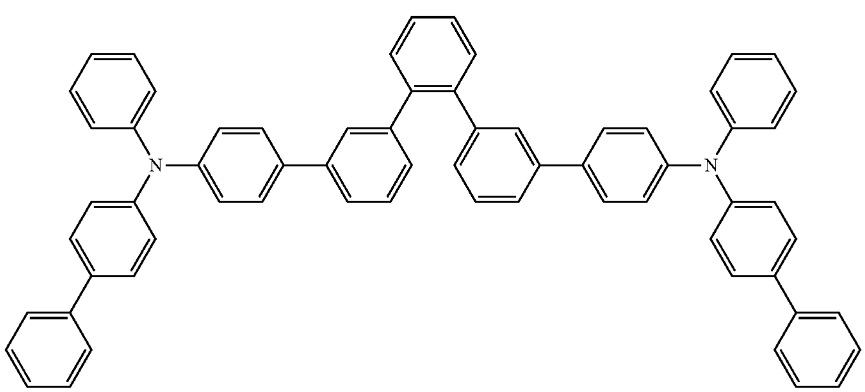

-continued
D16
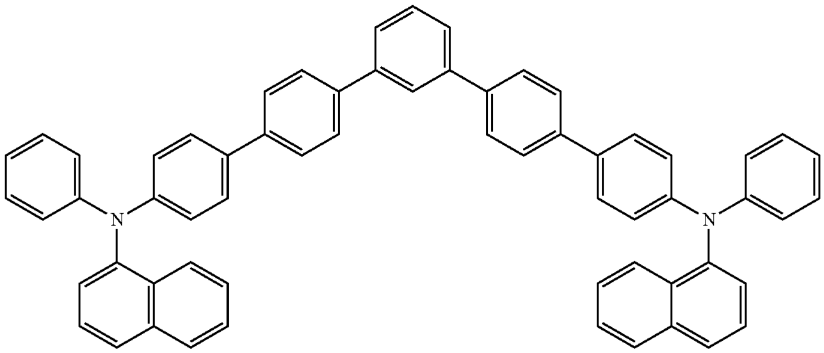
D17
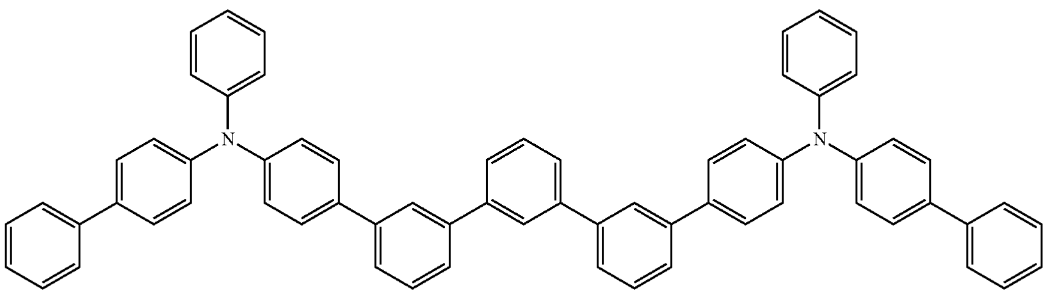
D18
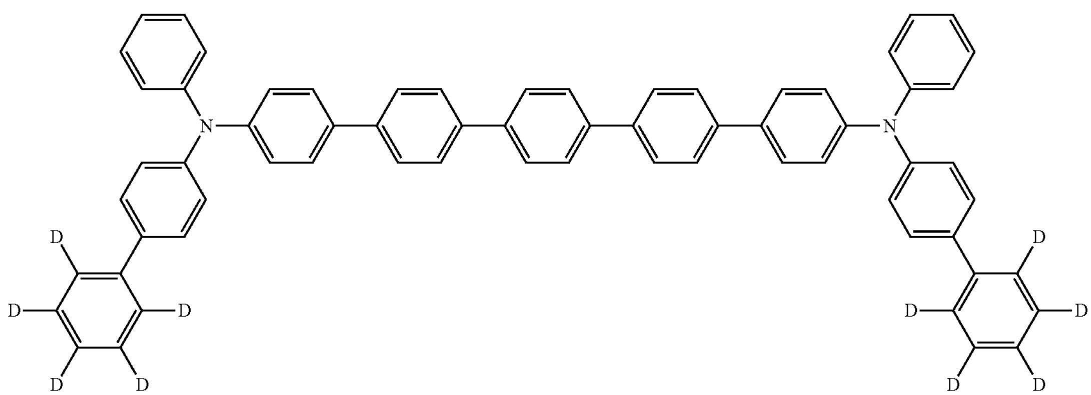
D19
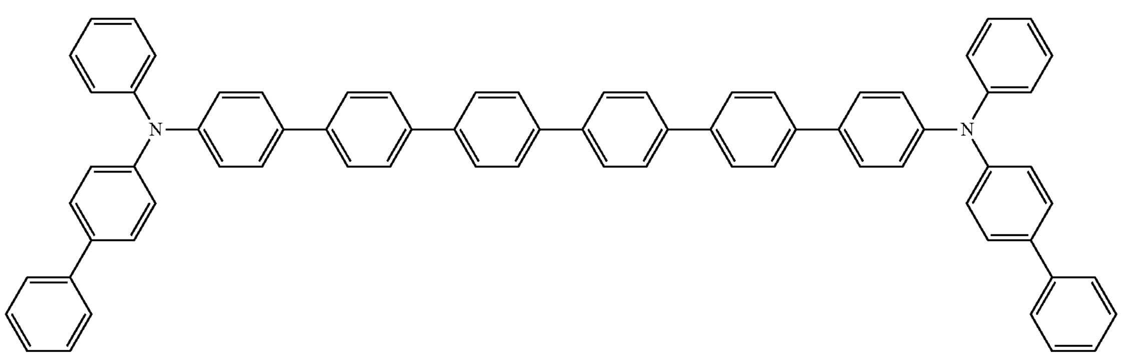

-continued
D20
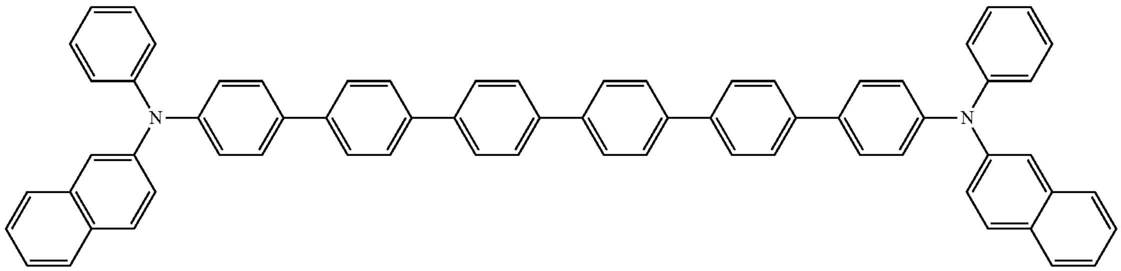
D21
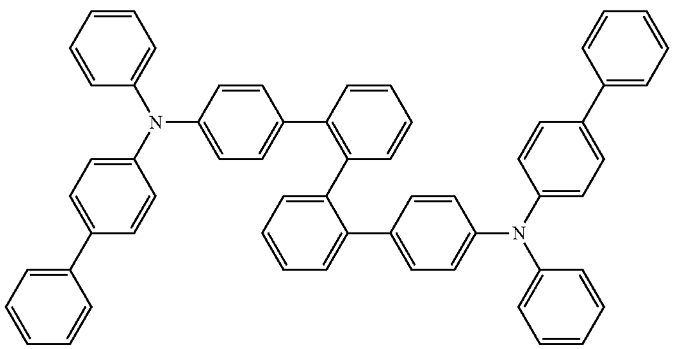
D22
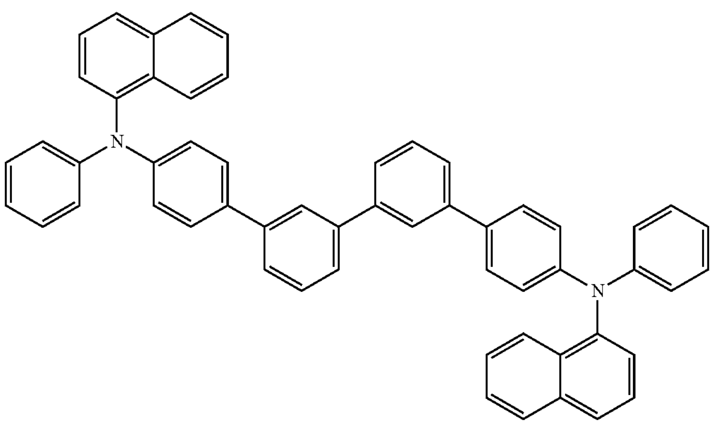
D23
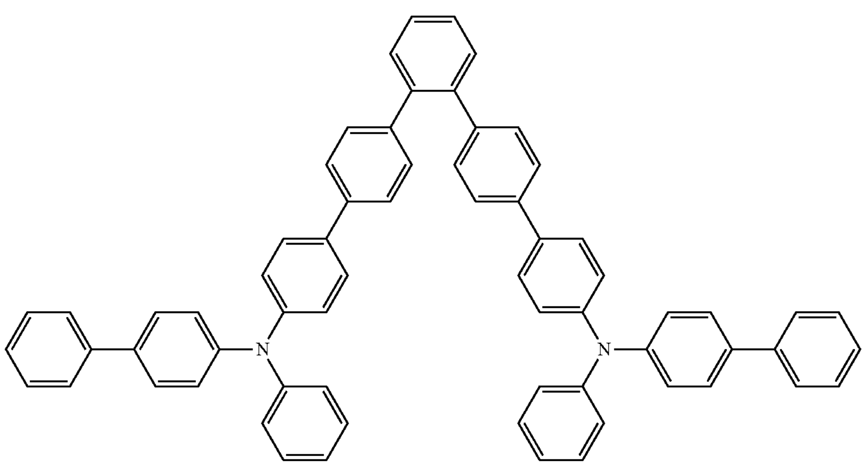

-continued
D24
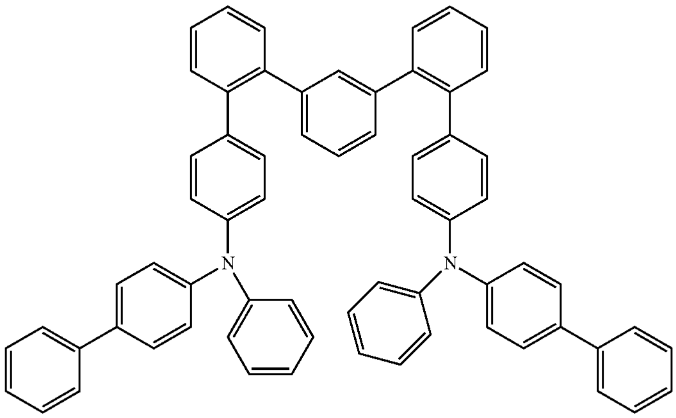
D25
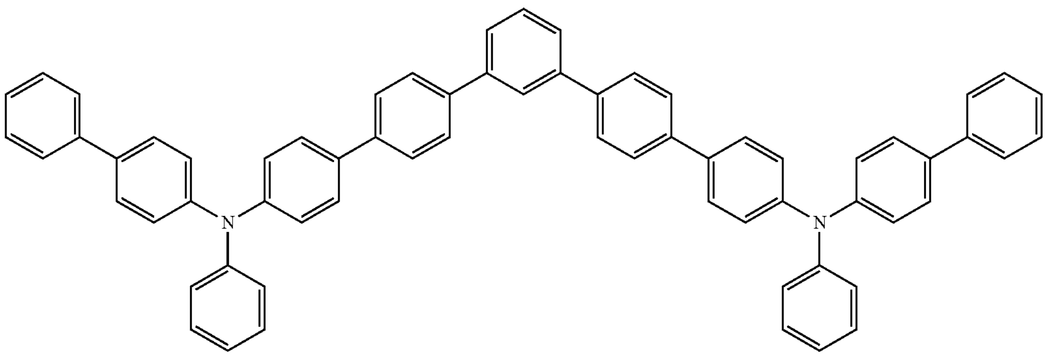
D26
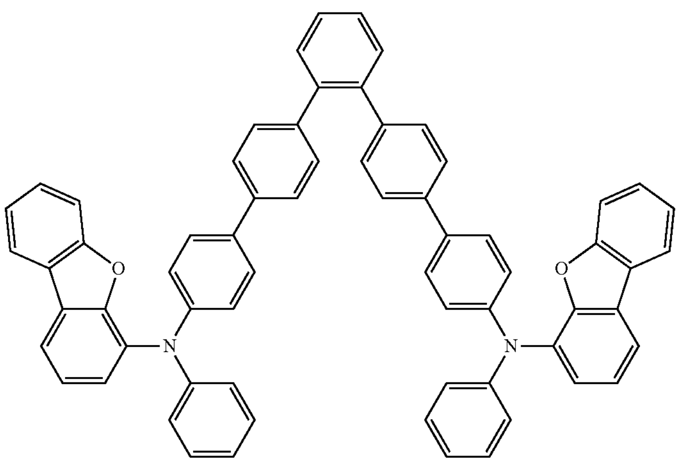
D27
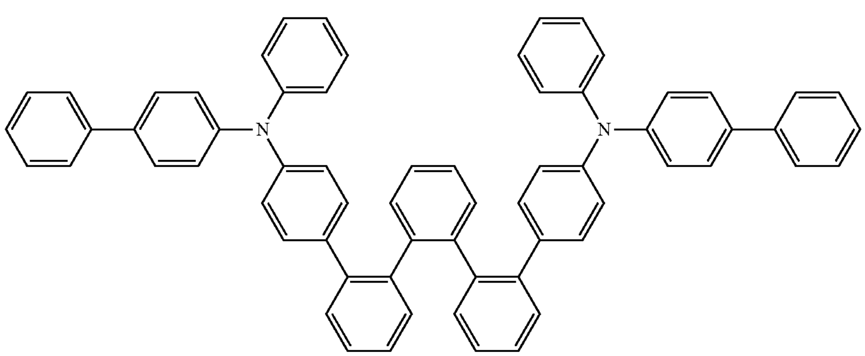

-continued
D28
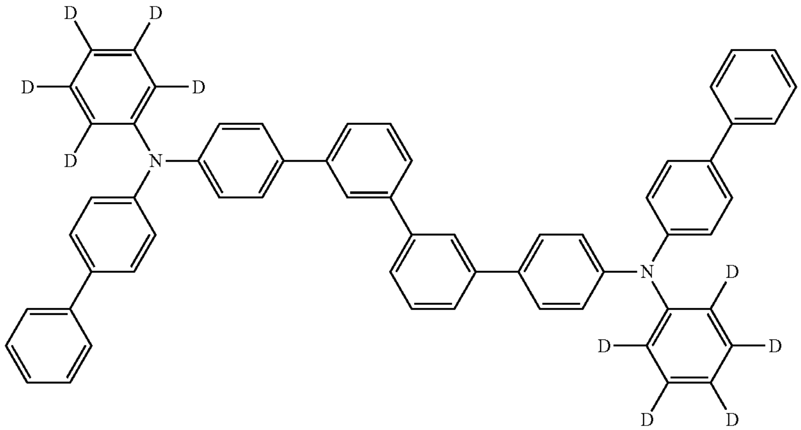
D29
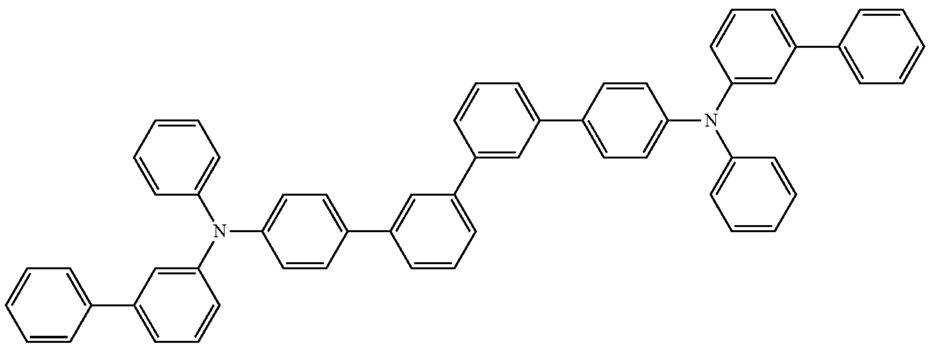
D30
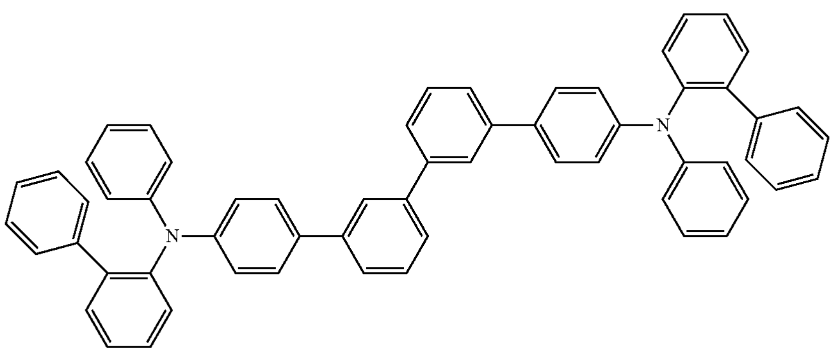
D31
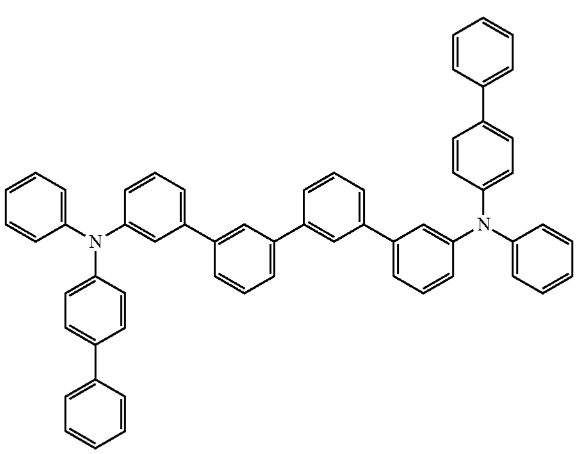
D32
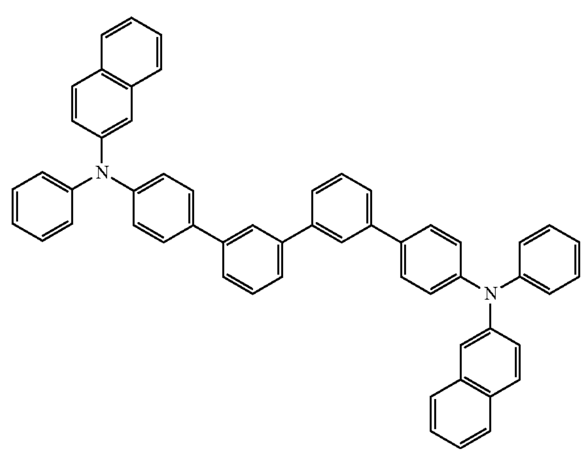

-continued
D33
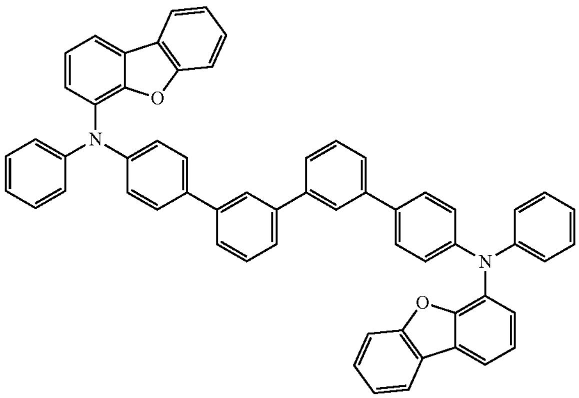
D34
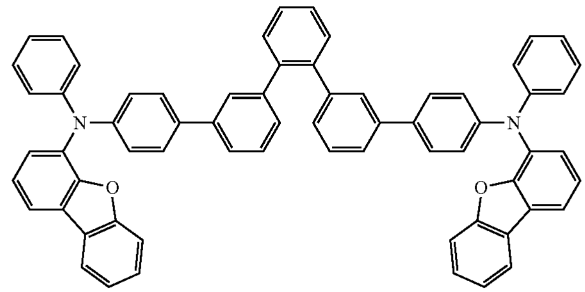
D35
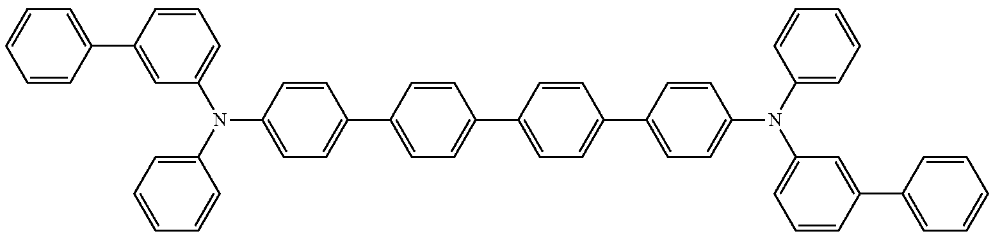
D36
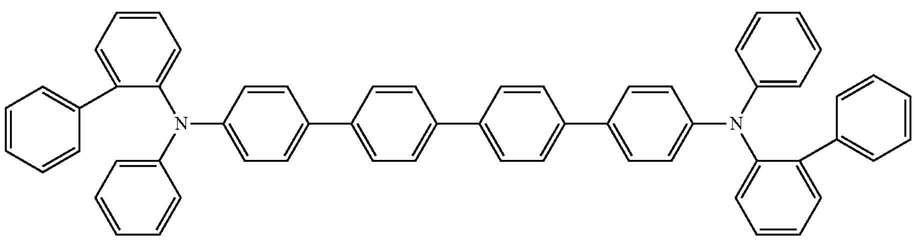
D37
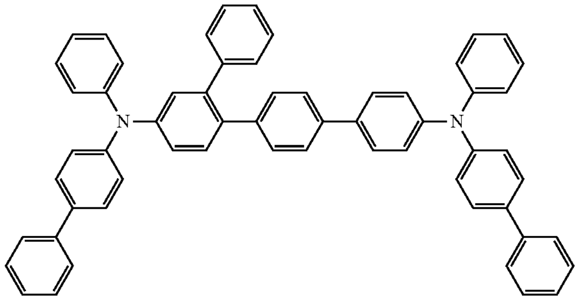
D38
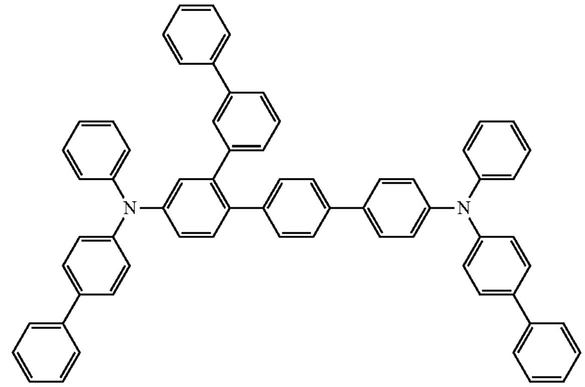

-continued
D39
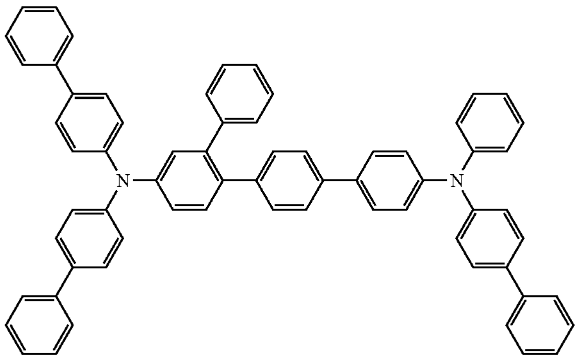
D40
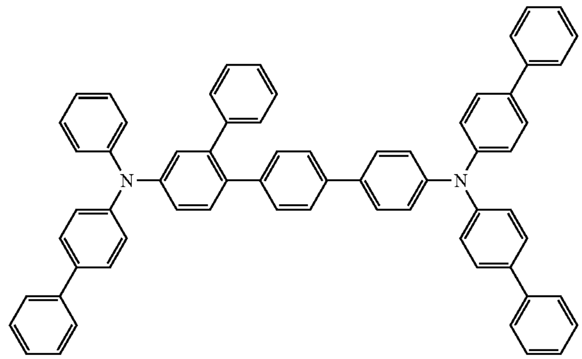
D41
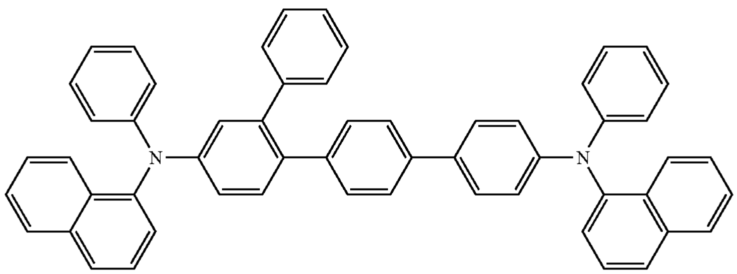
D42
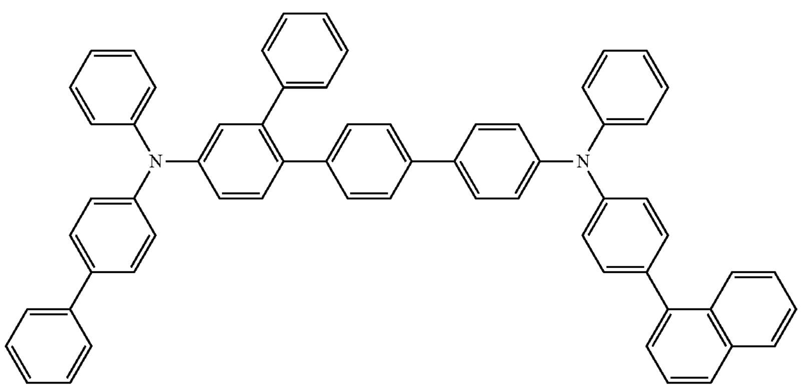
D43
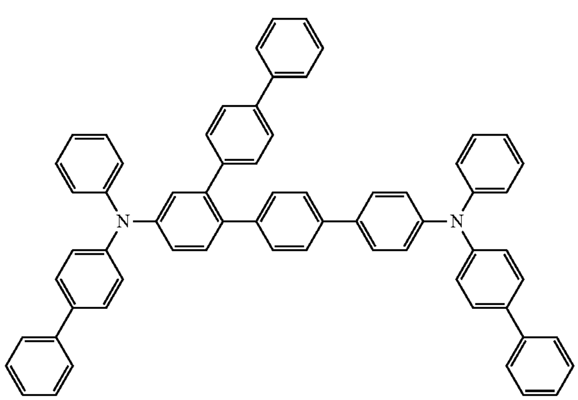
D44
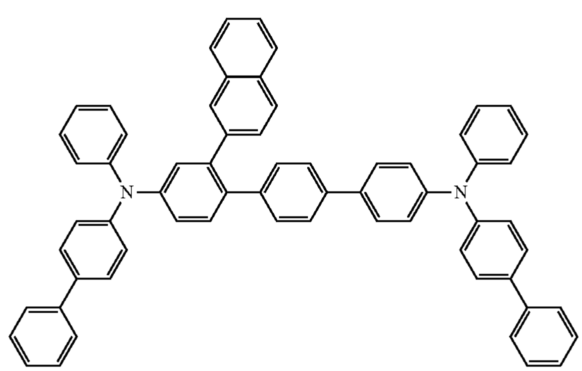

-continued
D45
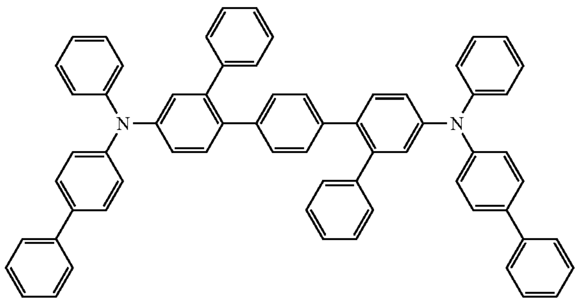
D46
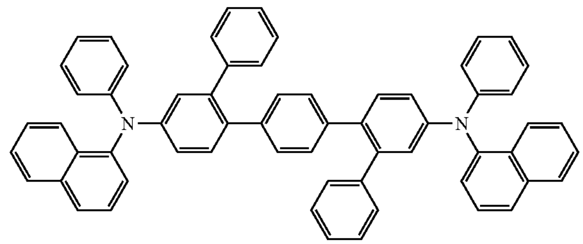
D47
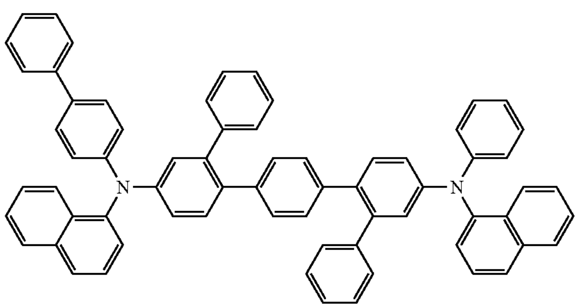
D48
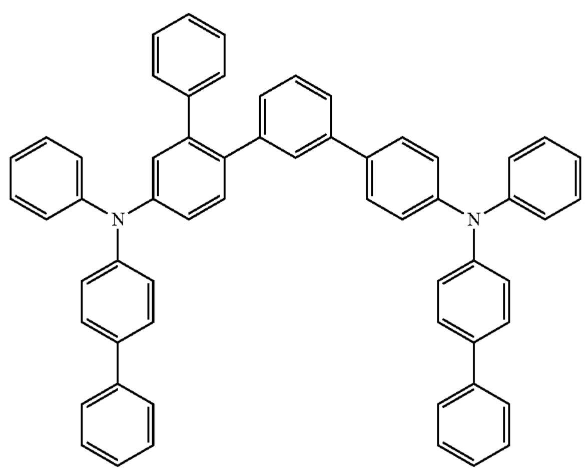
D49
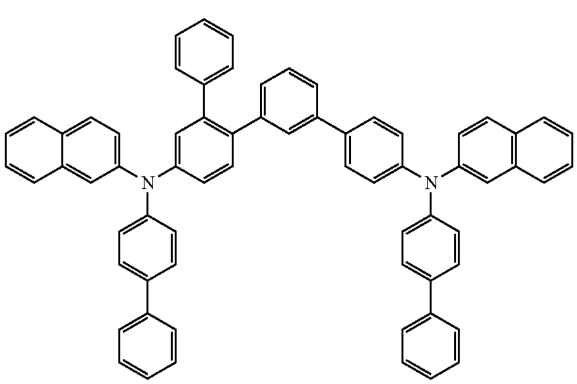
D50
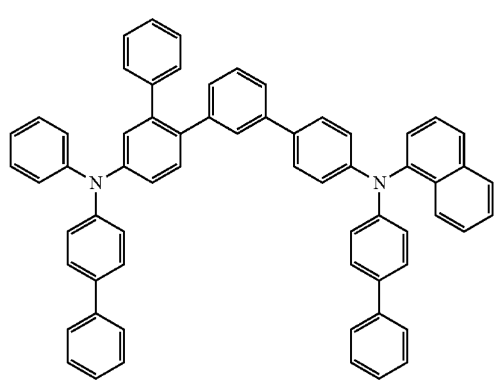

-continued
D51
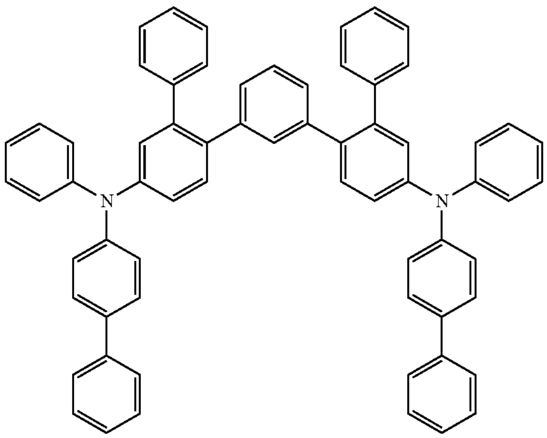
D52
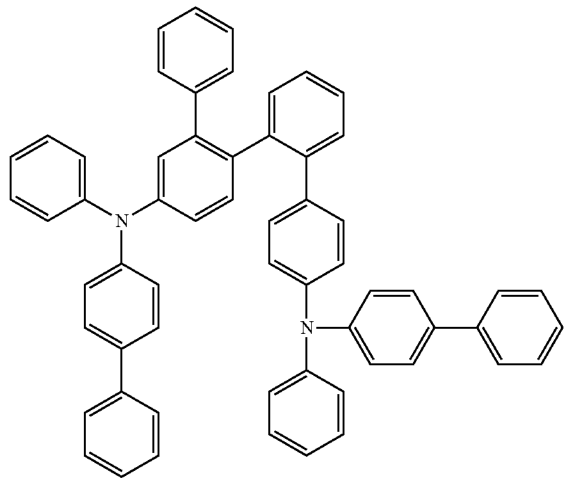
D53
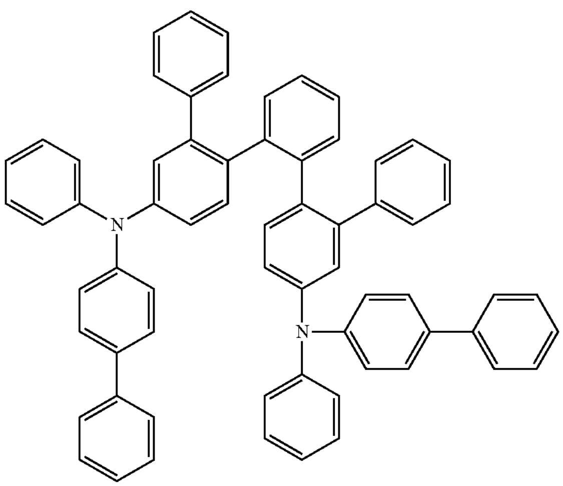
D54
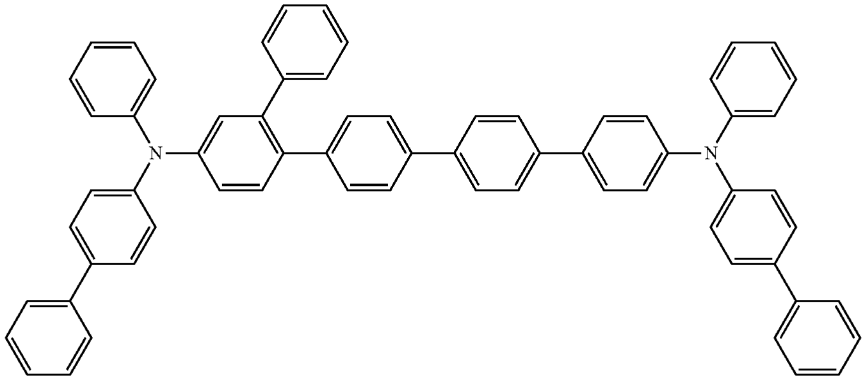

-continued
D55
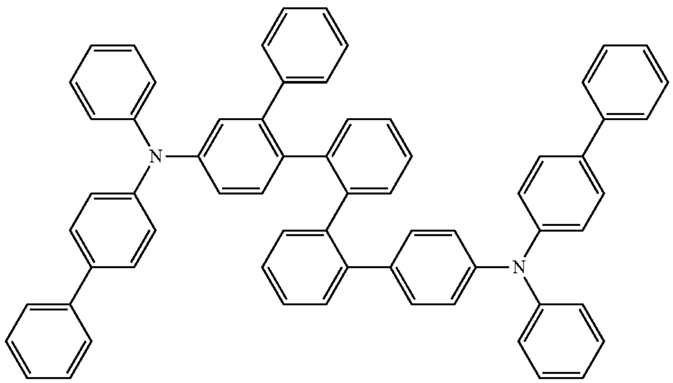
D56
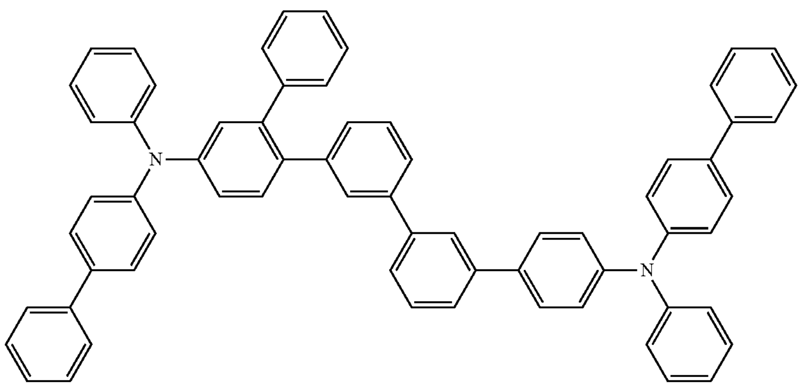
D57
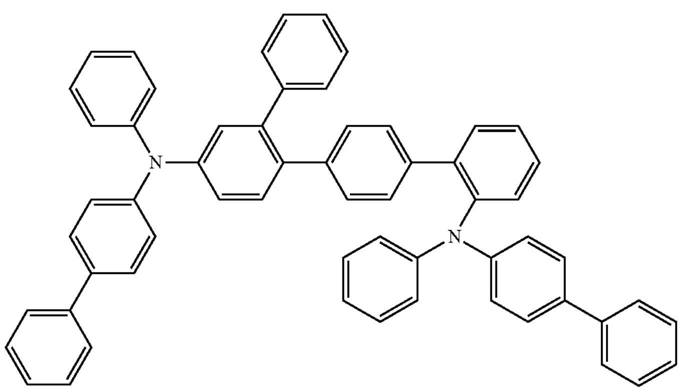
D58
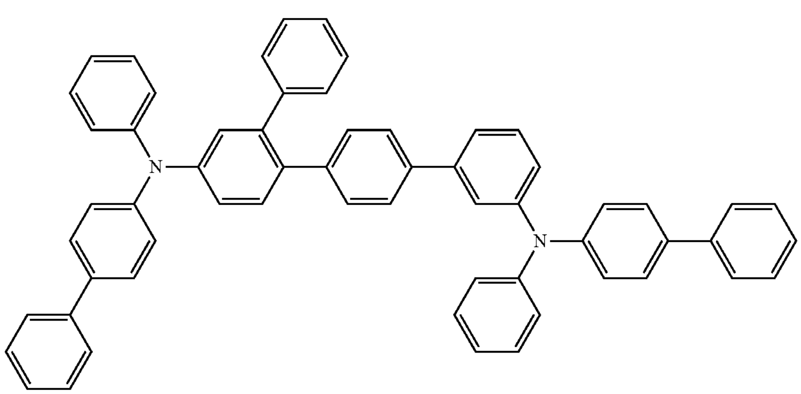

-continued
D59
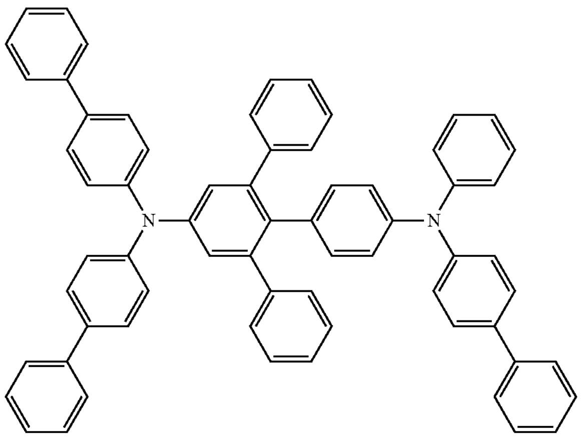
D60
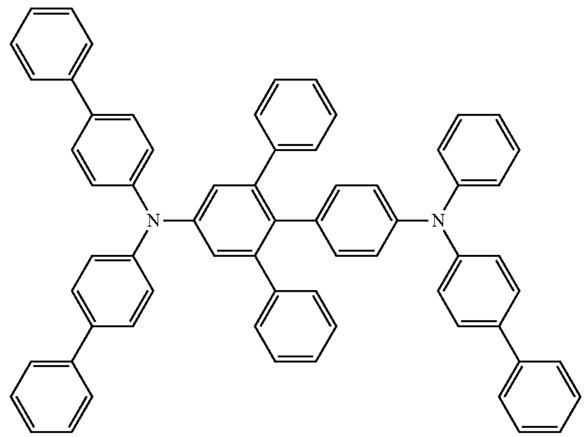
D61
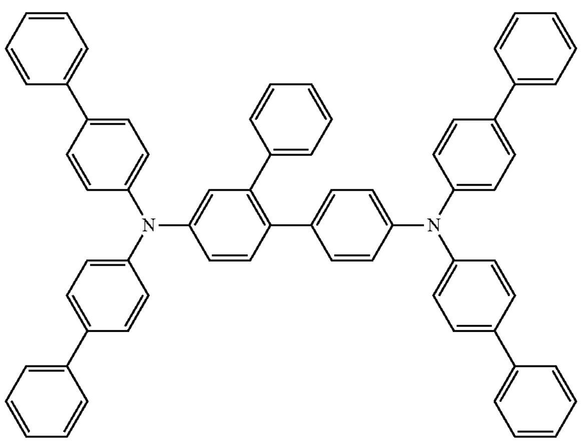
D62
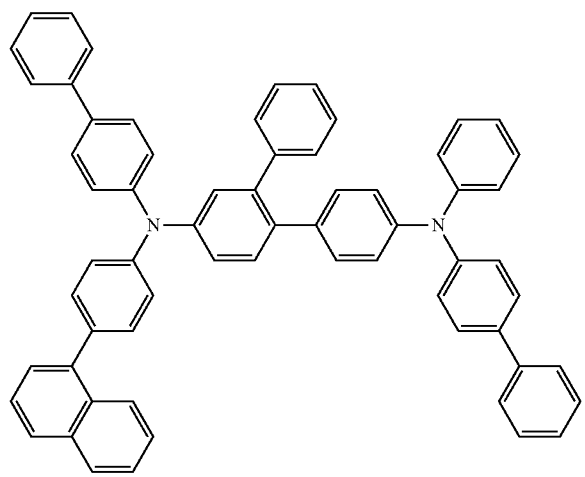
D63
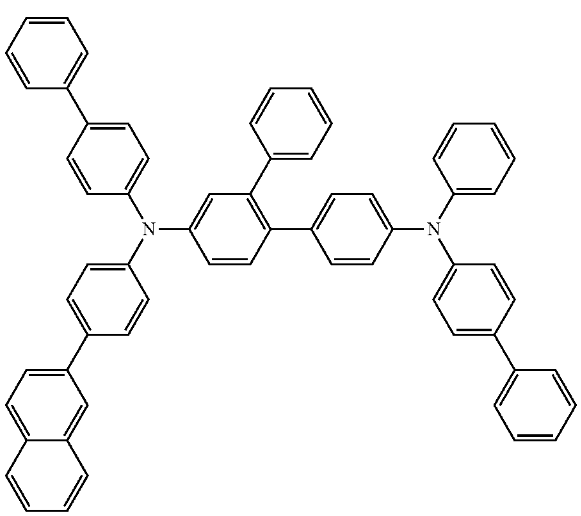
D64
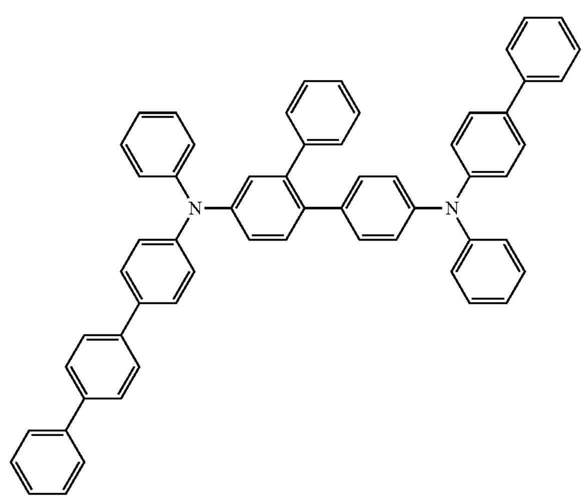

-continued
D65
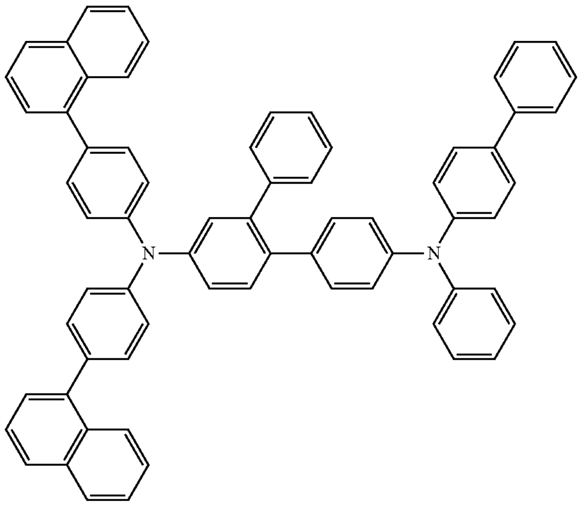
D66
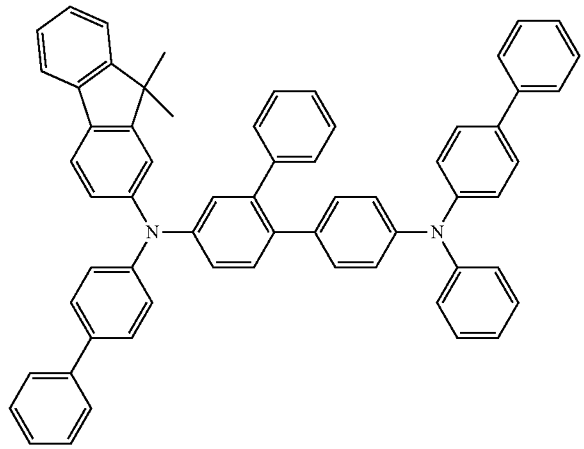
D67
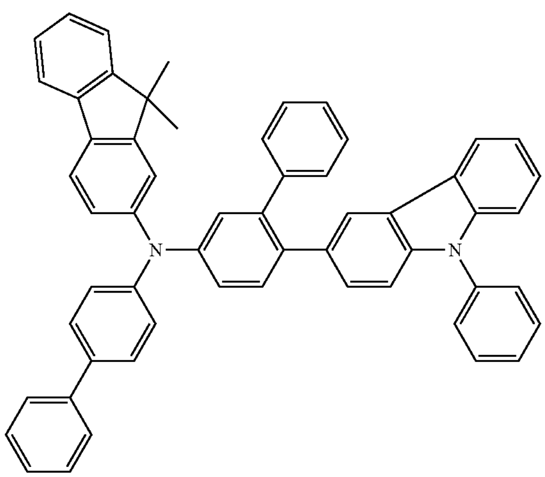
D68
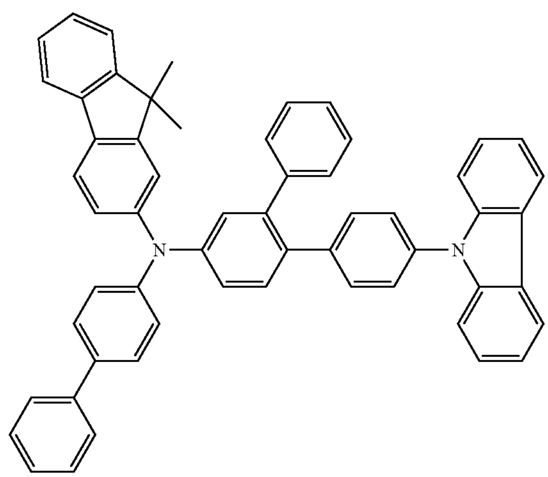
D69
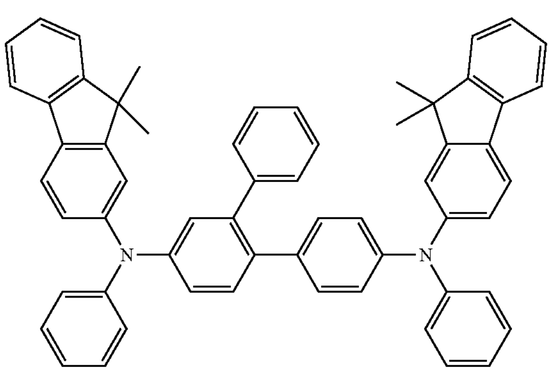
D70
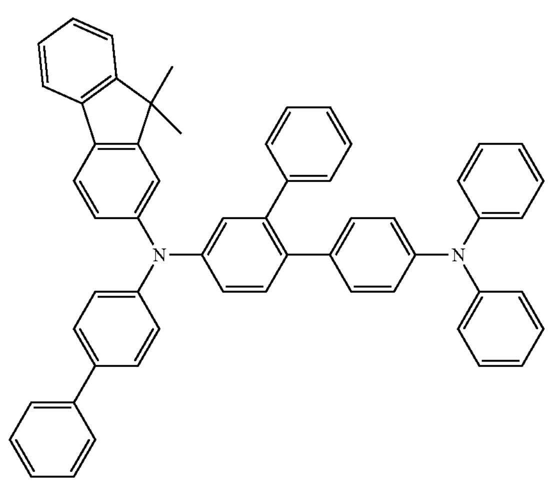

-continued
D71
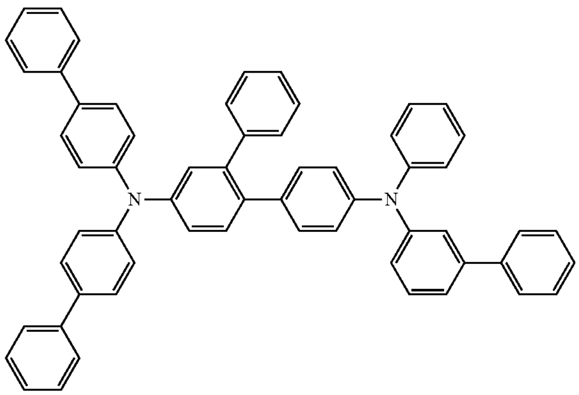
D72
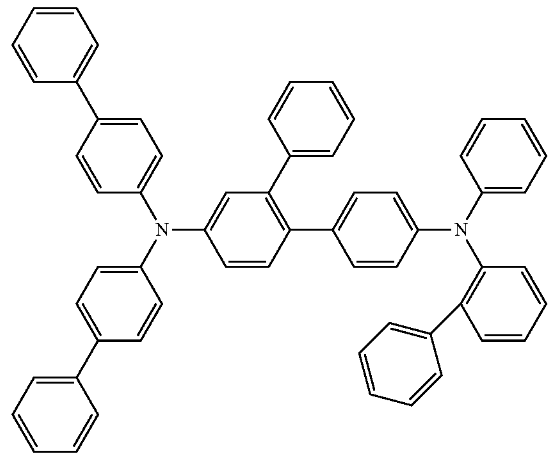
D73
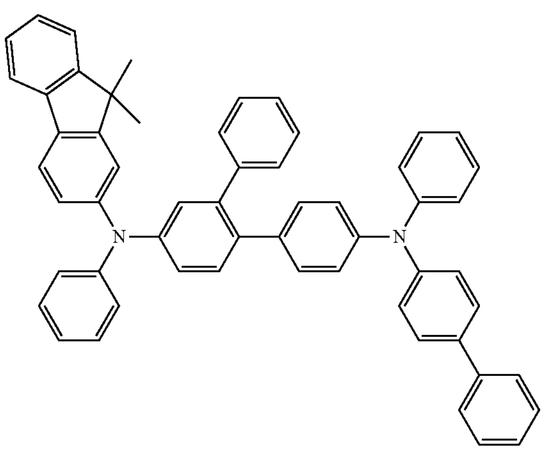
D74
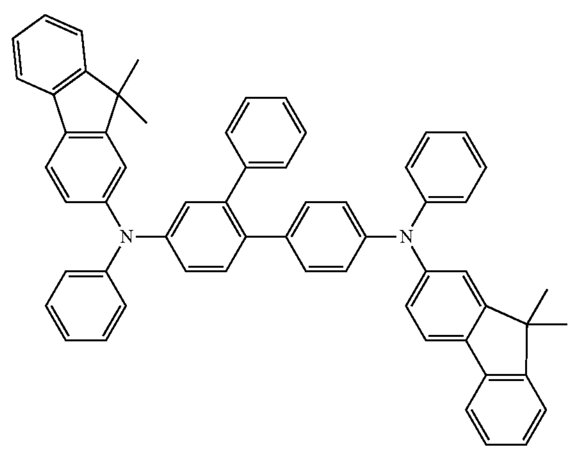
D75
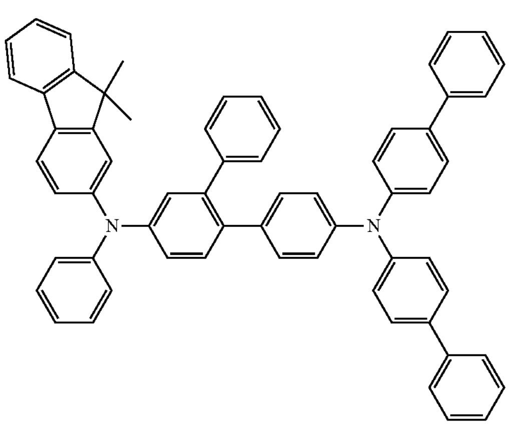
D76
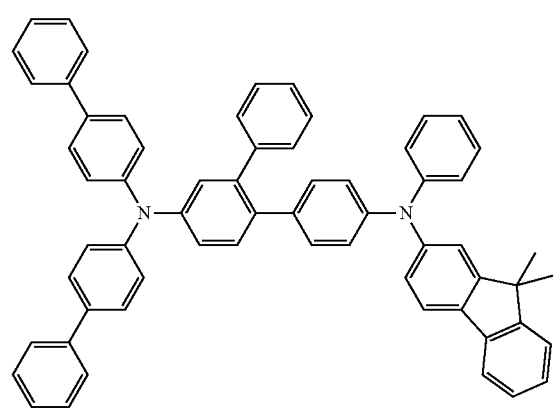

-continued
D77
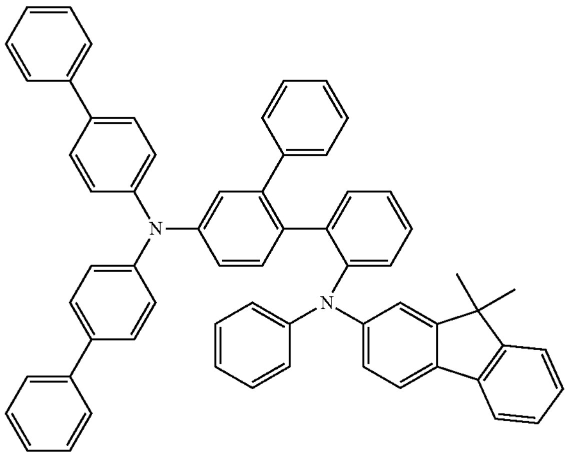
D78
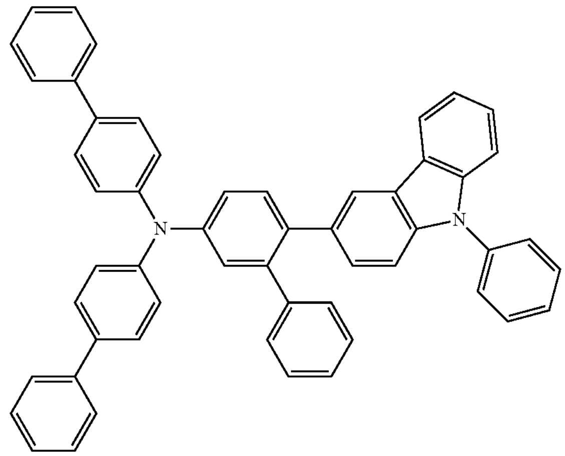
D79
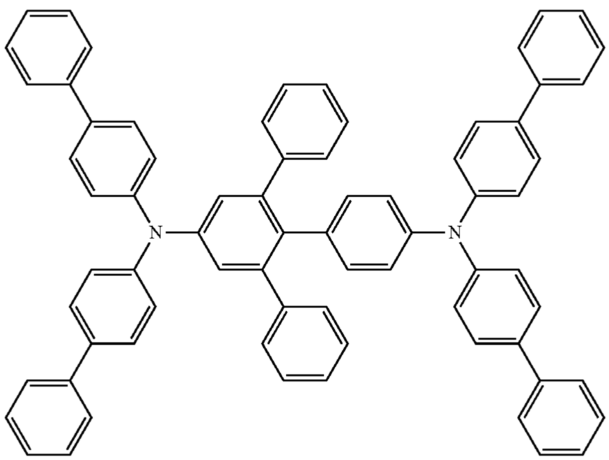
12. The organic electroluminescent according to claim 9, wherein the compound of Formula D is selected from the compounds of Formulae D101 to D145:
D101
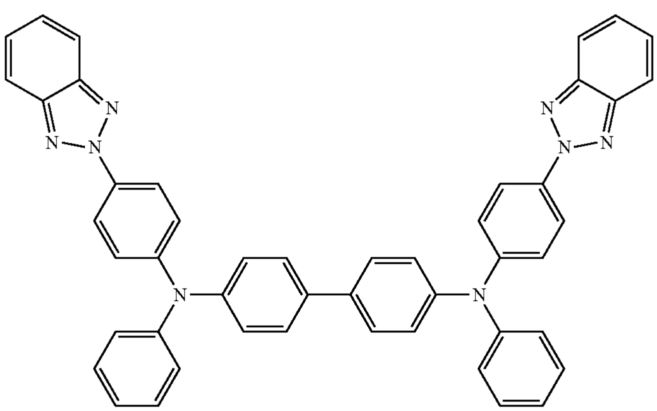

-continued
D102
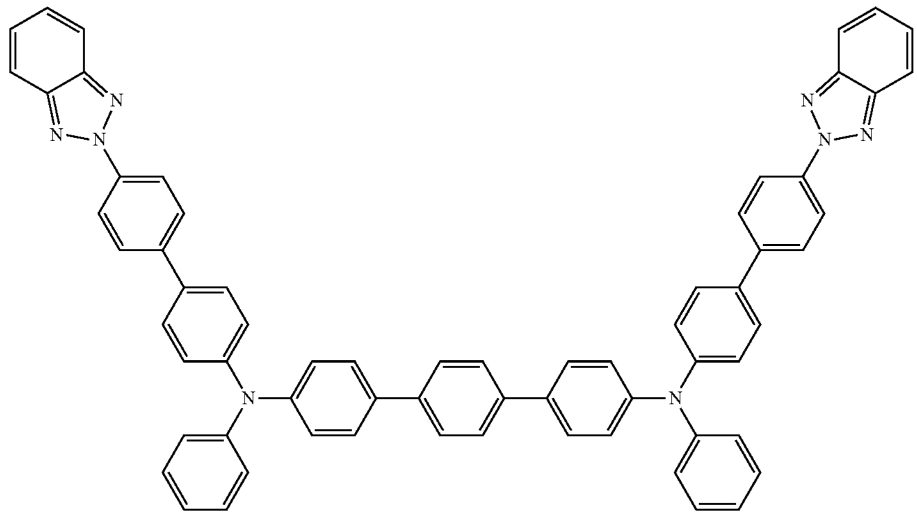
D103
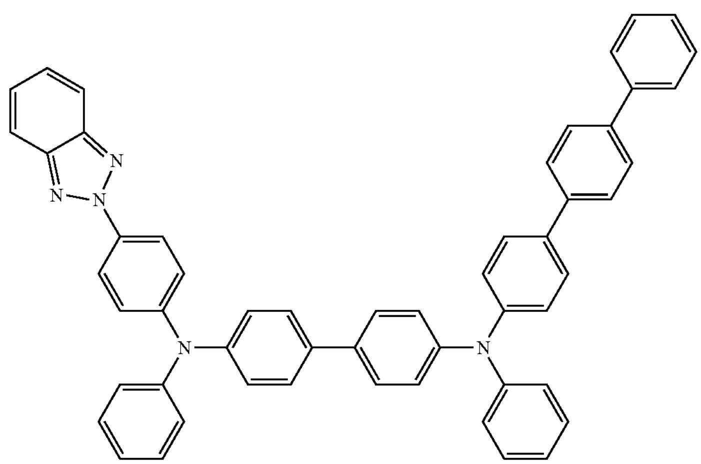
D104
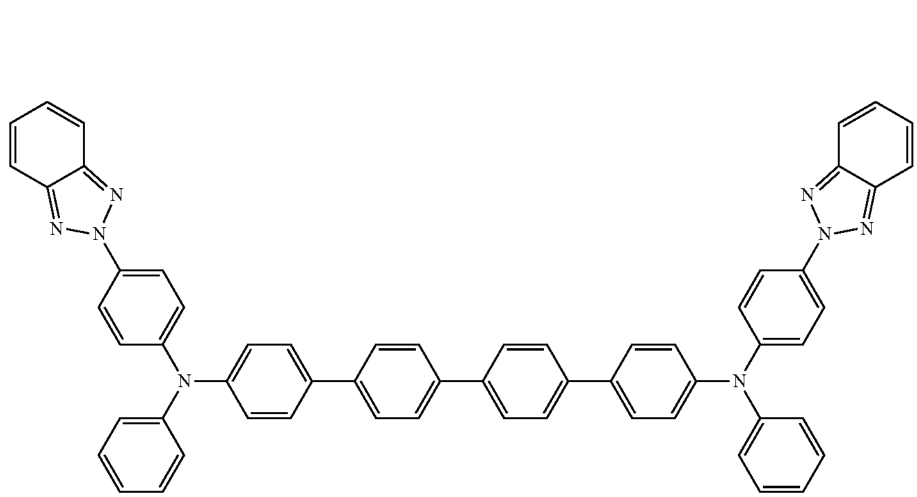

-continued
D105
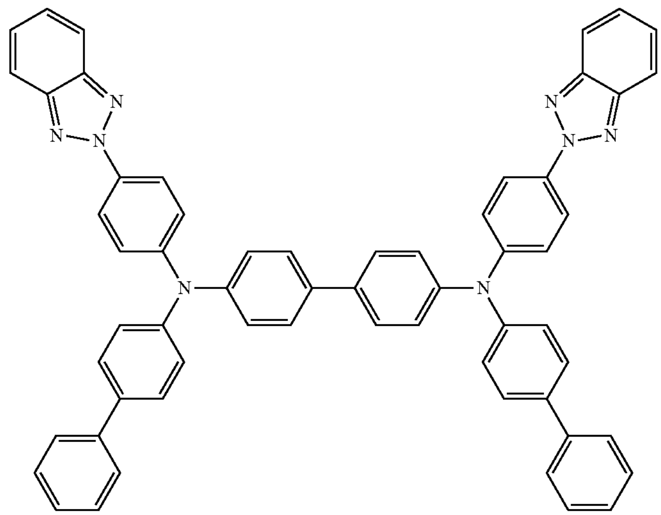
D106
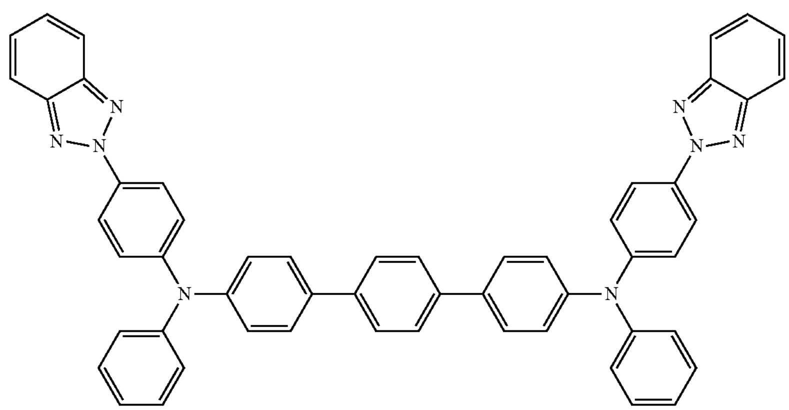
D107
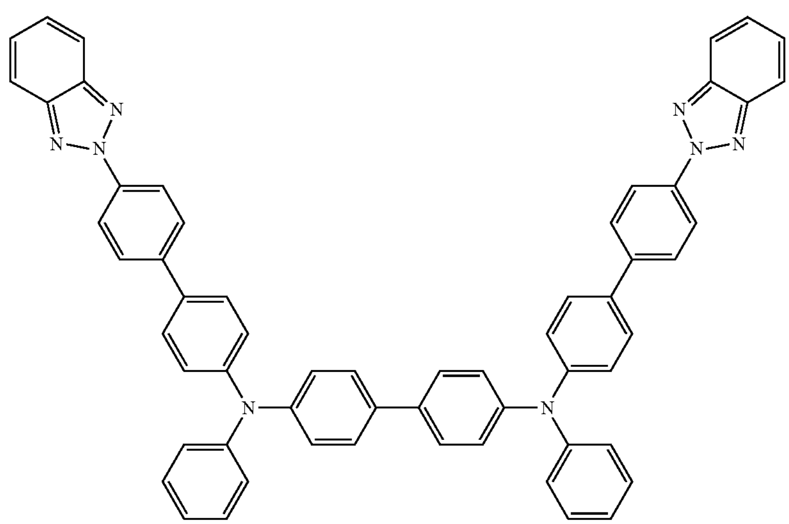

-continued
D108
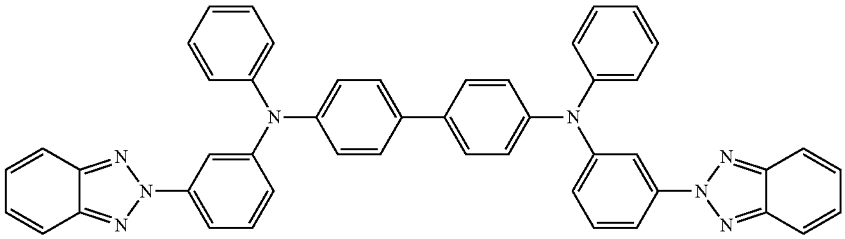
D109
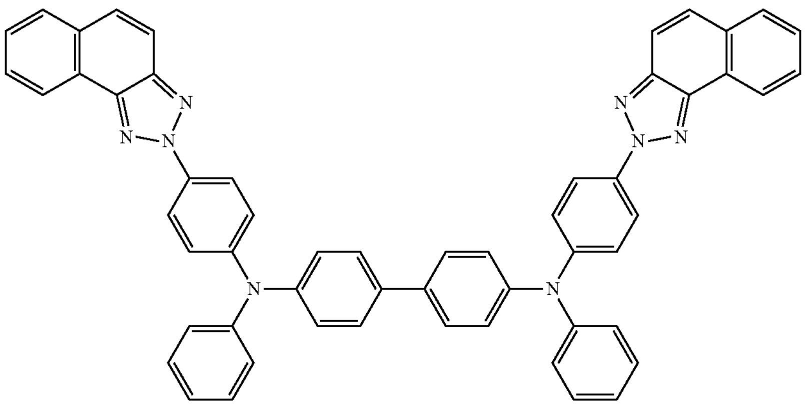
D110
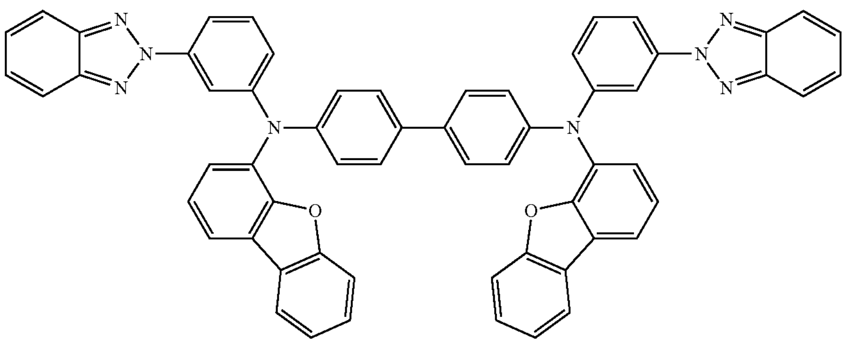
D111
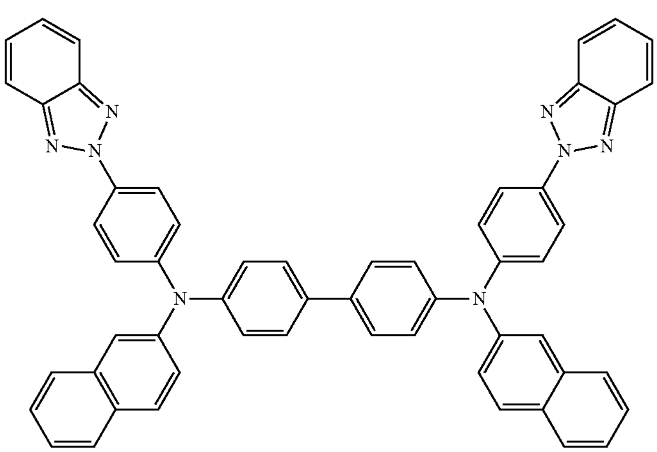

-continued
D112
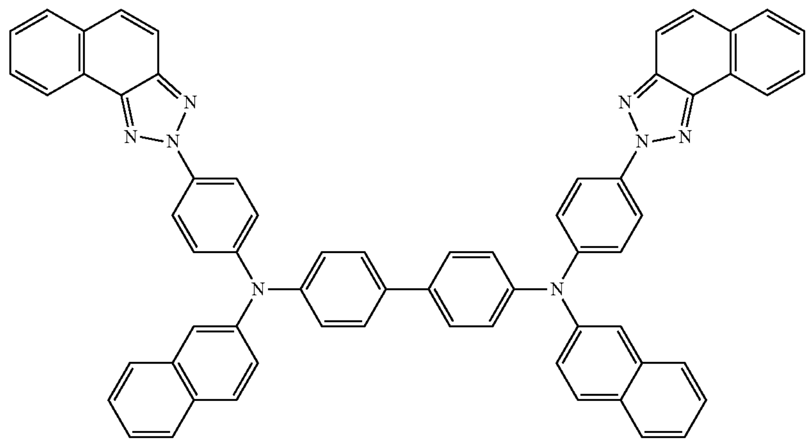
D113
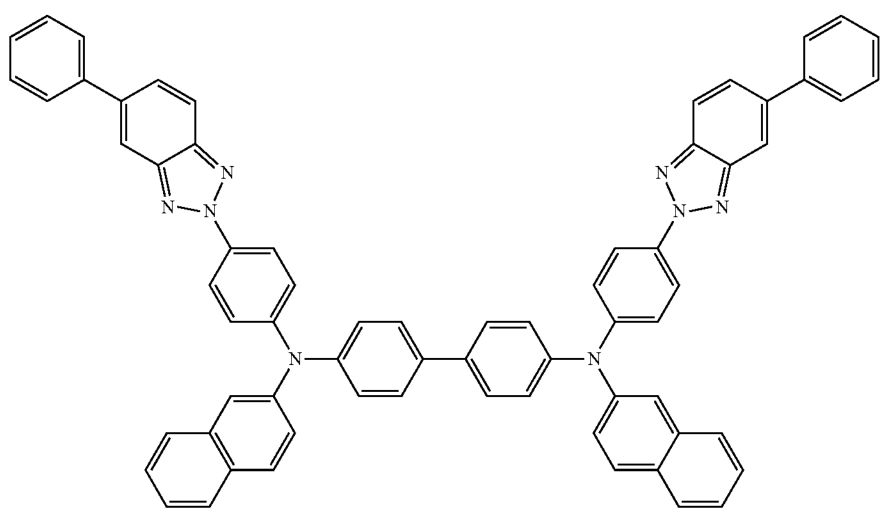
D114
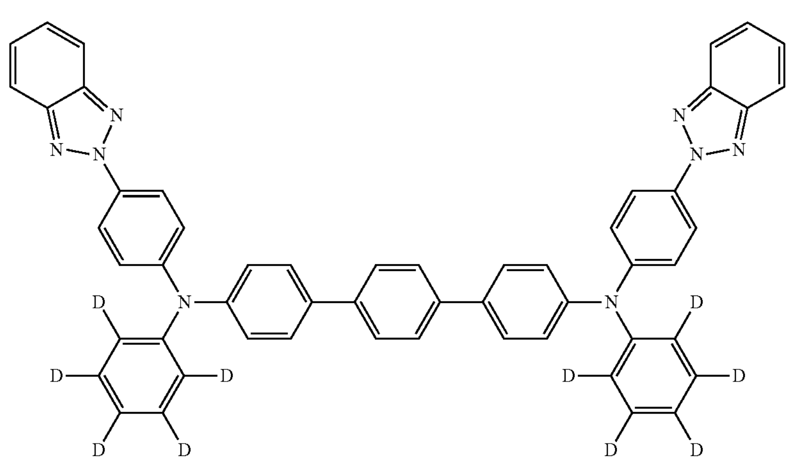

-continued
D115
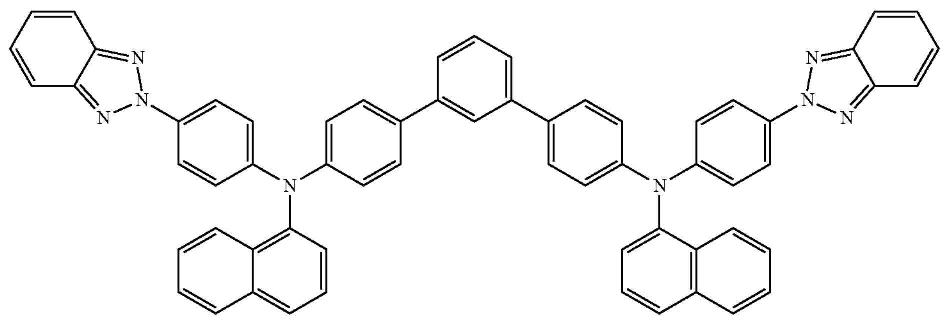
D116
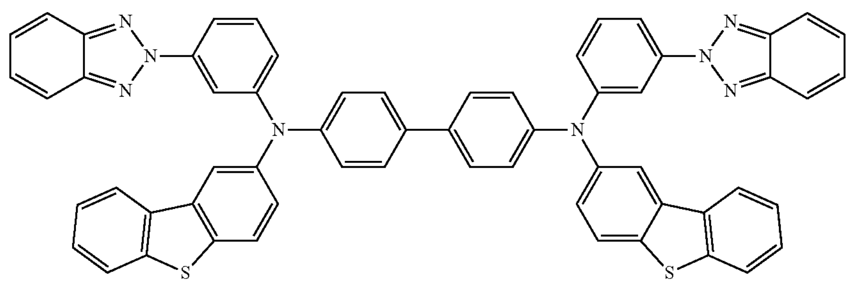
D117
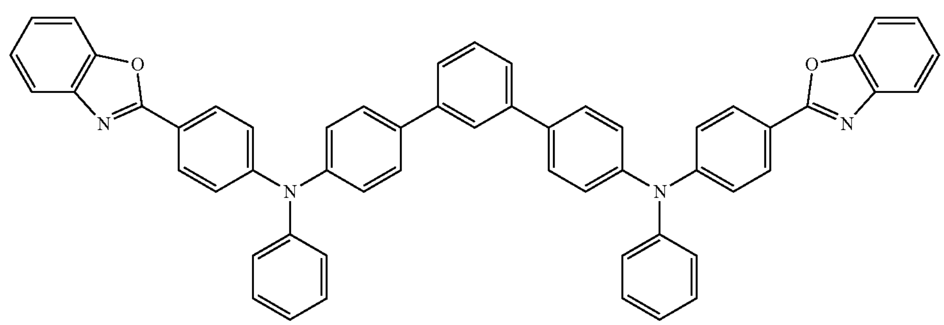
D118
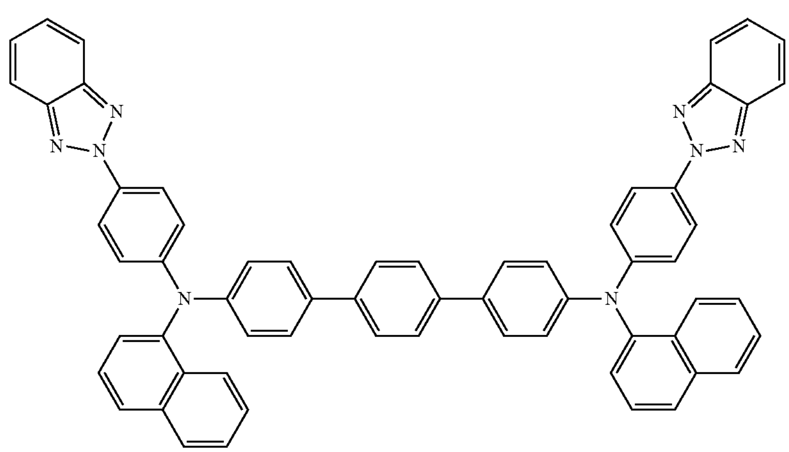

-continued
D119
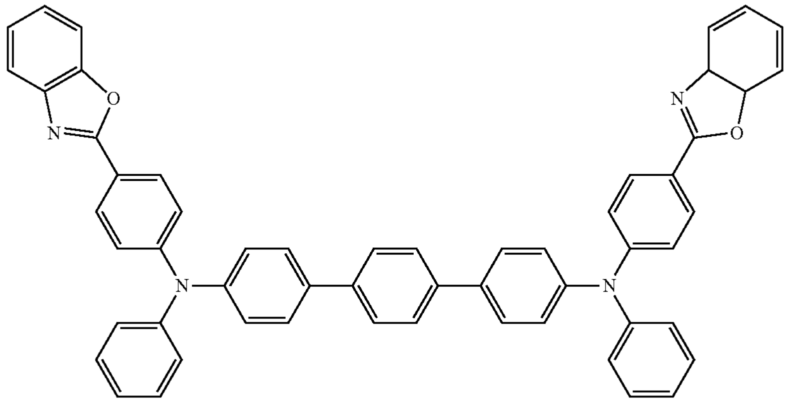
D120
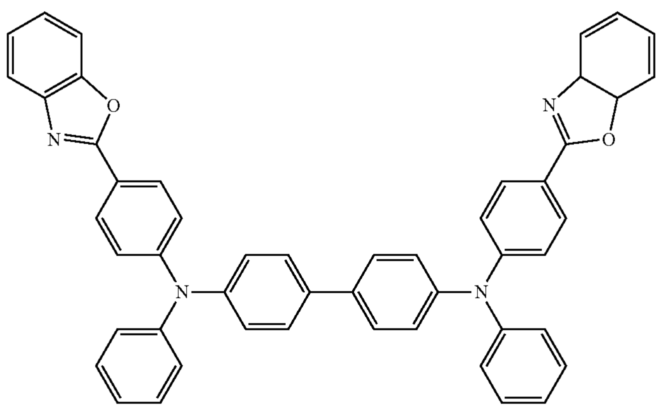
D121
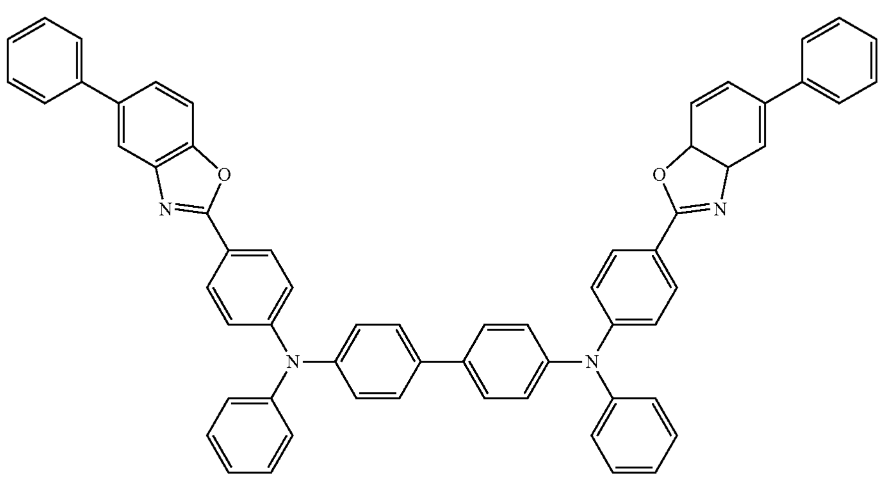

-continued
D122
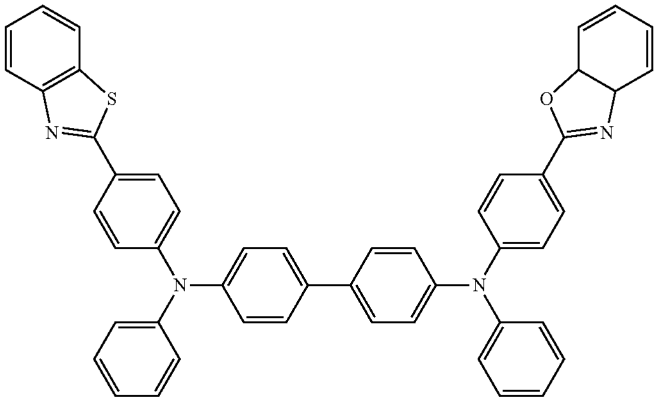
D123
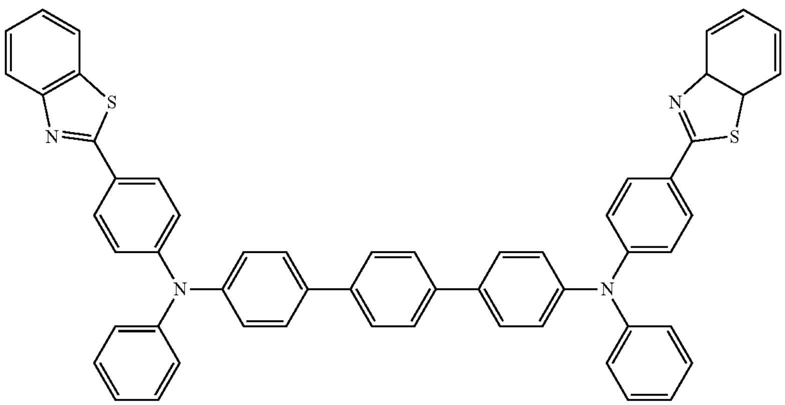
D124
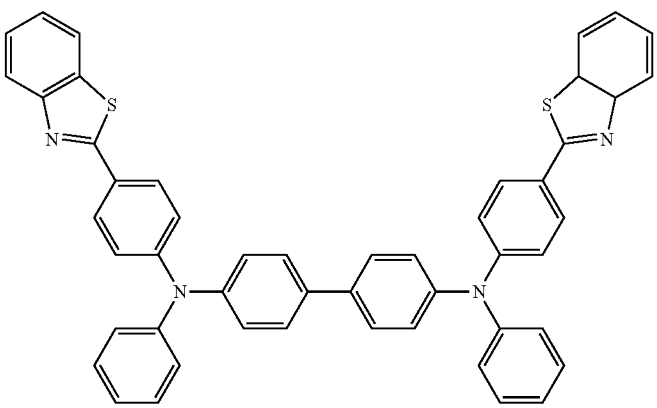
D125
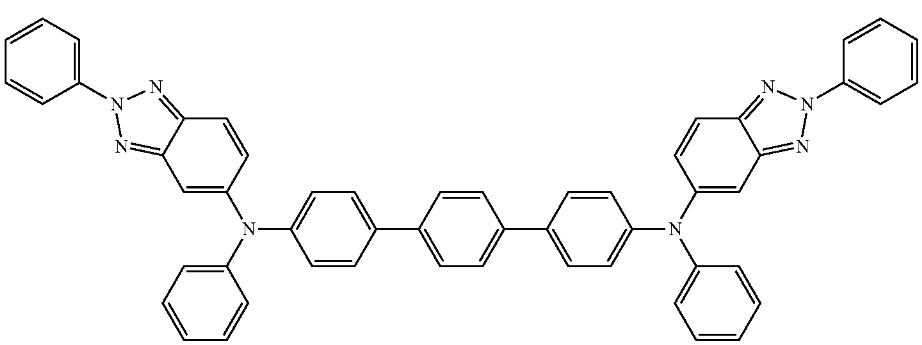

-continued
D126
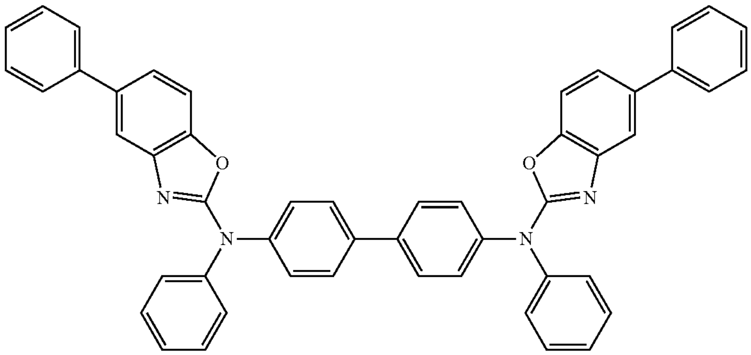
D127
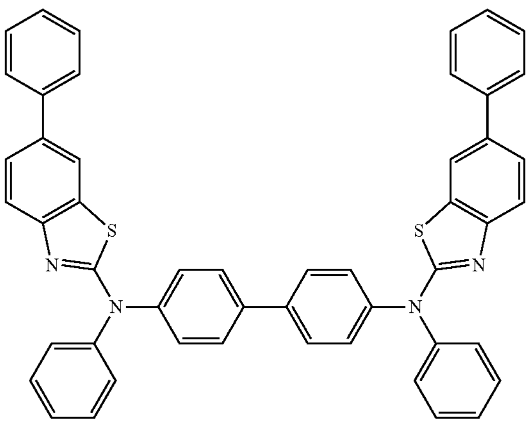
D128
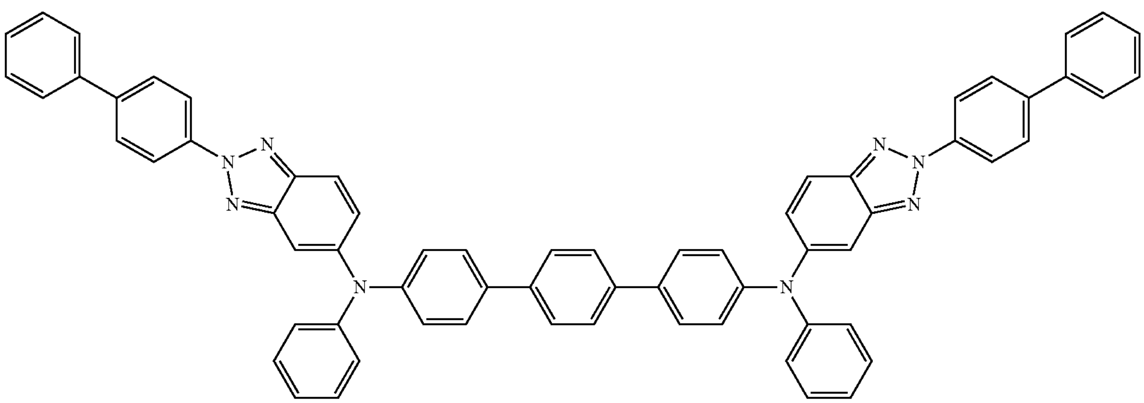
D129
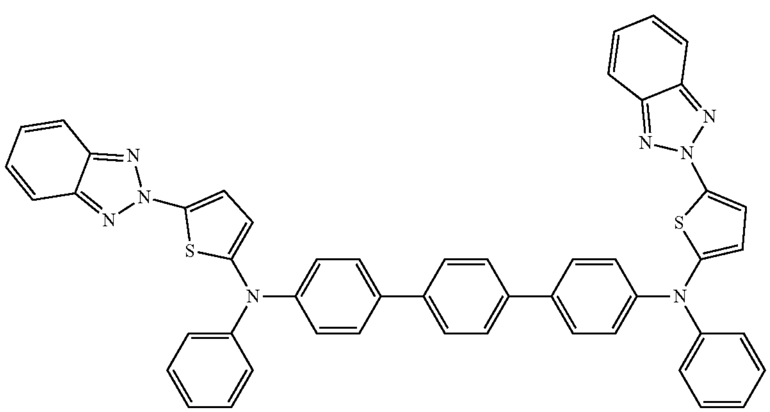

-continued
D130
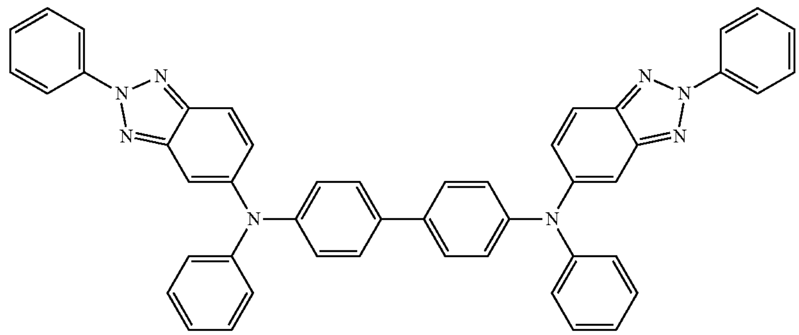
D131
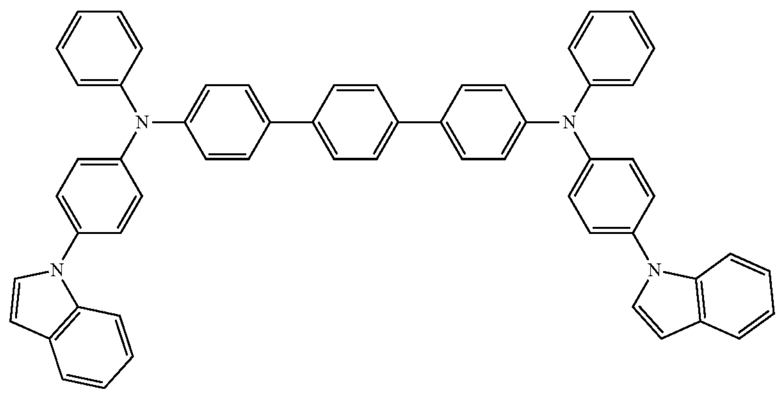
D132
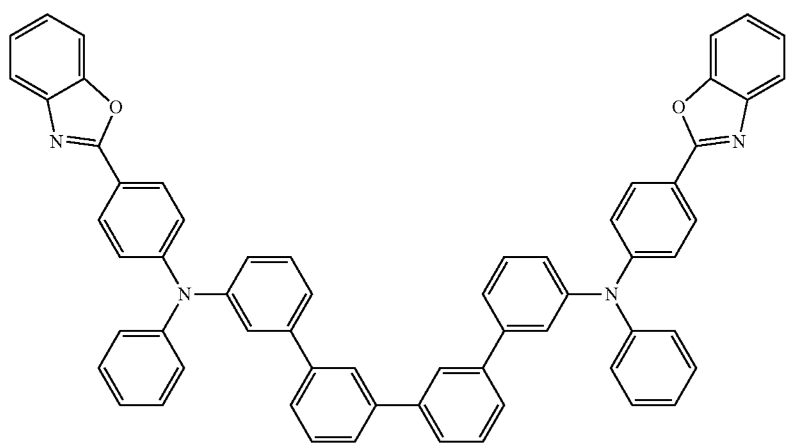
D133
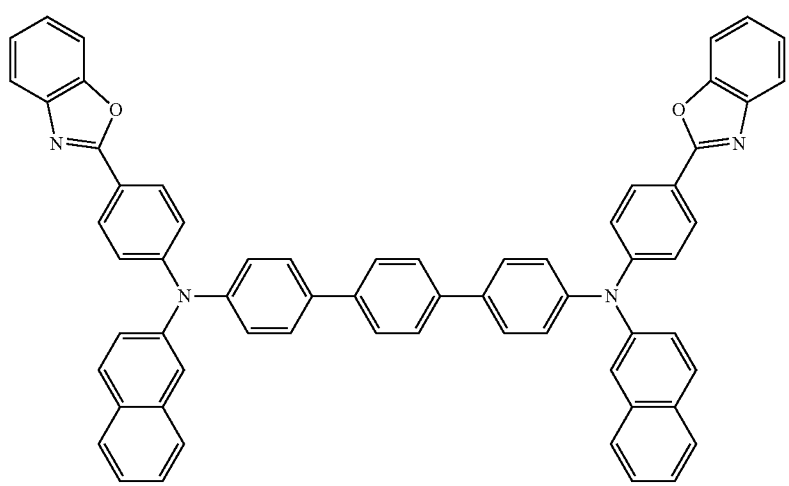

-continued
D134
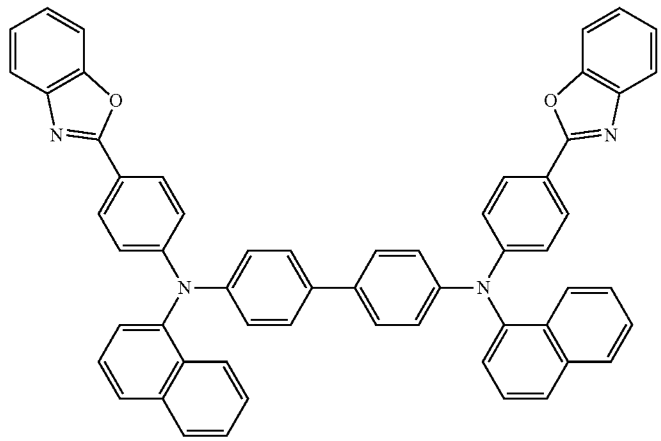
D135
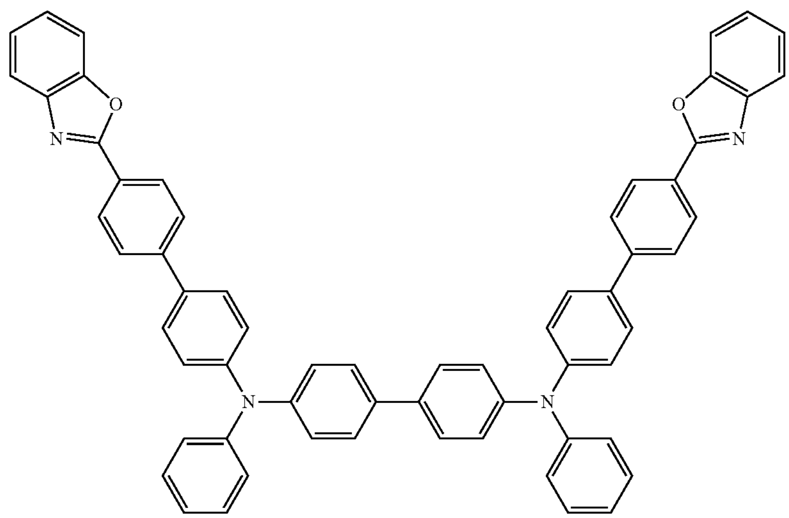
D136
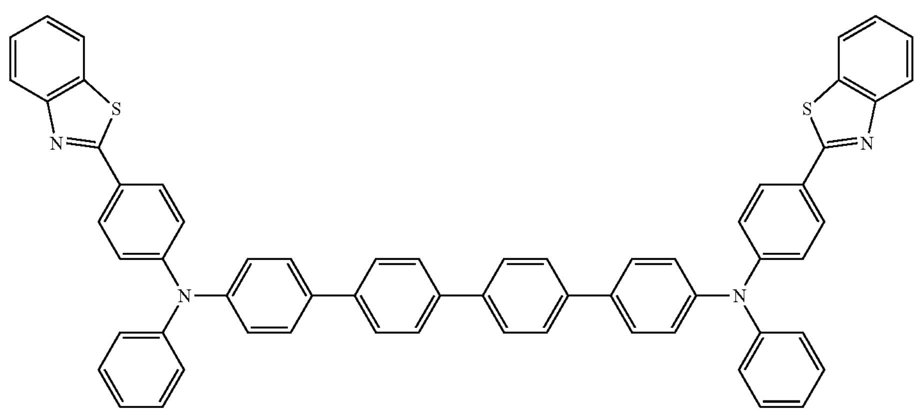

-continued
D137
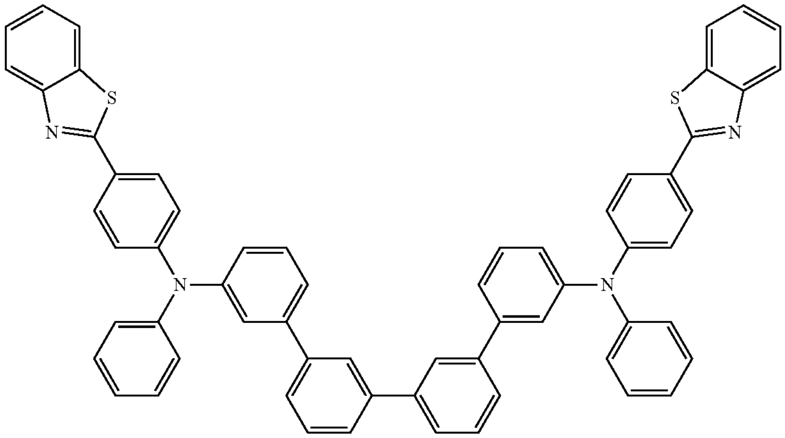
D138
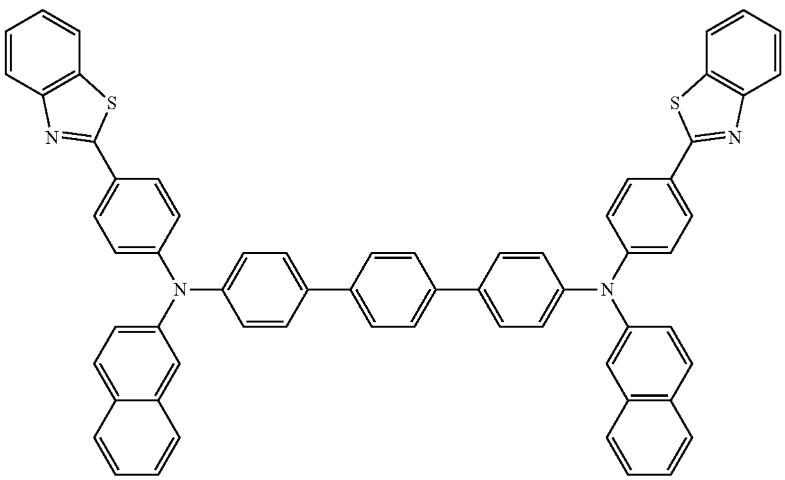
D139
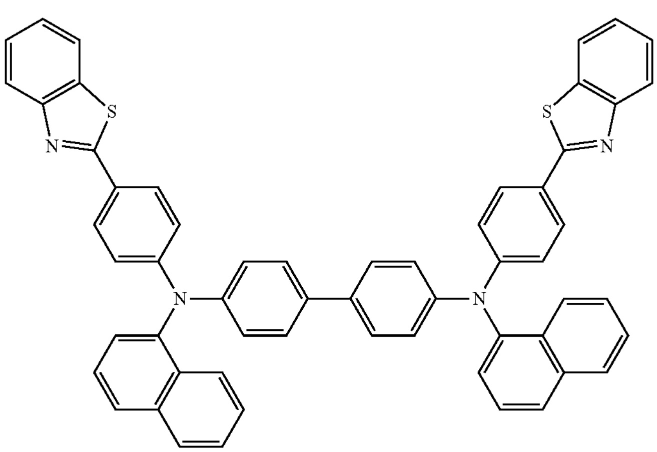

-continued
D140
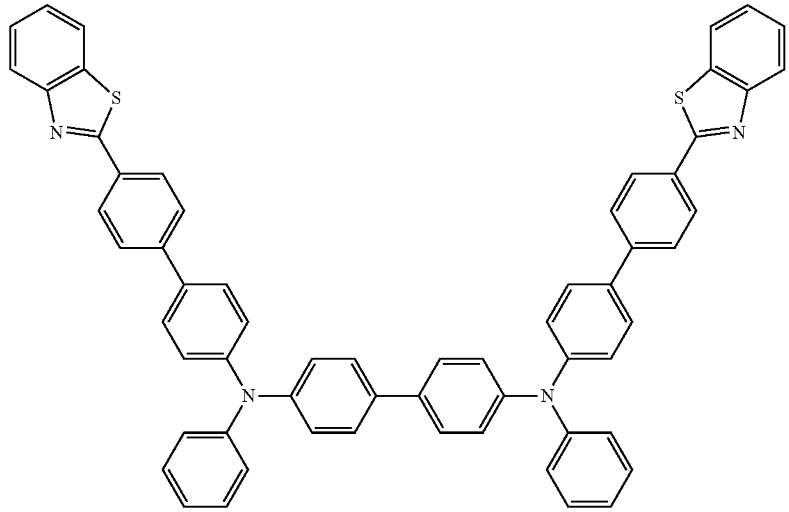
D141
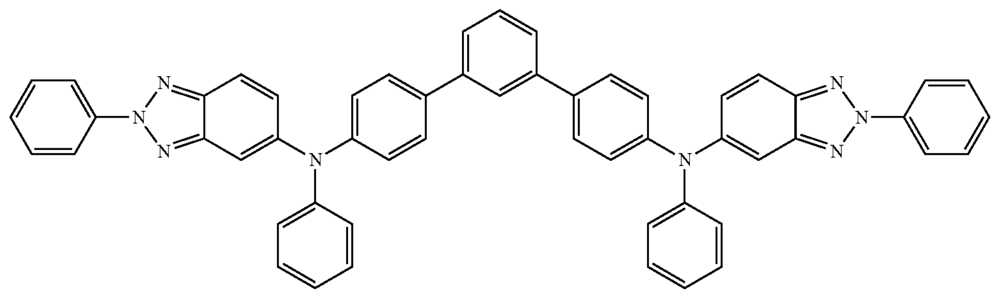
D142
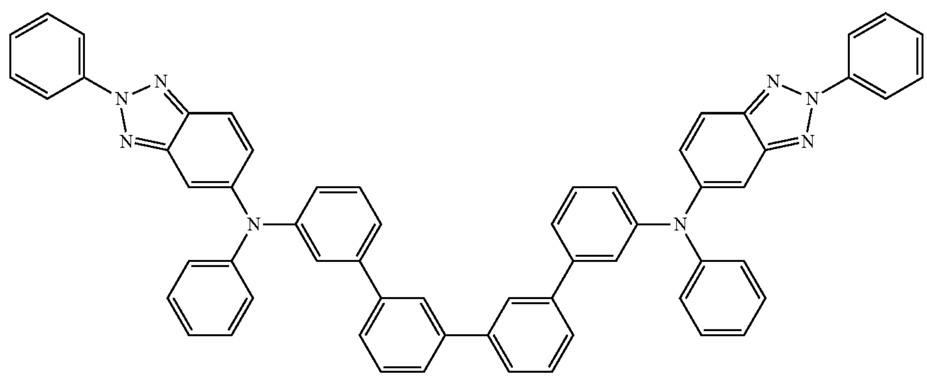
D143
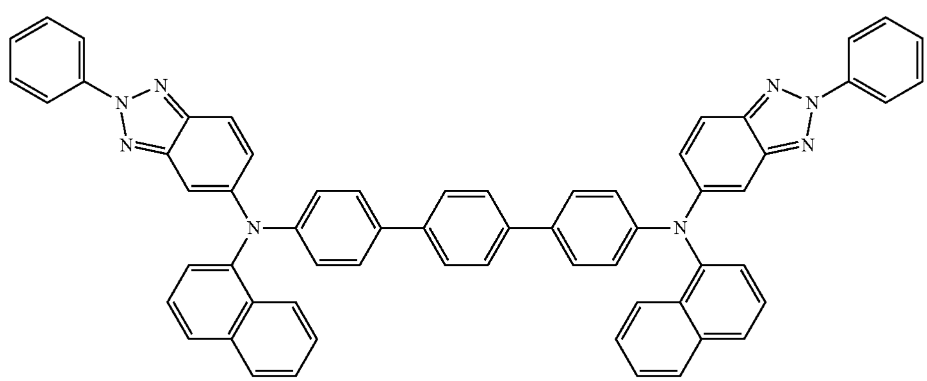

-continued

D144

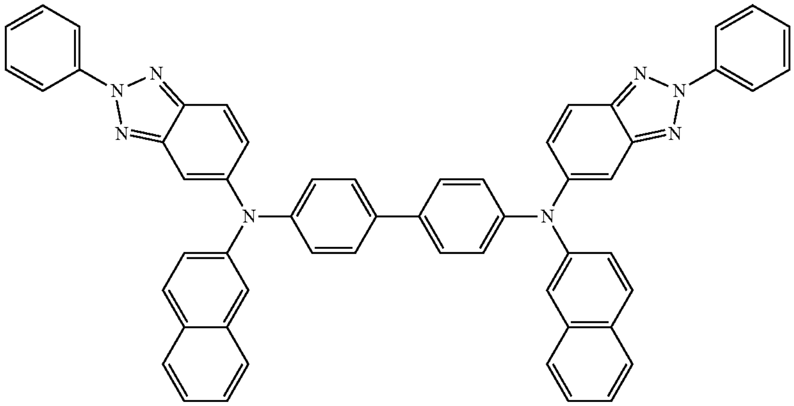

D145

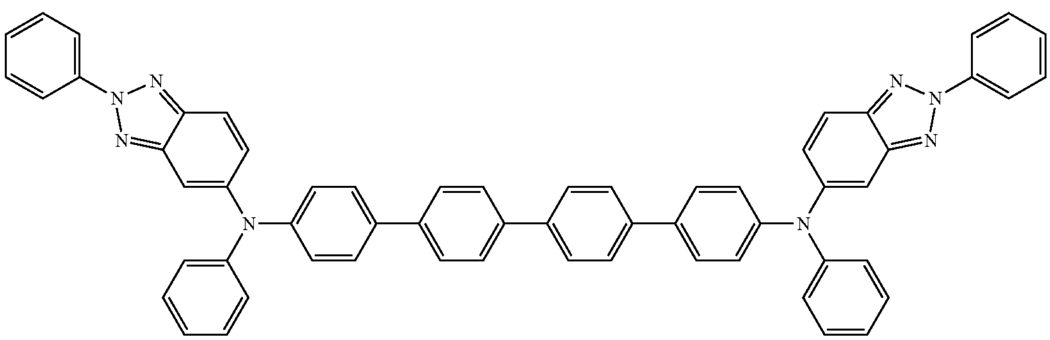

13. The organic electroluminescent according to claim 4, wherein each of the hole transport layer and the electron blocking layer comprises a compound represented by Formula F:

(F)

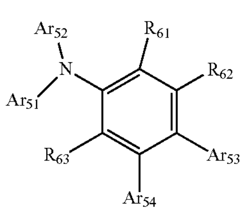

wherein $R_{61}$ to $R_{63}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, substituted or unsubstituted $C_1$-$C_{30}$ alkylgermanium, substituted or unsubstituted $C_1$-$C_{30}$ arylgermanium, cyano, nitro, and halogen, and $Ar_{51}$ to $Ar_{54}$ are identical to or different from each other and are each independently substituted or unsubstituted $C_6$-$C_{40}$ aryl or substituted or unsubstituted $C_2$-$C_{30}$ heteroaryl.

14. The organic electroluminescent according to claim 13, wherein the compound of Formula F is selected from the compounds of Formulae F1 to F33:

F1
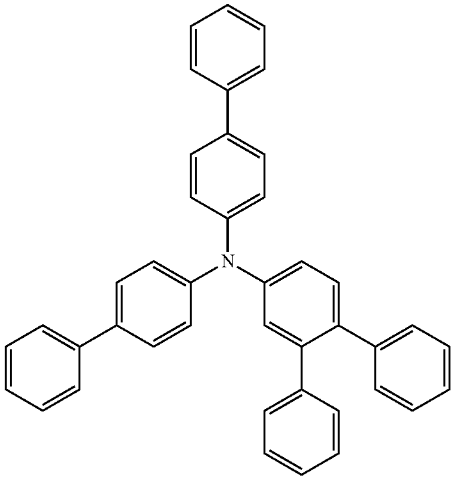
F2
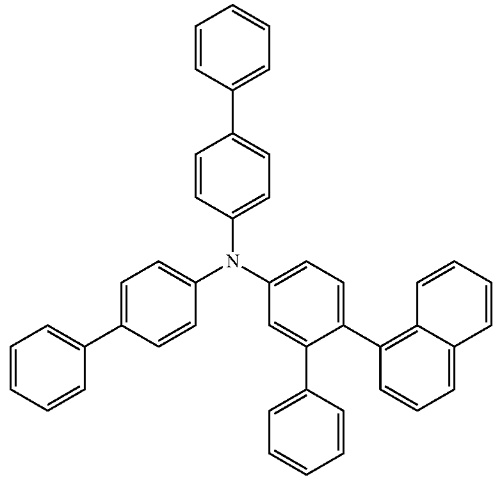
F3
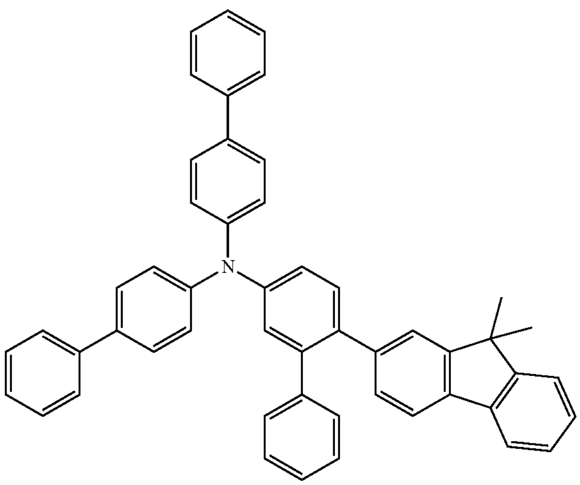
F4
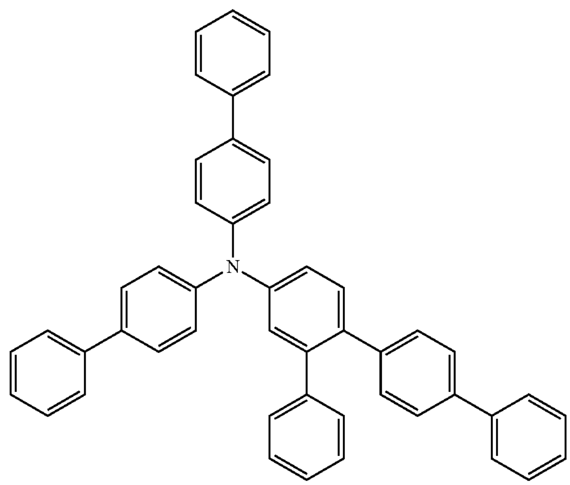
F5
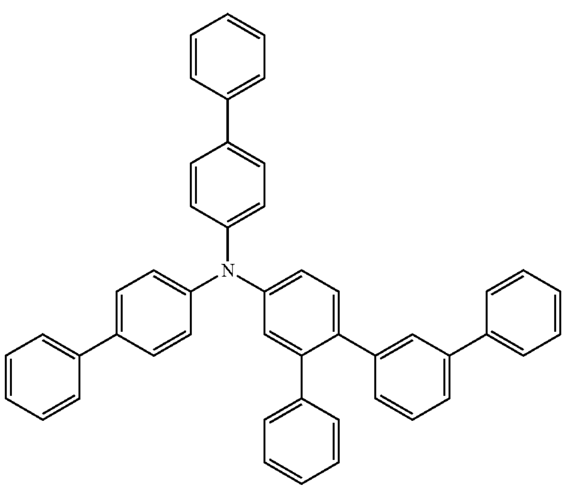
F6
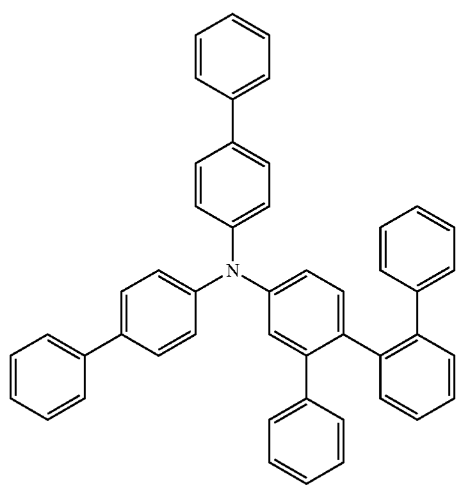

-continued
F7
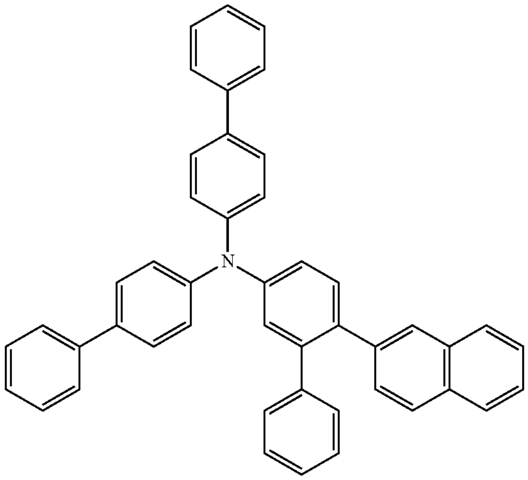
F8
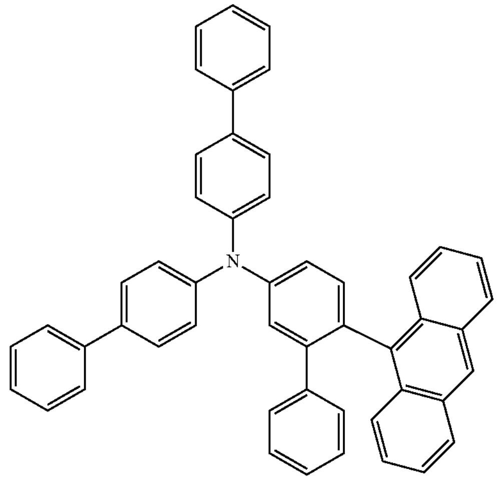
F9
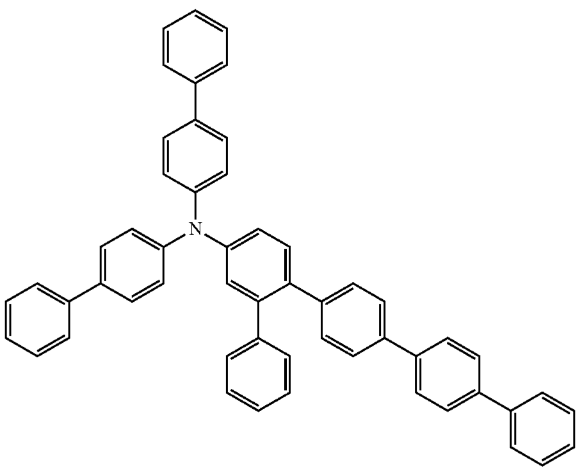
F10
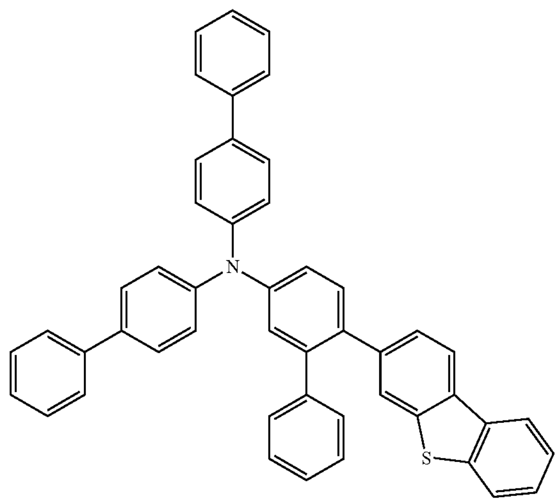
F11
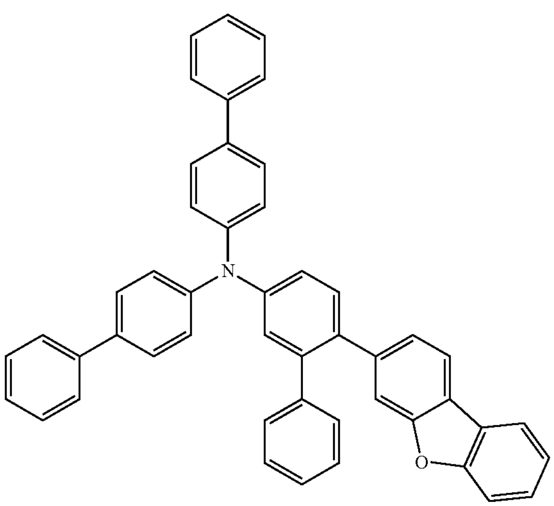
F12
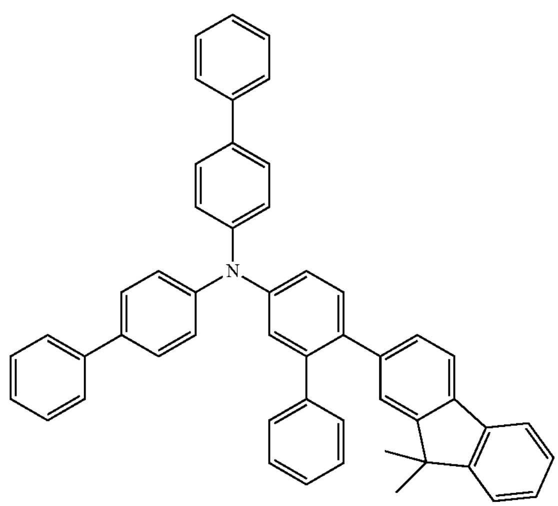

-continued
F13
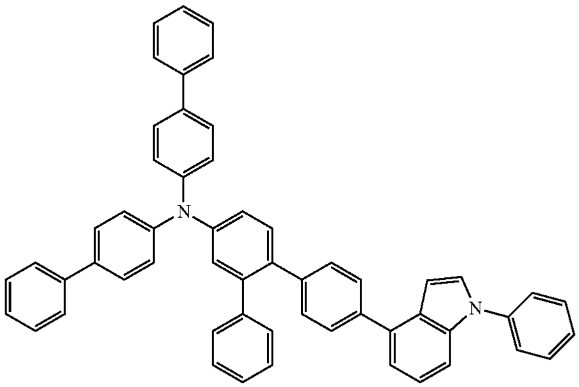
F14
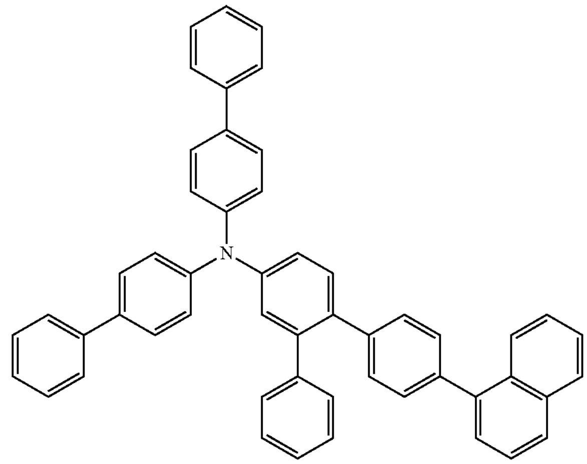
F15
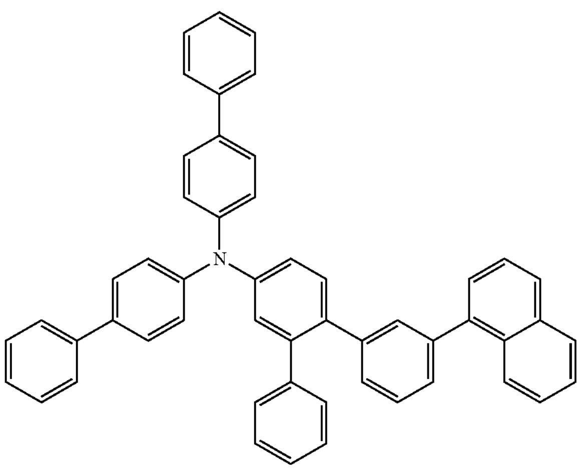
F16
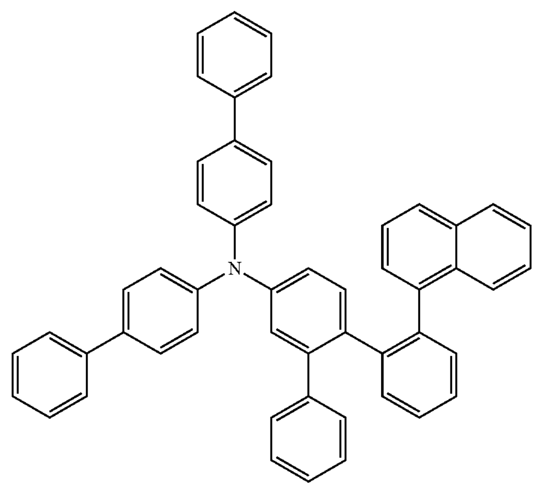
F17
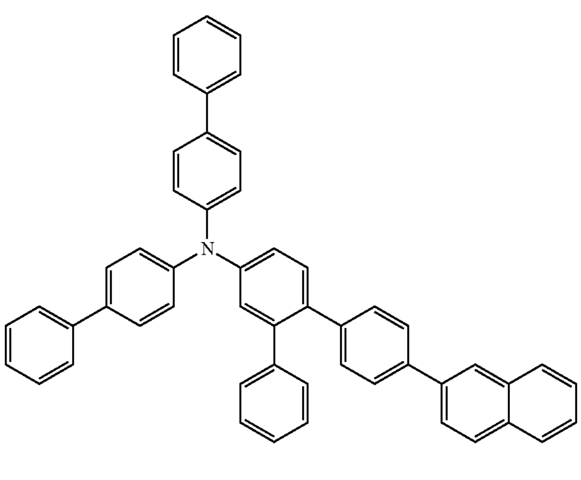
F18
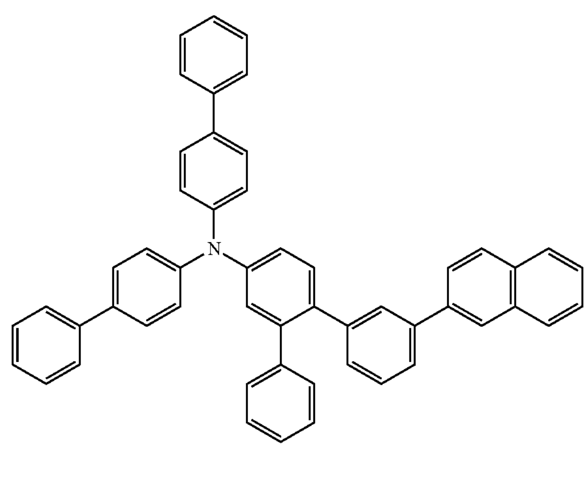

-continued
F19
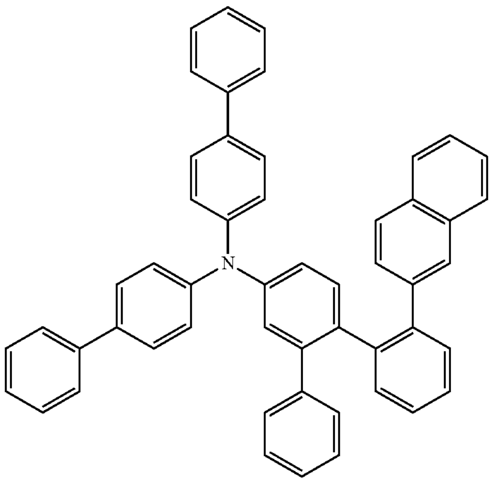
F20
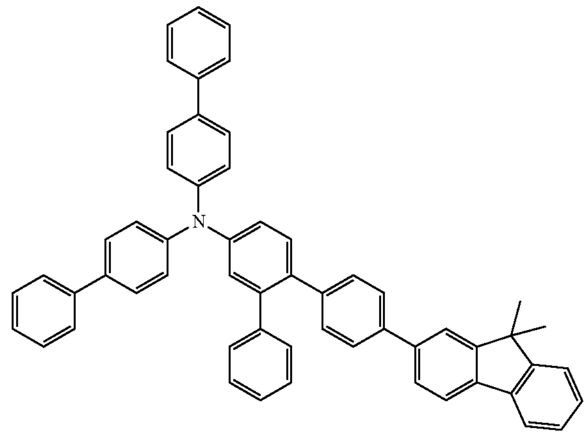
F21
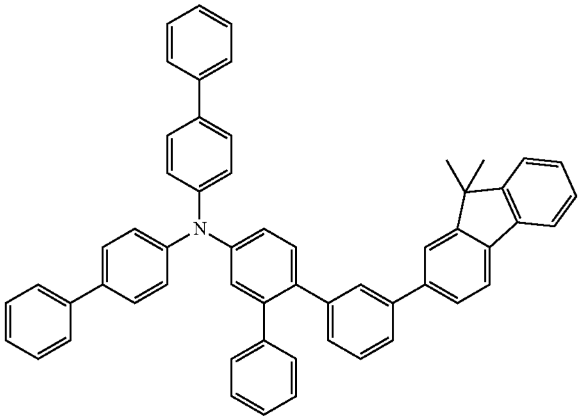
F22
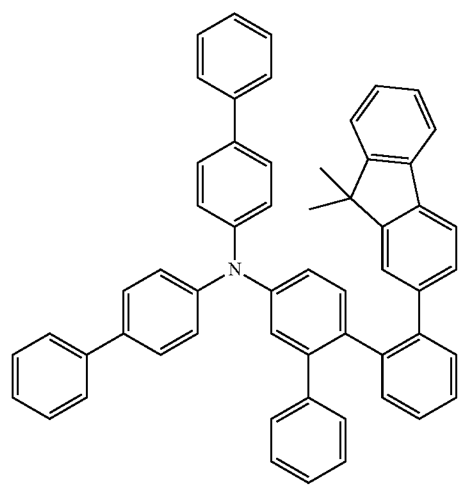
F23
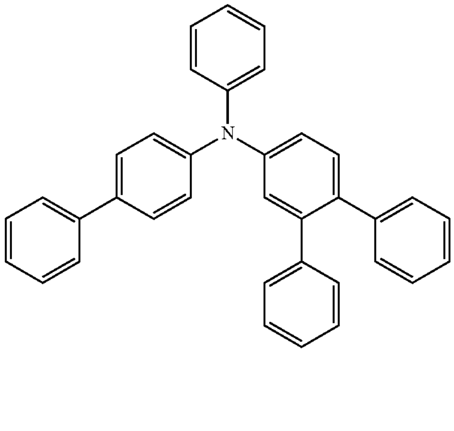
F24
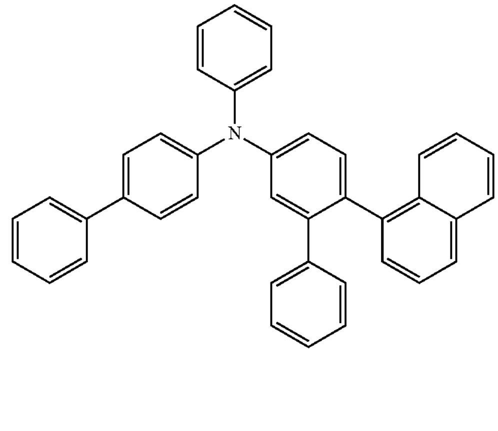

-continued
F25
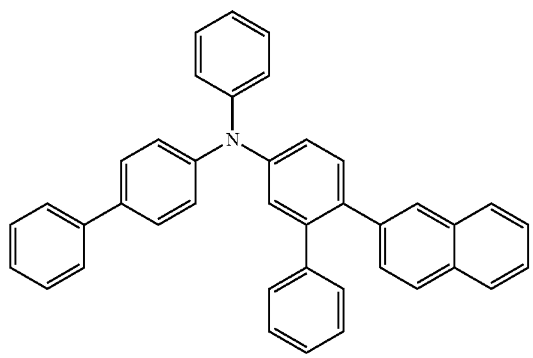
F26
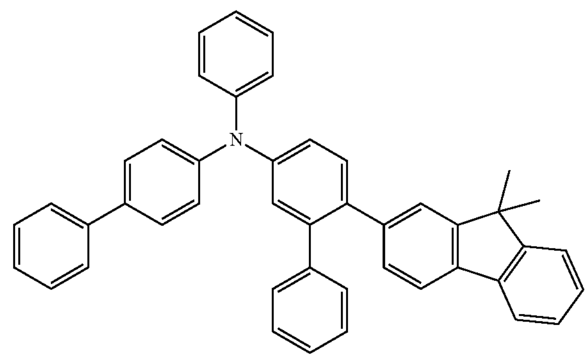
F27
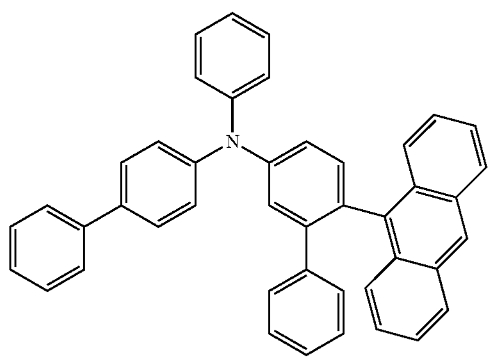
F28
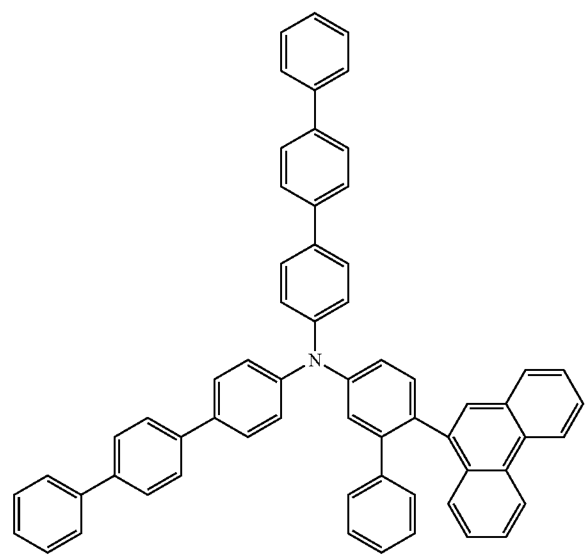
F29
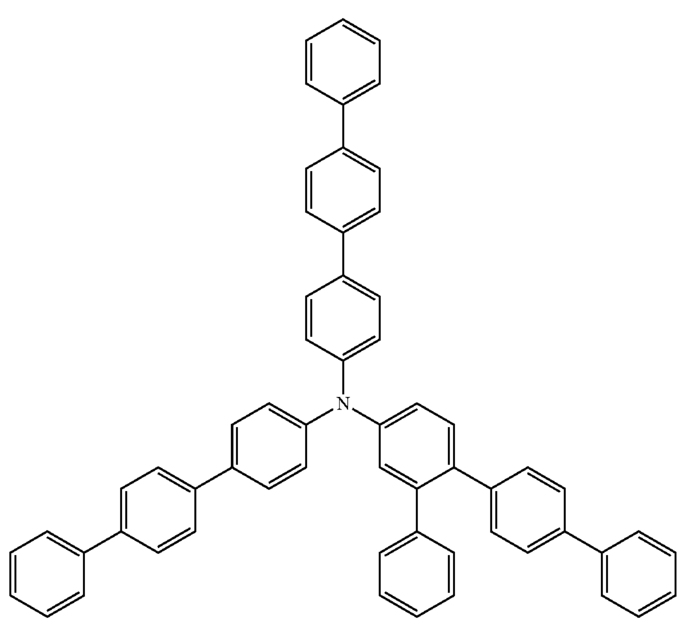

-continued
F30
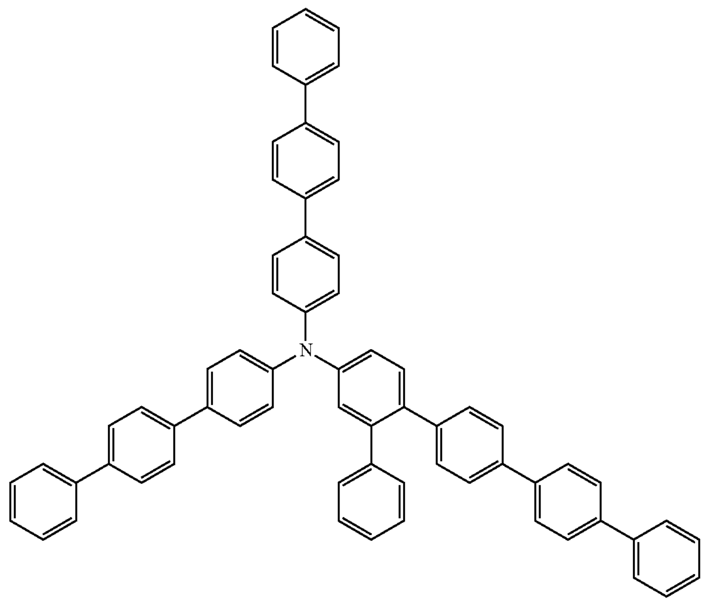
F31
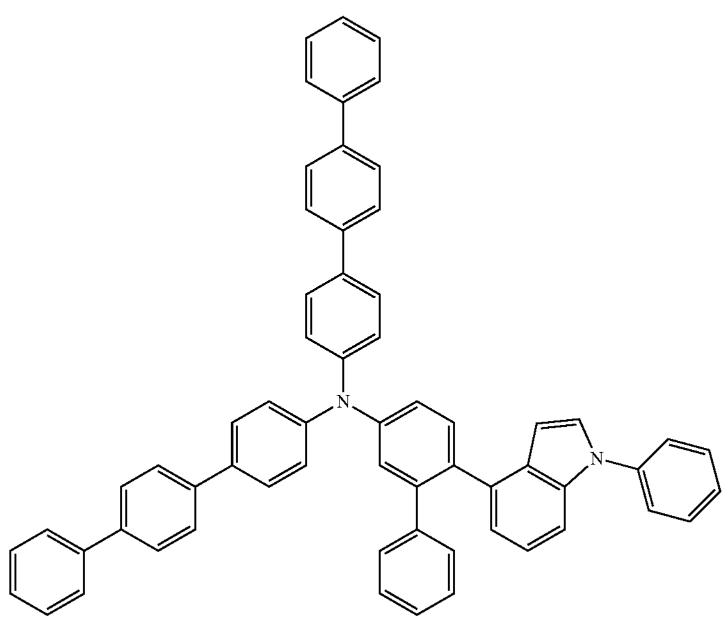

-continued
F32
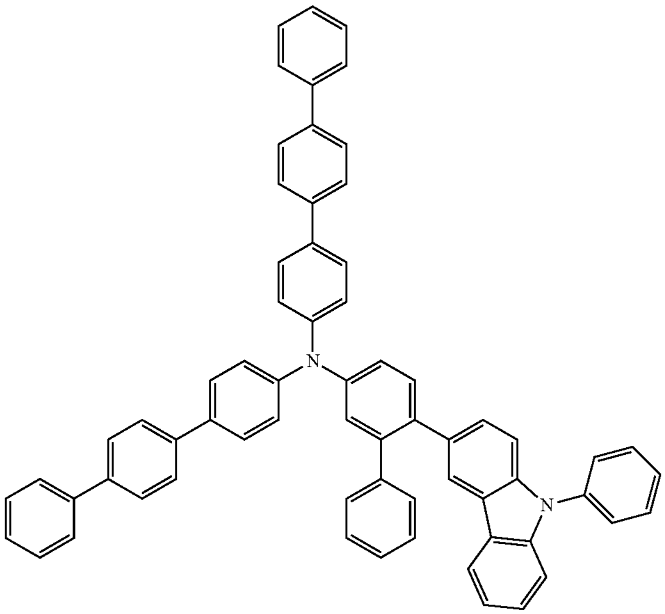
F33
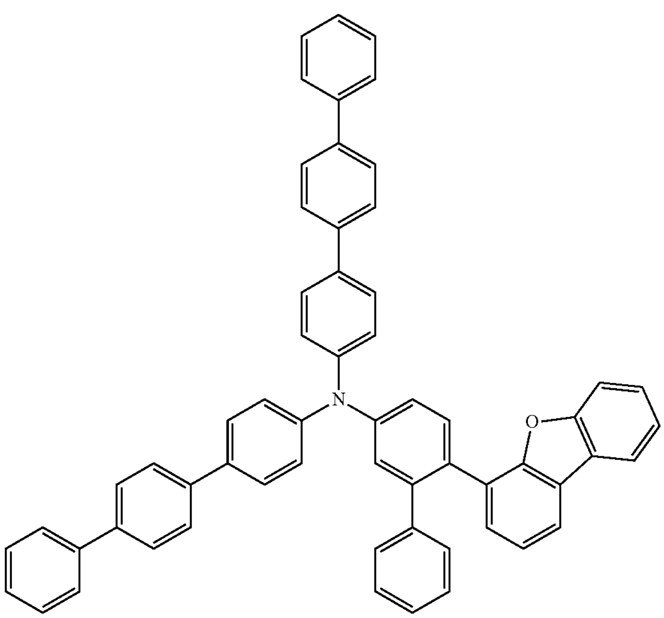

15. The organic electroluminescent according to claim 4, wherein one or more of the layers are formed by a deposition or solution process.

16. The organic electroluminescent according to claim 3, wherein the organic electroluminescence device is used in a display or lighting system selected from flat panel displays, flexible displays, monochromatic flat panel lighting systems, white flat panel lighting systems, flexible monochromatic lighting systems, and flexible white lighting systems.

17. An organic electroluminescent compound represented by Formula 145:

145

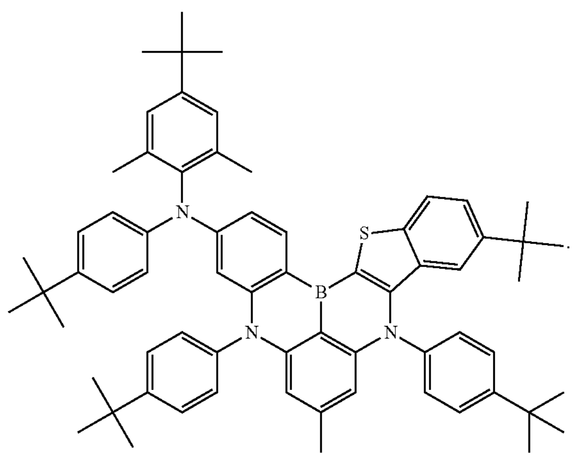

18. An organic electroluminescent device comprising a first electrode, a second electrode opposite to the first electrode, and one or more organic layers interposed between the first and second electrodes wherein at least one of the organic layers comprises the organic electroluminescent compound represented by Formula 145 according to claim 17 and optionally another organic electroluminescent compound represented by Formula A-3, A-4, A-5 or A-6:

(A-3)

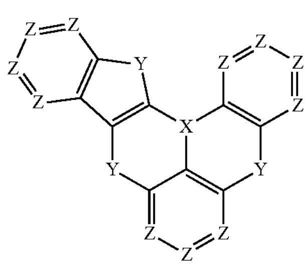

(A-4)

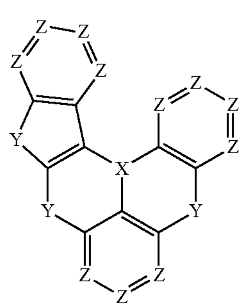

-continued (A-5)

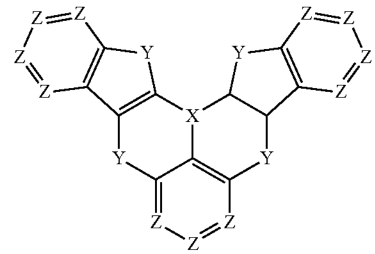

(A-6)

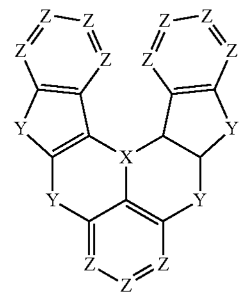

wherein X is B, Y are identical to or different from each other and are each independently selected from N-$R_1$, $CR_2R_3$, O, S, Se, and $SiR_4R_5$, $R_1$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that $R_2$ and $R_3$ are optionally linked to each other to form an alicyclic or aromatic monocyclic or polycyclic ring, $R_4$ and $R_5$ are optionally linked to each other to form an alicyclic or aromatic monocyclic or polycyclic ring, each Z is independently CR or N, the substituents R are identical to or different from each other and are independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the substituents R are optionally bonded to each other or are optionally linked to other adjacent substituents to form alicyclic or aromatic monocyclic or polycyclic rings whose carbon atoms are optionally substituted with one or more heteroatoms selected from N, S, and O atoms.

19. The organic electroluminescent according to claim 18, wherein the organic layers comprise an electron injecting layer, an electron transport layer, a hole injecting layer, a hole transport layer, an electron blocking layer, a hole blocking layer, and a light emitting layer, and at least one of the organic layers comprises the organic electroluminescent compound represented by Formula 145.

20. The organic electroluminescent according to claim 19, wherein the light emitting layer comprises, as a host compound, an anthracene derivative represented by Formula C:

(C)

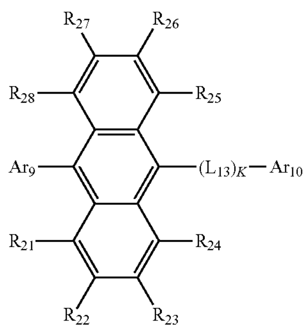

wherein $R_{21}$ to $R_{28}$ are identical to or different from each other and are as defined for $R_1$ to $R_4$ in Formula A-3, A-4, A-5 or A-6 representing the organic electroluminescent compound according to claim 18, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

* * * * *